(12) United States Patent
Kito et al.

(10) Patent No.: US 12,414,299 B2
(45) Date of Patent: *Sep. 9, 2025

(54) NONVOLATILE SEMICONDUCTOR MEMORY DEVICE AND MANUFACTURING METHOD THEREOF

(71) Applicant: Kioxia Corporation, Tokyo (JP)

(72) Inventors: Masaru Kito, Yokohama (JP); Hideaki Aochi, Kawasaki (JP); Ryota Katsumata, Yokohama (JP); Akihiro Nitayama, Yokohama (JP); Masaru Kidoh, Kawasaki (JP); Hiroyasu Tanaka, Tokyo (JP); Yoshiaki Fukuzumi, Yokohama (JP); Yasuyuki Matsuoka, Yokohama (JP); Mitsuru Sato, Yokohama (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/398,863

(22) Filed: Dec. 28, 2023

(65) Prior Publication Data

US 2024/0138150 A1 Apr. 25, 2024

Related U.S. Application Data

(60) Continuation of application No. 17/744,571, filed on May 13, 2022, now Pat. No. 11,903,205, which is a
(Continued)

(30) Foreign Application Priority Data

Mar. 27, 2006 (JP) ................................. 2006-086674

(51) Int. Cl.
*H10B 43/27* (2023.01)
*H10B 41/27* (2023.01)
(Continued)

(52) U.S. Cl.
CPC ............. *H10B 43/27* (2023.02); *H10B 41/27* (2023.02); *H10B 43/20* (2023.02); *H10B 43/40* (2023.02);
(Continued)

(58) Field of Classification Search
None
See application file for complete search history.

(56) References Cited

U.S. PATENT DOCUMENTS 5,258,635 A 11/1993 Nitayama et al.
5,308,778 A 5/1994 Fitch et al.
(Continued)

FOREIGN PATENT DOCUMENTS

JP H2-188966 A 7/1990
JP H4-79369 A 3/1992
(Continued)

OTHER PUBLICATIONS

Endoh et al., "Novel Ultrahigh-Density Flash Memory With a Stacked-Surrounding Gate Transistor (S SGT) Structured Cell," IEEE Trans. on Electron Devices (Apr. 2003), 50:945-951.
(Continued)

*Primary Examiner* — Michael Lebentritt
(74) *Attorney, Agent, or Firm* — Finnegan, Henderson, Farabow, Garrett & Dunner, LLP

(57) ABSTRACT

A nonvolatile semiconductor memory device that have a new structure are provided, in which memory cells are laminated in a three dimensional state so that the chip area may be reduced. The nonvolatile semiconductor memory device of the present invention is a nonvolatile semiconductor memory device that has a plurality of the memory strings, in which a plurality of electrically programmable memory cells is connected in series. The memory strings comprise a pillar shaped semiconductor; a first insulation
(Continued)

film formed around the pillar shaped semiconductor; a charge storage layer formed around the first insulation film; the second insulation film formed around the charge storage layer; and first or nth electrodes formed around the second insulation film (n is natural number more than 1). The first or nth electrodes of the memory strings and the other first or nth electrodes of the memory strings are respectively the first or nth conductor layers that are spread in a two dimensional state.

15 Claims, 95 Drawing Sheets

Related U.S. Application Data continuation of application No. 17/141,504, filed on Jan. 5, 2021, now Pat. No. 11,362,106, which is a continuation of application No. 16/245,271, filed on Jan. 11, 2019, now Pat. No. 10,916,559, which is a continuation of application No. 15/666,653, filed on Aug. 2, 2017, now Pat. No. 10,211,219, which is a continuation of application No. 14/724,853, filed on May 29, 2015, now Pat. No. 9,748,260, which is a continuation of application No. 13/198,359, filed on Aug. 4, 2011, now Pat. No. 9,064,735, which is a continuation of application No. 13/064,559, filed on Mar. 31, 2011, now Pat. No. 8,551,838, which is a division of application No. 11/654,551, filed on Jan. 18, 2007, now Pat. No. 7,936,004.

(51) Int. Cl.
*H10B 43/20* (2023.01)
*H10B 43/40* (2023.01)
*H10B 69/00* (2023.01)
*H10D 84/03* (2025.01)
*H10D 88/00* (2025.01)
*G11C 16/04* (2006.01)

(52) U.S. Cl.
CPC ........... *H10B 69/00* (2023.02); *H10D 84/038* (2025.01); *H10D 88/00* (2025.01); *H10D 88/01* (2025.01); *G11C 16/0483* (2013.01)

(56) References Cited

U.S. PATENT DOCUMENTS

| | | | |
|---|---|---|---|
| 5,311,050 A | 5/1994 | Nitayama et al. | |
| 5,480,820 A | 1/1996 | Roth et al. | |
| 5,599,724 A | 2/1997 | Yoshida | |
| 5,612,563 A | 3/1997 | Fitch et al. | |
| 5,671,176 A | 9/1997 | Jang et al. | |
| 5,707,885 A | 1/1998 | Lim | |
| 5,990,509 A | 11/1999 | McAllister, Jr. et al. | |
| 5,994,735 A | 11/1999 | Maeda et al. | |
| 6,060,746 A | 5/2000 | Berlin et al. | |
| 6,127,209 A | 10/2000 | Maseda et al. | |
| 6,165,823 A | 12/2000 | Kim et al. | |
| 6,372,559 B1 | 4/2002 | Crowder et al. | |
| 6,624,024 B1 | 9/2003 | Prall et al. | |
| 6,635,924 B1 | 10/2003 | Hergenrother et al. | |
| 6,716,764 B1 | 4/2004 | Girad et al. | |
| 6,727,544 B2 | 4/2004 | Endoh et al. | |
| 6,821,851 B2 | 11/2004 | Hergenrother et al. | |
| 6,870,215 B2 | 3/2005 | Endoh et al. | |
| 7,387,935 B2 | 6/2008 | Masuoka et al. | |
| 7,821,058 B2 | 10/2010 | Kidoh et al. | |
| 7,936,004 B2 * | 5/2011 | Kito | H10B 43/27 257/329 |
| 8,278,695 B2 | 10/2012 | Kidoh et al. | |
| 8,551,838 B2 | 10/2013 | Kito et al. | |
| 9,633,730 B2 | 4/2017 | Hioka | |
| 10,916,559 B2 * | 2/2021 | Kito | H10B 41/27 |
| 11,362,106 B2 | 6/2022 | Kito | |
| 2002/0020871 A1 | 2/2002 | Forbes | |
| 2004/0041189 A1 | 3/2004 | Voshell et al. | |
| 2004/0262681 A1 | 12/2004 | Masuoka et al. | |
| 2005/0133860 A1 | 6/2005 | Forbes | |
| 2005/0236660 A1 | 10/2005 | Watanobe et al. | |
| 2005/0275002 A1 | 12/2005 | Shone | |
| 2008/0067583 A1 * | 3/2008 | Kidoh | H10B 43/30 257/326 |
| 2009/0230449 A1 * | 9/2009 | Sakaguchi | H01L 28/20 257/E27.081 |
| 2009/0230450 A1 | 9/2009 | Shiino et al. | |
| 2009/0230458 A1 * | 9/2009 | Ishiduki | H01L 29/42324 257/E21.21 |
| 2009/0230462 A1 * | 9/2009 | Tanaka | H10B 43/27 257/326 |
| 2009/0242967 A1 * | 10/2009 | Katsumata | H10B 43/50 257/E21.409 |
| 2009/0267135 A1 * | 10/2009 | Tanaka | H10B 43/20 257/E21.585 |
| 2010/0038703 A1 * | 2/2010 | Fukuzumi | G11C 8/14 257/326 |
| 2010/0096682 A1 * | 4/2010 | Fukuzumi | H10B 43/20 257/314 |
| 2010/0148237 A1 * | 6/2010 | Kito | H01L 29/7926 438/618 |
| 2010/0171162 A1 * | 7/2010 | Katsumata | H01L 29/792 257/E27.06 |
| 2010/0232224 A1 * | 9/2010 | Maeda | H10B 43/20 365/185.18 |
| 2010/0238732 A1 * | 9/2010 | Hishida | G11C 16/08 365/185.11 |
| 2011/0121403 A1 | 5/2011 | Lee et al. | |
| 2012/0243326 A1 * | 9/2012 | Maeda | G11C 16/26 365/185.21 |

FOREIGN PATENT DOCUMENTS

| | | | | |
|---|---|---|---|---|
| JP | H6-338602 A | | 12/1994 | |
| JP | H8-78635 A | | 3/1996 | |
| JP | 2002-299478 A | | 10/2002 | |
| JP | 2003-7873 A | | 1/2003 | |
| JP | 2003-78044 A | | 3/2003 | |
| JP | 2003-86714 A | | 3/2003 | |
| JP | 2003-92366 A | | 3/2003 | |
| JP | 2004-356314 A | | 12/2004 | |
| JP | 2005-93808 A | | 4/2005 | |
| JP | 2007266143 A | * | 10/2007 | ......... G11C 16/0483 |
| JP | 2009224565 A | * | 10/2009 | ......... H01L 27/0688 |
| JP | 2010114370 A | * | 5/2010 | ....... H01L 21/28282 |
| JP | 2010199312 A | * | 9/2010 | ......... G11C 16/0483 |
| JP | 2010199314 A | * | 9/2010 | ......... H01L 27/11578 |
| JP | 2013042179 A | * | 2/2013 | ......... G11C 16/0483 |

OTHER PUBLICATIONS

Notification of Reasons for Refusal issued by the Korean Patent Office on Aug. 18, 2008, for Korean Patent Application No. 10-2007-29906, and English-language translation thereof.
JP 1993-126958 (Machine Translation of Pub. JP H6-338602).
English language translation of JP H6-338602 A, published Dec. 6, 1994.
Notification of Reasons for Refusal issued by the Japanese Patent Office on Jan. 17, 2012, for Japanese Patent Application No. 2006-086674, and English-language translation thereof.

\* cited by examiner

FIG. 10(A)
FIG. 10(B)
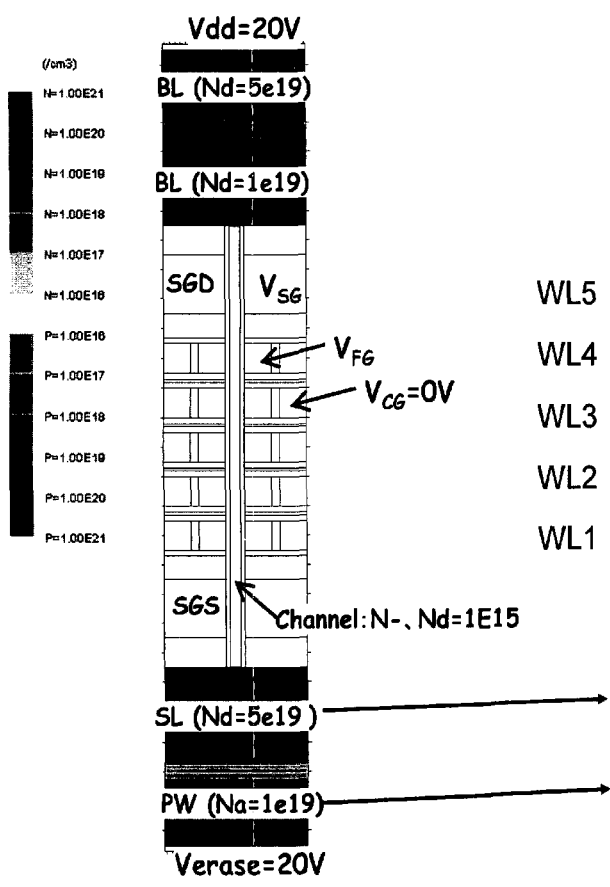
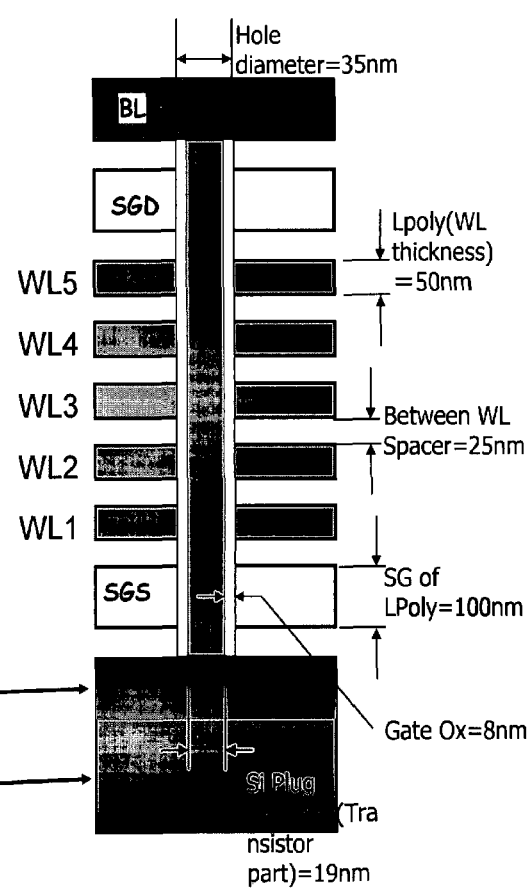

NONVOLATILE SEMICONDUCTOR MEMORY DEVICE AND MANUFACTURING METHOD THEREOF

CROSS-REFERENCE TO RELATED APPLICATIONS

This application is a continuation of U.S. patent application Ser. No. 17/744,571, filed May 13, 2022 which is a continuation of U.S. patent application Ser. No. 17/141,504, filed Jan. 5, 2021 (now U.S. Pat. No. 11,362,106), which is a continuation of U.S. patent application Ser. No. 16/245,271, filed Jan. 11, 2019 (now U.S. Pat. No. 10,916,559), which is a continuation of U.S. patent application Ser. No. 15/666,653, filed Aug. 2, 2017 (now U.S. Pat. No. 10,211,219, issued Feb. 19, 2019), which is a continuation of U.S. patent application Ser. No. 14/724,853, filed May 29, 2015 (now U.S. Pat. No. 9,748,260, issued Aug. 29, 2017), which is a continuation of U.S. patent application Ser. No. 13/198,359, filed Aug. 4, 2011 (now U.S. Pat. No. 9,064,735, issued Jun. 23, 2015), which is a continuation of U.S. patent application Ser. No. 13/064,559, filed Mar. 31, 2011 (now U.S. Pat. No. 8,551,838, issued Oct. 8, 2013), which is a divisional of U.S. patent application Ser. No. 11/654,551, filed Jan. 18, 2007 (now U.S. Pat. No. 7,936,004, issued May 3, 2011), which are all incorporated herein by reference.

FIELD OF THE INVENTION

The present invention is related to an electrically programmable semiconductor memory device, and particularly in such a semiconductor memory device, related to a nonvolatile semiconductor memory device.

BACKGROUND OF THE INVENTION

Demand for a nonvolatile semiconductor memory device that is small and has a large capacity has been increasing rapidly, and a NAND type flash memory, in which high integration and large capacitivity can be expected, has been paid attention.

It will be necessary that a design rule should be reduced to proceeded high integration and large capacity. For reducing the design rules, further micro processing of wiring patterns will be required.

For realizing further micro processing such as wiring patterns, a very high quality of processing technique is required; therefore, reduction of the design rules has become difficult.

Thus, in late years, large number of inventions on semiconductor memory devices, in which a three-dimensional memory cell has been suggested to raise integration degree of the memory (Japanese Patent Laid-Open No. 2003-078044, U.S. Pat. Nos. 5,599,724, 5,707,885, "Masuoka et al. "Novel Ultrahigh-Density Flash Memory With a Stacked-Surrounding Gate Transistor (S-SGT) Structured Cell", IEEE TRANSACTION SON ELECTRON DEVICES, VOL. 50, NO. 4, pp 945-951, April 2003".

Many of the conventional semiconductor memory device, in which a three dimensional memory cell is placed, need to proceed Photo Etching Process (hereinafter called "PEP", which represents so-called a process to proceed a patterning, using photo resist and manufacturing process such as a lithography process and etching, etc.). Here, a Photo Etching Process performed with a smallest line width of the design rule is set as "a critical PEP", and a Photo Etching Process performed with a line width larger than the smallest line width of the design rule is set as "a rough PEP". In the conventional semiconductor memory device, in which a three-dimensional memory cell is disposed, it is required that the critical PEP number per one layer of a memory cell part should be equal to or more than 3. Additionally in a conventional semiconductor memory device, there are many of those, in which memory cells are simply stacked, and thus cost increase caused by three-dimensional manufacturing will not be avoided.

In addition, in one of the conventional semiconductor memory devices which placed a three-dimensional memory cell, there is a semiconductor memory device in use of a transistor of a SGT (a column shape) structure (Japanese Patent Laid-Open No. 2003-078044, U.S. Pat. Nos. 5,599,724, 5,707,885).

In a semiconductor memory device in use of a transistor of a SGT (a column shape) structure, a process, in which poly-silicon that will become gate electrodes in its side walls are formed after having formed a channel (a body) part of a stacked memory transistor part in the shape of a pillar, is adopted. It is highly possible that problems such as a shortstop between the adjacent gates occur with micro processing, because the structure from the overhead view is the structure like skewering dumplings.

Even more particularly, as disclosed by IEEE TRANSACTION SON ELECTRON DEVICES, VOL. 50, NO 4, pp 945-951, April 2003, after having formed upper pillar and a side wall gate, a lower layer pillar is formed regarding the upper pillar and the sidewall gate as a mask, and thus a lower layer gate is formed. Therefore, as the lower the layer is going, pillar diameter is different. Accordingly, not only a variation of a transistor property occurs in every layer, but also a cell area from the overhead view becomes large, because a pitch at the time of two dimensional placements with a pillar diameter of the bottom layer is fixed. In addition, a pair of adjacent pillars that is disposed in a two dimensional state are separated thoroughly, and an extra process that connects word lines of every layer will be needed. Therefore, the process will become cumbersome.

As for the nonvolatile semiconductor memory device of conventional stacked type, a number of the word line driver that is necessary has increased because there are word lines that exist at least independently in every layer thus; a tip area has grown large.

BRIEF SUMMARY OF THE INVENTION

According to one embodiment of the present invention, a nonvolatile semiconductor memory device comprising a plurality of memory strings, the memory string comprising a memory strings having a plurality of electrically programmable memory cells connected in series, wherein the memory string comprises a pillar shaped semiconductor, a first insulation film formed around the pillar shaped semiconductor, a charge storage layer formed around the first insulation film, a second insulation film formed around the charge storage layer, and first to nth electrodes formed around the second insulation film (n is a natural number not less than 2); and wherein the first to the nth electrodes of the memory strings and the first to the nth electrodes of the other memory strings form first to nth conductor layers spread in two dimensional, respectively.

In addition, according to one embodiment of the present invention, a manufacturing method of a nonvolatile semiconductor memory device comprising: forming diffusion areas having conductor impurities on a semiconductor substrate; forming a plurality of first insulation films and conductors in turn above the semiconductor substrates; forming a plurality of holes in the plurality of the first insulation films and the conductors; forming a second insulation film on the surface of the holes; etching the second insulation film at the bottom of the holes; and forming a plurality of pillar shape semiconductors in the holes, respectively.

BRIEF DESCRIPTION OF THE DRAWINGS

The accompanying drawings, which are incorporated in and constitute a part of this specification, illustrate an implementation of the present invention, and together with the description, explain the invention.

In the drawings.

FIG. 10(A) is a diagram that shows a condition setting of a simulation of the deletion operation of one memory string of the nonvolatile semiconductor memory device according to one embodiment of the present invention; FIG. 10 (B) is a diagram that shows structure of the memory string based on the condition setting of FIG. 10(A).

DETAILED DESCRIPTION OF THE PREFERRED EMBODIMENTS

The following description explains embodiments of the nonvolatile semiconductor memory device and the manufacturing methods for according to one embodiment of the present invention; however, the present invention will not be will not be limited to the following embodiments. Also, in each of the embodiment, same codes are referred for the similar structure, and will not be explained again.

Figure 1:
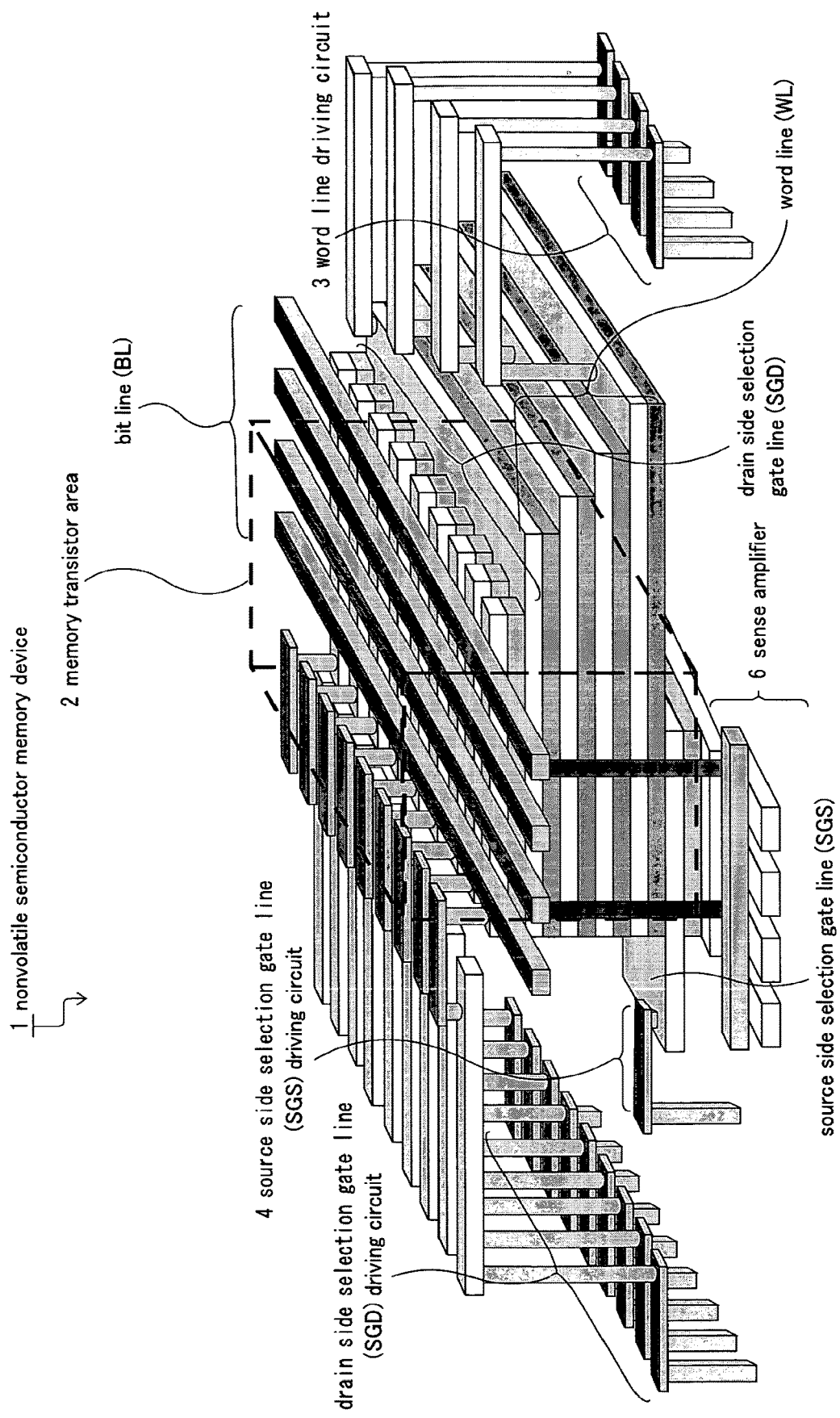
FIG. 1 is an outline diagram of the nonvolatile semiconductor memory device according to one embodiment of the present invention.

An outline diagram of the nonvolatile semiconductor memory device 1 of the present invention according to the embodiment is shown in FIG. 1. The nonvolatile semiconductor memory device 1 of the present invention according to the embodiment has a memory transistor area 2, a word line driving circuit 3, source side selection gate line (SGS) a driving circuit 4, drain side selection gate lines (SGD) a driving circuit 5, a sense amplifier 6, etc. As shown in FIG. 1, in the nonvolatile semiconductor memory device 1 of the present invention according to this embodiment, memory transistors that configure the memory transistor area 2 are formed by laminating a plurality of semiconductor layers. In addition, the word line of each of the layers, are spread in a two dimensional state at a certain area. The word lines of each layers respectively have a plane structure comprising the same layer and have a plate-shaped plane structure.

Figure 87:
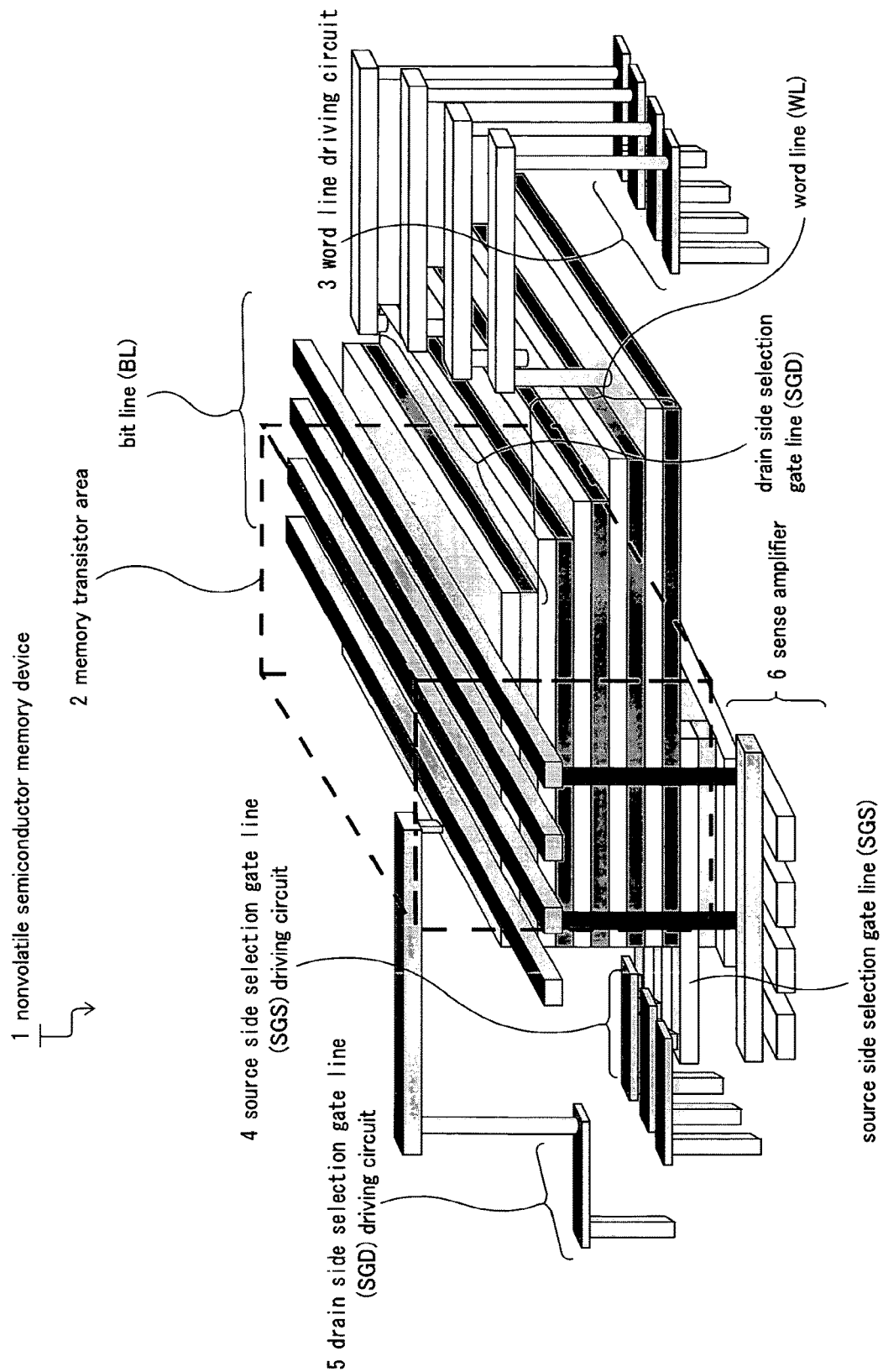
FIG. 87 is an outline diagram of the nonvolatile semiconductor memory device according to one embodiment of the present invention.
Figure 88:
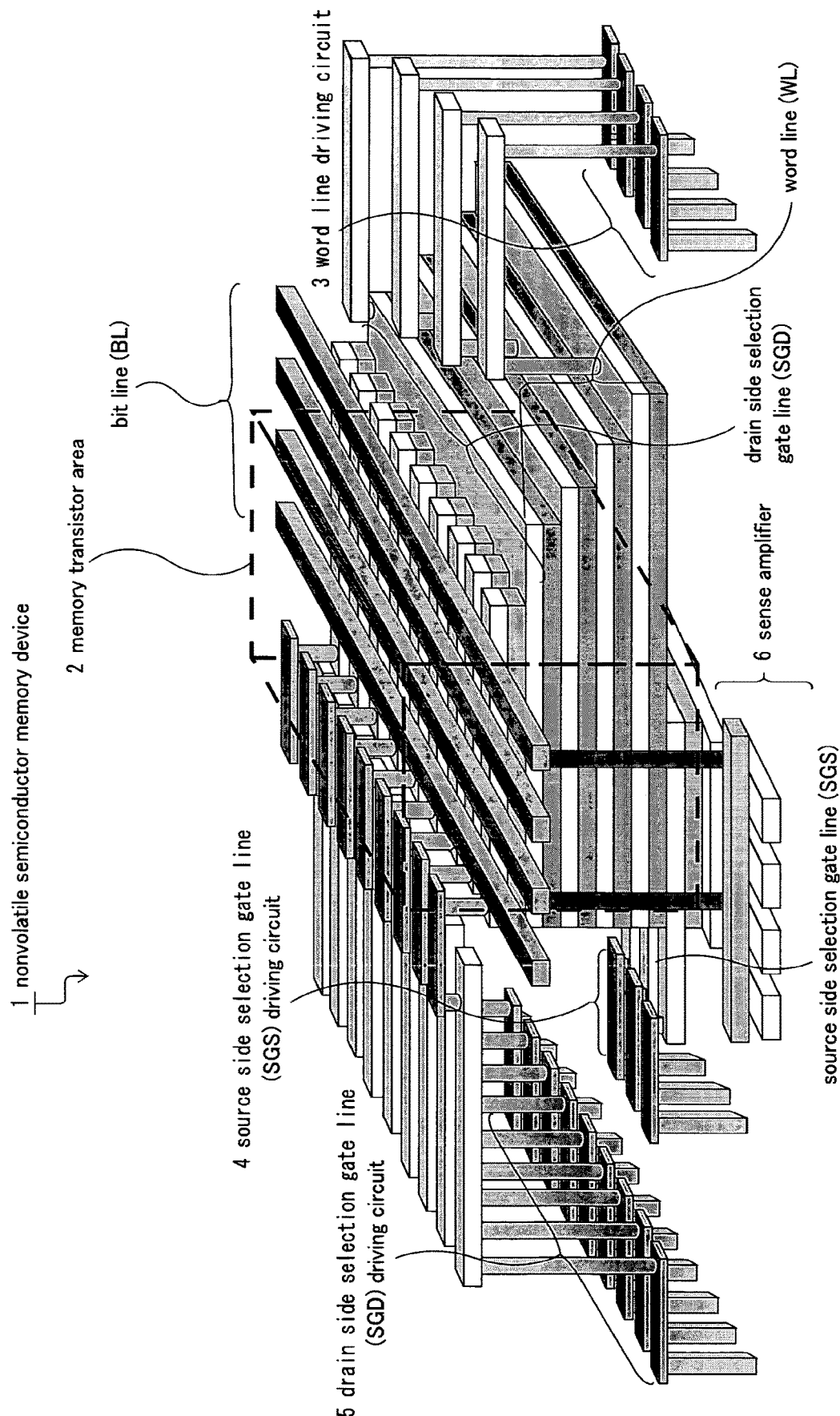
FIG. 88 is an outline diagram of the nonvolatile semiconductor memory device according to one embodiment of the present invention.

Further, in the nonvolatile semiconductor memory device 1 of the present invention according to the embodiment shown in FIG. 1, the source side selection gate line (SGS) has a plate-shaped wiring structures, and the drain side selection gate lines (SGD) respectively have insulated and isolated wiring structures. Also, in the nonvolatile semiconductor memory device 1 of the present invention according to the embodiment, each of the source side selection gate line (SGS) may be set to have an insulated and isolated wiring structures, and a drain side selection gate line (SGD) may be set to have a plate-shaped plane wiring structures, as shown in FIG. 87. Also, in the nonvolatile semiconductor memory device 1 of the present invention according to the embodiment, each of the source side selection gate lines (SGS) may be set to have an insulated and isolated wiring structure, and each of the drain side selection gate lines (SGD) may be set to have an insulated and isolated plane wiring structure, as shown in FIG. 88.

Figure 2:
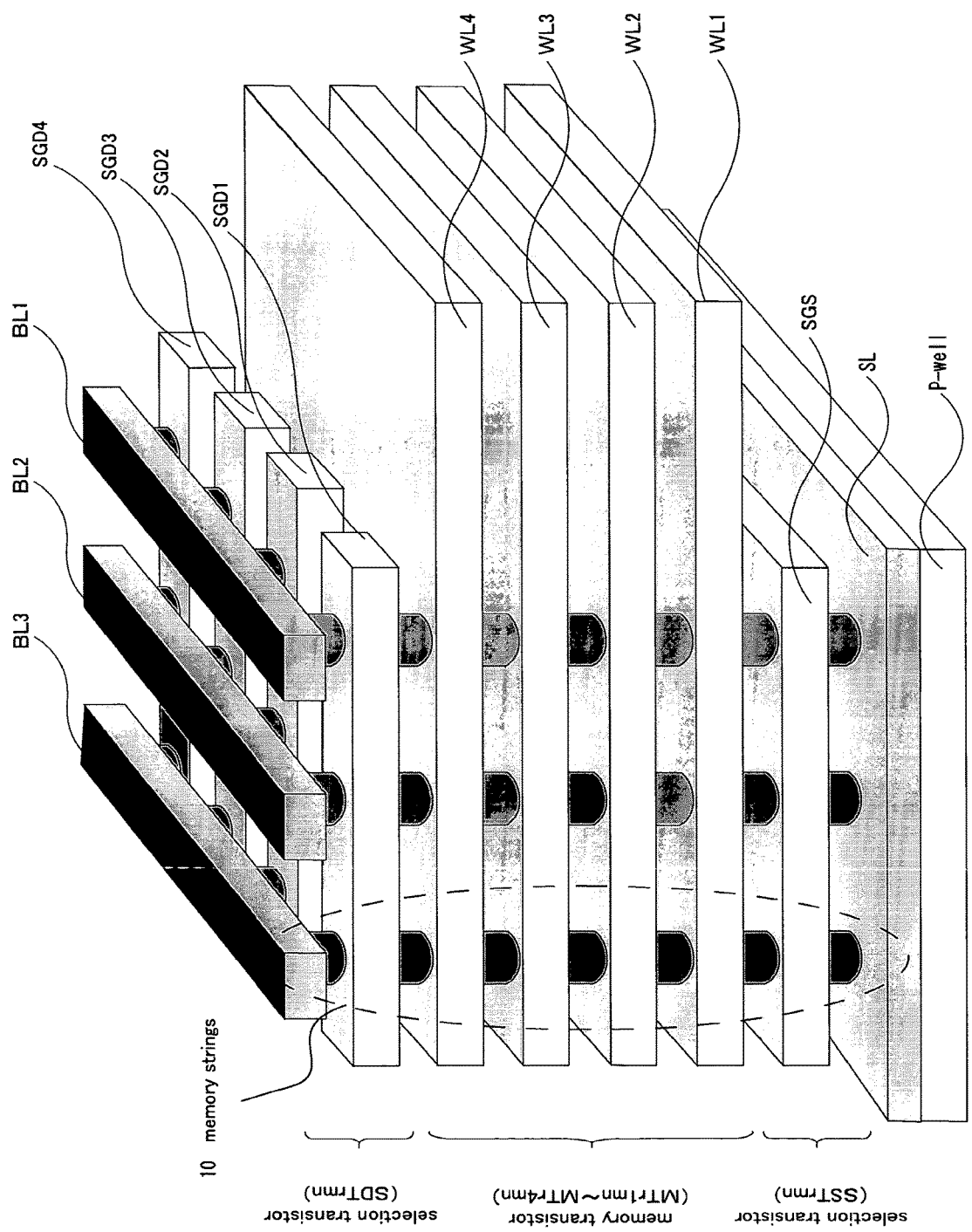
FIG. 2 is a part of an outline diagram of the memory transistor area 2 of the nonvolatile semiconductor memory device 1 according to one embodiment of the present invention.

FIG. 2 is an outline structure diagram of a part of a memory transistor area 2 of the nonvolatile semiconductor memory device 1 according to the embodiment. In the embodiment, the memory transistor area 2 has m×n of memory strings 10 (m and n are natural numbers) comprising memory transistors (MTr1$mn$ to MTr4$mn$) and selection transistors SSTrmn and SDTrmn. In FIG. 2, an example of m=3 and n=4.

Word Lines WL 1 to WL 4 are formed with conductive layers that are connected to the gates of memory transistors (MTr1$mn$ to MTr4$mn$) of each of the memory strings 10, which are applied to each of the counterpart respectively. In other words: all of the gates of the memory transistor MTr1$mn$ of each of the memory strings 10 are connected to the word line 1, all of the gates of the memory transistor MTr2$mn$ of each of the memory strings 10 are connected to word line 2, all of the gates of memory transistor MTr3$mn$ of each of the memory strings 10 are connected to word line WL3, and all of the gates of the memory transistor MTr4$mn$ of each of the memory strings 10 are connected to word line 4. In a nonvolatile semiconductor memory device 1 of the present invention according to this embodiment, as shown in FIGS. 1 and 2, the word lines (WL1 to WL4) are respectively spread in two dimensional and have a plate-shaped plane structure. Also, the word lines (WL1 to WL4) respectively have a plane structure, which is almost vertical for the memory strings 10. In addition, source side selection gate lines SGS, which drive the source side selection transistors SSTrmn, can be set to set as a common potential per each layer all the time as a matter of operation. Therefore, in this embodiment, a plate shaped structure is applied for the source side selection gates SGS.

Each of memory strings 10 has a pillar shaped semiconductor on n+ area that is formed in a P-well area of the semiconductor substrate. Each of the memory strings 10 is arranged within a plane being vertical to the pillar shaped semiconductor with a matrix. In addition, the pillar shaped semiconductor may be either a cylindrical shape or a prism shape. Also, a pillar shaped semiconductor includes a pillar shaped semiconductor having stepwise shape.

Figure 3:
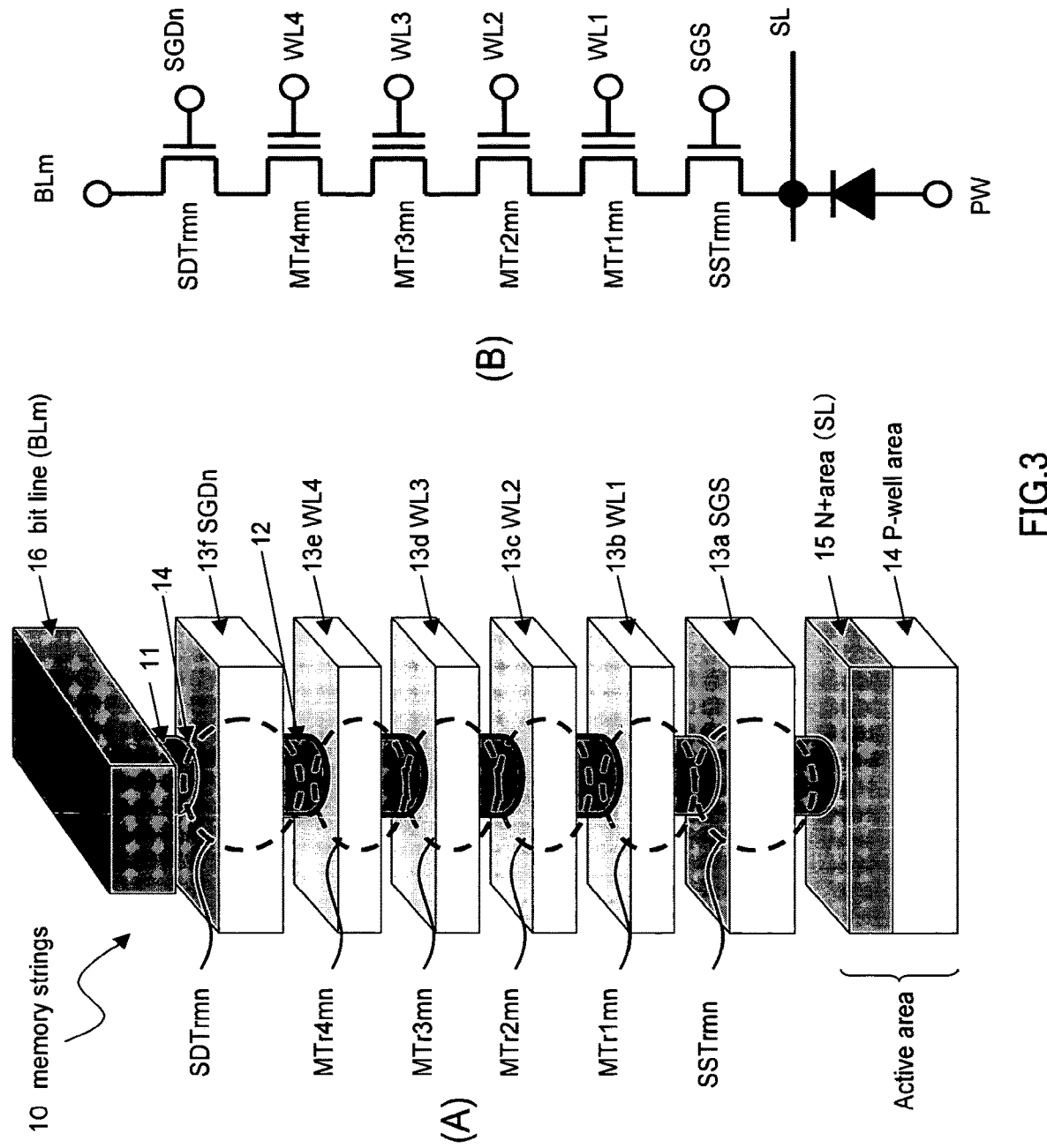
FIG. 3 is a diagram that shows an outline structure of one of the memory strings 10 of the nonvolatile semiconductor memory device 1 according to one embodiment of the present invention.

Each word line WL may be set to have a spread that is equal to or more than two times of a distance, wherein a diameter of a pillar shaped semiconductor is added in an interval of the pillar shaped semiconductor next to each other. In other words, it is preferable that each word line WL should have a spread that is equal to or more than two times of the distance between centers of the pillar shaped semiconductor An outline diagram of one memory string 10 (here shown by mnth memory string) of the nonvolatile semiconductor memory device 1 of the present invention according to this embodiment is shown in FIG. 3 (A), and its equivalent circuit schematic in FIG. 3 (B). In this embodiment, the memory strings 10 have 4 memory transistors MTr1$mn$ to MTr4 nm, and two selection transistors SSTrmn and SDTrmn. The 4 memory transistors MTr1$mn$ to MTr4$mn$ and two selection transistors SSTrmn and SDTrmn are connected respectively in series, as shown in FIG. 3. In one memory strings 10 of the nonvolatile semiconductor memory device 1 of this embodiment, a pillar semiconductor 11 is formed in N+ area 15 that is formed in P-type area (P-Well area) on a semiconductor substrate. Also, insulation films 12 formed around a pillar shaped semiconductor 11 and a plurality of plate shaped electrodes 13$a$ to 13$e$ that are formed around the insulation films 12 are formed. The electrodes 13$b$ to 13$e$, the insulation films 12, and the pillar shaped semiconductor 11 form memory transistor MTr1$mn$ to MTr4$mn$. In addition, the insulation films 12 is the insulation film that function as charge storage layers (for example, a silicon oxide film, a silicon nitride film, a lamination film of the silicon oxide films). For example, if the insulation films 12 include a film that is made of a silicon oxide film, a silicon nitride film, a lamination film of the silicon oxide films, what is called ONO film, a charge is held in a SiN trap disintegrated and distributed into the silicon nitride film. The electrodes 13$b$ to 13$e$ respectively become word line WL1 to WL4, an electrode 13$f$ becomes a selection gate line SGDn, and 13$a$ becomes a selection gate line SGS. Also, a bit line BLm is connected to an edge of source/drain of the selected transistor SDTrmn, a source line SLm (in this embodiment, N+ area 15) is connected to an edge of the source/drain the selected transistor SDTrmn. In addition, the charge storage layer may be set to be formed around the column shaped semiconductor layer 11 of the MTr1$mn$ to MTr4$mn$ (that is, the layer may be set to be localized between the pillar shaped semiconductor 11 and the electrodes 13$b$ to 13$e$).

In addition, a floating gate, which is formed in the charge storage layer by a conductor, may be applied. At the time, the conductor is formed only between the pillar shaped semiconductor and each word line.

Further, an insulation film 14 functioning as a gate insulation film is formed between the electrodes 13$a$ and 13$f$, and the pillar shaped semiconductor 11.

Further in this embodiment, the memory strings 10 has 4 memory transistors MTr1$mn$ to MTr4$mn$, the number of memory transistors in a memory string is not limited to this, but may be changed accordingly to an arbitrary number depending on memory capacity.

The memory string in this embodiment of the present invention has an outline symmetry shape to a center axis of the pillar shaped semiconductor.

Figure 4:
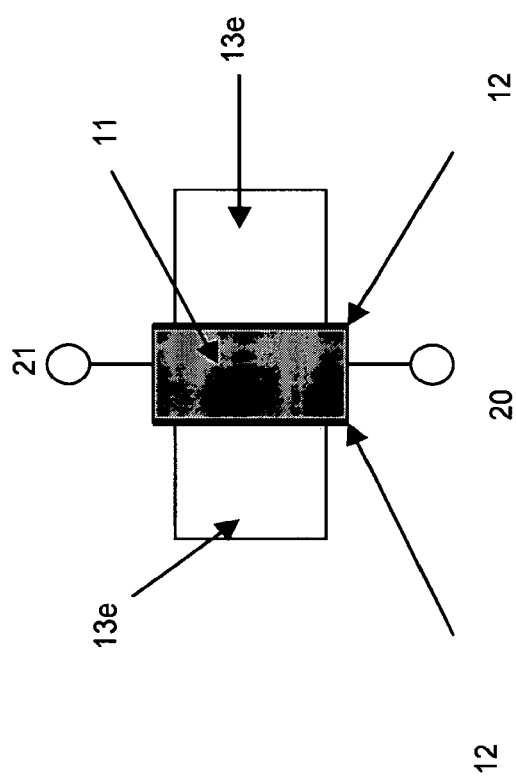
FIG. 4 is a diagram that shows a sectional view of one memory transistor MTr in the one embodiment of the present invention.

FIG. 4 is a figure that shows a cross-sectional structure of one memory transistor MTr (for example, MTr4$mn$) in this embodiment. In addition, the other memory transistors MTr1$mn$ to MTr3$mn$ have same structure with the memory transistor MTr4$mn$. In the memory transistor MTr4$mn$, the conductor layer 13$e$ surrounding the pillar shaped semiconductor 11 functions as a control gate electrode via the insulation films 12. The source 20 and drain 21 of the memory transistor are formed in the pillar shaped semiconductor 11. However, for case that the memory transistor MTr1$mn$, and the selection gate transistors SSTrmn and SDTrmn have a depression type transistor structure, a definite source/drain diffusion layer may be set not to exist in a part of the semiconductor 11. Also, the pillar shaped semiconductor 11 may be set what is called an enhancement type transistor, in which an area roughly surrounded with the conductor layer 13$e$ roughly is set to be a P-type semiconductor, and in which an area not roughly surrounded with the conductor layer 13$e$ is set to be a N-type semiconductor.

In FIG. 3 and FIG. 4, explanation for one memory string 10 has been performed, in the nonvolatile semiconductor memory device 1 according to this embodiment; all of the memory strings have the same structure.

Operation

First, "reading operation", "programming operation" and "erasing operation" in the memory transistors MTr1$mn$ to MTr4$mn$ of one memory strings 10 according to this embodiment will be explained referring to FIG. 3. As for the "reading operation" and "program operation" explanation is held by illustrating memory transistor MTr3$mn$.

Further, the memory transistors MTr1$mn$ to MTr4$mn$ in this embodiment are what is called a MONOS type transistor including semiconductor 11, insulation films (a silicon oxide film, a silicon nitride film, and a lamination film of the silicon oxide film) functioning as a charge storage layer, and a conductor layer (a poly-silicon layer in this embodiment), here explanation will be performed with the assumption that threshold Vth of a memory transistor MTr with a situation that electrons are not accumulated in the charge storage layer (hereinafter called "neutral threshold") be near 0V.

Reading Operation

At the time of data reading from the memory transistor MTr3$mn$, Vbl (for example 0.7V), 0V, Vdd (for example 3.0V), and VPW (for example, 0V) are respectively applied to the bit line BLm, source line SL, the selection gate line SGD and SGS, and P-Well area. Then, the word line WL3, wherein the bit desired to be read out bit (MTr3$mn$) is connected, is set as 0V, and the other word lines WL are set as Vread (for example, 4V). Hereby is determined whether current is charged to the bit line BLm, depending upon whether the threshold Vth of the bit desired to be read out bit (MTr3$mn$) more or less than 0V, and thus it becomes possible to read out data information of the bit (MTr3$mn$) by sensing current of the bit line BLm. In addition, the data of other bits (the memory transistor MTr1$mn$, MTr2$mn$, and MTr4$mn$) can be read out with a similar operation.

Programming Operation

At the time of programming data "0" into the memory transistor MTr3$mn$, i.e., enhancing threshold of the memory transistor by implanting electrons in the charge storage layer of the memory transistor MTr3$mn$ (shifting the threshold toward a positive direction), 0V, Vdd, Vdd (for example, 3.0 V), Voff (for example 0V) and VPW (for example, 0V) are respectively applied to bit line BLm, the source line SL, the selection gate line SGDn, the selection gate line SGS, and the P-Well area. And the word line WL3 of bits desired to be programmed (MTr3) and the other word lines WL, are further set to be Vprog (for example, 18V) and Vpass (for example, 10V), respectively. By doing so, electric field strength, wherein only the desired bits (MTr3*mn*) are applied to the charge storage layer, are strengthened, electrons are implanted into the charge storage layer, and then the threshold of the memory transistor MTr3*mn* is shifted toward a positive direction.

At the time of programming data "1" into the memory transistor MTr3*mn*, i.e., the threshold is not enhanced from the erasing state of the memory transistor MTr3*mn* (electrons are not implanted into the charge storage layer), the gate potential and the source potential of the selection transistor SDTrmn become equivalent potentials by applying to the bit line BLm. Therefore, the selection transistor SDTrmn becomes an off-state, and a potential difference between the channel forming area (a body part) and the word line 3 of the memory transistor MTr3*mn* are decreased. As a result, the electron implantation into the charge storage layer of the memory transistor MTr3*mn* is not occurred. In addition, data may be programmed into the other bits (memory transistors MTr1*mn*, MTr2*mn*, and MTr4*mn*) by the same operation.

Erasing Operation

At the time of data erasing, data erasing of the memory transistors MTr1*mn* to MTr4*mn* is performed a block unit including a plurality of memory strings 10.

In the selection blocks (the blocks desired to be erased) Verase (for example 20V) is applied to the P-Well area, the potentials of the selection gate lines SGS and the SGDn are enhanced (for example, to 15V), setting the source line SL to be floating and sliding the time slightly with the timing applying Verase to the P-Well area (sliding at a degree of 4 μsec, for example). By doing so, GIDL (Gate Induced Drain Leak) is occurred near the gate terminal of the selection transistor SSTrmn, and the generated holes are drained into the inside of the semiconductor layer 11, which is the body part of the memory transistors MTr1*mn* to MTr4*mn*. On the other hand, electrons are flowed into the P-Well direction. Thereby potential near Verase is transmitted to the channel forming area (the body part) of the memory transistor MTr, because of this, if the potentials of the word line WL1 to WL4 are set to be 0V, the electrons of the charge storage layer are pulled out into the P-Well and thus data deletion of the memory transistors MTr1*mn* to MTr4*mn* may be performed.

On the other hand, when data erasing of the memory transistor is performed, in the non-selected blocks, potentials of the channel forming area (the body part) of the memory transistors MTr1*mn* to MTr4*mn* are enhanced by setting the word lines WL1 to WL4 being floating, at the same time, potentials of the word lines WL1 to WL4 are enhanced by coupling and there becomes no potential difference between the word lines WL1 to WL4 and the charge storage layers of the memory transistors MTr1*mn* to MTr4*mn*. Therefore, pulling out (deletion) of the electrons from the charge storage layer is not performed.

Figure 5:
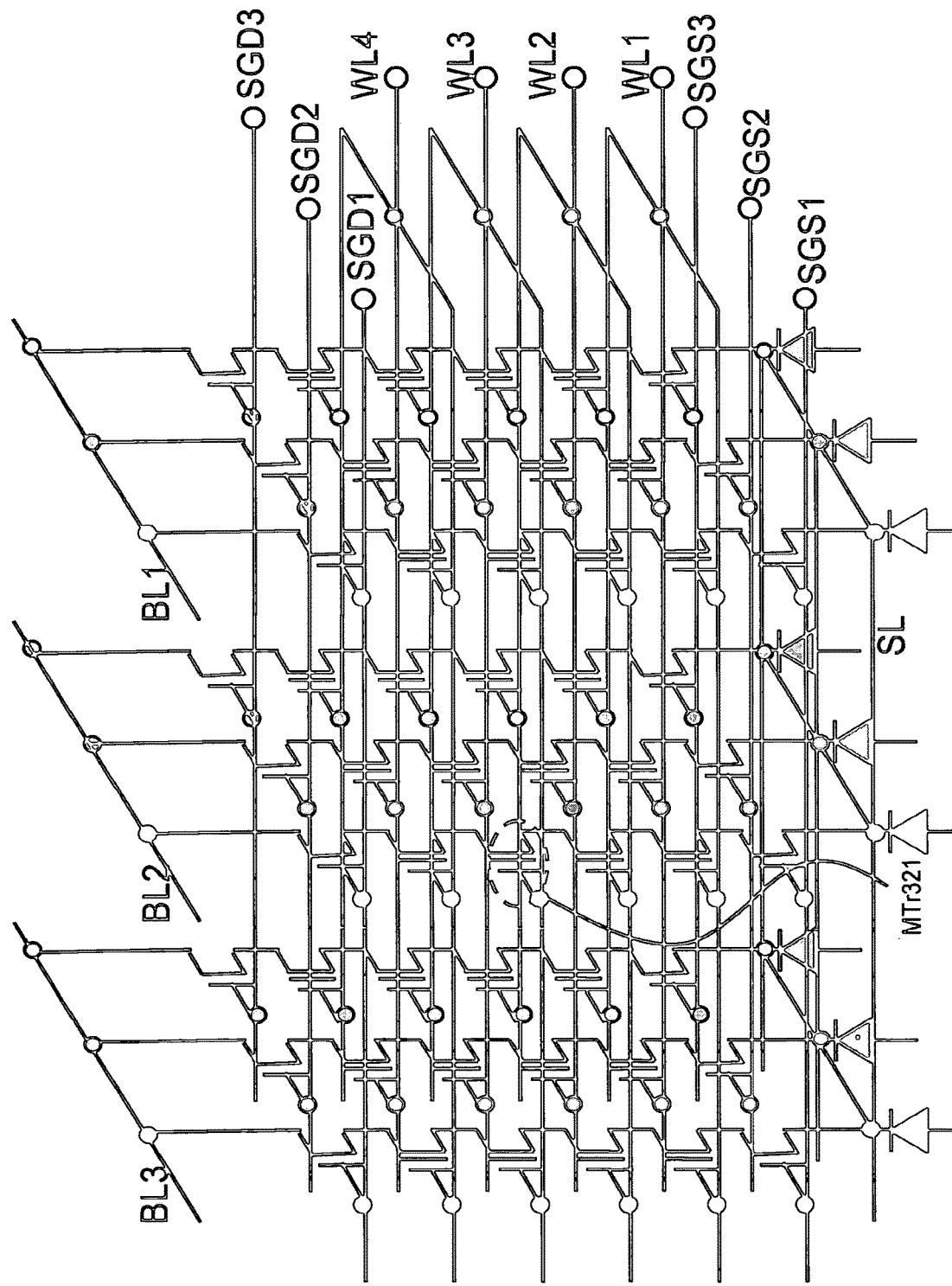
FIG. 5 is an equivalent circuit schematic of the nonvolatile semiconductor memory device according to one embodiment of the present invention.

Next, "reading operation", "program operation" and "erasing operation" of the nonvolatile semiconductor memory device 1 of this embodiment, wherein the memory strings 10 are disposed vertically and horizontally with a two dimensional shape for the substrate face, are explained. In FIG. 5, an equivalent circuit of the nonvolatile semiconductor memory device 1 of the present invention according to this embodiment is shown. In the nonvolatile semiconductor memory device 1 of this embodiment, the potentials of word lines WL1 to WL4 respectively have the same ones, as described above. Also here, each of the selection gate lines SGS1 to SGS3 are set to be able to be controlled independently, and these potentials may be set to be controlled by setting them to be the equivalent potentials such as forming the selection gate lines SGS1 to SGS3 with the same conductor layer and soon.

Further in this case, "reading operation" and "programming operation" in the memory transistor Mtr321 shown with a dotted line (a Mtr3 of the memory strings that is connected to the bit line BL2 and the selection gate lines SGS1 and SGD1) will be explained, and "erasing operation" of the memory transistor will be explained.

Reading Operation

Figure 6:
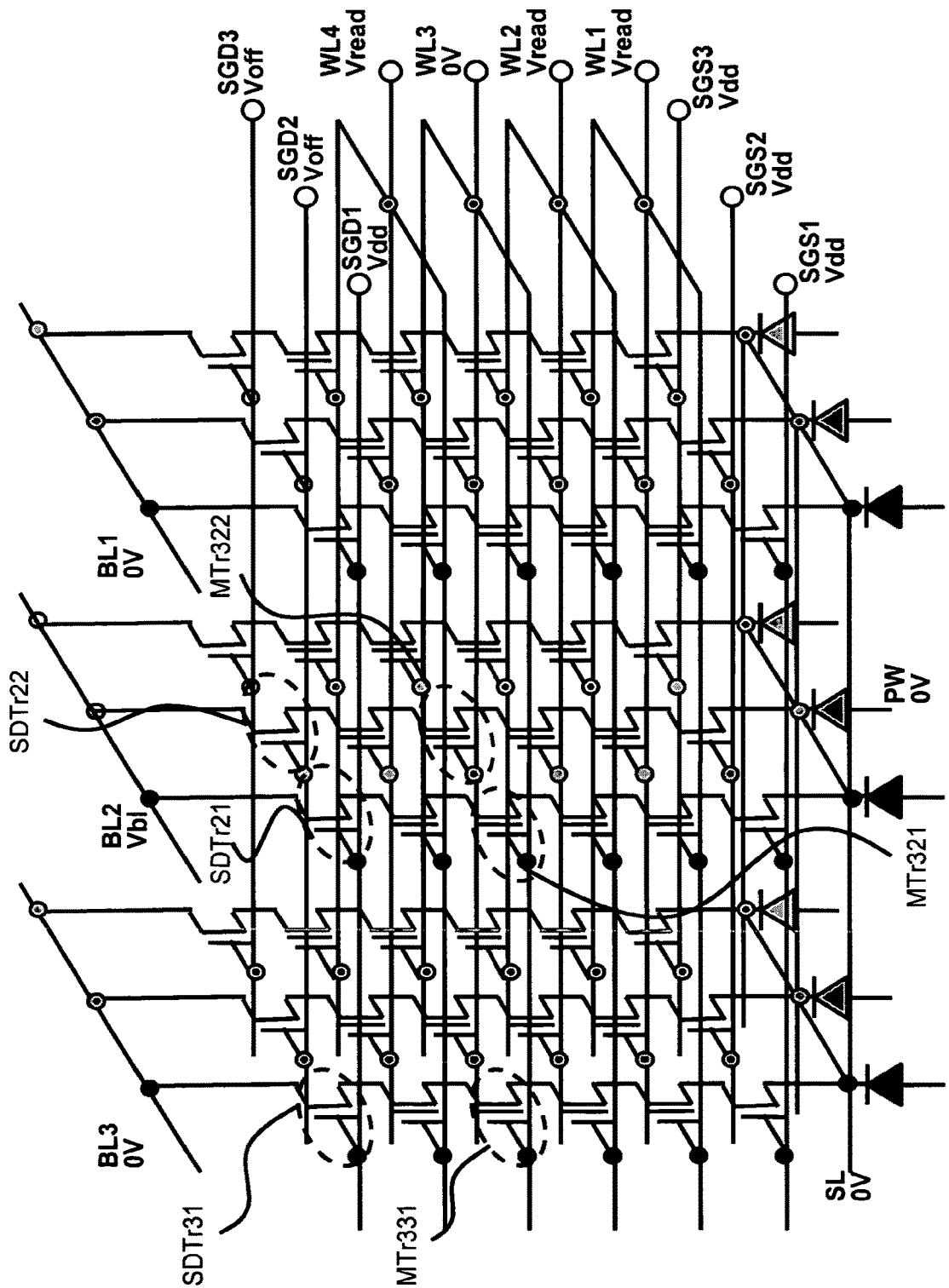
FIG. 6 is a diagram that shows a bias state in the case that reading operation of the data of the memory transistor MTr 3 shown by dotted lines is performed, in the nonvolatile semiconductor memory device 1 according to one embodiment of the present invention.

FIG. 6 is a diagram showing bias state in the case that reading operation of data of the memory transistor Mtr321 shown by dotted line in the nonvolatile semiconductor memory device 1 according to this embodiment is performed. Here again, explanation will be performed assuming: the memory transistor Mtr in this embodiment is what is called a MONOS type transistor including the semiconductor 11, the insulation film, which function as a charge storage layer (a silicon oxide film, a silicon nitride film, and a lamination film of the silicon nitride film) and the conductor layer (a poly-silicon layer in this embodiment), and a threshold Vth (a neutral threshold) of the memory transistor Mtr in the state, wherein the electrons are laminating in the charge storage layer, is near 0V.

At the time of data reading out from the memory transistor MTr321, Vbl (for example, 0.7V), 0V, 0V, Vdd (for example, 3.0V), and Voff (for example, 0V), and VPW (for example, 0V; however, VPW may be any potentials so far as the P-Well and the memory strings are not in a forward bias) are respectively applied to: the bit line BL2, which the memory transistor Mtr321 is connected to, the other bit lines BL, the source line SL, the selection gate lines SGD1 and SGS1, in which the memory transistor MTr321 is connected, the other selection gate lines SGD and SGS, and the P-Well area. And the word line WL3, which the bit (MTr321) desired to be read out is connected to, is set to be 0V, and the other word lines WL are set to be Vread (for example, 4.5V). Hereby a potential difference occurs between the bit line BL2 and the source line SL of the bit (MTr321) reading out data, and the selection gate line SGD1 is in an "on" state. Because of this, whether the current is flow or not to the bit line BL2 is determined by whether the threshold Vth of the bit desired to be read out (MTr321) is large or small. Therefore, the data information of the bit (MTr321) can be read out by sensing the current of the bit line BL2. In addition, the data of the other bits (the memory transistor MTr1*mn*) may be read out with a similar operation. As this occurs, for example, the SGD2 of the memory transistor MTr322 is Voff, despite the threshold Vth is at any value i.e., either "1" or "0" is programmed into the memory transistor MTr322, therefore, current will not flow into the memory transistor MTr322 and the memory strings 10 that the MTr322 belongs to. These are memory strings 10 connected to the bit line BL2, which is similar in all of the memory strings 10 that is not connected to the selection gate line SGD1.

Also, for example, explaining with an example of the memory transistor MTr331, in the case of the memory strings 10 that MTr331 belongs to, despite a threshold Vth of the memory transistor MTr331 is at any value, i.e., either "1" or "0" is programmed into the memory transistor 322, current will not be running into the bit line BL3, because the bit line BL3 is 0V and has same potential to the source line SL. This is common in all of the memory strings 10 not connected to the bit line BL2.

From the above description, in the nonvolatile semiconductor memory device 1 of the present invention according to this embodiment, even if the word lines WL1 to WL4 are respectively made driven with the common potentials, and the selection gate lines SGS1 to SGD3 are respectively driven with the common potential, the data at the threshold of the optional bits can be read.

Programming Operation

Figure 7:
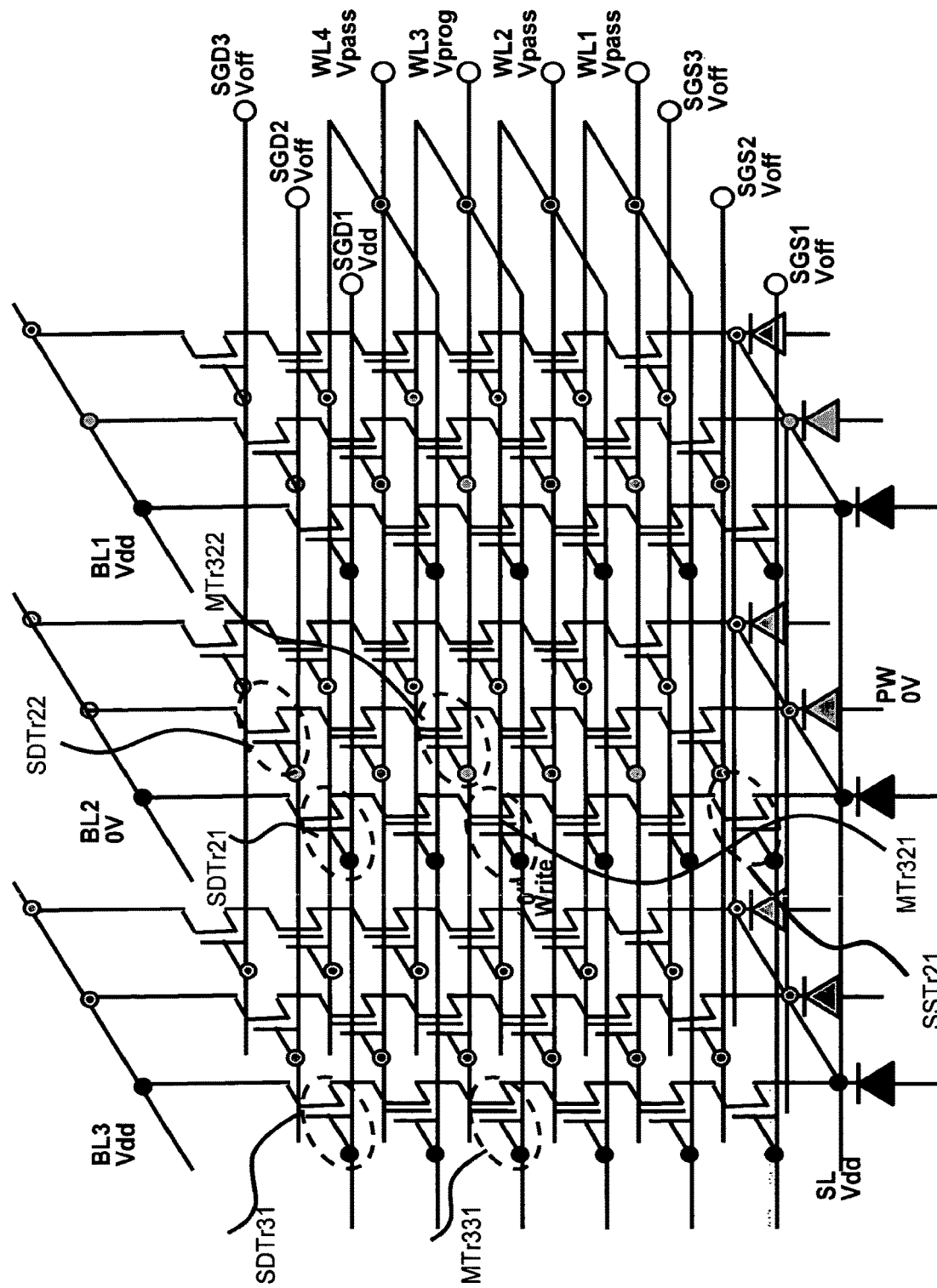
FIG. 7 is a diagram that shows a bias state in the case that program operation of the data of the memory transistor MTr 3 shown by dotted lines is performed, in the nonvolatile semiconductor memory device 1 according to one embodiment of the present invention.

FIG. 7 is a diagram showing a bias state in the case of programming operation of the data of the memory transistor MTr321 shown with the dotted line, in the nonvolatile semiconductor memory device 1 of the present invention according to this embodiment.

In the case that data "0" is programmed into the memory transistor MTr3, i.e., the threshold of the memory transistor is enhanced by implanting electrons into the charge storage layer of the memory transistor MTr321 (shifting the threshold toward a positive direction), 0V, Vdd, Vdd, Vdd, Voff, Voff, VPW (for example, 0V), are respectively applied to: the bit line BL2, which the memory transistor MTr321 is connected to the other bit lines, the source line SL, the selection gate line SGD1, which the memory transistor MTr321 is connected to the other selection gate line SGD, the selection gate lines SGS1 to SGS3, and the P-Well area. Further, by setting the word line WL3 of the bit (MTr321) desired to be programmed to be Vprog (for example, 18V) and the other word lines WL to be Vpass (for example, 10V), a channel is formed into all the memory transistors except for the selection gate transistor SSTr21, which a source side selection gate line SGS1 is connected to MTr121, MTr221, MTr321, and MTr421, in the memory strings 10 that the MTr321 belongs to, then the potential of the bit line BL2 (0V) is transmitted to the channel. Therefore, the filed strength, which is applied to a ONO film including the charge laminating layer that exists between the word line of the desired bit (MTr321) and the column shaped semiconductor becomes strong, the electrons are implanted into the charge storage layer, and then the threshold of the memory transistor MTr321 shifts toward a positive direction.

At this time, for example, in the memory transistor MTr322, Voff is applied to the source side selection gate line SGD2 so that the potential of the bit line BL2 is not transmitted to the channel part of the memory transistor MTr322 and thus no implantation of the electrons occurs in the memory transistor MTr322. This is applied to the memory strings 10 connected to the BL2, which is same to all the memory strings 10, in which the memory transistor MTr321 is not belonged to.

Also for example, in the memory transistor MTr331, the source side potential of the selection transistor SDTr31, which the selection gate line SGD1 is connected to, becomes Vdd and the potential of the bit line BL3 is also Vdd in the memory strings 10 that MTr331 belongs to. Therefore, the potentials of the source of the selection transistor and the gate of the selection transistor SDTr31 become same potentials. As a consequence, the selection transistor SDtr31 is not on, and the outer electric potential is not transmitted in the channel part of the memory transistor MTr331, and thus, electron implant will not occur. This is similar to all the memory strings 10 that are not connected to the bit line 2.

In case that data "1" is programmed in memory transistor MTr321, i.e., the threshold is not enhanced from the erasing state of the memory transistor MTr321 (electrons are not implanted into the charge storage layer), the gate potential and the source potential of the selection transistor SDTr21 become the same potentials by applying Vdd to the bit line BL2.

Therefore, the selection transistor SDTr21 becomes off state and the potential difference between the channel formation area (the body part) and the word line WL3 of the memory transistor MTr3 becomes reduced, so that the electron implant does not occur in the charge storage layer of the memory transistor MTr321. In addition, data of the other bits (memory transistor MTr1$mn$: in an example shown in FIG. 7, 1 is 1 to 4, m is 1 to 3, and n is 1 to 3) may be programmed.

Also, by setting the potential of each bit line BL adequately with 0V or Vdd, it becomes possible to perform a programming, namely page programming simultaneously on the bit (MTr) of the common word lines WL selected by one selection gate line SGD.

Erasing Operation

Figure 8:
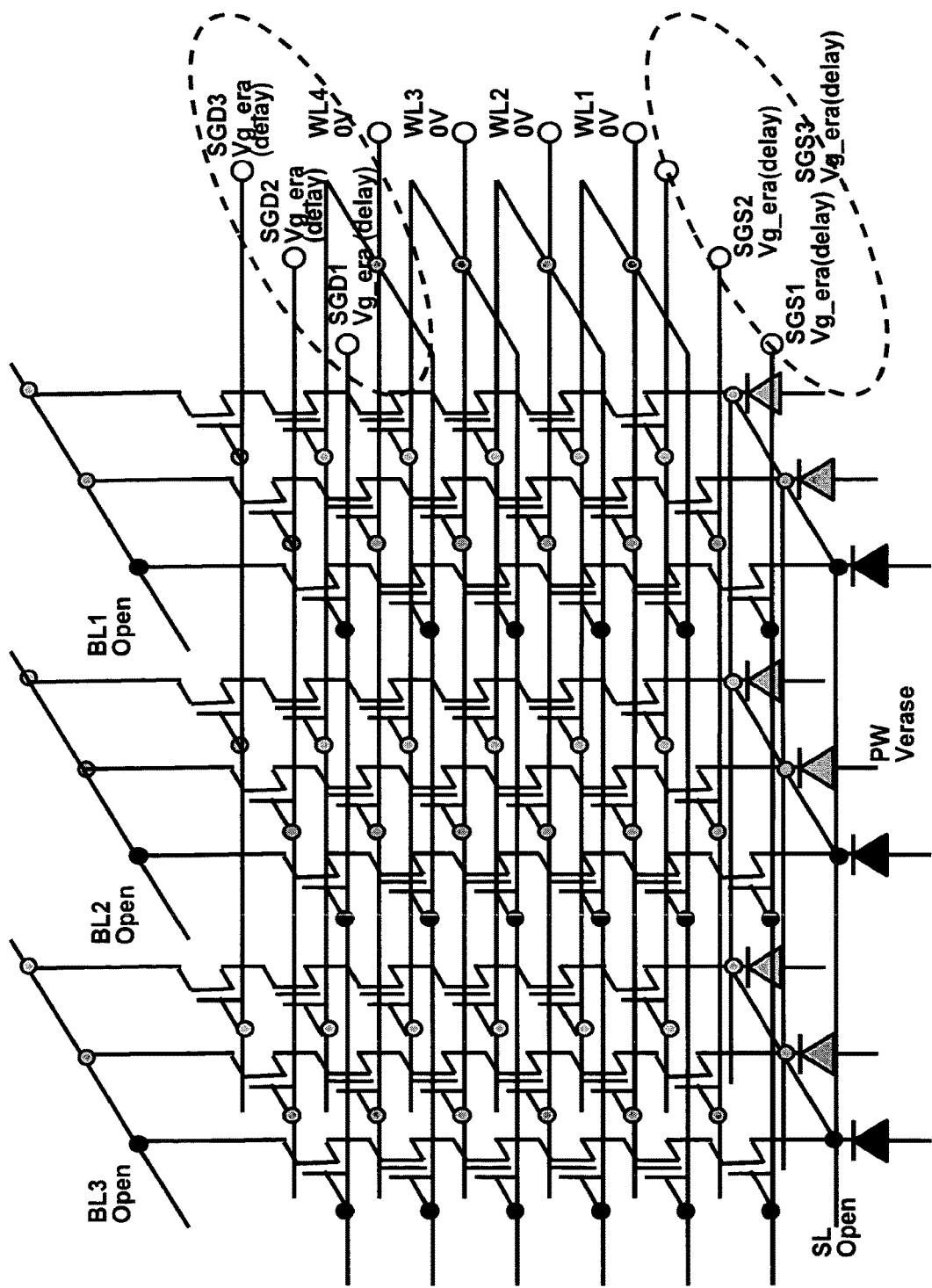
FIG. 8 is a diagram that shows a bias state of the selected block in the case that deletion operation of the data of the memory transistor MTr of the selected block is performed, in the nonvolatile semiconductor memory device according to one embodiment of the present invention.
Figure 9:
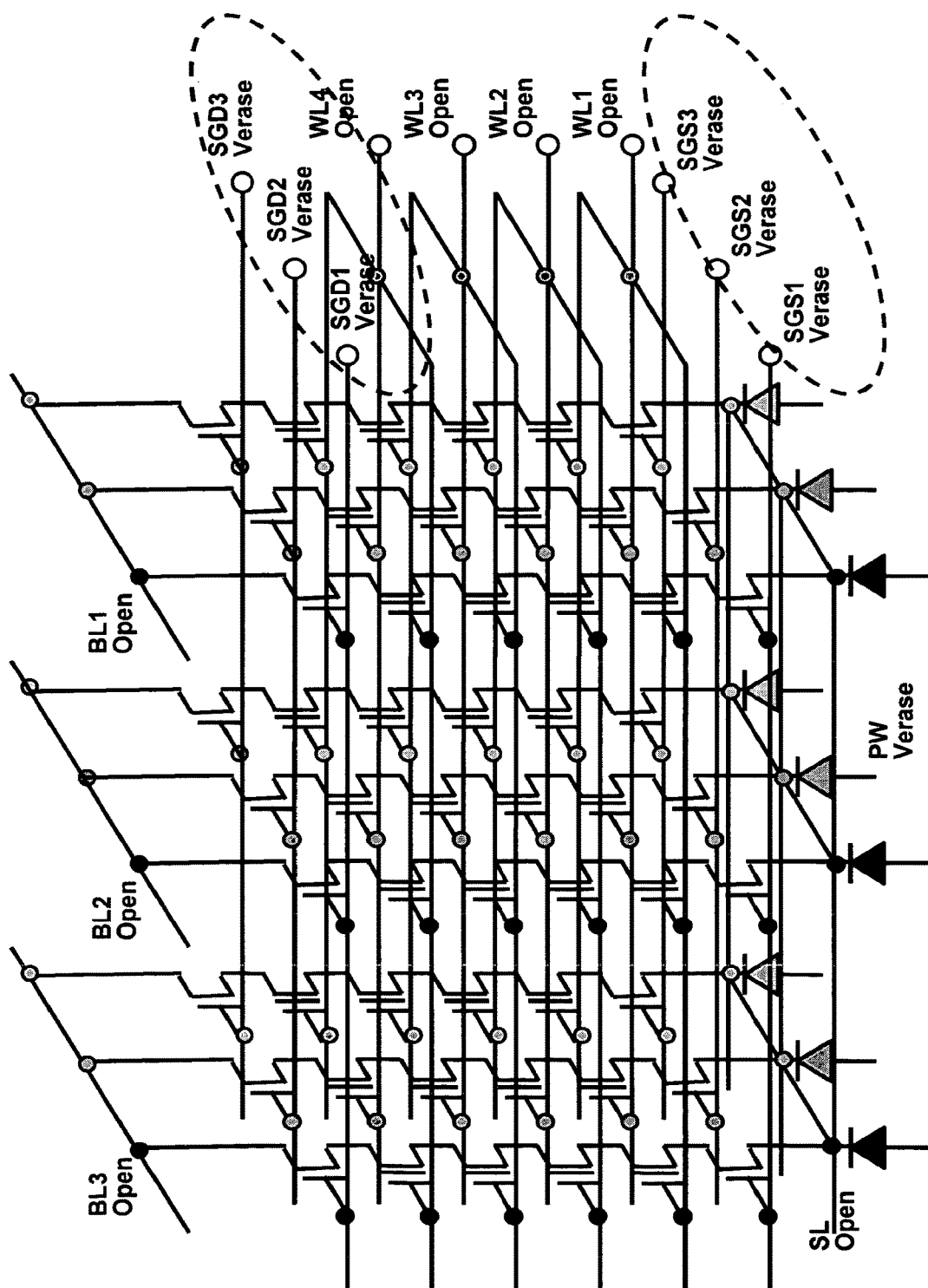
FIG. 9 is a diagram that shows a bias state of the no selected block in the case deletion operation of the data of the memory transistor MTr of the selected block is performed, in the nonvolatile semiconductor memory device according to one embodiment of the present invention.

At the time of data erasing, data erasing of the memory transistor MTr is performed per block unit including a plurality of memory strings. FIG. 8 is a diagram showing a bias state in the case the erasing operation of data of the memory transistor MTr of the selected block, in the nonvolatile semiconductor memory device 1 of the present invention according to this embodiment.

In the selected block (the block desired to be erased), Verase (for example, 20V) is applied in the P-Well area, the source line SL is set to be at floating, and sliding the time slightly with the timing applying Verase in the P-Well area (for example, sliding in the degree of 4 μsec), and thus the potentials of the selection gate lines SGS and SGD is enhanced (for example, to 15V). By doing so, GIDL (Gate Induced Drain Leak) is occurred near the gate terminal of the selection transistor SSTr, and the generated holes are drained into the inside of the semiconductor layer 11, which is the body part of the memory transistor MTr. On the other hand, electrons are drained into the P-Well direction. Thereby potential near Verase is transmitted to the channel forming area (the body part) of the memory transistor MTr, because of this, if the voltage of the word lines WL1 to WL4 are set to be 0V, the electrons of the charge storage layer of the memory transistor MTr are pulled out into the P-Well and thus data erasing may be performed.

On the other hand, when performing data erasing of the memory transistors of the selected block, in the no selected block, potentials of the channel forming area (the body part) of the memory transistors MTr1$mn$ to MTr4$mn$ are enhanced by setting the word lines WL1 to WL4 being floating, at the same time, potential of the word lines WL1 to WL4 are enhanced by coupling and there becomes no potential difference between the word lines WL1 to WL4 and the charge storage layers of the memory transistors MTr1 to MTr4. Therefore, pulling out (erasing) of the electrons from the charge storage layer is not performed.

Here summarization of a relationship of the potentials among "the reading out operation", "the programming operation" and "the erasing operation" of the nonvolatile semiconductor memory device 1 of the present invention according to this embodiment is shown in Table 1.

TABLE 1

|  | Read | Write"0" | Write"1" | Erase (selection) | Erase (nonselection) |
| --- | --- | --- | --- | --- | --- |
| BL | Vbl | 0 | Vdd | Verase | Verase |
| SGD | Vdd | Vdd | Vdd | Vera_del | Vera_del |

TABLE 1-continued

| | Read | Write"0" | Write"1" | Erase (selection) | Erase (nonselection) |
|---|---|---|---|---|---|
| WL4 | Vread | Vpass | Vpass | 0 | open |
| WL3 | 0 | Vprog | Vprog | 0 | open |
| WL2 | Vread | Vpass | Vpass | 0 | open |
| WL1 | Vread | Vpass | Vpass | 0 | open |
| SGS | Vdd | Voff | Voff | Vera_del | Vera_del |
| SL | 0 | Vdd | Vdd | open | open |
| PW | 0 | 0 | 0 | Verase | Verase |

Erasing Operation Simulation

A setting condition and a result of the erasing operation simulation of the nonvolatile semiconductor memory device 1 of the present invention according to this embodiment are shown in FIG. 10 to FIG. 13.

FIG. 10 (A) is a diagram showing a setting condition of the simulation of the erasing operation of one memory string of the nonvolatile semiconductor memory device of the present invention according to this embodiment. Also, FIG. 10 (B) shows a structure of the memory strings based on a condition setting of FIG. 10 (A). In FIGS. 10 (A) and (B), impurity concentration of the P-Well is 1E19 cm-3, impurity concentration of the source line SL is 5E19 cm-3, a diameter and impurity concentration of the pillar shaped semiconductor layer (the body) was respectively set to be 19 nm, 1E15 cm-3, impurity concentration of the bit line BL was set to be 1E19 cm-3 (the lower layer part), 5E19 cm-3 (the upper layer part), a thickness of the word line WL was set to be 50 nm, a distance between each of the word lines WL was set to be 25 nm, a thickness of poly-silicon of the selection gate line SGS was set to be 100 nm, a diameter of a hole, in which the pillar shaped semiconductor layer is implanted (hereinafter it may be called "a memory plug hole"), was set to be 35 nm, and the thickness of the charge storage layer FG was set to be 16 nm (however in the simulation, the potential of FG is not floating but a word line potential VCG). In addition, the voltage Verase that was applied to P-Well at the time of data erasing, is made enhanced up to 20V, the voltage Vdd that was applied to the bit line BL, is made enhanced up to 20V, a voltage VSG that is applied to the selection gate line SGD was made enhanced up to 15V, and thus a voltage VCG that was applied to the word lines were set to be 0V.

Figure 12:
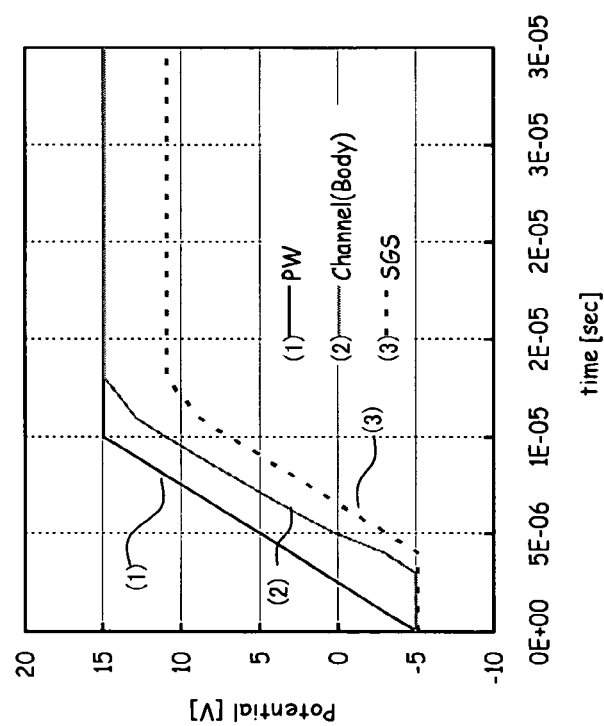
FIG. 12 is a diagram that shows a calculation result based on a simulation condition shown in FIG. 10.
Figure 13:
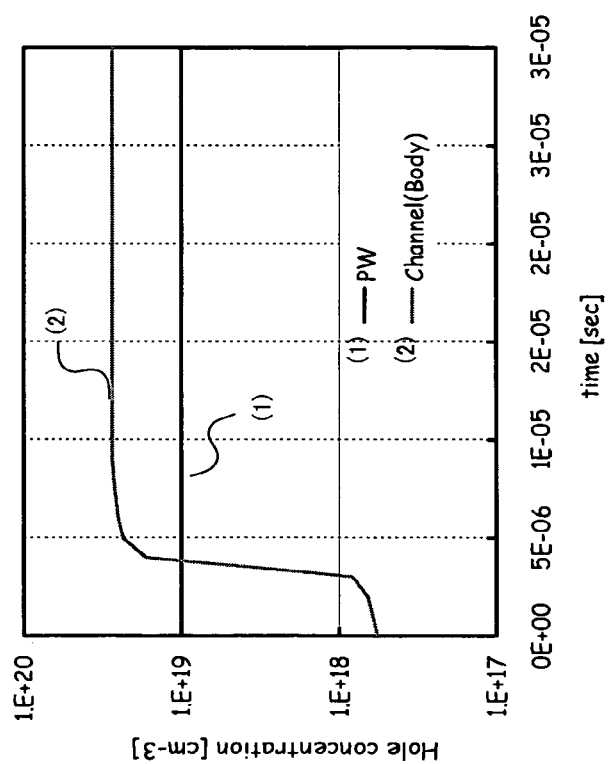
FIG. 13 is a diagram that shows a calculation result based on a simulation condition shown in FIG. 10.

FIG. 12 and FIG. 13 show a calculation result based upon the simulation condition that is shown in FIG. 10, is shown. FIG. 12 shows a potential change and FIG. 13 shows a hole concentration. If the potential of the P-Well is enhanced, the potential of the pillar shaped semiconductor layer (the body) begins to enhance having a little delay. Accompanying with it, the hole concentration of the pillar shaped semiconductor layer (the body) is enhancing. This indicates that electric field is on between the pillar shaped semiconductor layer (the body) and word lines the erasing becomes possible by occurrence of the GIDL current at SGS gate terminal part, implant of the hole in the pillar shaped semiconductor layer (the body), and transmission of the potentials.

Figure 14:
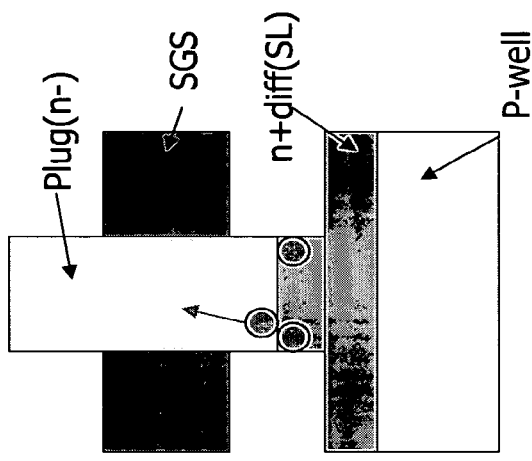
FIG. 14 is a diagram that shows a deletion operation model of the nonvolatile semiconductor memory device 1 according to one embodiment of the present invention.
Figure 15:
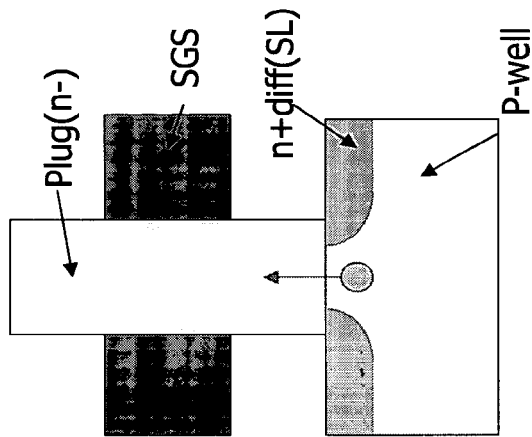
FIG. 15 is a diagram that shows a deletion operation model of the nonvolatile semiconductor memory device 1 according to one embodiment of the present invention.
Figure 16:
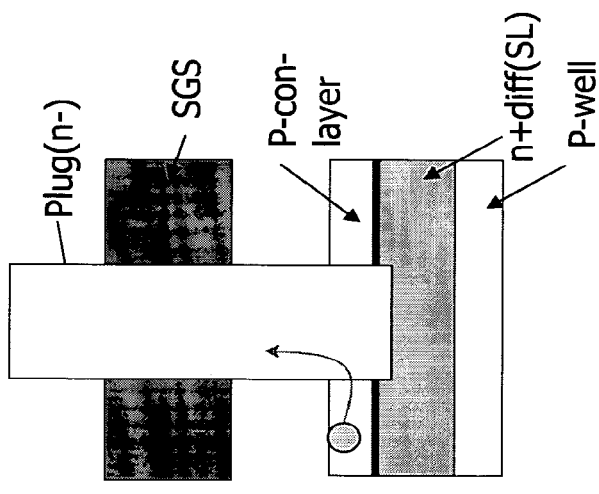
FIG. 16 is a diagram that shows a deletion operation model of the nonvolatile semiconductor memory device 1 according to one embodiment of the present invention.

Here in the nonvolatile semiconductor memory device of the present invention according to this embodiment, examples of the structure to realize the deletion operation is shown in FIG. 14 to FIG. 16.

FIG. 14 is an example, in which concentration of the pillar shaped semiconductor layer (the body) of the selection gate transistor SSTr connected to the source side selection gate line SGS is enhanced. By doing this, GIDL may be increased so that the holes that are necessary and sufficient for the erasing operation may be supplied. FIG. 14 is a structure, in which the deletion method using GIDL current shown in the above-described simulation, is realizable. In addition, this embodiment of the present invention is also realizable with the deletion method, in which the GIDL is not used. Such example is shown in FIG. 15 and FIG. 16.

In FIG. 15, an example, in which the pillar shaped semiconductor layer (the body) and the P-Well area of the semiconductor substrate are connected directly. In this case, holes can be implanted directly from the P-Well. Also, because contact with the source line SL and the pillar shaped semiconductor layer (the body) is also necessary, it is necessary that the pillar shaped semiconductor layer (the body) and n+ diffusion area be an overlap structure.

In FIG. 16, a method, in which holes are directly injected into the pillar shaped semiconductor layer from the P-dope poly-silicon layer of the substrate, is shown. It shows a constitution, in which a contact layer including a p-type poly-silicon is formed on a n+ diffusion area, and the pillar shaped semiconductor layer (the body) contacts with the contact layer including the n+ diffusion area and the p-type poly-silicon.

Any structures in FIG. 14 to FIG. 16, the erasing operation of the nonvolatile semiconductor memory device of the present invention according to this embodiment may be realized. In addition, the structures explained in this embodiment are merely examples of the nonvolatile semiconductor memory device of the present invention so that it is not limited to these structures.

Manufacturing Method

Figure 17:
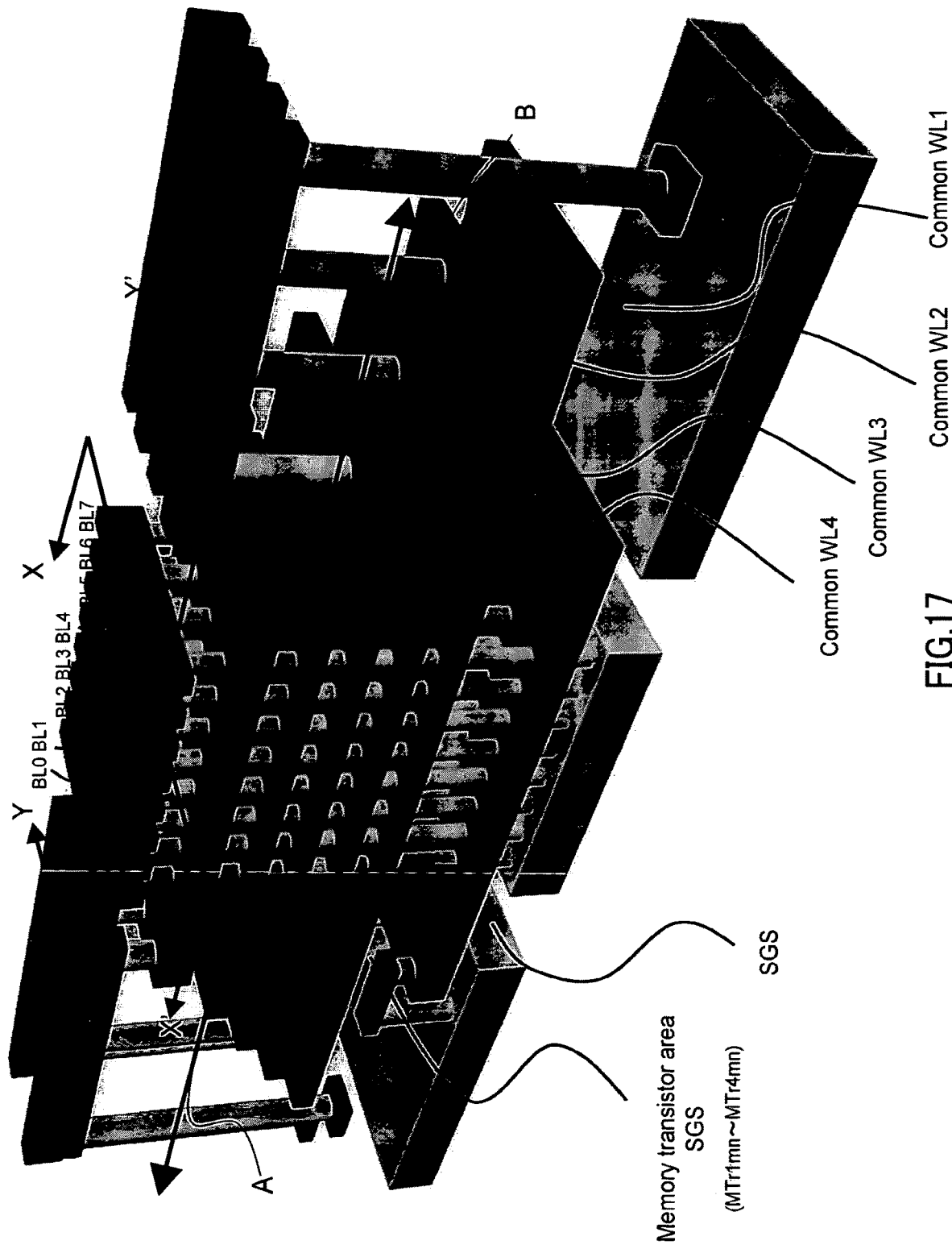
FIG. 17 is a diagram that shows a bird's-eye view of the nonvolatile semiconductor memory device 1 according to one embodiment of the present invention.

A bird's-eye view of the nonvolatile semiconductor memory device 1 of the present invention according to this embodiment is shown in FIG. 17. The nonvolatile semiconductor memory device 1 of the present invention according to this embodiment has a structure, in which memory transistors are laminated on the semiconductor substrate. The area, in which the memory transistors are laminated (memory transistor areas), can be manufactured by 5 Photo Etching Processes (3 critical PEP and 2 rough PEP) without a relationship of the lamination number of the memory transistors.

As shown in FIG. 17, each of the word lines WL1 to WL4 respectively has a plate-shaped and a stepwise-shaped structure. Because each of the word lines WL1 to WL4 respectively has a plate-shaped and stepwise-shaped structure, a step occurs in the side edge parts of each of the word lines WL1 to WL4. By using the steps, contact holes to connect a word line driver and each of the word lines WL1 to WL4 may be manufactured by the same photo etching process. Also, the bit lines are connected to the sense amplifier, and the selection gate line SGD is connected to the selection gate line SGD driver, using the contact holes that are formed at the same time by the photo etching process.

The nonvolatile semiconductor memory device according to one embodiment of the present invention may form a plurality of vertical type transistors connected in series with 1 PEP, by laminating the lamination film corresponding to number of the lamination of the memory transistors in advance and forming a hole pattern simultaneously.

Also in the nonvolatile semiconductor memory device 1 of the present invention according to this embodiment, it is necessary to connect the selection gates to the upper and lower parts of vertical type transistors that are connected in series to operate a plurality of the vertical type transistors. Formation of the series structure with the plurality of the vertical type transistors that are connected in series to the selection gates, can be performed simultaneously with PEP of 1 or 2 a (memory transistor formation holes PEP)

Further, the source side selection gate lines SGS of the vertical transistor that are connected in series and each of the word lines of each of the memory transistors can be set as a common potential per each layer all the time as a matter of operation. Therefore, a plane shaped structure may be applied to either the selection gate lines SGS and the word lines WL. As thus described, the word line may be formed by the rough PEP, by which the manufacturing process may be simplified and thus the cost reduction may be realized.

A manufacturing process of the nonvolatile semiconductor memory device 1 of the present invention according to this embodiment using FIG. 18 to FIG. 44 will be explained. In FIG. 18 to FIG. 44, a peripheral circuit area, in which a peripheral circuit areas such as a word line driver circuit and a sensing amplifier circuit are formed are shown on the left side, and the memory transistor area is shown on the right side. Also in the memory transistor area, parts corresponding to an area A part, an area B part, a cross section of X-X' and Y-Y' of the nonvolatile semiconductor memory device 1 of the present invention according to this embodiment shown in FIG. 17 are shown.

Figure 18:
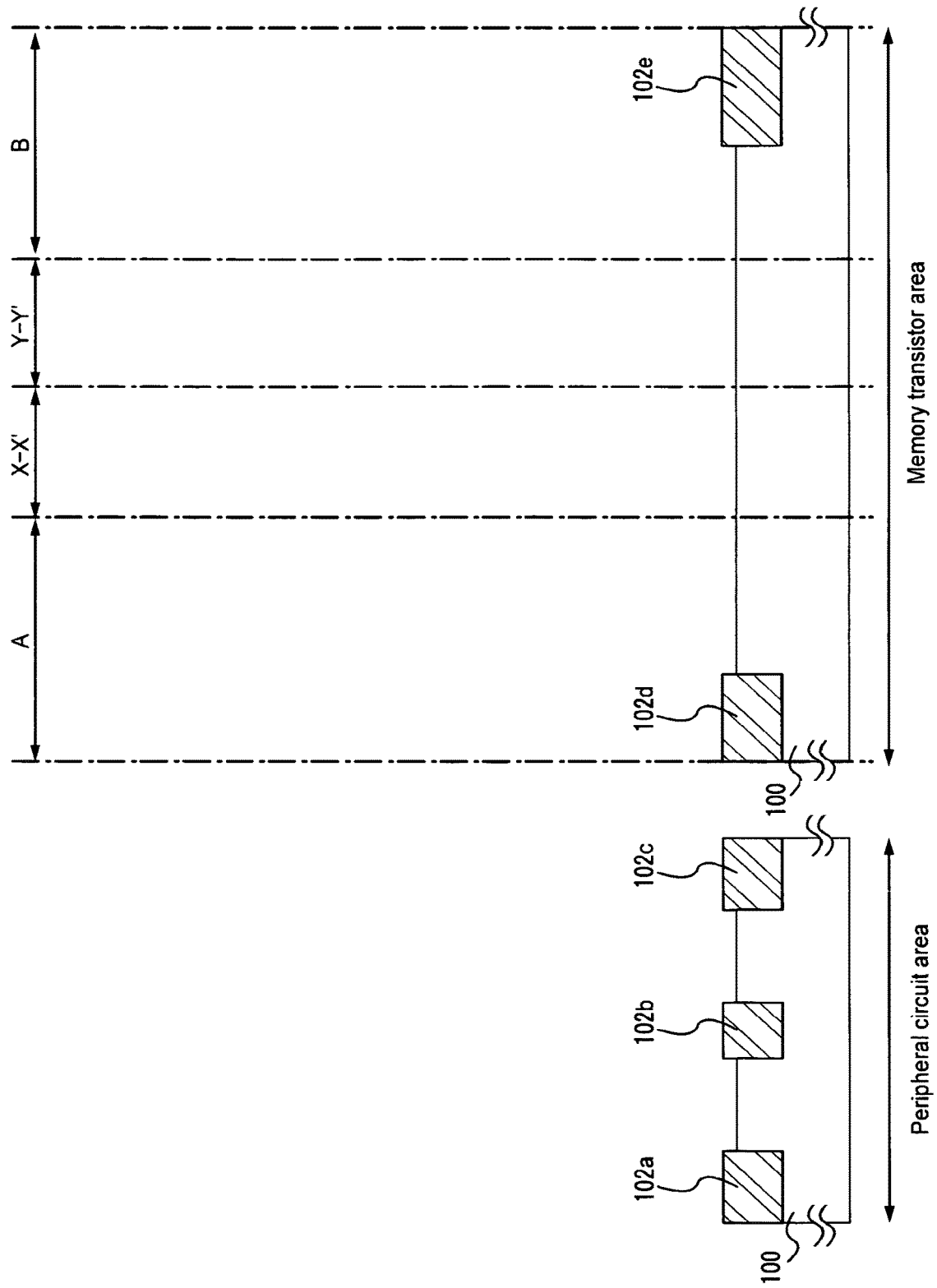
FIG. 18 is a diagram that shows a manufacturing process of the nonvolatile semiconductor memory device 1 according to one embodiment of the present invention.

First, FIG. 18 is referred. A thin silicon oxide film (SiO2) is formed on a semiconductor substrate 1 (not shown in the figures), then subsequently, a silicon nitride film (Si3N4) is laminated (not shown in the figures), and in the area 102*a*, 102*b*, 102*c*, 103*d* and 102*e*, which forms STI (Sharrow Trench Isolation), a shallow trench of about 300 nm is formed by Dry Etching method. Afterwards, by laminating a silicon oxide film with a heat CVD method or a plasma CVD (Chemical Vapor Deposition) method, embedding the slot thoroughly with the silicon oxide film, and removing the silicon oxide film other than the part of the slot by Chemical Mechanical Polishing (CMP), STI (Shallow Trench Isolation) 102*a*, 102*b*, 102*c*, 102*d*, 102*e* are formed (FIG. 18). Then, the remaining silicon oxide films are removed with heat phosphorous.

Figure 19:
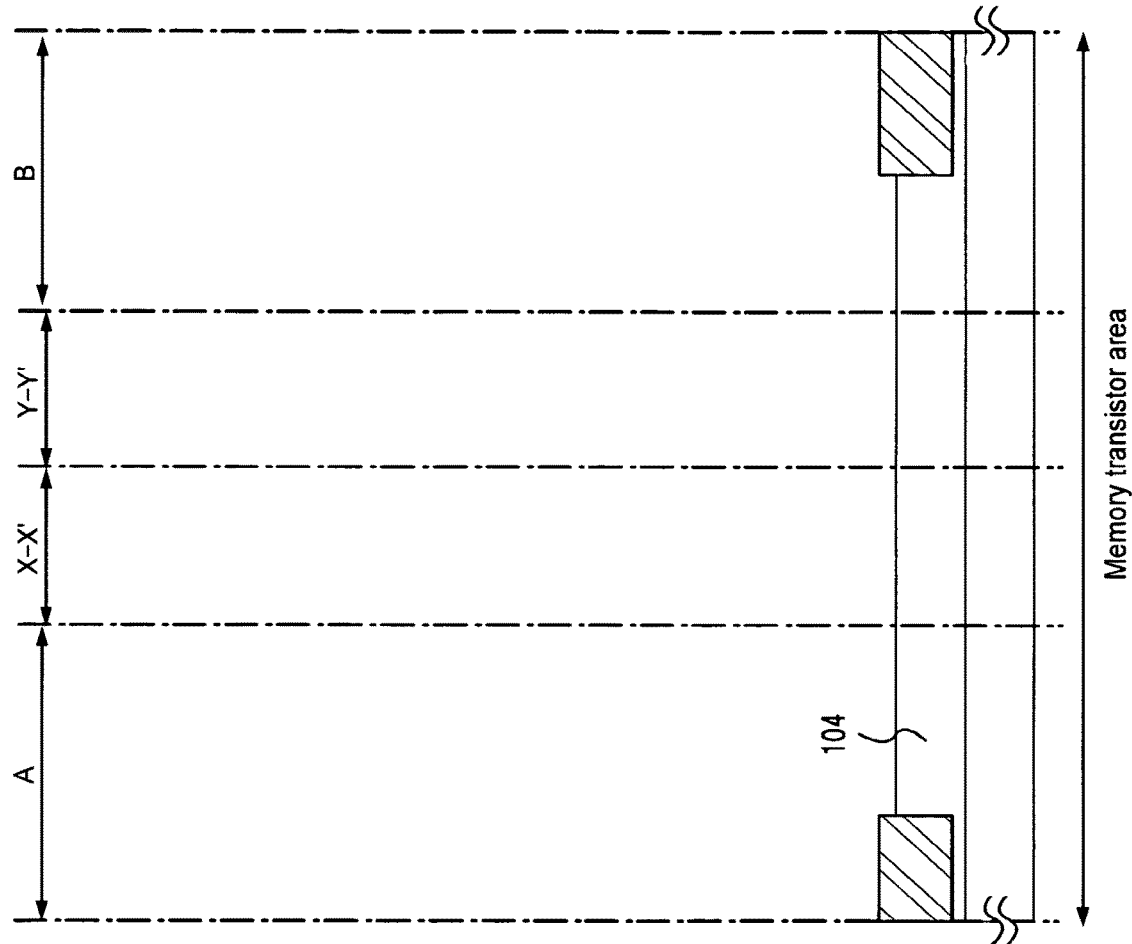
FIG. 19 is a diagram that shows a manufacturing process of the nonvolatile semiconductor memory device 1 according to one embodiment of the present invention.
Figure 19:
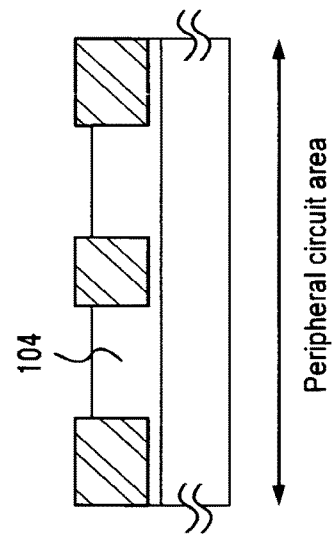

Next, sacrificial oxidation is performed in the substrate surface (not shown in the figures), photoresist pattern that opens desired areas is formed, boron (B) ions are implanted, forming the P-Well area 104, afterwards, the resist is removed (FIG. 19). Next, the photo resist pattern that opens the desired areas is formed; boron (B) ions are implanted near the surface of the substrate 100, and thus a channel implant area 106*a* and 106*b*, by which a threshold of the transistor Vth is adjusted. are formed. In addition, here, the transistor formed in the peripheral circuit area shows an example of N-channel type transistor; however, N-Well area is formed and thus P-channel type transistor is formed (not shown in the figures) by implanting ions giving the N type in the desired area.

Figure 20:
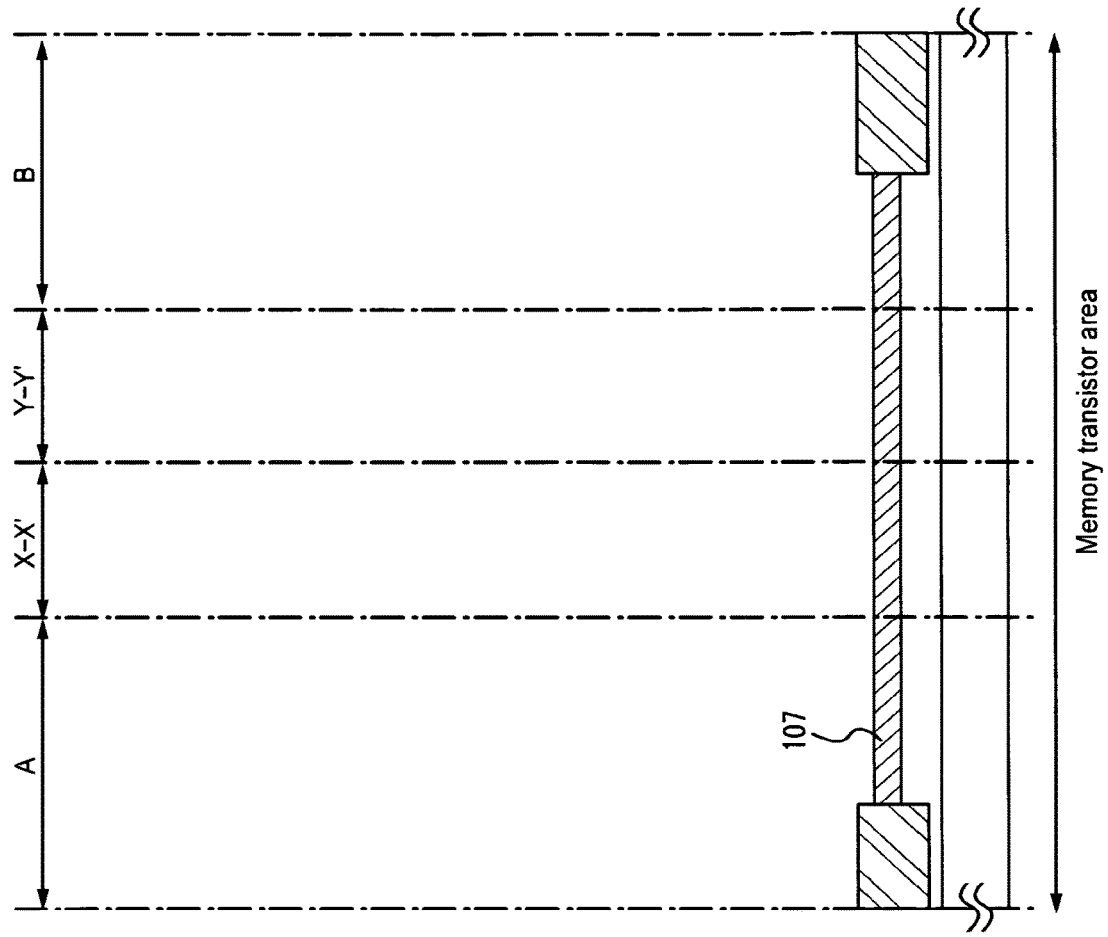
FIG. 20 is a diagram that shows a manufacturing process of the nonvolatile semiconductor memory device 1 according to one embodiment of the present invention.

Next, the photo resist pattern, in which only the memory transistor areas is open, is formed, a phosphorous (P) ions are implanted only in the memory cell transistor area, and thus n+ diffusion area 107 is formed (FIG. 20). The n+ diffusion area 107 becomes the source line SL.

Next, the sacrificial oxidation film (not shown in the figures) is removed, and thus a first gate insulating film (not shown in the figures) is formed.

Figure 21:
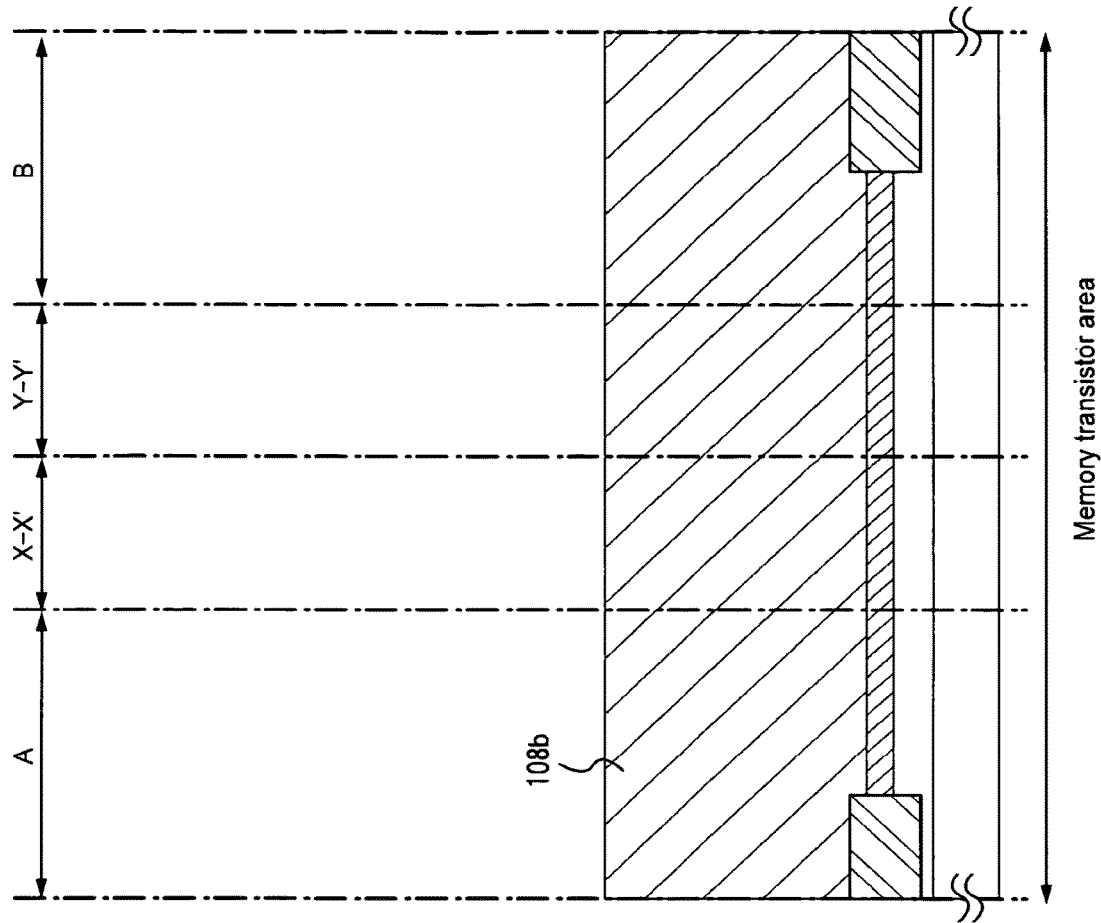
FIG. 21 is a diagram that shows a manufacturing process of the nonvolatile semiconductor memory device 1 according to one embodiment of the present invention.
Figure 21:
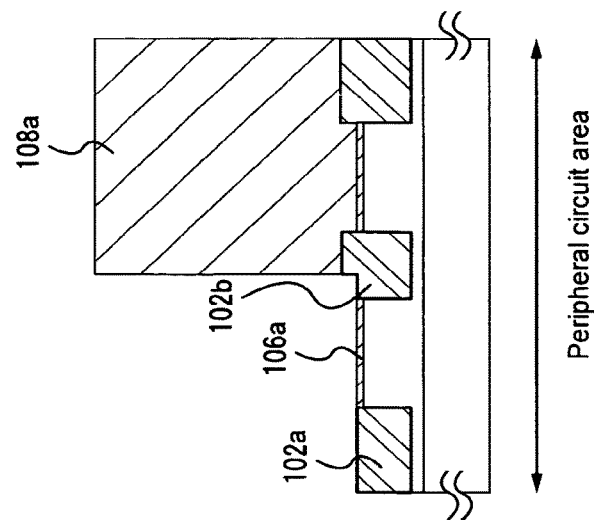

Next, photo resist masks 108*a* and 108*b* are formed in the desired pattern, and Wet Etching is performed, by doing so, the first gate insulation film at the desired position and a part of STI102*a* and 102*b* are etched and removed (FIG. 21). A thin film gate transistor for high speed operation is formed in the area, and the thick gate transistor for high resist pressure will be formed in the area, where no Wet Etching is performed.

Figure 22:
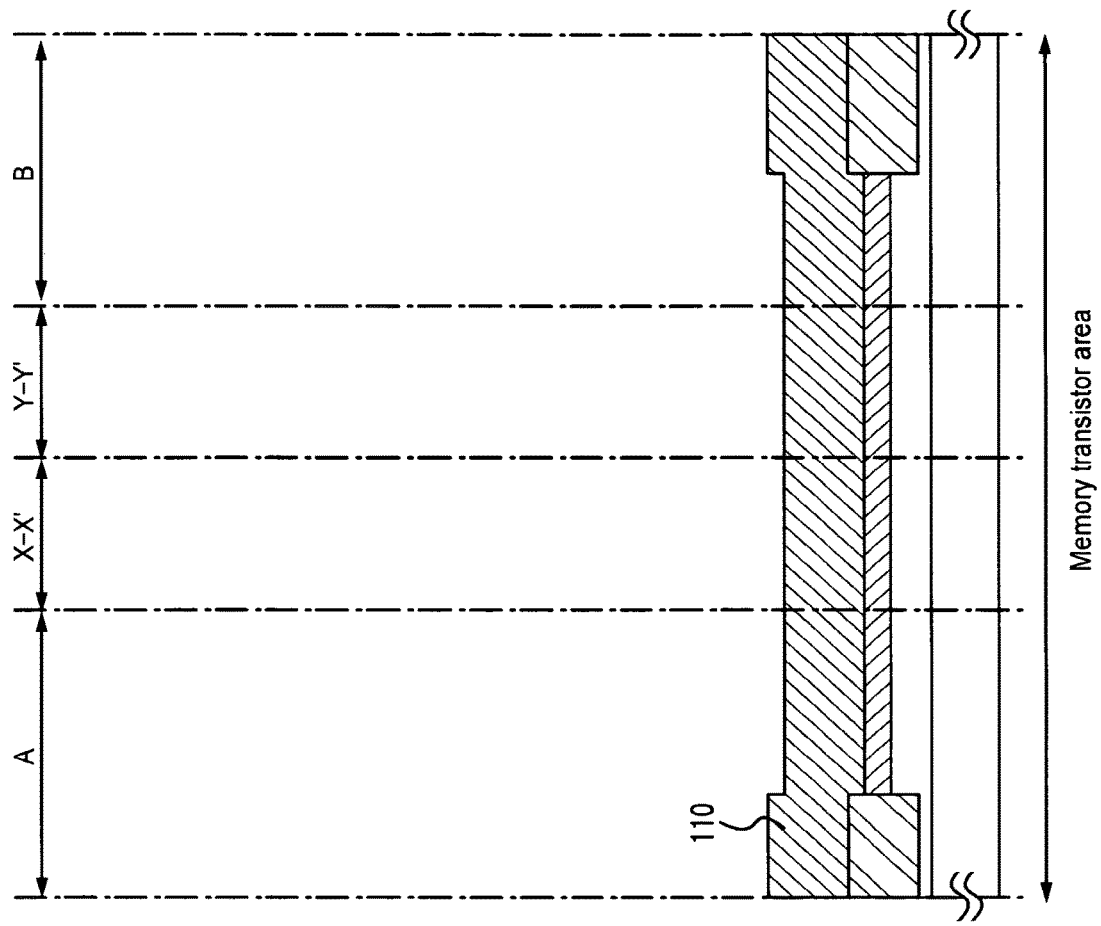
FIG. 22 is a diagram that shows a manufacturing process of the nonvolatile semiconductor memory device 1 according to one embodiment of the present invention.
Figure 23:
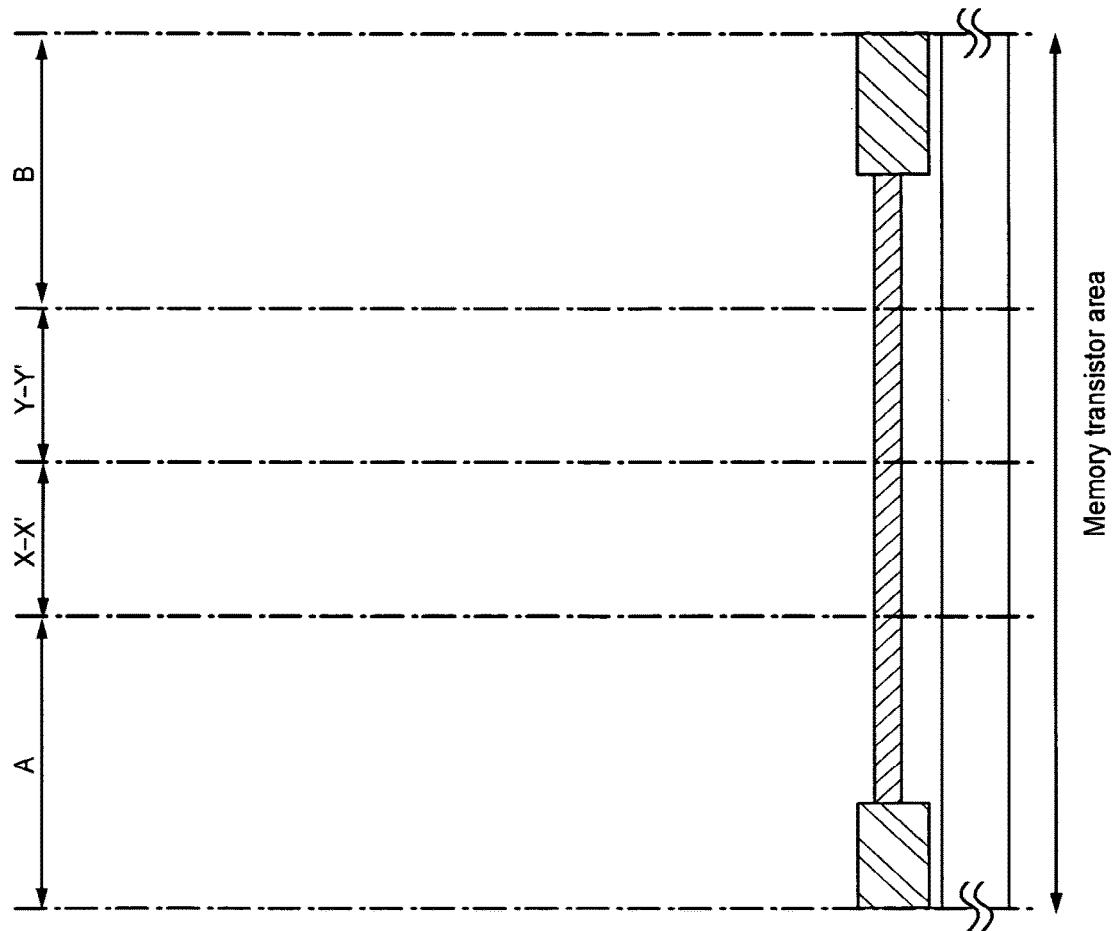
FIG. 23 is a diagram that shows a manufacturing process of the nonvolatile semiconductor memory device 1 according to one embodiment of the present invention.
Figure 23:
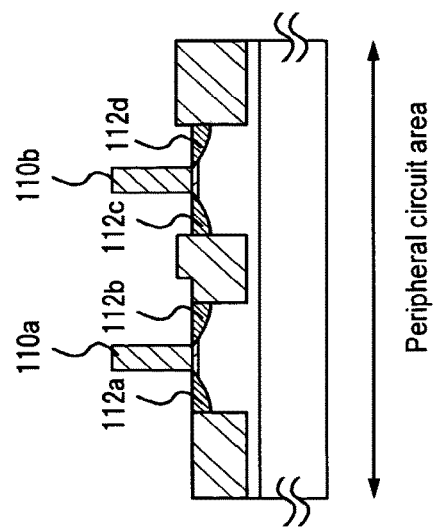

Next, the photo resist mask 108*a* and 108*b* are removed so that a second gate insulation film (not shown in the figures) is formed. And a poly-silicon (p-Si) film 110 adding conductive type impurities such as P (phosphorus) are formed on the substrate (FIG. 22). And the poly-silicon film 110 is etched with a predetermined pattern, then gate electrodes 110*a* and 110*b* of the transistor of the peripheral circuit area are formed (FIG. 23). Next, photo resist is formed in the P-channel type transistor area of the peripheral circuit area and the memory transistor area (not shown in the figures), P (phosphorus) ions or As (arsenic) ions etc., are implanted into the N-channel type transistor area in the peripheral circuit area, the N-channel type areas 112*a*, 112*b*, 112*c* and 112*d* that are automatically shallow are formed with the gate electrode 110*a* and 110*b* (FIG. 23). Then the photo resist is removed.

Next, photo resist is formed in the area of N-channel type transistor and the memory transistor area of the peripheral circuit areas (not shown in the figures), B (boron) ion etc., are implanted in the P-channel type transistor area of the peripheral circuit areas, a P-type area (not shown in the figures) that automatically shallow are formed with the gate electrode (not shown in the figures), and then, the photo resist is removed.

Figure 24:
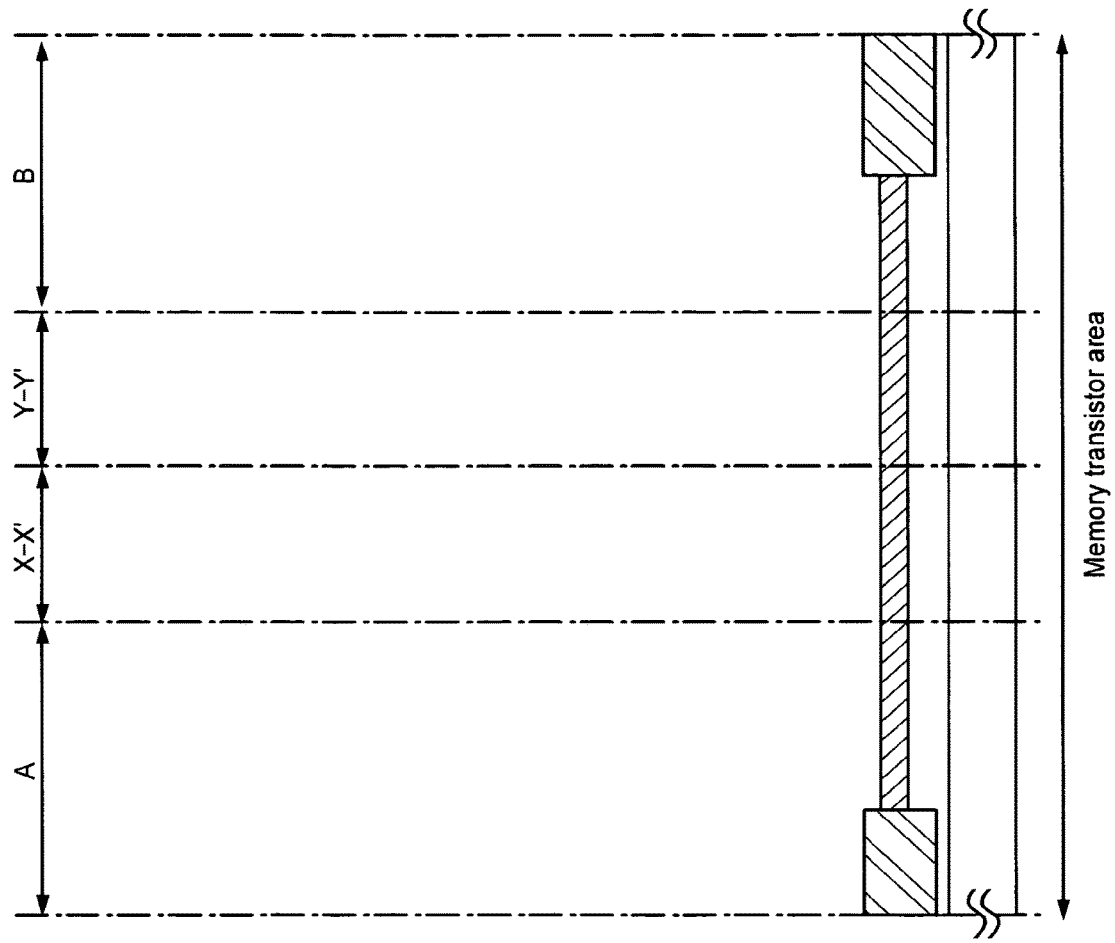
FIG. 24 is a diagram that shows a manufacturing process of the nonvolatile semiconductor memory device 1 according to one embodiment of the present invention.

Next, silicon nitride film is formed on the whole surface of the substrate and by performing anisotropic etching, the silicon nitride films are remained only in the both edge part of the gate electrode 110*a* and 110*b*, thus side walls 114*a*, 114*b*, 114*c* and 114*d* are formed (FIG. 24).

Next, photo resist is formed in the P-channel type transistor area in the peripheral circuit area and the memory transistor area (not shown in the figures), arsenic (As) ions are implanted in the N-channel type transistor of the peripheral circuit areas, a source/drain areas 116*a*, 116*b*, 116*c* and 116*d* are formed automatically shallow with the side walls 114*a*, 114*b*, 114*c* and 114*d* (FIG. 25), and then, the photo resist is removed.

Next, photo resist is formed in the N-channel type transistor area of the peripheral circuit area and the memory transistor area (not shown in the figures), boron (B) ions are implanted into the P-channel type transistor area of the peripheral circuit area, the source/drain areas are formed automatically shallow with the side walls (not shown in the figures), and then, photo resist is removed.

Figure 25:
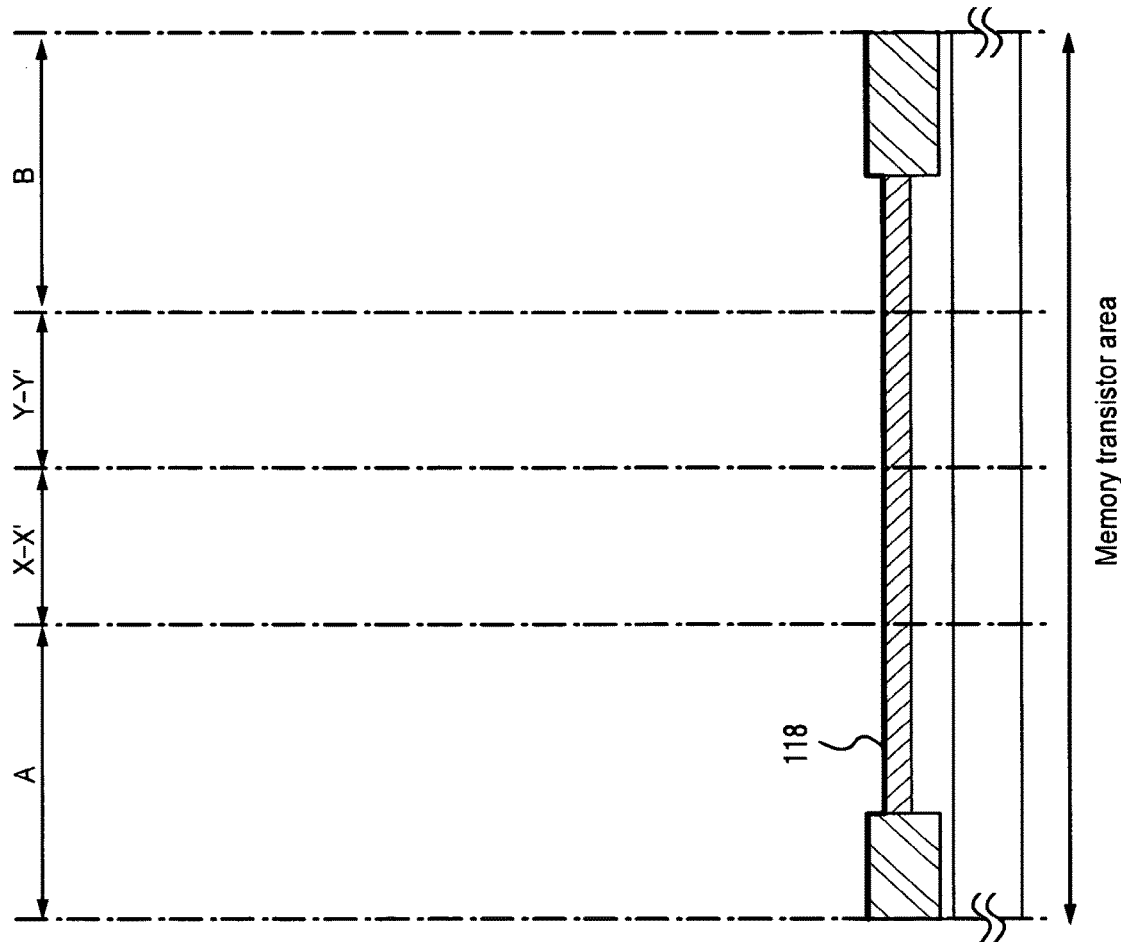
FIG. 25 is a diagram that shows a manufacturing process of the nonvolatile semiconductor memory device 1 according to one embodiment of the present invention.

Next, a silicon nitride film (a barrier silicon nitride film) 118 is formed on the whole surface of the substrate (FIG. 25).

Figure 26:
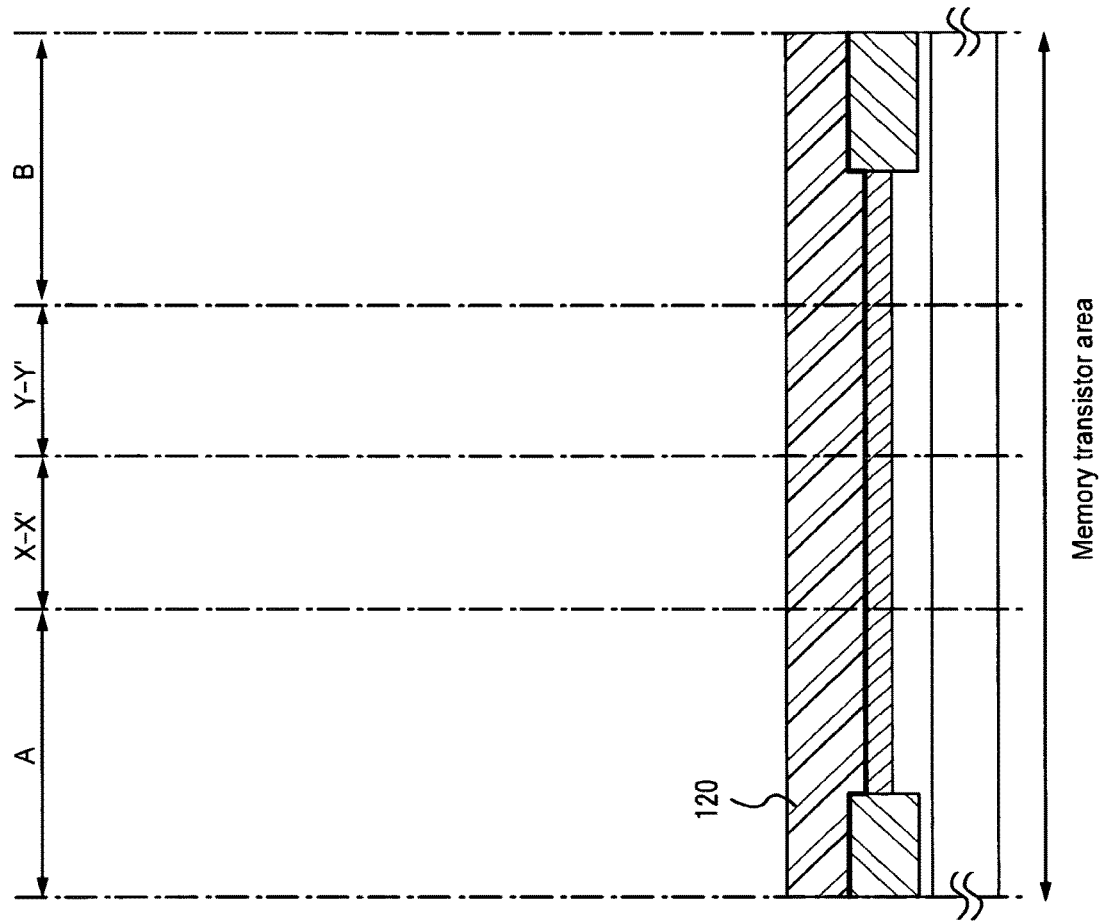
FIG. 26 is a diagram that shows a manufacturing process of the nonvolatile semiconductor memory device 1 according to one embodiment of the present invention.

Subsequently, BPSG (Boron Phosphor Silicate Glass) film 120 is formed in the whole substrate, and by performing CMP treatment, a BPSG film 120 is planarized (FIG. 26). And by forming cobalt (Co) film on the whole surface of the substrate by a spattering method and performing a heat treatment, cobalt silicide (CoSi2) is 122*a* and 122*b* are formed (FIG. 26). Then, useless Co is removed. Hereby cobalt silicide may be formed in the gate electrode, and the silicide using other metals (Ti, Ni, etc.) may be formed. Further, no silicide may be formed, and in this case, manufacturing of the gate and the formation of the transistor may be performed, after tungsten silicide and SiN are formed as a film on a poly-silicon at the time of laminating the poly-silicon 110 of the gate electrodes.

Figure 27:
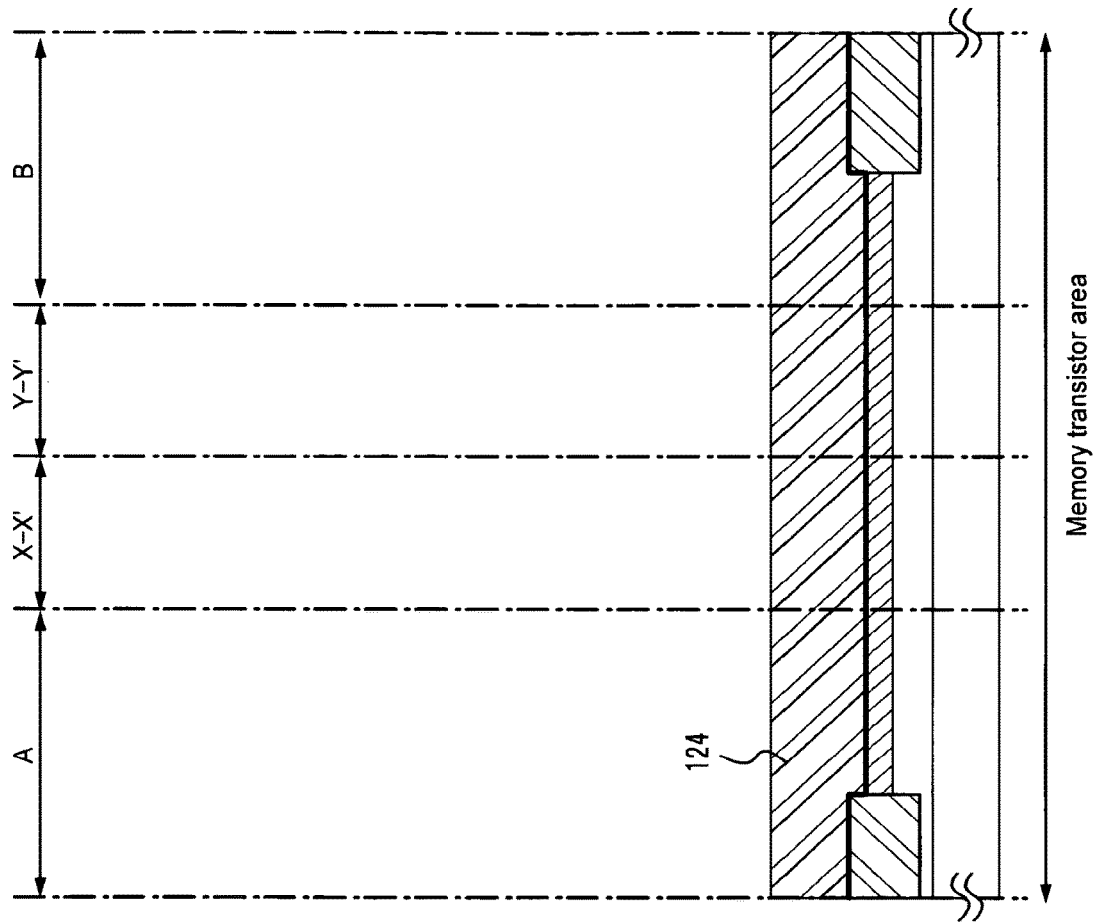
FIG. 27 is a diagram that shows a manufacturing process of the nonvolatile semiconductor memory device 1 according to one embodiment of the present invention.
Figure 27:
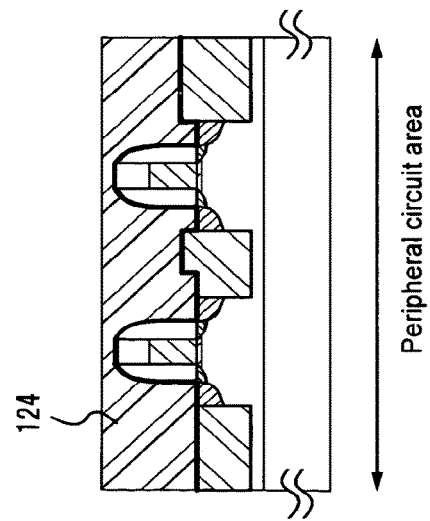

Next, a BPSG film 124 is formed on the whole substrate (FIG. 27).

Figure 28:
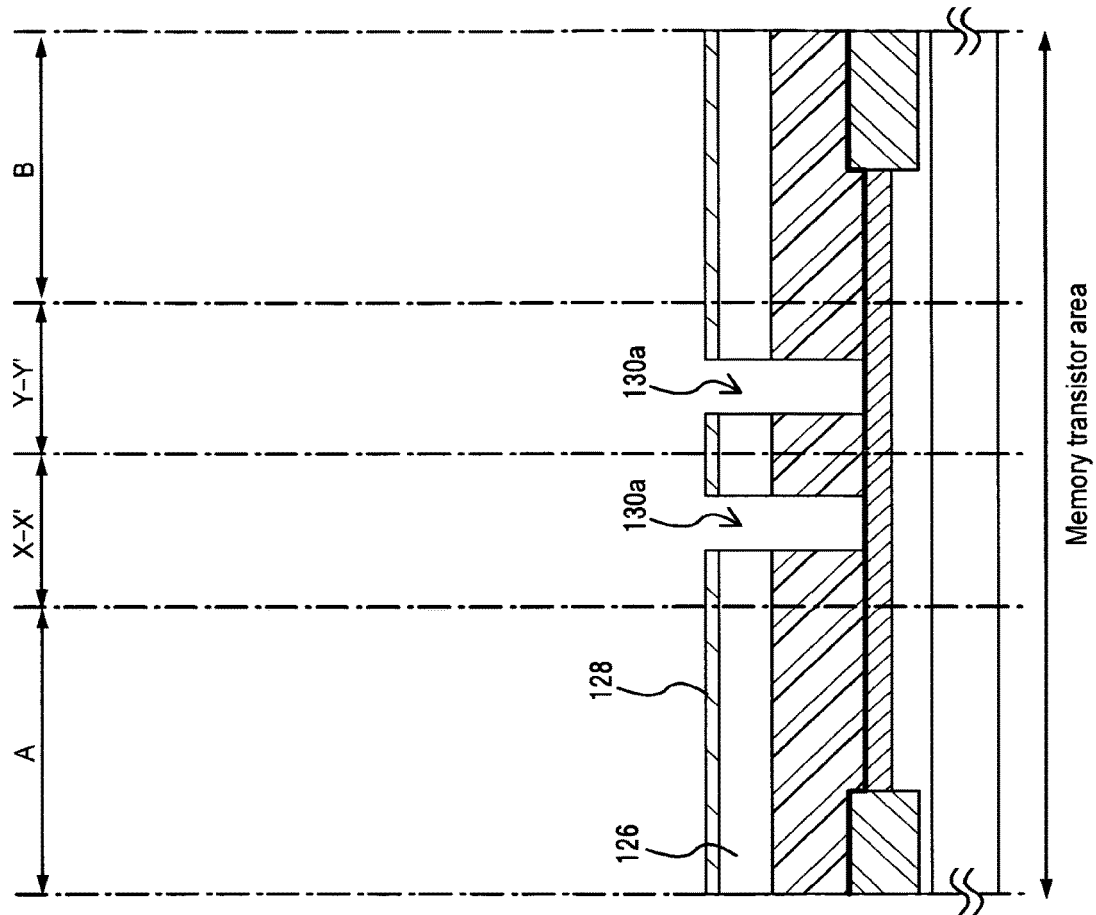
FIG. 28 is a diagram that shows a manufacturing process of the nonvolatile semiconductor memory device 1 according to one embodiment of the present invention.
Figure 28:
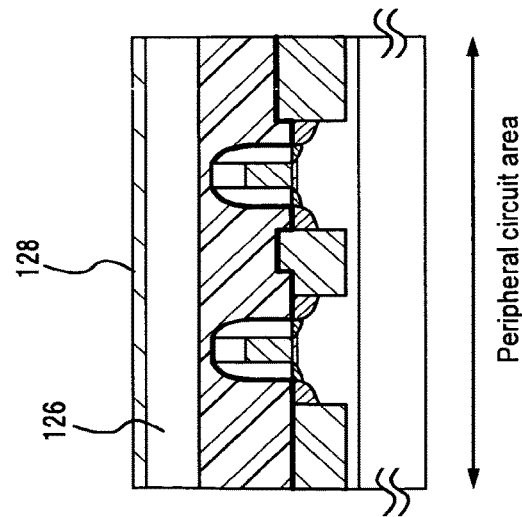

Subsequently, the poly-silicon film 126 and a silicon nitride film 128, in which conductive type impurities of the P (phosphorus) on the whole surface of the substrate are formed (FIG. 28). Afterwards, holes (hereinafter it may be called "transistor plug holes") 130*a* are formed by the photoresist process. The poly-silicon film 126 becomes a Selected Gate Line SGS of the memory transistor area.

Figure 29:
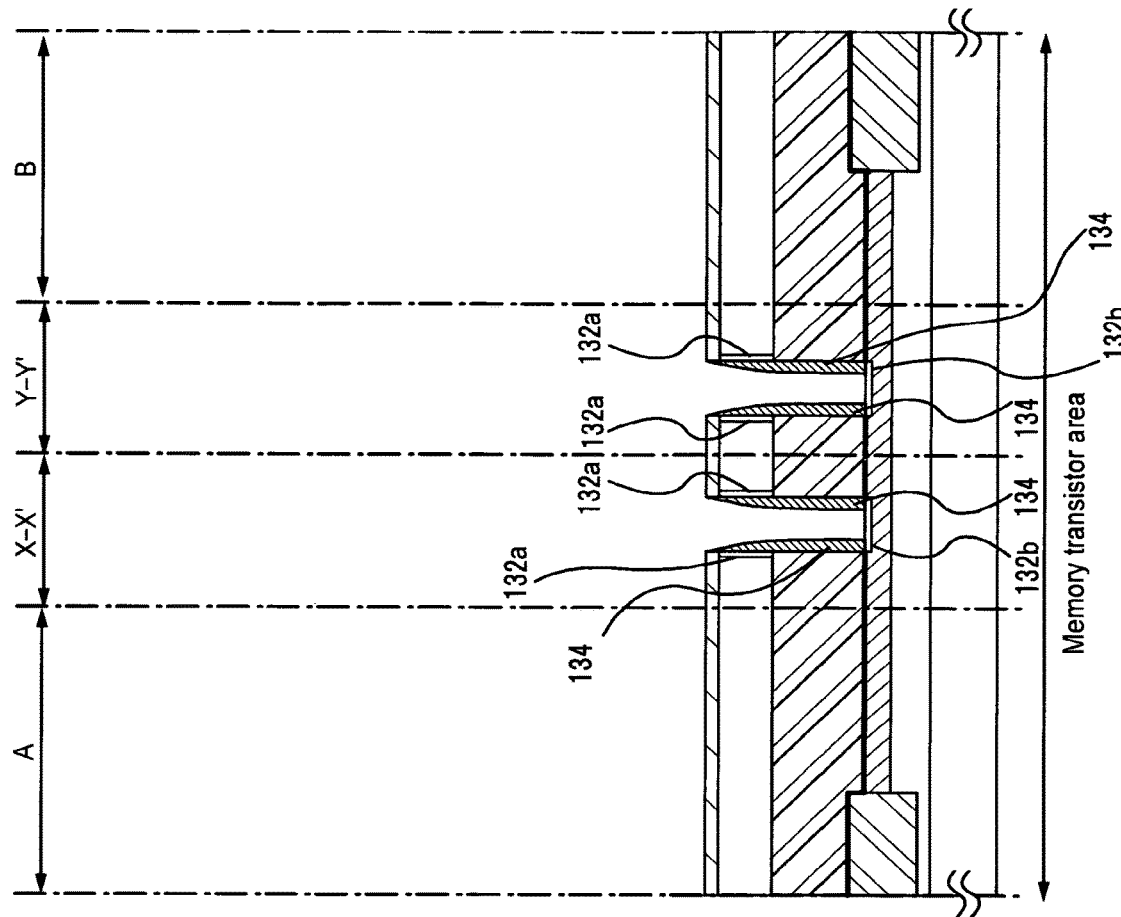
FIG. 29 is a diagram that shows a manufacturing process of the nonvolatile semiconductor memory device 1 according to one embodiment of the present invention.
Figure 29:
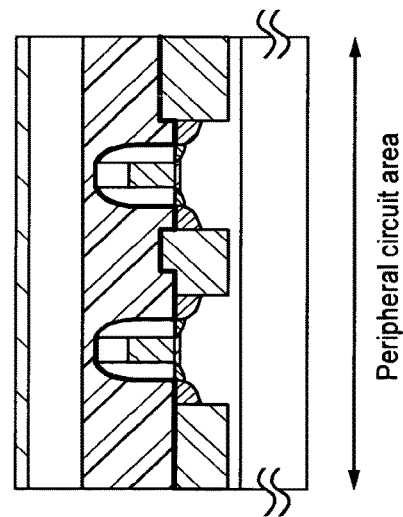

Next by heating the substrate, thermal oxidation film 132*a* and 132*b* are formed (FIG. 29). The thermal oxidation films 132*a* and 132*b* becomes the gate insulating films of the selection gate transistor SSTr. Subsequently, a silicon nitride film is formed on the whole surface of the substrate, and by performing anisotropic etching, a block silicon nitride 134 is formed (FIG. 29).

Figure 30:
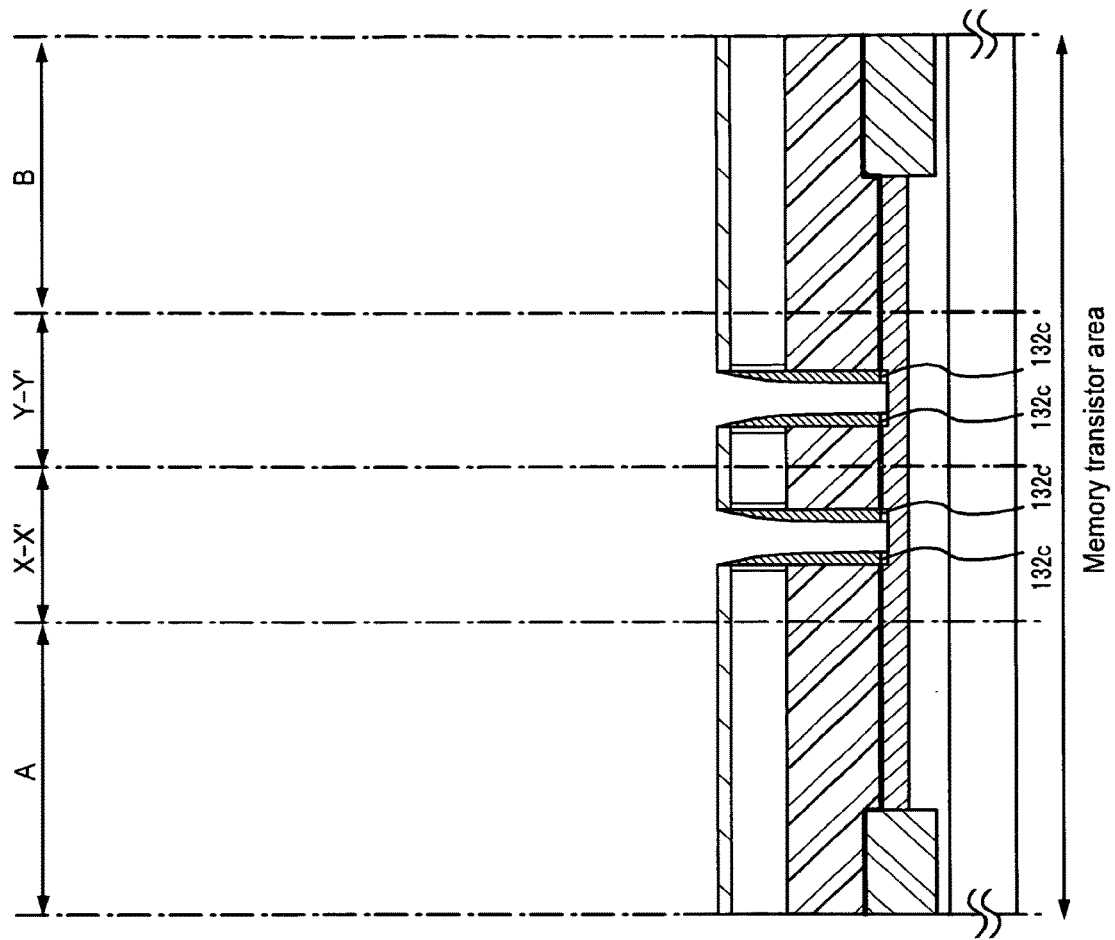
FIG. 30 is a diagram that shows a manufacturing process of the nonvolatile semiconductor memory device 1 according to one embodiment of the present invention.

Next, a part of the thermal oxidation film 132*b* is removed, by wet etching using hydrofluoric acid or dry etching using gas of fluoride system, thus thermal oxidation film 132*c* is formed (FIG. 30).

Figure 31:
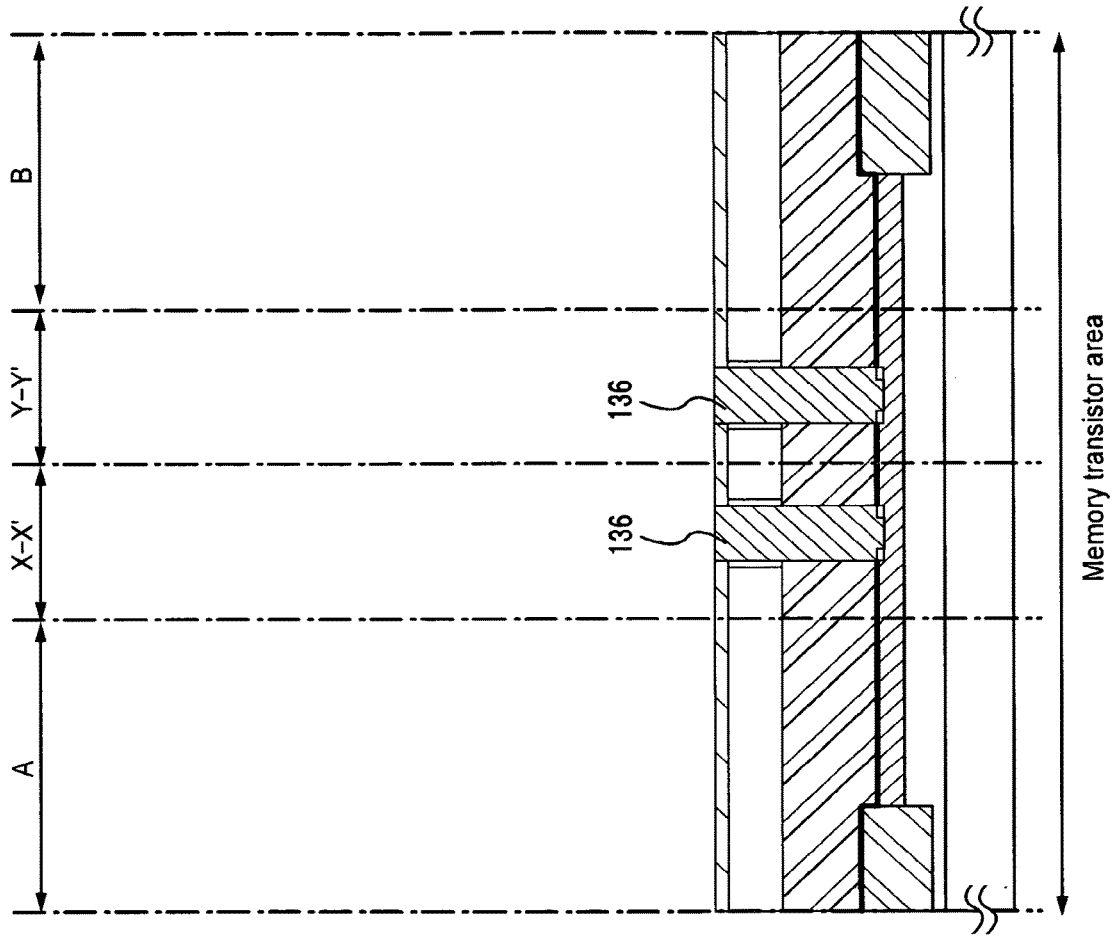
FIG. 31 is a diagram that shows a manufacturing process of the nonvolatile semiconductor memory device 1 according to one embodiment of the present invention.

Subsequently, after a block silicon nitride film 134 is removed and amorphous silicon (a-Si) films 136 are formed on the whole surface of the substrate, amorphous silicon films are formed by performing the CMP to the amorphous silicon films 136 (FIG. 31). In addition, instead of the amorphous silicon films 136, silicon film 136*a* and 136*b* may be formed by performing epitaxial growth to the single crystal silicon.

Figure 32:
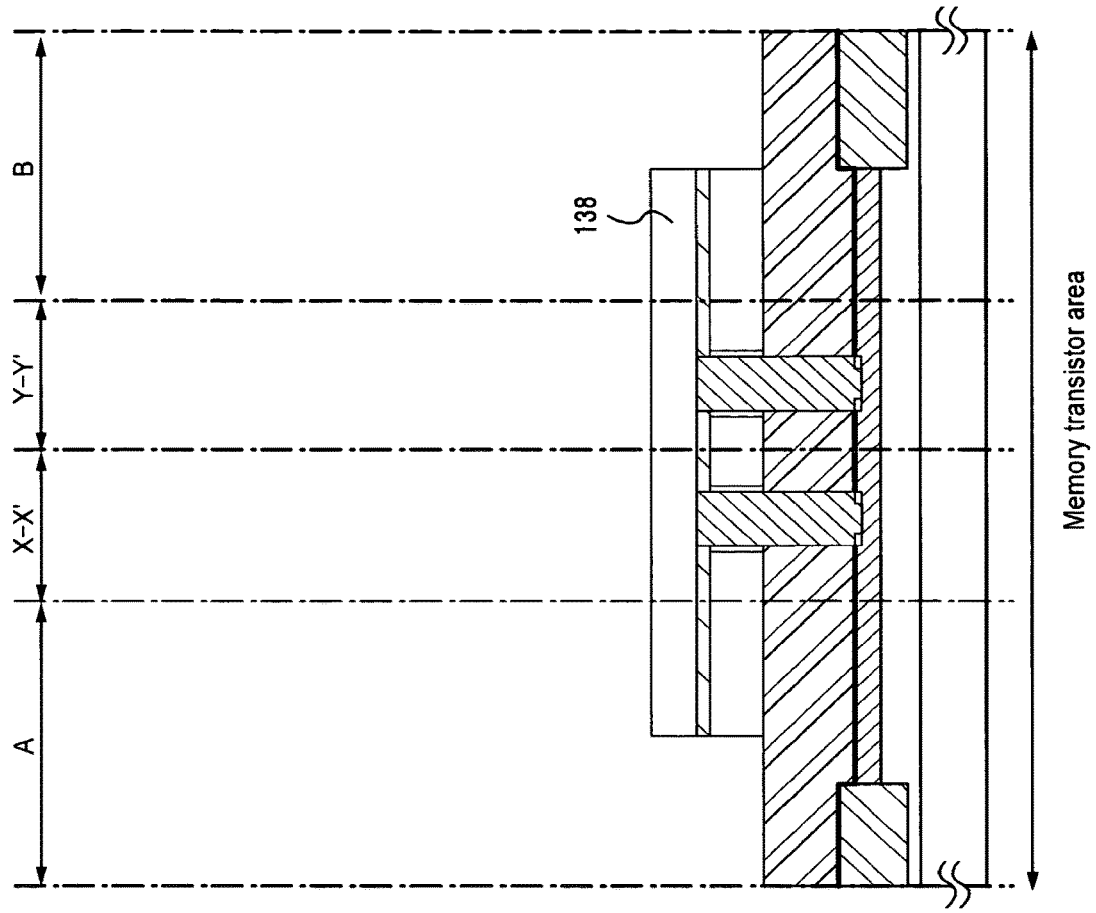
FIG. 32 is a diagram that shows a manufacturing process of the nonvolatile semiconductor memory device 1 according to one embodiment of the present invention.
Figure 32:
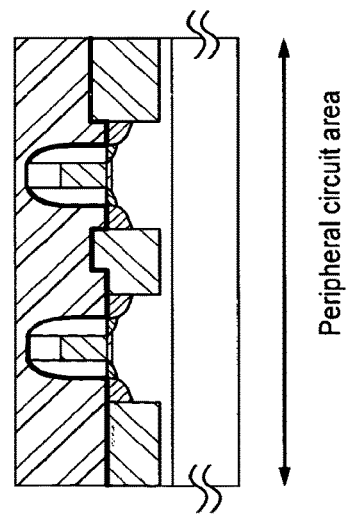

Next, photo resist 138 is formed and photo etching process is performed (FIG. 32).

Figure 33:
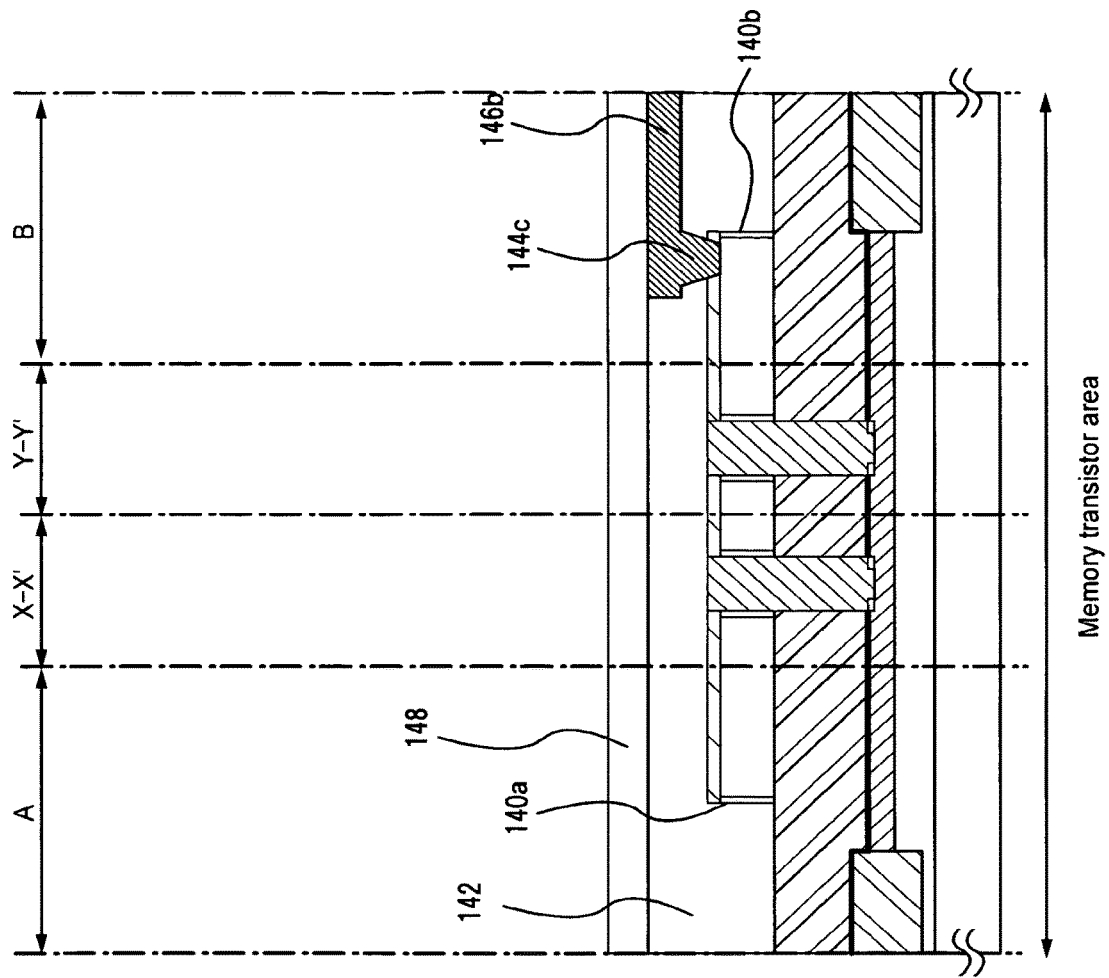
FIG. 33 is a diagram that shows a manufacturing process of the nonvolatile semiconductor memory device 1 according to one embodiment of the present invention.
Figure 33:
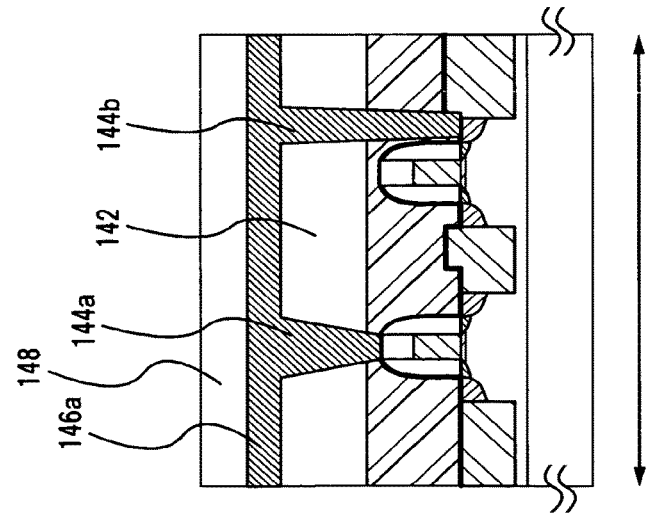

Next, by forming titanium (Ti) film and performing heat treatment titanium silicide (TiSi) 140*a* and 140*b* are formed (FIG. 33). In addition, instead of titanium silicide (TiSi) 140*a* and 140*b* cobalt silicide (CoSi2) may be formed, also, the silicide 140*a* and 140*b* either may or not may be formed.

Next, the silicon oxide film 142 is formed as the primetal insulation film (PMD). Then a contact hole is formed by photo etching process, then, after forming a slot for wiring in the silicon oxide film 142, a tungsten (W) film is embedded, tungsten (W) plugs 144*a*, 144*b* and 144*c* and a wiring 146*a* and 146*b* are formed. Next, silicon oxide film 148 is formed using TEOS (Tetraethoxysilane) (FIG. 33). Hereinafter, the silicon nitride film that is formed using TEOS may be called "a TEOS film."

Figure 34:
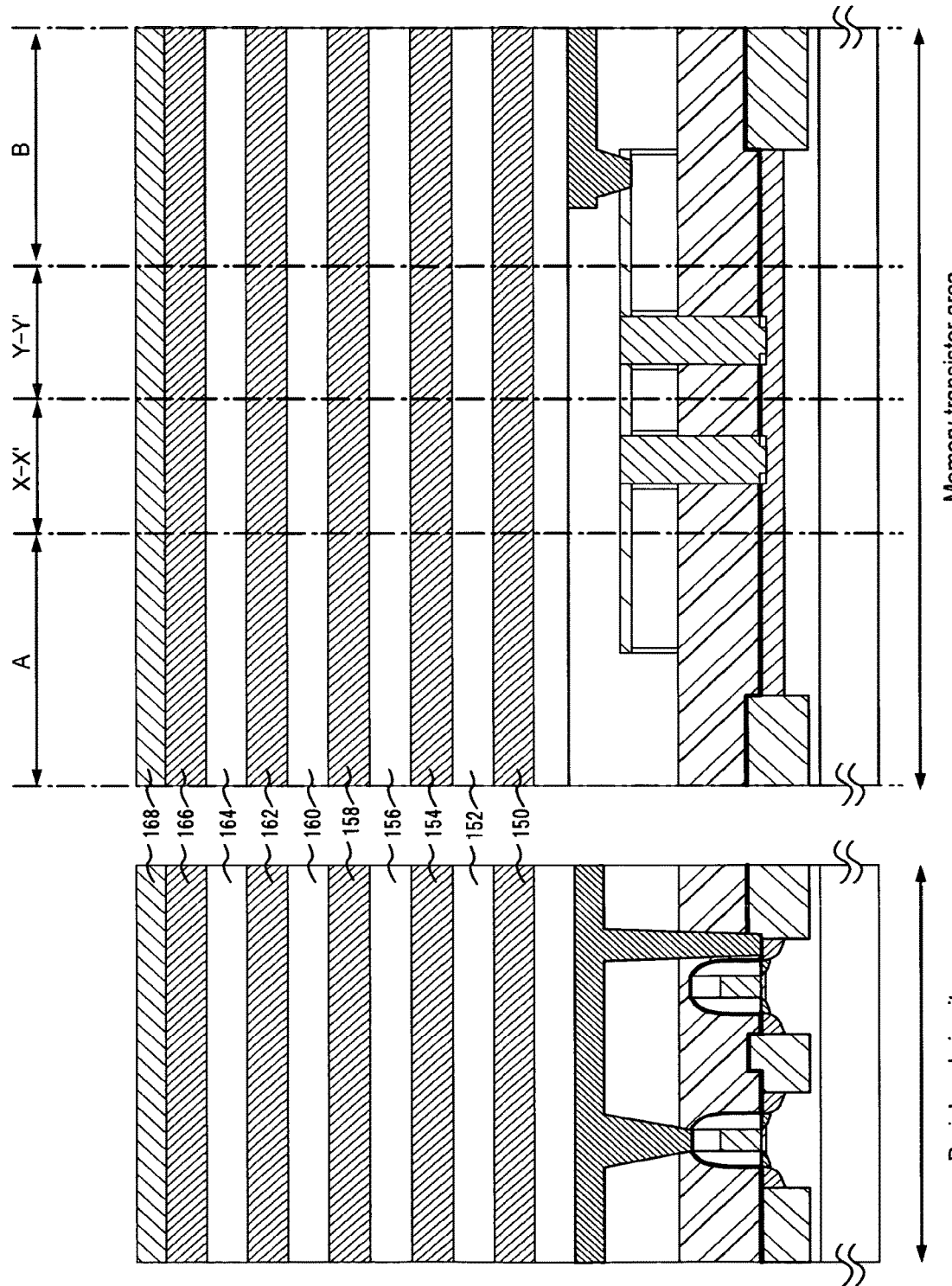
FIG. 34 is a diagram that shows a manufacturing process of the nonvolatile semiconductor memory device 1 according to one embodiment of the present invention.

Next, by forming poly-silicon films (or amorphous silicon films) and silicon oxide films in turn, in which conductive impurities such as P (phosphorous) etc. are added in, poly-silicon films 150, 154, 158, 162 and 166, and silicon oxide films 152, 156, 160, 164, are formed (FIG. 34). Further, a silicon nitride film 168 is formed (FIG. 34).

Figure 35:
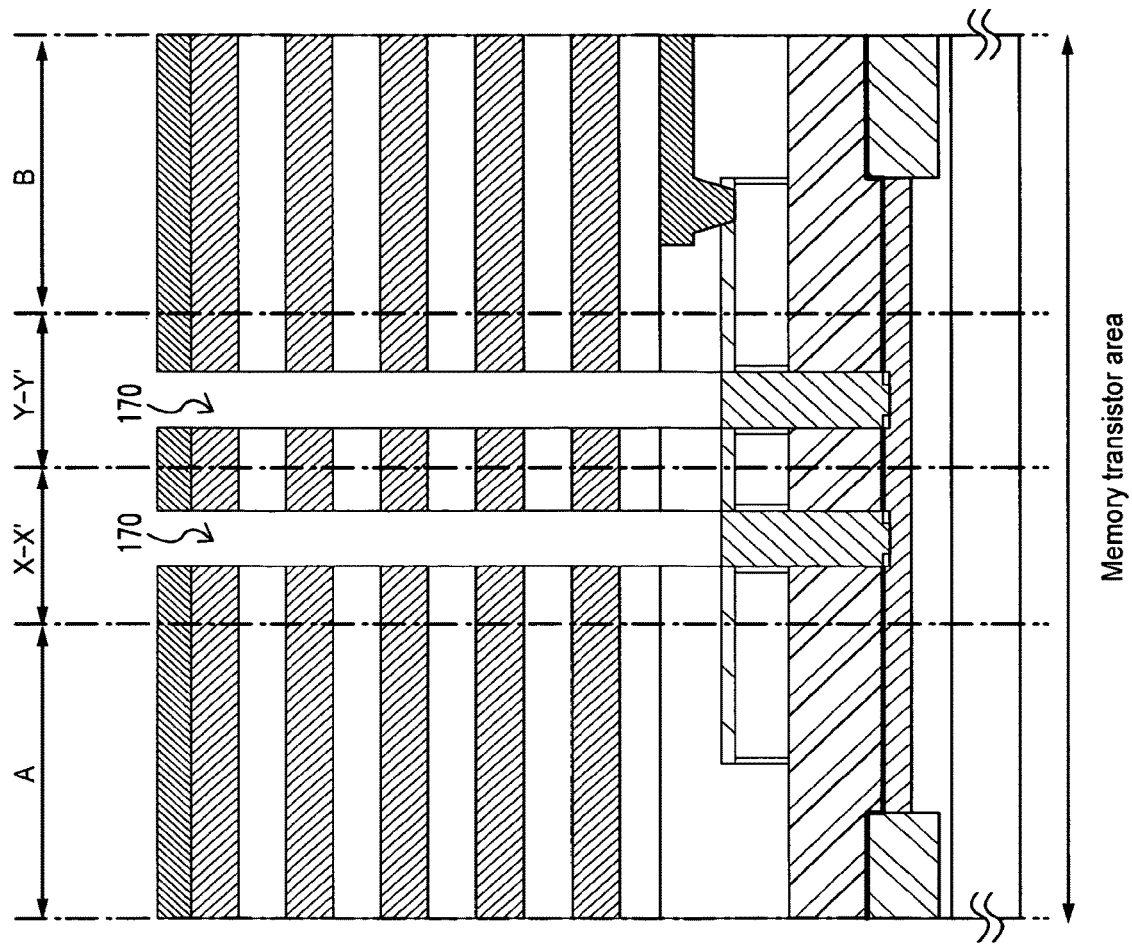
FIG. 35 is a diagram that shows a manufacturing process of the nonvolatile semiconductor memory device 1 according to one embodiment of the present invention.
Figure 35:
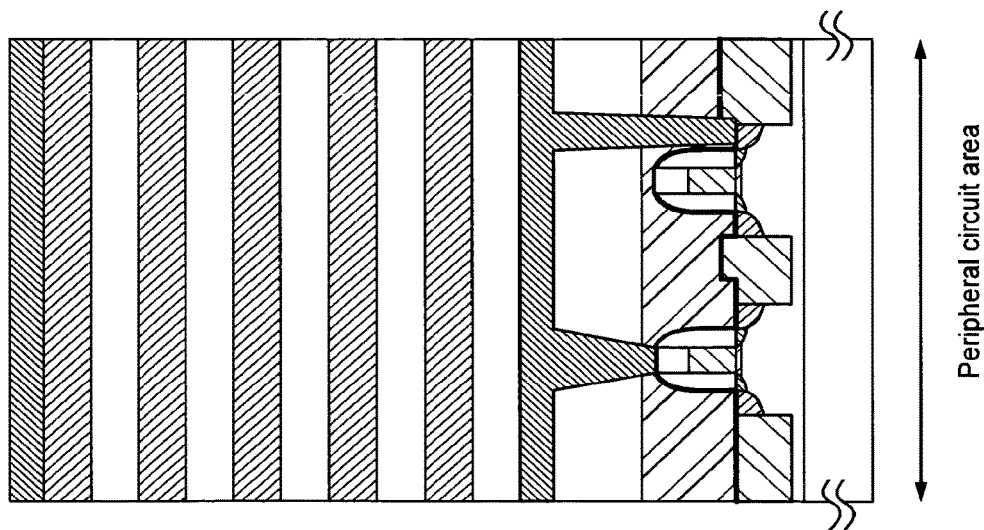

Subsequently in the memory transistor area, memory plug holes 170 are formed to form a pillar shaped semiconductor (a body part) of the memory transistor (FIG. 35). In addition, in this embodiment, the memory plug holes 170 are called "a memory plug holes 170".

Figure 81:
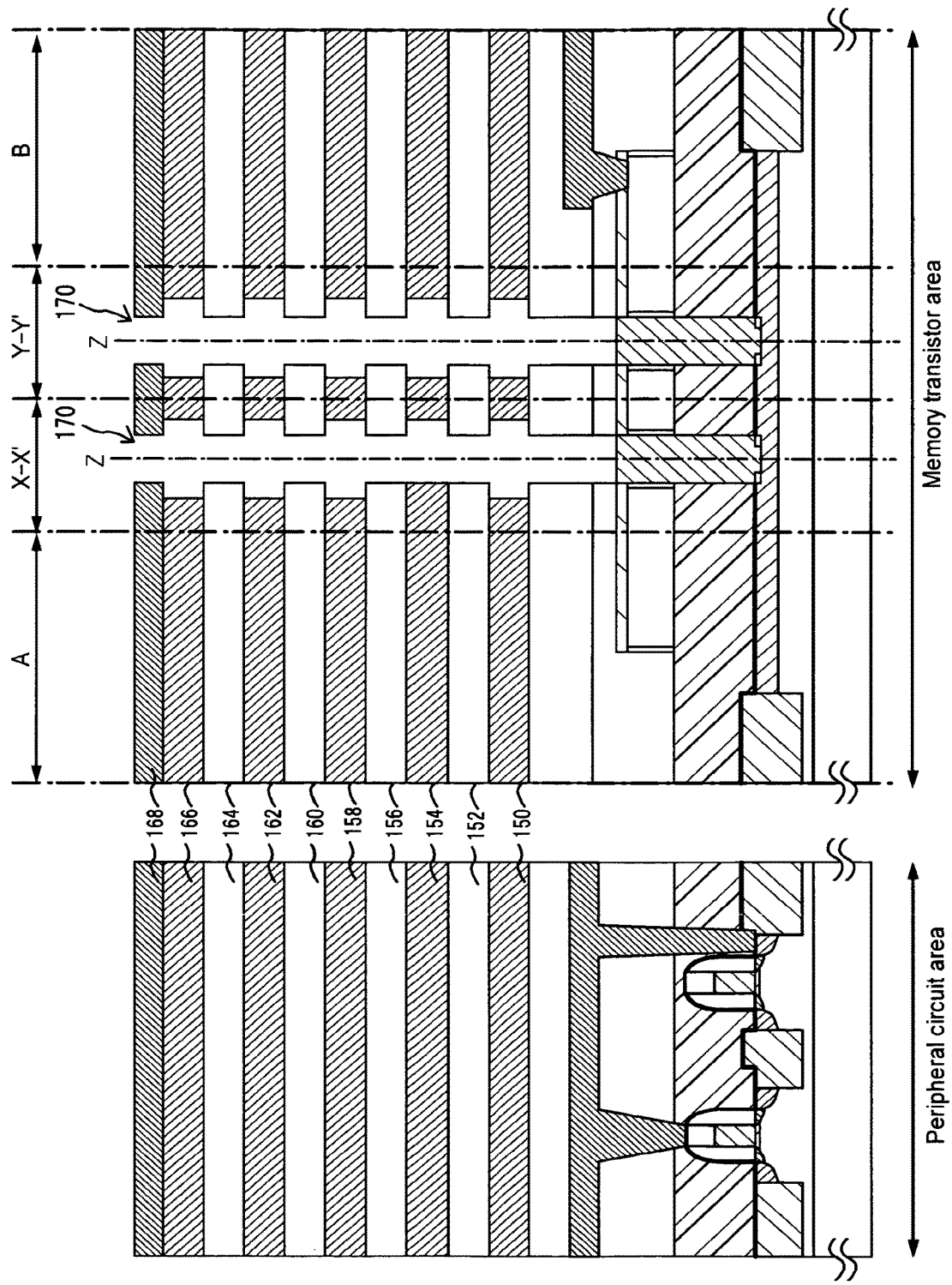
FIG. 81 is diagram that shows a manufacturing process of the nonvolatile semiconductor memory device 1 according to one embodiment of the present invention.
Figure 82:
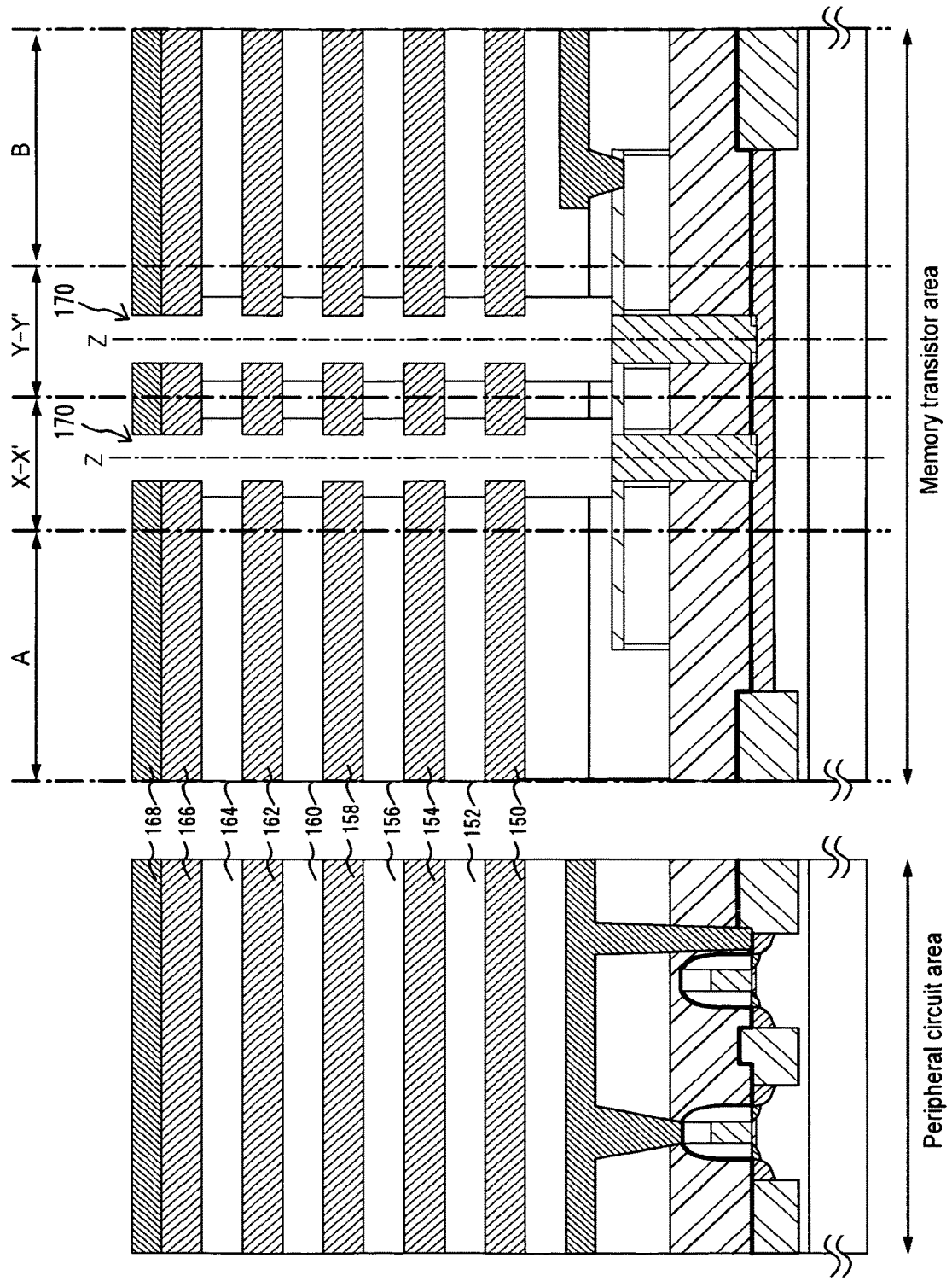
FIG. 82 is diagram that shows a manufacturing process of the nonvolatile semiconductor memory device 1 according to one embodiment of the present invention.

In addition, unevenness may be occurred on the surface of the memory plug holes 170 as shown in FIG. 81 and FIG. 82, by various factors such as: switching of the etching gas, at the time of forming this memory plug holes 170; removal of the piles; materials of films 150 to 168 and so on. In FIG. 81, an example, in which poly-silicon films 150, 154, 158, 162 and 166 on the surface of the memory hole 170 are excessively etched and unevenness is occurred on the surface of the memory plug holes 170, are shown. Even though the case like this, which the unevenness is occurred on the surface of the memory plug holes 170, the cross-sectional shape of the memory transistor area of the nonvolatile semiconductor memory device 1 according to this embodiment is almost symmetric to a central axis of the memory plug holes 170.

In FIG. 82, an example, in which silicon nitride films 150, 152, 156, 160 and 164 on the surface of the memory plug holes 170 are excessively etched, and unevenness is occurred on the surface of the memory plug hole 170 are shown. In addition, even though the case like this, which the unevenness is occurred on the surface of the memory plug holes 170, the cross-section of the memory transistor area of the nonvolatile semiconductor memory device 1 according to this embodiment is almost symmetric to a central axis of the memory plug holes 170.

Figure 83:
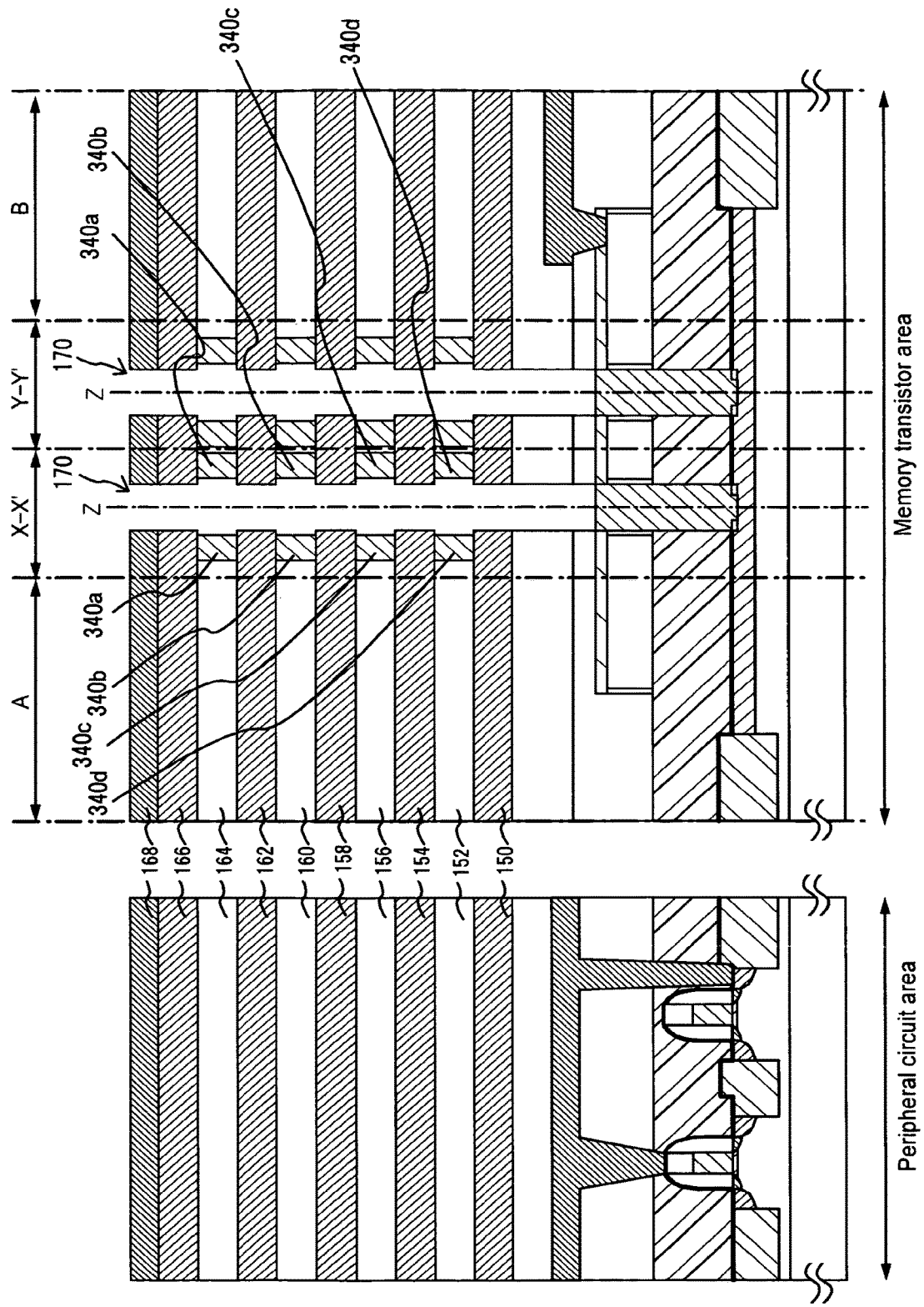
FIG. 83 is diagram that shows a manufacturing process of the nonvolatile semiconductor memory device 1 according to one embodiment of the present invention.

Also, silicon nitride films 340*a*, 340*b*, 340*c* and 340*d* on the surface of the memory plug holes 170 may be formed so that dielectric constant of the film among each of the poly-silicon films 150, 154, 158, 162 and 166 that become the word lines WL of the nonvolatile semiconductor memory device 1 according to this embodiment may be enhanced (FIG. 83). By doing so, change effect of the potential of the word lines WL may be efficiently transmitted to the pillar shaped semiconductor layer that are formed in the memory plug holes 170 later.

Figure 84:
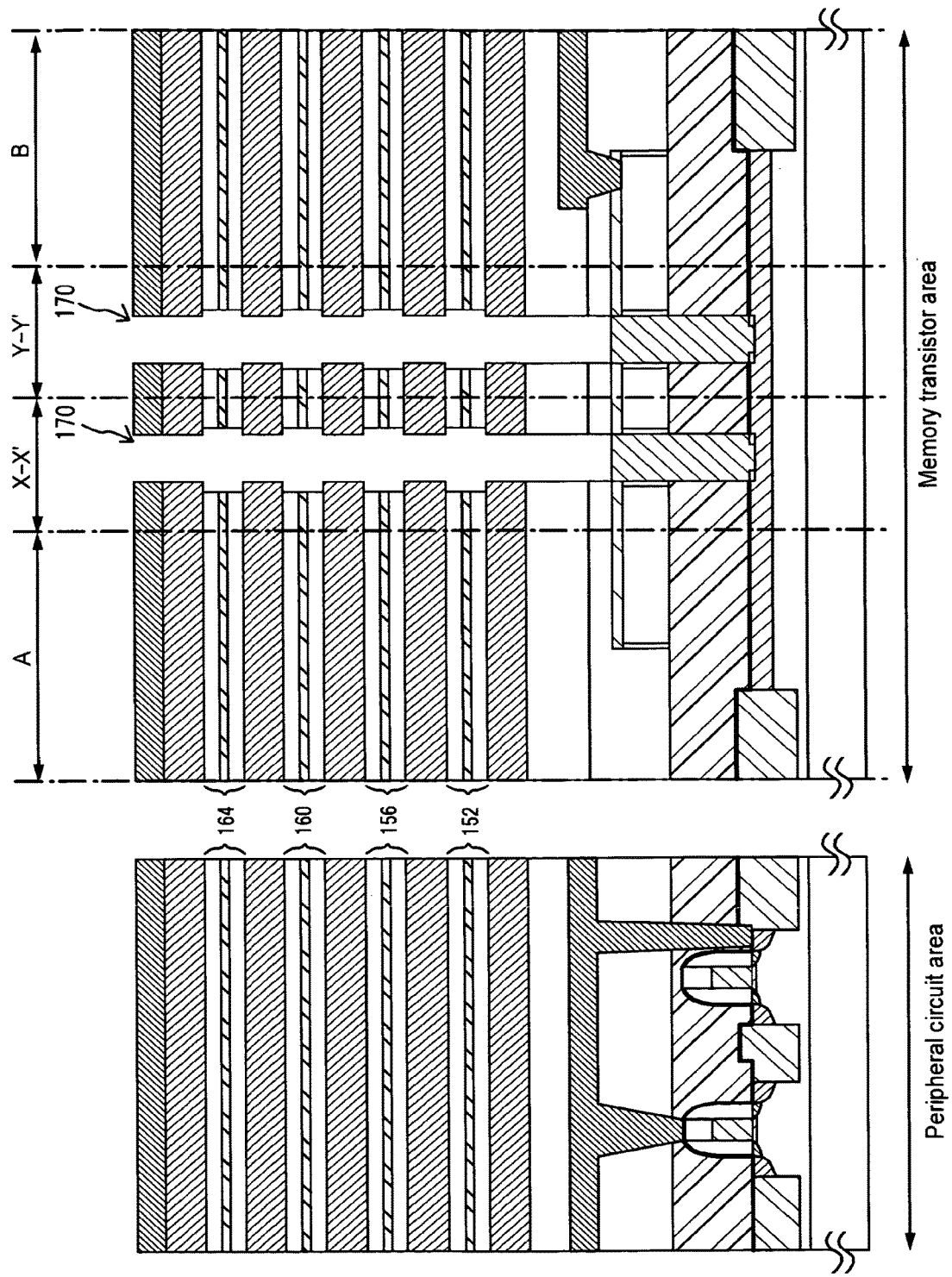
FIG. 84 is diagram that shows a manufacturing process of the nonvolatile semiconductor memory device 1 according to one embodiment of the present invention.

Also in this embodiment, the silicon oxide films 152, 156, 160 and 164 are formed (FIG. 34), alternatively, lamination films 152, 156, 160 and 164 of the silicon oxide films/silicon nitride films/silicon nitride film may be formed (FIG. 84). By doing so, change effect of the potential of the word lines WL may be efficiently transmitted to the pillar shaped semiconductor layer that are formed in the memory plug holes 170 later.

Figure 85:
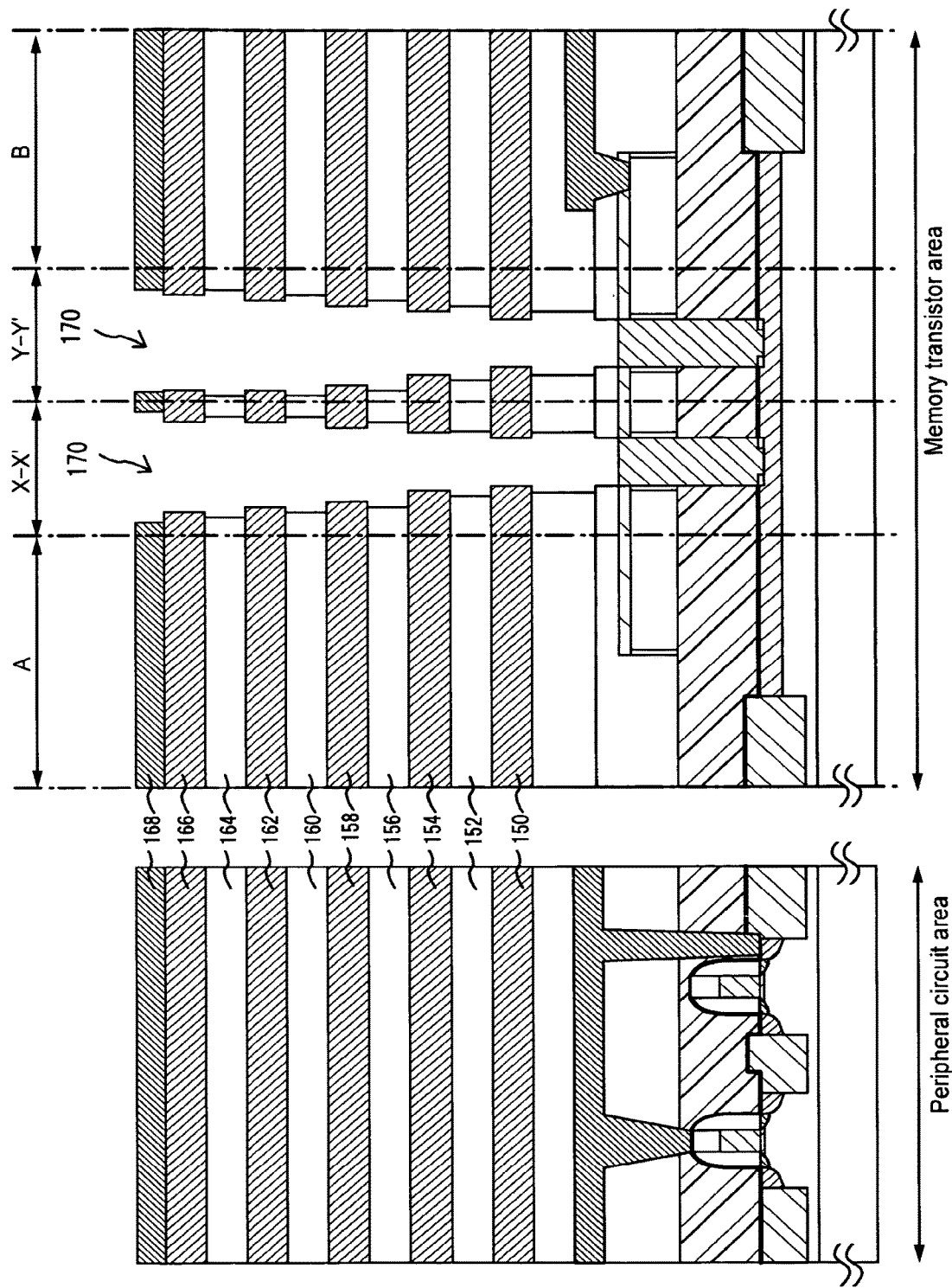
FIG. 85 is diagram that shows a manufacturing process of the nonvolatile semiconductor memory device 1 according to one embodiment of the present invention.
Figure 86:
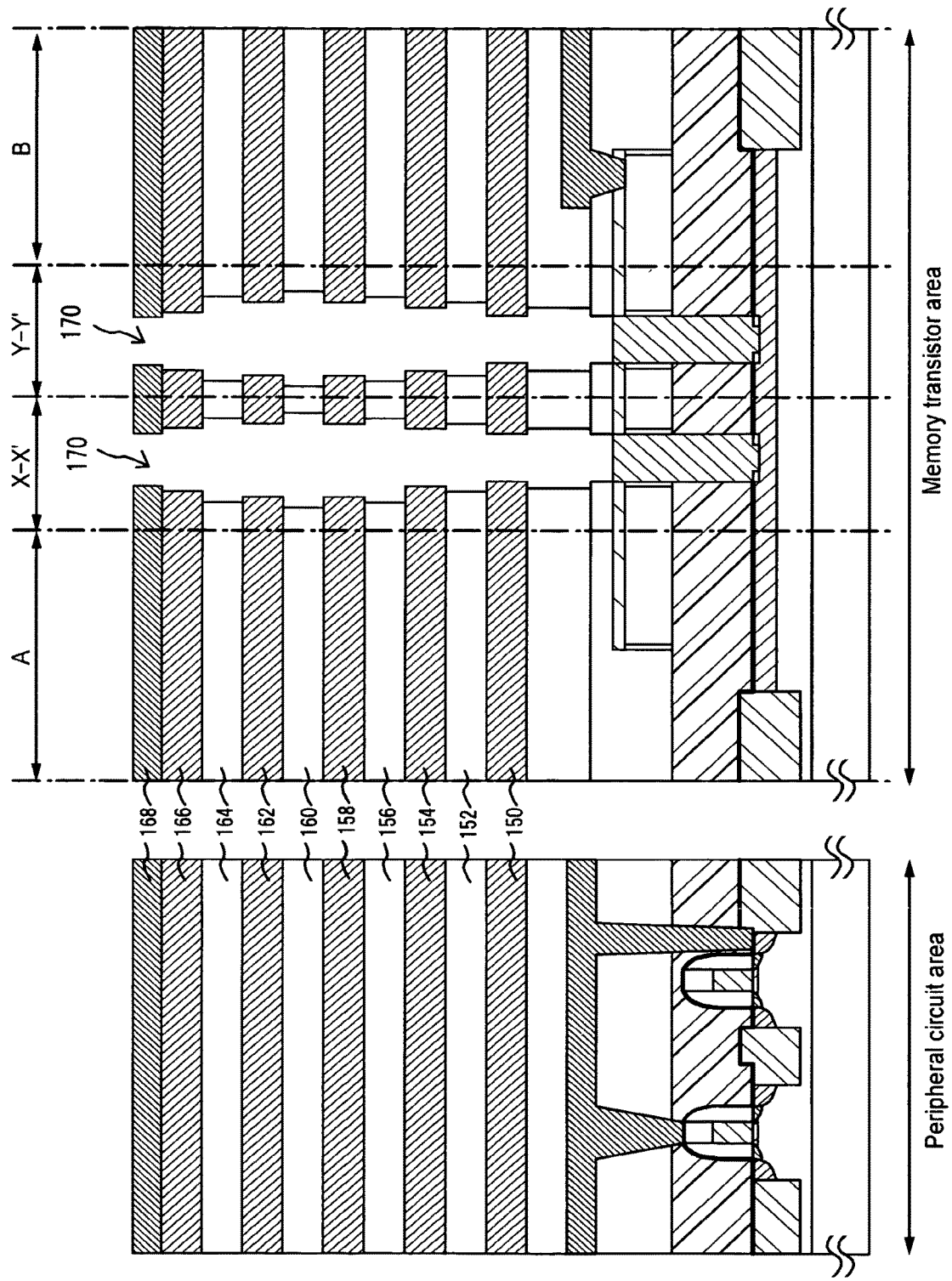
FIG. 86 is diagram that shows a manufacturing process of the nonvolatile semiconductor memory device 1 according to one embodiment of the present invention.

In addition, by various factors such as: switching of the etching gas at the time of forming this memory plug holes 170, removal of the piles, materials of films 150 to 168 and so on, a shape of the memory plug holes 170 may become a forward taper shape (FIG. 85) or in a barrel shape (FIG. 86).

Figure 36:
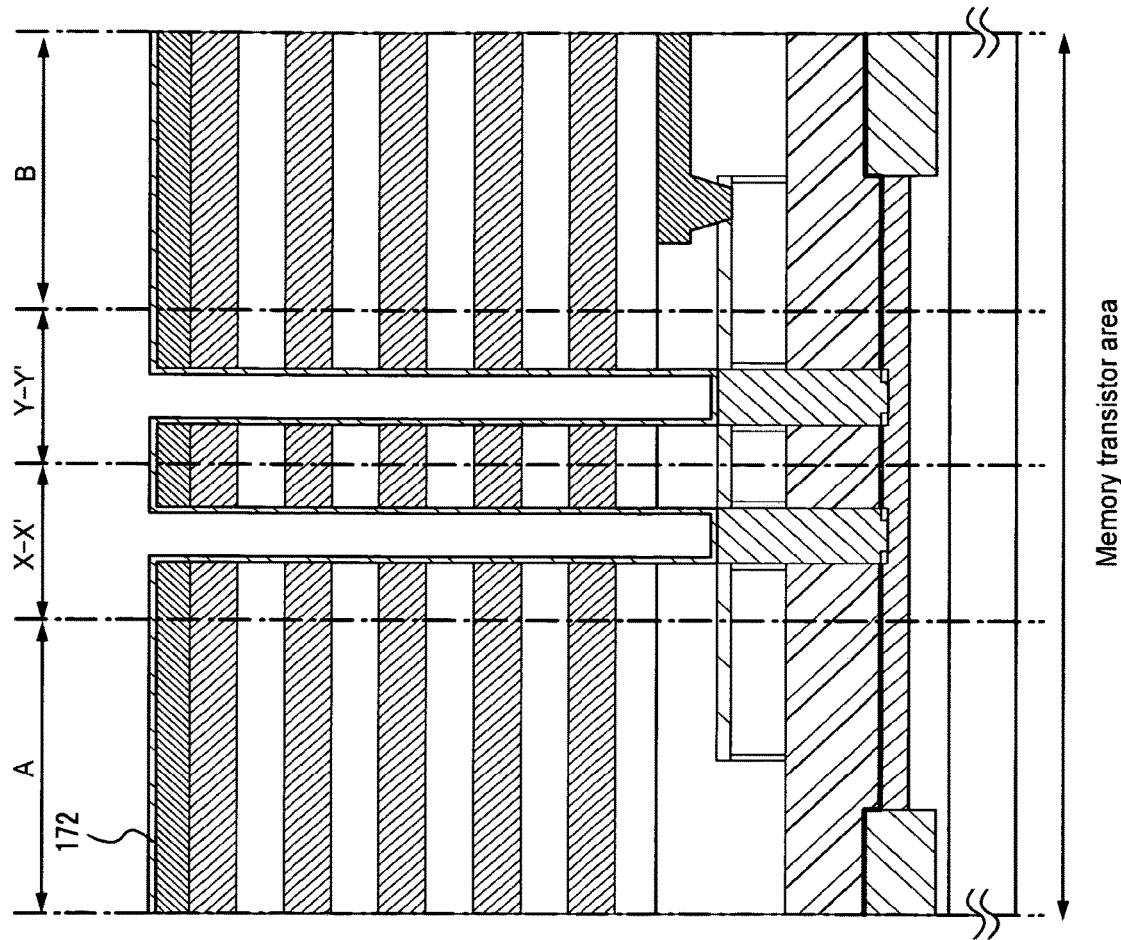
FIG. 36 is a diagram that shows a manufacturing process of the nonvolatile semiconductor memory device 1 according to one embodiment of the present invention.
Figure 36:
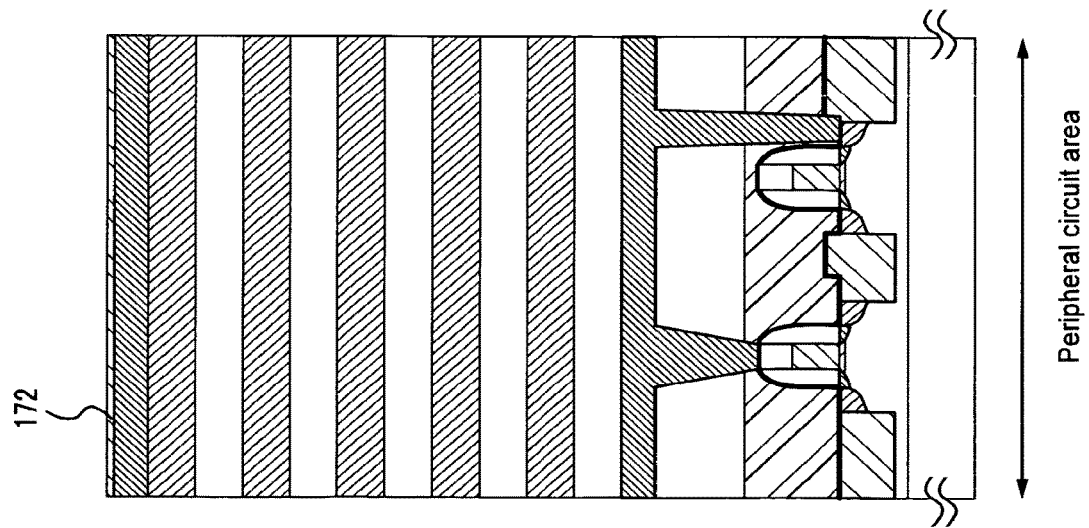

Next, a silicon oxide film, a silicon nitride film and silicon oxide film are sequentially laminating and thus what is called a ONO film 172 are formed (FIG. 36). The silicon nitride film in the ONO films 172 becomes a charge storage layer of the memory transistor.

Figure 37:
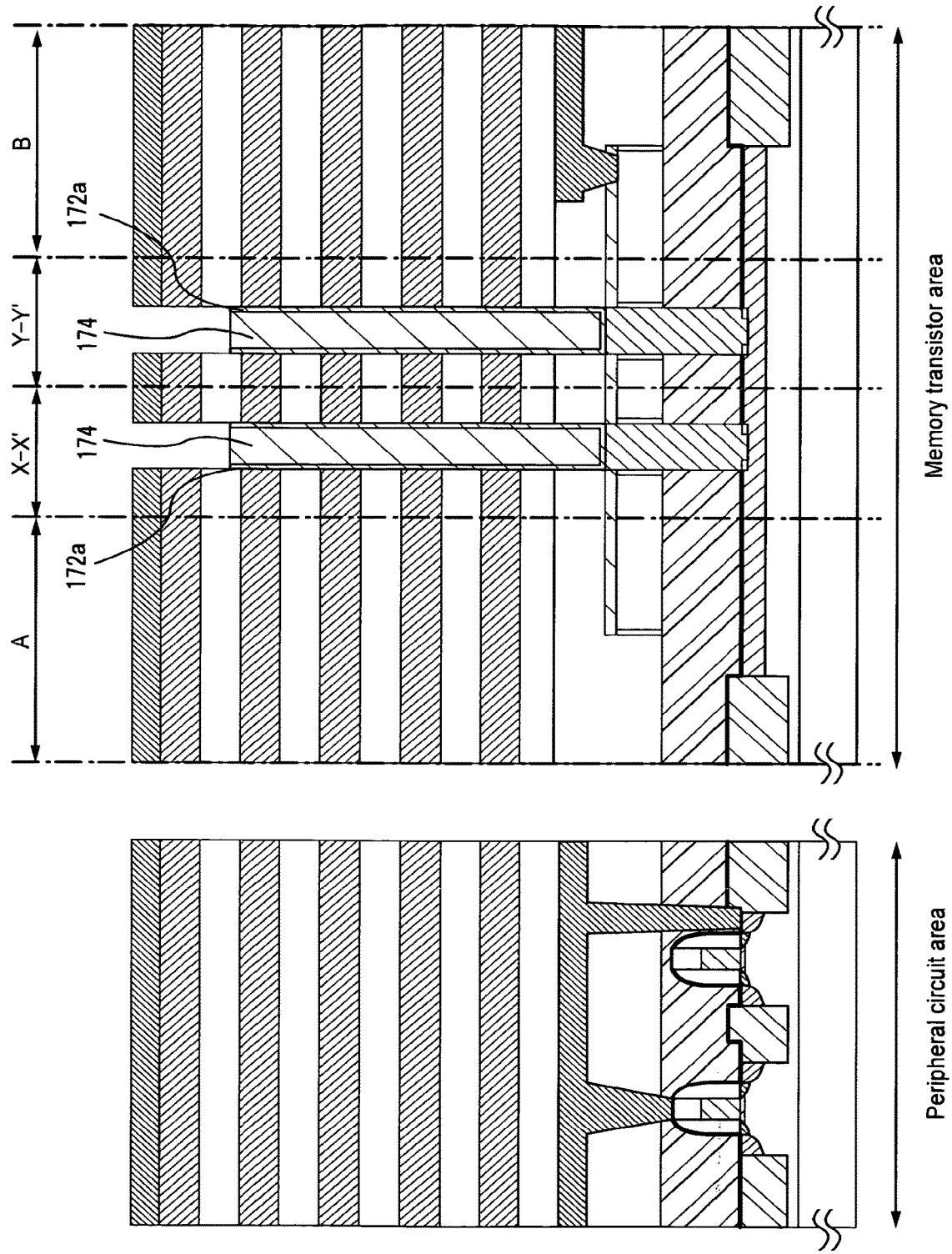
FIG. 37 is a diagram that shows a manufacturing process of the nonvolatile semiconductor memory device 1 according to one embodiment of the present invention.
Figure 38:
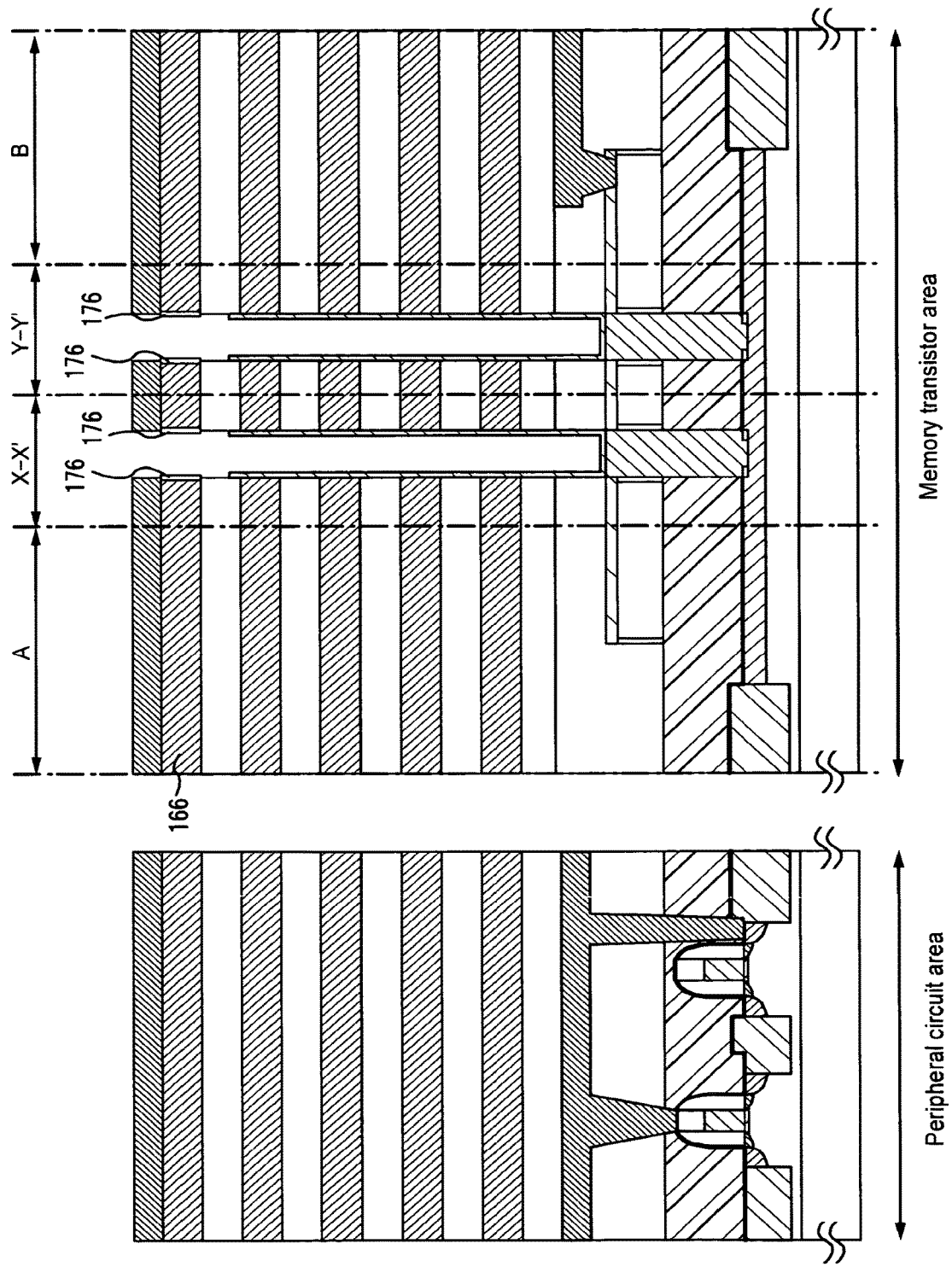
FIG. 38 is a diagram that shows a manufacturing process of the nonvolatile semiconductor memory device 1 according to one embodiment of the present invention.

Subsequently, by forming photoresist and performing etch back, a part of the ONO film 172 of the peripheral circuit area and the memory transistor area are removed. In the memory plug holes 170 of the memory transistor area, an ONO film 172*a* and a photo resist 174 are remained except for a layer (poly-silicon 166), in which the selection gate transistor SDTr is formed, and a part of the silicon oxide film 164 at the lower part of the poly-silicon layer 166 (FIG. 37).

Next, by removing photo resist 174 and performing heat treatment, a thermal oxidation film 176 is formed in the layer (FIG. 38), in which the selected gate transistor SDTr is formed (poly-silicon 166). In addition, instead of forming this thermal oxidation film, a silicon oxide film 176 may be formed by the CVD method.

Figure 39:
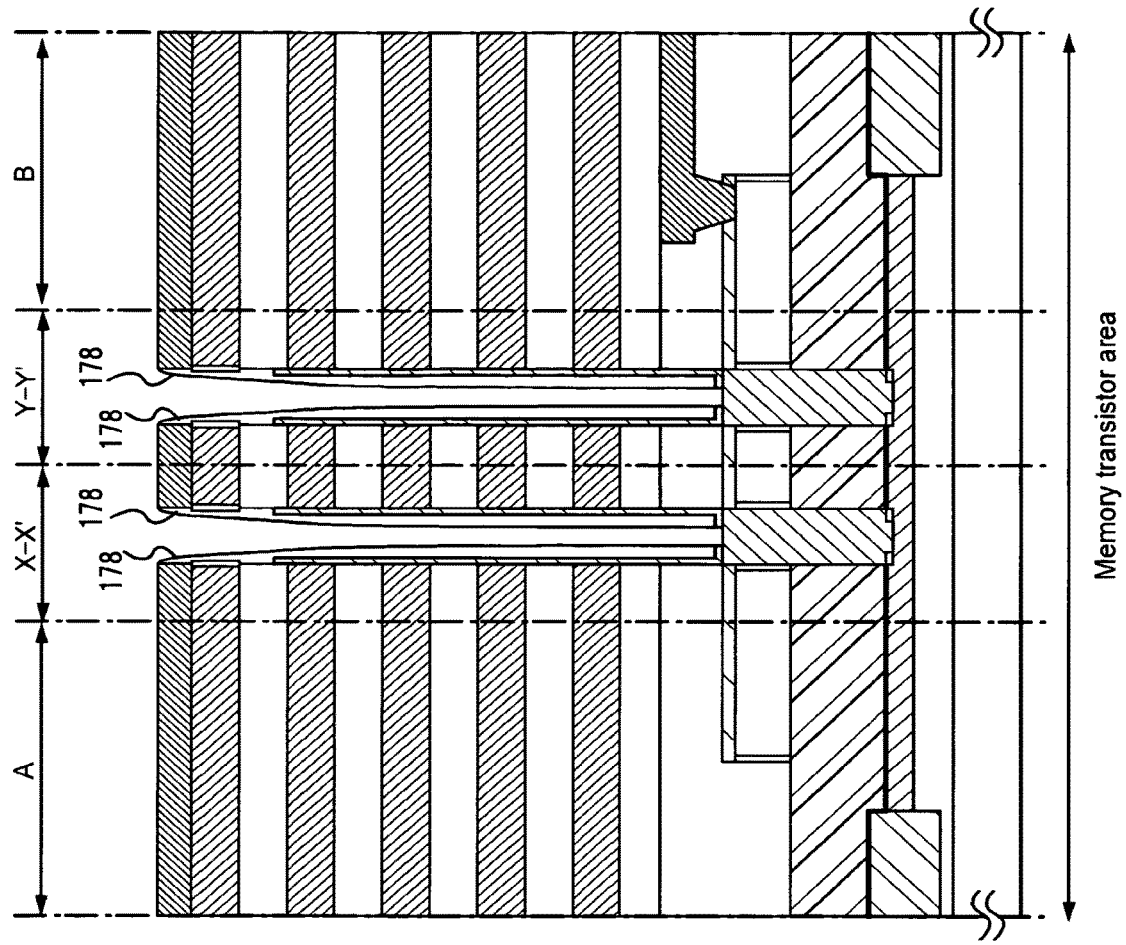
FIG. 39 is a diagram that shows a manufacturing process of the nonvolatile semiconductor memory device 1 according to one embodiment of the present invention.
Figure 39:
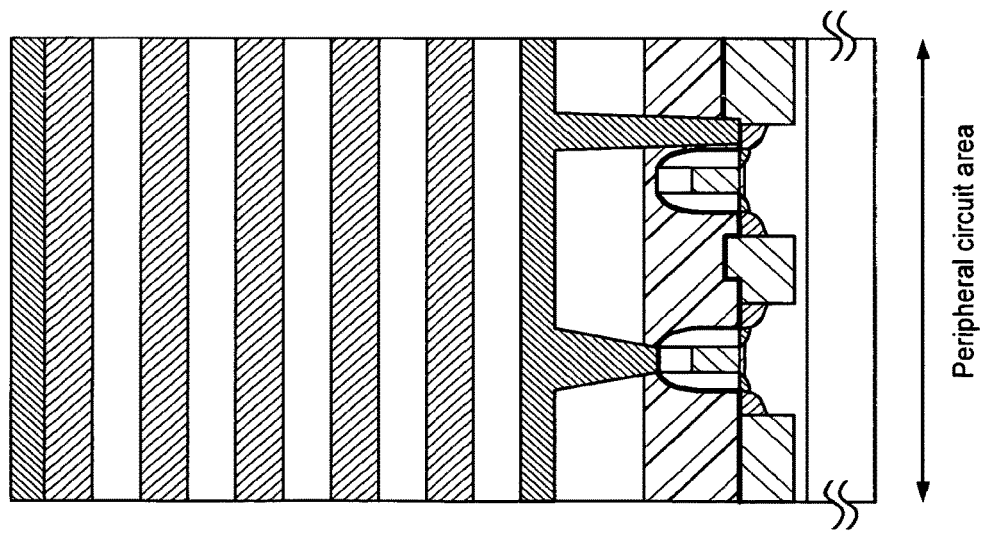

Subsequently, by forming a silicon nitride film on the whole substrate and performing anisotropic etching, spacer silicon nitride films 178 are formed (FIG. 39).

Figure 40:
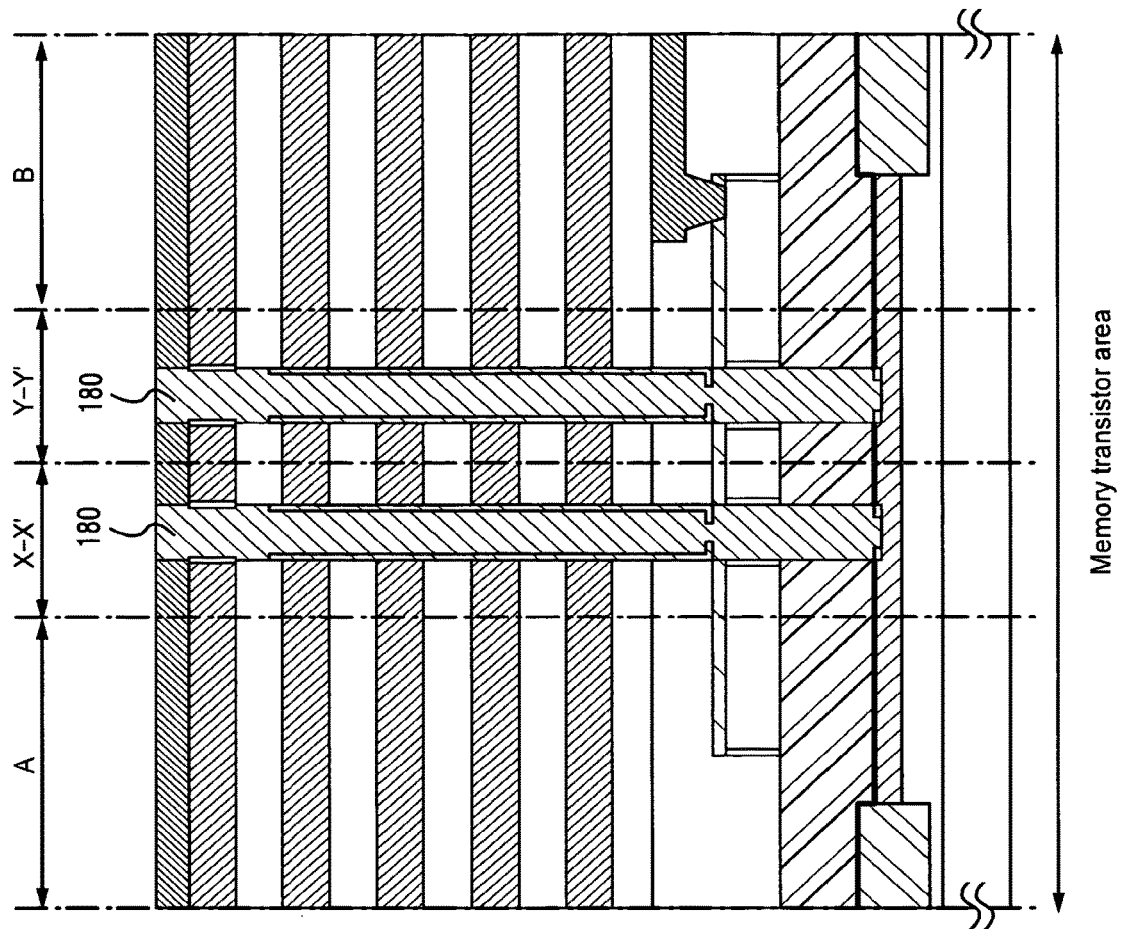
FIG. 40 is a diagram that shows a manufacturing process of the nonvolatile semiconductor memory device 1 according to one embodiment of the present invention.
Figure 40:
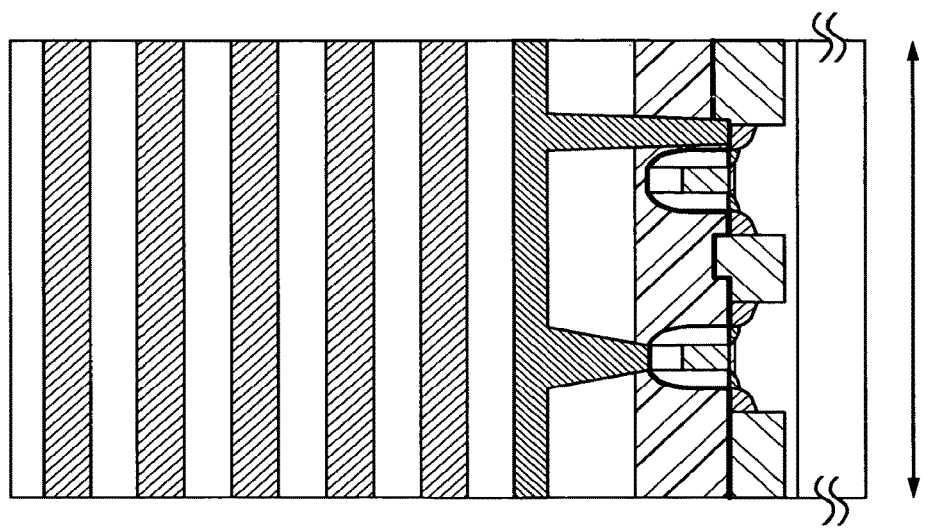

After removing the spacer silicon nitride films 178, by laminating amorphous silicon films and performing CMP treatment, a pillar shaped amorphous silicon layers 180 are formed (FIG. 40). In addition, instead of laminating the amorphous silicon films, poly-silicon is made to be grown with an epitaxial growth, by which poly-silicon layers 180 may be formed. Also, in the case that the poly-silicon are formed by selective epitaxial growth in the silicon inside of the lower layer selection gate transistor SSTr, monosilicon 180 may be formed by the selective epitaxial growth method.

Figure 41:
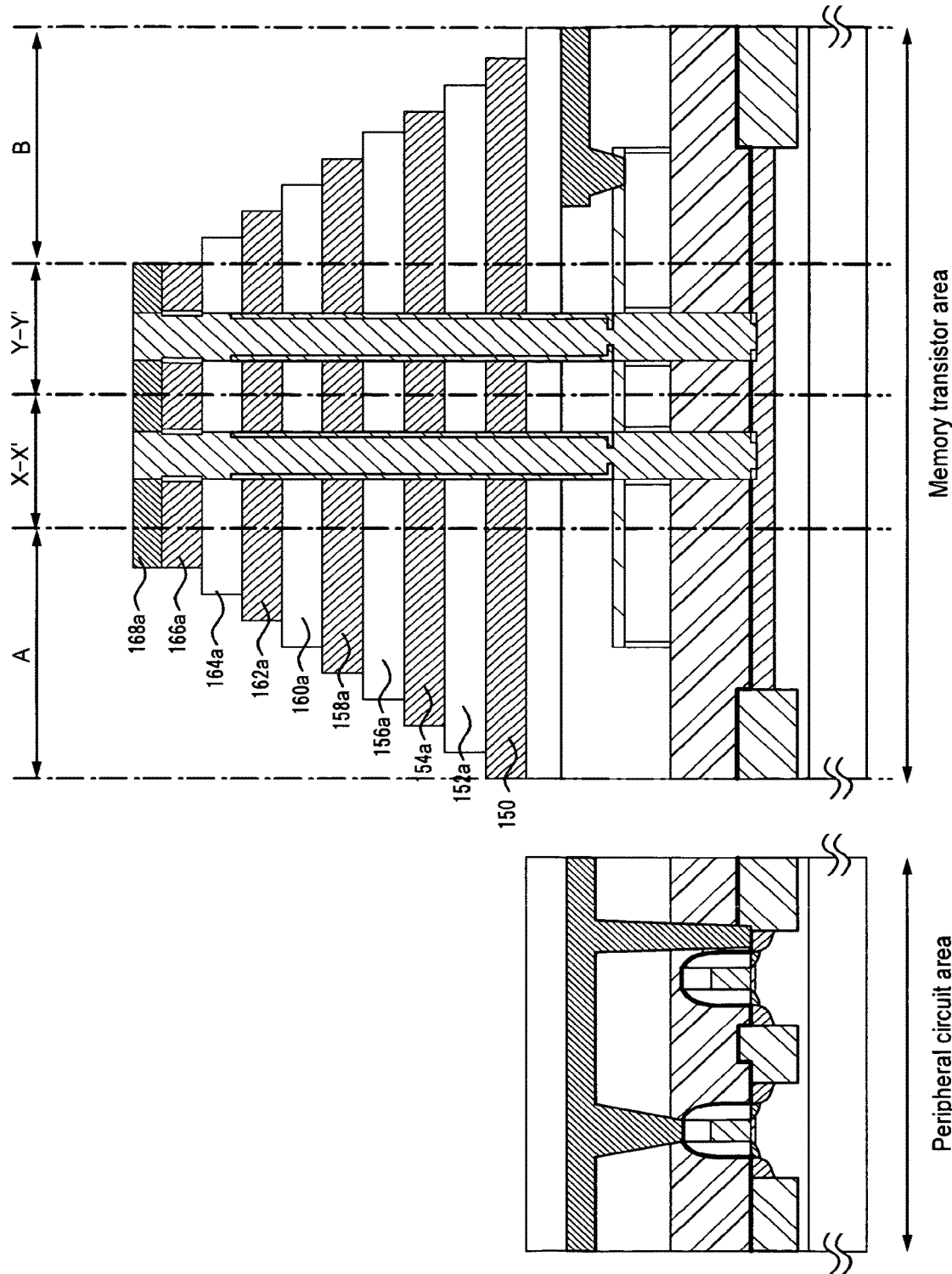
FIG. 41 is a diagram that shows a manufacturing process of the nonvolatile semiconductor memory device 1 according to one embodiment of the present invention.

A taper etching is performed to silicon nitride 168; poly-silicon films 150, 154, 158, 162 and 166, and the silicon oxide films 152, 156, 160 and 164 so that the edge parts of each layer become stepwise shapes. Thus, silicon nitride film 168a, poly-silicon film 150, 154a, 158a, 162a and 166a, and silicon oxide films 152a, 156a 160a and 164a are formed (FIG. 41).

Figure 42:
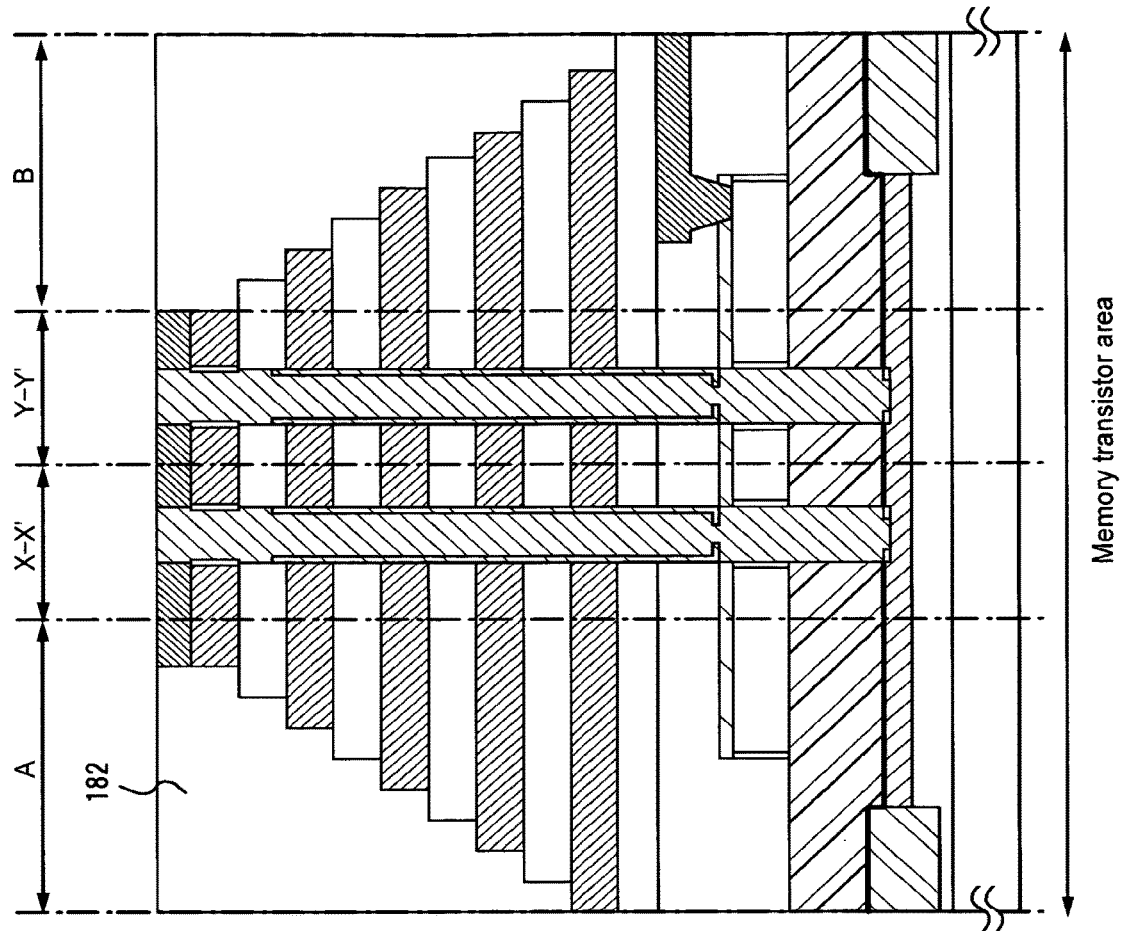
FIG. 42 is a diagram that shows a manufacturing process of the nonvolatile semiconductor memory device 1 according to one embodiment of the present invention.
Figure 42:
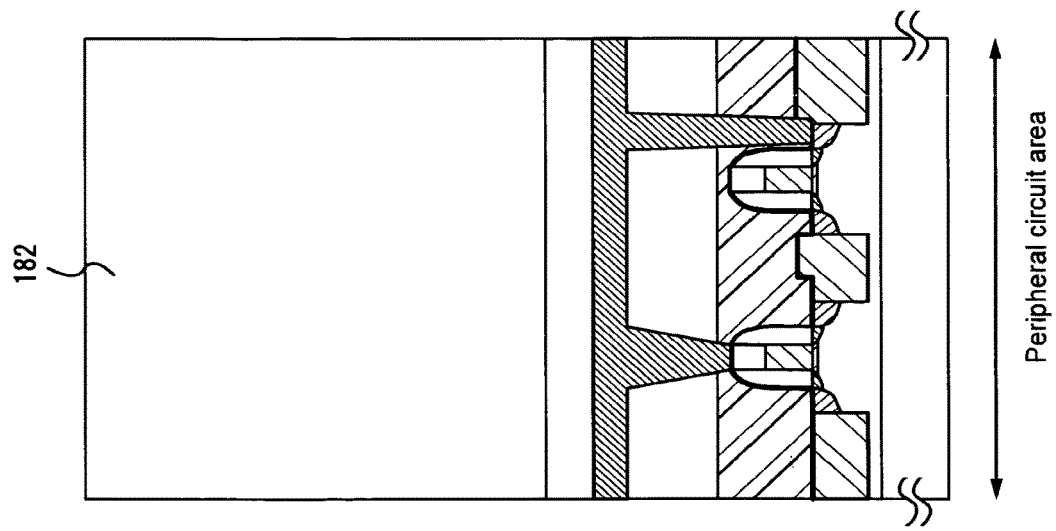

Next, interlayer insulation film (BPSG) 182 is formed, performing CMP treatment, and planarized (FIG. 42).

Figure 11:
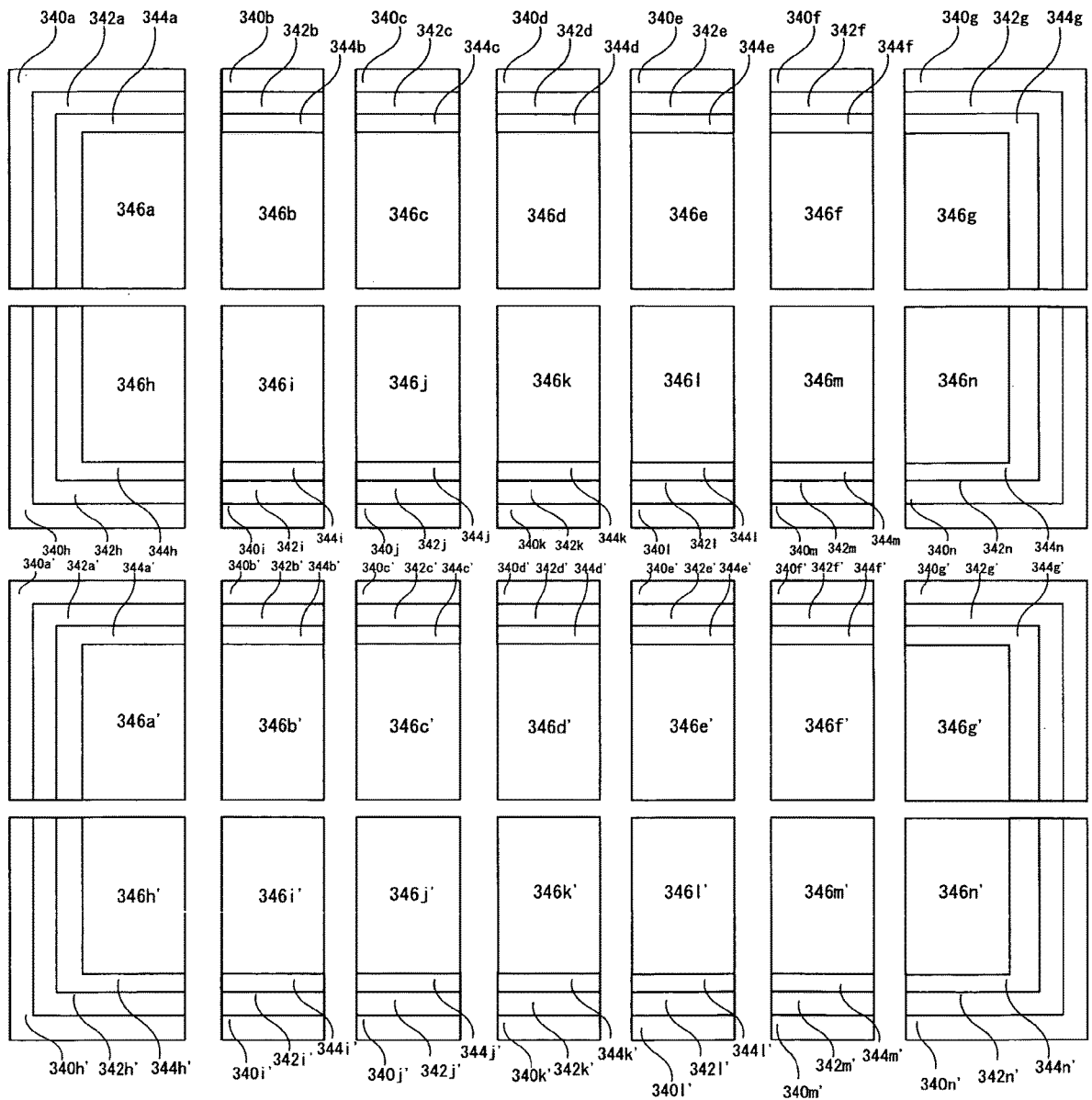
FIG. 11 is a diagram that shows a plurality of adjacent memory transistor areas in the nonvolatile semiconductor memory device 1 according to one embodiment of the present invention.
Figure 80:
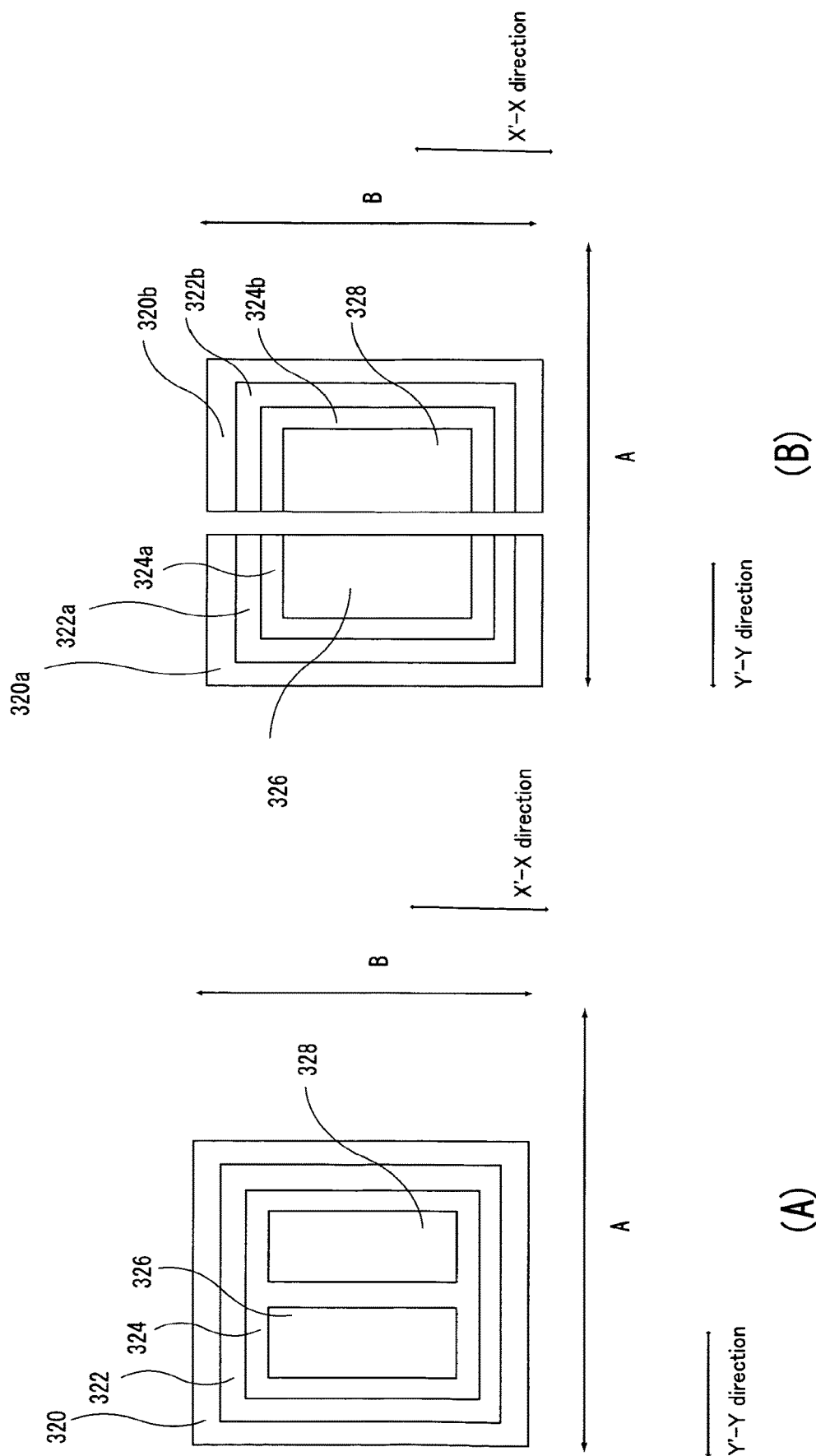
FIG. 80 is a diagram that shows two adjacent memory transistor areas in the nonvolatile semiconductor memory device 1 according to one embodiment of the present invention.
Figure 90:
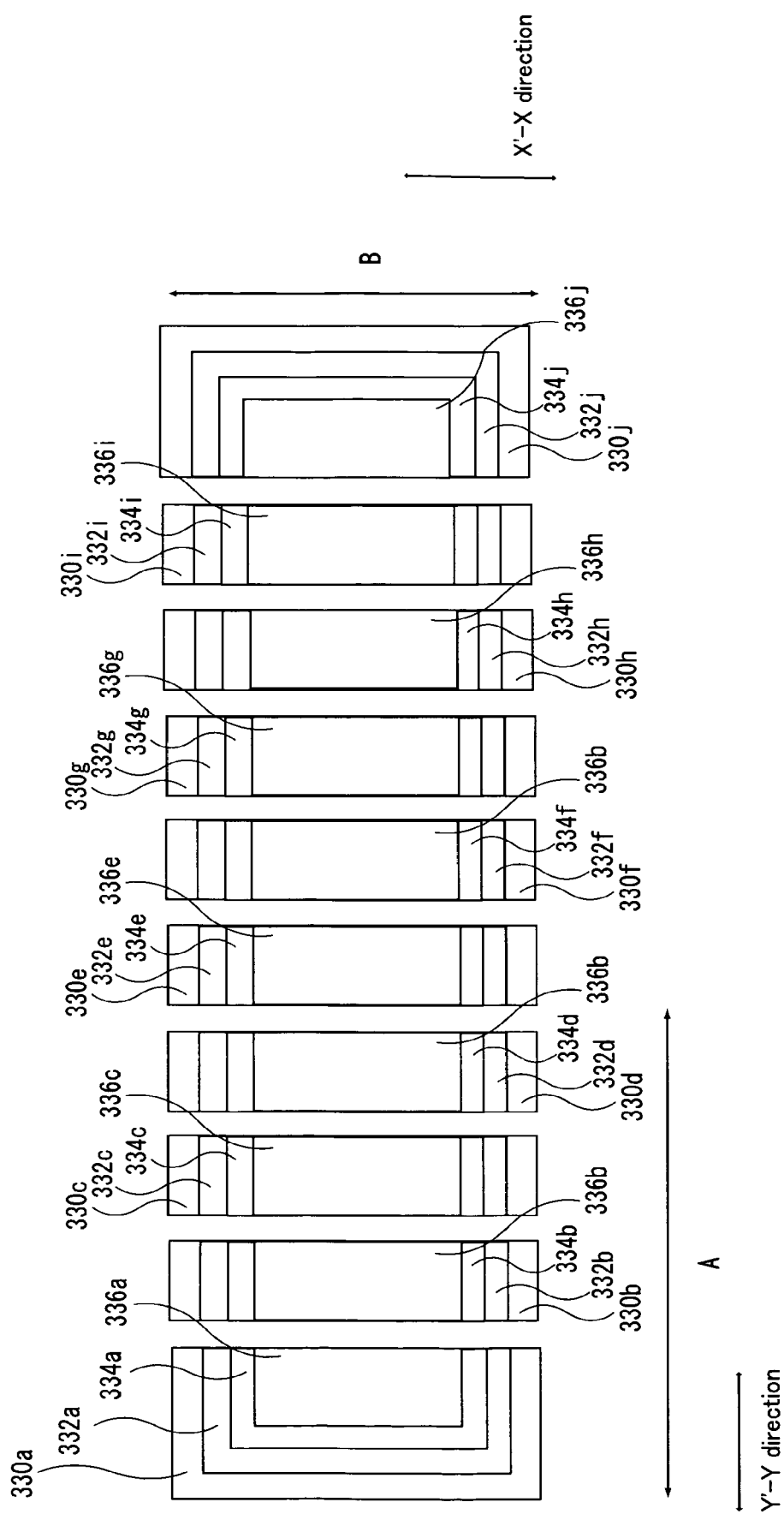
FIG. 90 is a diagram that shows a plurality of adjacent memory transistor areas in the nonvolatile semiconductor memory device 1 according to one embodiment of the present invention.

Here, the memory transistor area may be divided as shown in FIG. 80 (B), FIG. 90 or FIG. 11. At the time, after forming the interlayer insulation film (BPSG) 182 and planarizing the BPSG with CMP, division patterns of the memory transistor are formed with a photolithography method and thus conductive films 150, 154, 158, 162 and 166, and the interlayer insulation films 152, 156, 160, 164 and 168, are etched. Then, by laminating the interlayer insulation films (BPSG) again and planarizing it, array divisions like FIG. 80 (B) or FIG. 90 are formed. Further, in case of performing the array division, the silicon substrate 100 of the memory area may be divided in advance into the area at the same degree of the array divided by the STI102; or the silicon substrate 100 may as well be divided.

Figure 43:
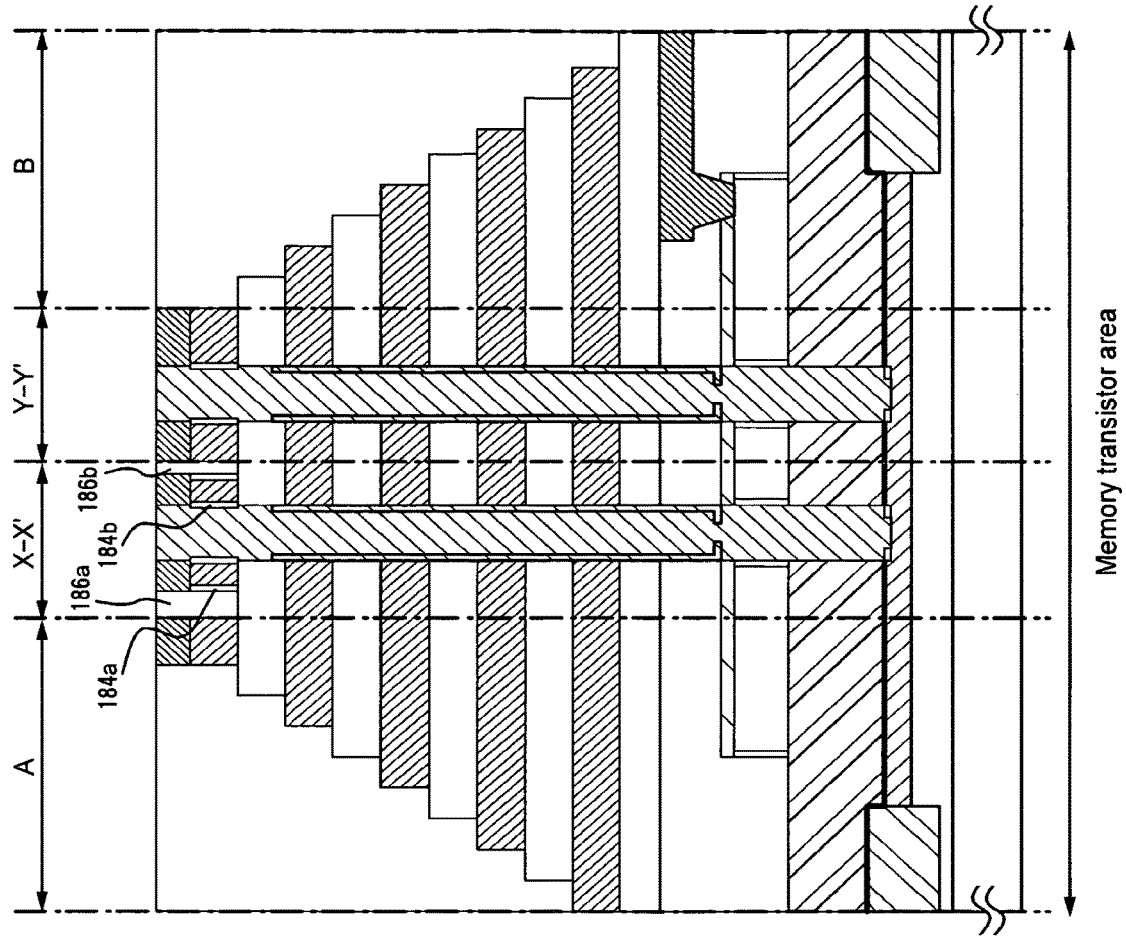
FIG. 43 is a diagram that shows a manufacturing process of the nonvolatile semiconductor memory device 1 according to one embodiment of the present invention.
Figure 43:
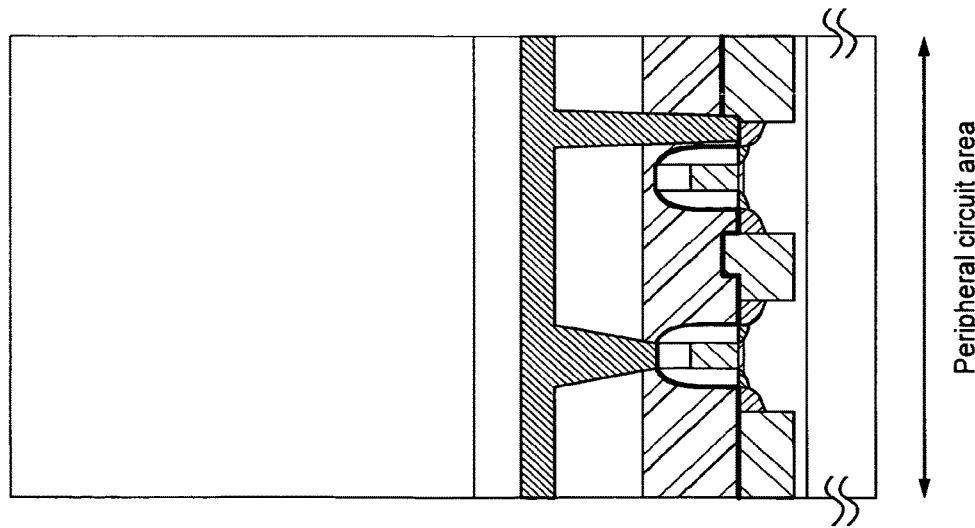

Next, by photo etching process, the layer of the selection gate transistor SDTr is divided, and the interlayer insulation films are laminated into the area 186a and 186b (FIG. 43).

Figure 44:
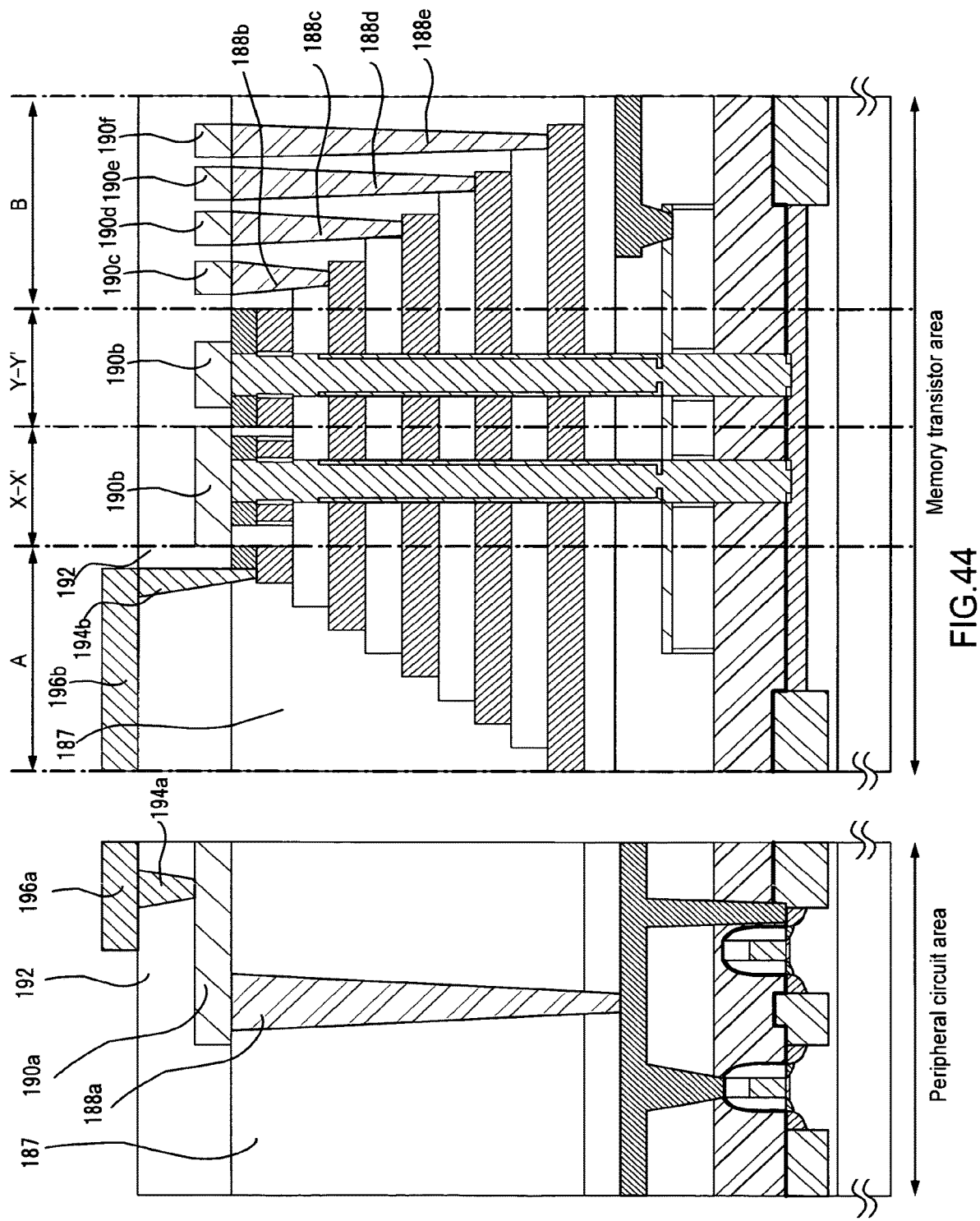
FIG. 44 is a diagram that shows a manufacturing process of the nonvolatile semiconductor memory device 1 according to one embodiment of the present invention.

Subsequently, the interlayer insulation films (BPSG) 182 are removed, titan films are formed, and the heat treatment is performed, and thus titan silicide films are formed. In addition, instead of titan silicide films, cobalt silicide or nickel silicide etc. may be used, or the silicides may as well be not formed. And silicon oxide films 187 as the primetal insulation films (PMD) are formed; the CMP is performed; and then planarized (FIG. 44). Afterwards by photo etching process, contact holes are formed; tungsten films are formed; and the CMP treatment is performed. Thus, tungsten plugs 188a, 188b, 188c, 188d and 188e are formed (FIG. 44).

Next, an aluminum (Al) films is formed and, via photo etching process, electrodes 190a, 190c, 190d, 190e and 190f are formed (FIG. 44).

Subsequently, interlayer insulation films (BPSG) are formed; the CMP treatment is performed; and then planarized (FIG. 44). Afterwards by photo etching process, contact holes are formed, tungsten films are formed, and the CMP treatment is performed; thus tungsten plugs 196a and 196b are formed (FIG. 44). And the aluminum film (Al) is formed and, via photo etching process, electrodes 196a and 190b are formed (FIG. 44).

By the above-described process, the nonvolatile semiconductor memory device 1 of the present invention according to this embodiment may be manufactured.

According to the nonvolatile semiconductor memory device according to one embodiment of the present invention and the manufacturing method thereof, by forming the word lines with a common conductor layer per each layer, the number of the word lines drive may be reduced, and thus reduction of the chip area may be realized.

Also in the nonvolatile semiconductor memory device according to one embodiment of the present invention and the manufacturing method thereof, a plurality of vertical type transistors that are connected in series may be formed by 1 PEP, by laminating the lamination films corresponding to the number of the lamination layers of the memory transistors in advance and formation hole patterns in a lump.

Also in the nonvolatile semiconductor memory device according to one embodiment of the present invention and the manufacturing method thereof, it is necessary to connect the selection gates to the upper and lower parts a plurality of vertical type transistors that are connected in series to operate. Formation of the series structure with the plurality of the vertical type transistors that are connected in series to the selection gates can be performed simultaneously with PEP of 1 or 2 a (memory transistor formation holes PEP).

Also in the nonvolatile semiconductor memory device according to one embodiment of the present invention and the manufacturing method thereof, the selection gate SGS of a plurality of vertical type transistors that are connected in series and the word lines WL of each memory transistor can be set always to be a common potential per each layer. Therefore in either of the selection gate lines SGS and the word lines WL, a layer structure may be adopted. Thereby the word lines can be formed by rough PEP, by which the manufacturing process is simplified, thus cost reduction may be realized.

Second Embodiment

In this embodiment, the manufacturing process of another example of the nonvolatile semiconductor memory device of the present invention will be explained using FIG. 45 to FIG. 77. Further in FIG. 45 to FIG. 77, as well as with the first embodiment, a peripheral circuit area, in which peripheral circuits such as a word line driver circuit and a sense amplifier circuit are formed, is shown at the left side; a memory transistor area is shown at the right side. In the memory transistor area, area A part, area B part, and parts equivalent to the cross section of X-X' and Y-Y' are shown.

Figure 45:
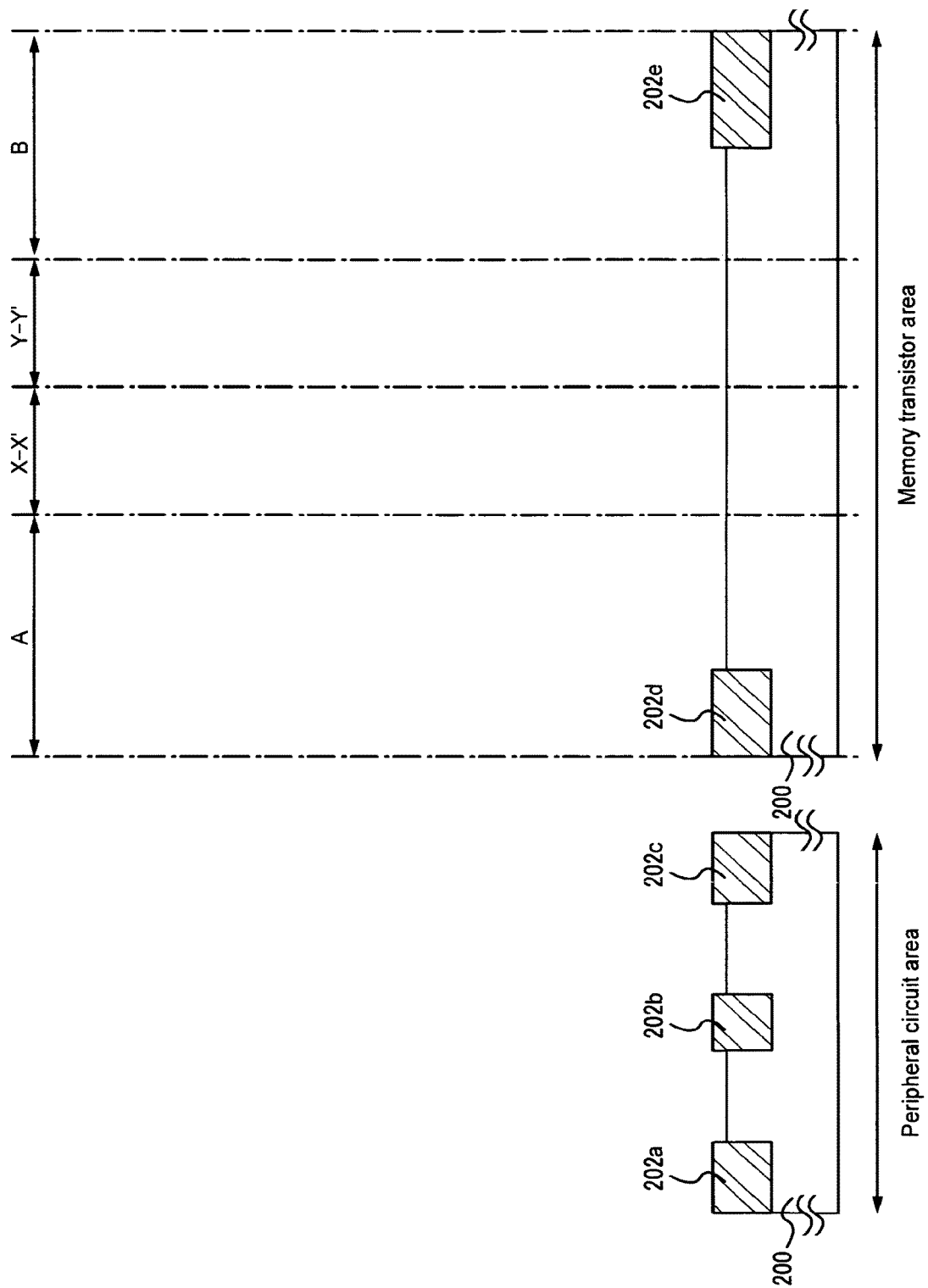
FIG. 45 is a diagram that shows a manufacturing process of the nonvolatile semiconductor memory device 1 according to one embodiment of the present invention.

First, FIG. 45 is shown. By the same method with the first embodiment, STI202a, 202b, 202c, 202d, 202e are formed on the semiconductor substrate 200 are formed (FIG. 45).

Figure 46:
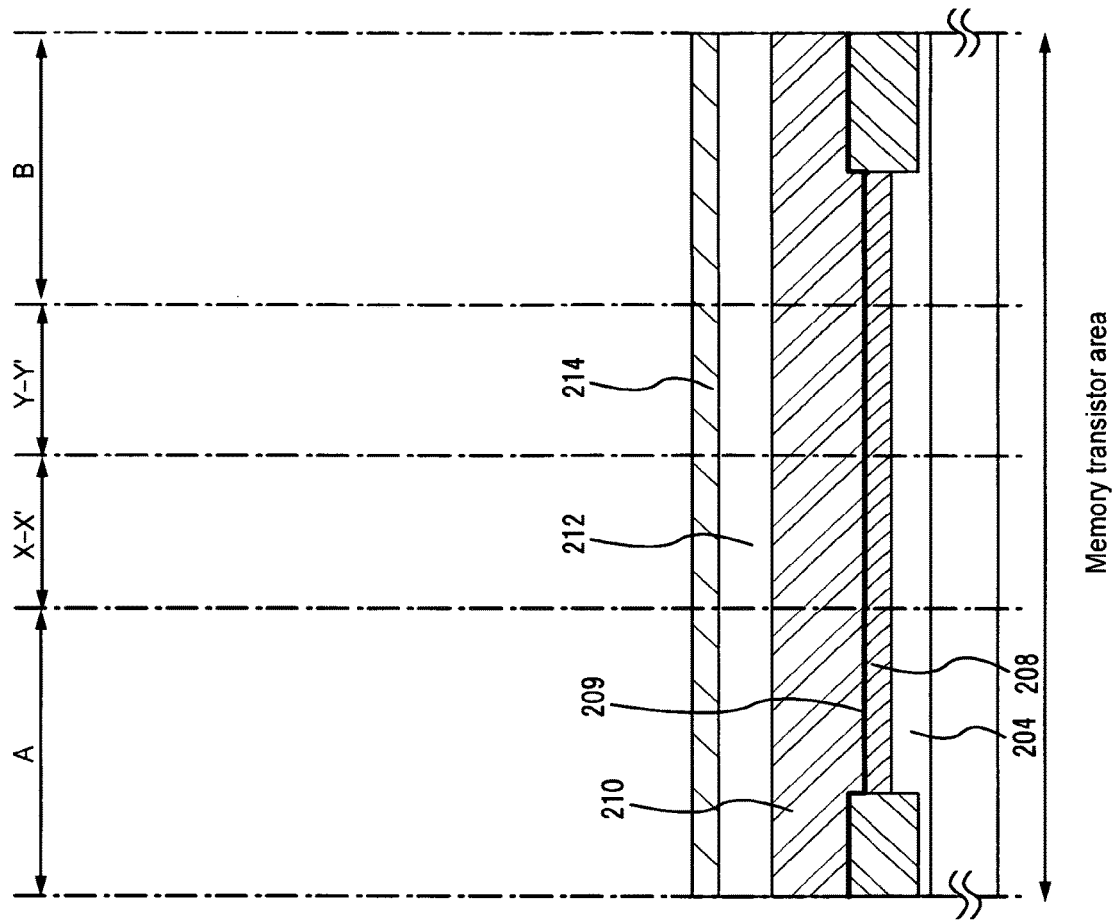
FIG. 46 is a diagram that shows a manufacturing process of the nonvolatile semiconductor memory device 1 according to one embodiment of the present invention.
Figure 46:
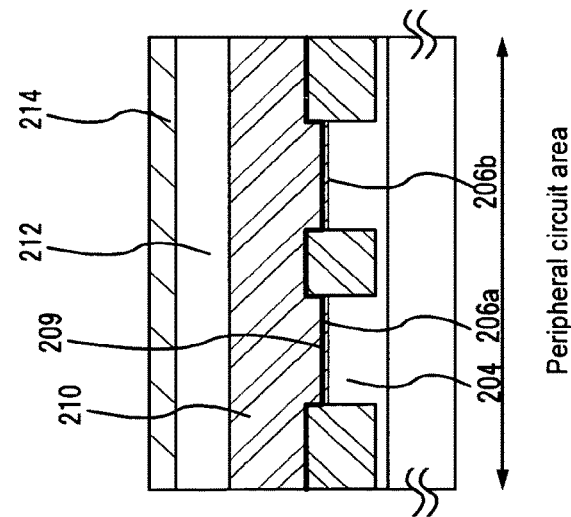

Next, sacrificial oxidation is performed on the substrate surface (not shown in the figures), and after the photo resist patterns are formed at the desired position, boron (B) ions are implanted, and thus P-Well area 204 is formed (FIG. 46). Also, after forming the photo resist pattern are formed at the desired position, boron (B) ions are implanted near the surface of the substrate 200 and thus channel implant area 206a and 206b are formed, which adjusts threshold Vth of the transistor. Here in addition, like the first embodiment 1, the transistor that is formed at the peripheral circuit area shows an example of the N-channel type transistor, in which N-Well area are formed by implanting ions that add N-type in the desired area, and thus P-channel type transistor is formed (not shown in the figures).

Next, photo etching process, by which only the memory transistor area is opened, is performed; phosphorus (P) ions are implanted at the desired position of the memory transistor area; and thus a thick n+ area 208 is formed (FIG. 46). The n+ diffusion area 208 becomes the source line SL.

Next, silicon nitride film 209 (barrier silicon nitride film) is formed on the whole surface of the substrate, then subsequently, TEOS film or BPSG film 210 are formed on the whole surface of the substrate (FIG. 46).

Next, poly-silicon (p-Si) film 212 is formed, in which conductive type impurities such as phosphorus (P) are added on the whole surface of the substrate, and subsequently, silicon nitride film 214 is formed on the whole surface of the substrate (FIG. 46).

Figure 47:
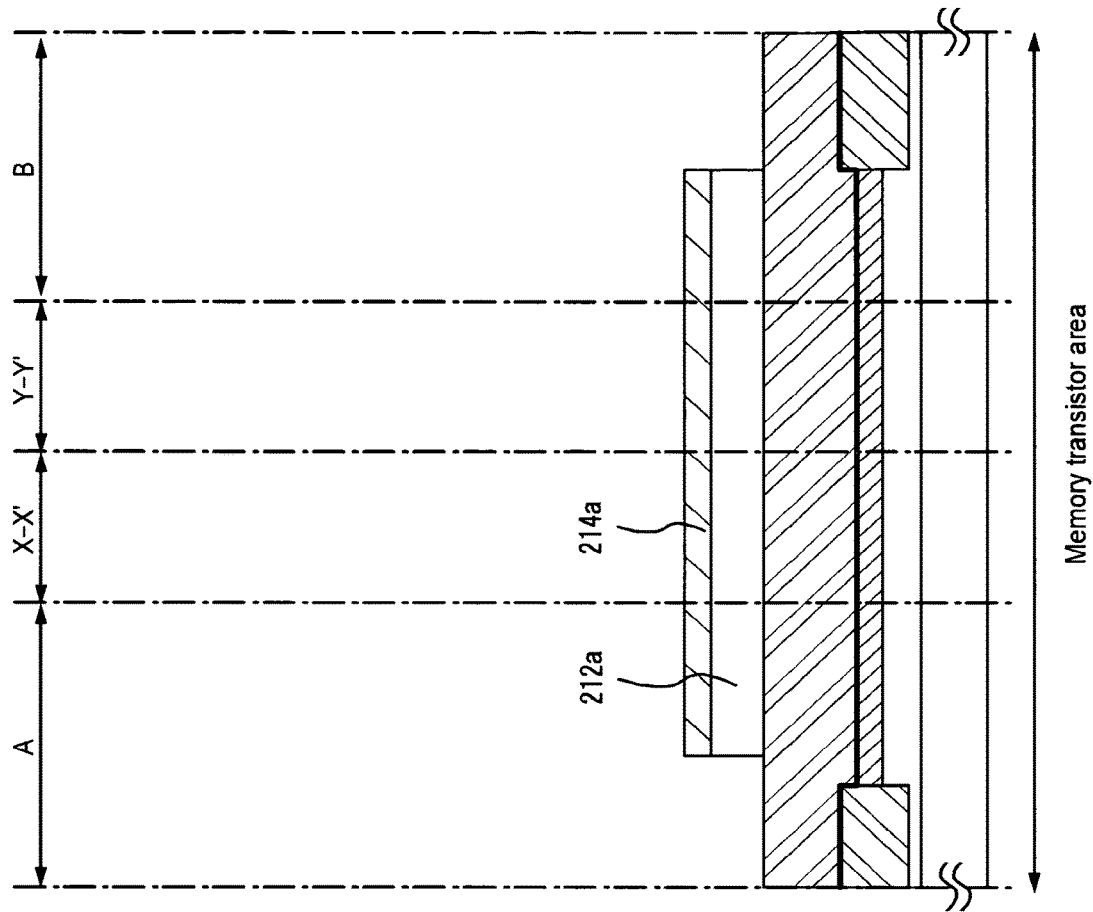
FIG. 47 is a diagram that shows a manufacturing process of the nonvolatile semiconductor memory device 1 according to one embodiment of the present invention.

Next, photo resist is formed at the desired pattern, the poly-silicon film 212 and the silicon nitride film 214 are etched with a photolithography process, and thus a poly-silicon film 212a and a silicon nitride film 214a are formed (FIG. 47).

Figure 48:
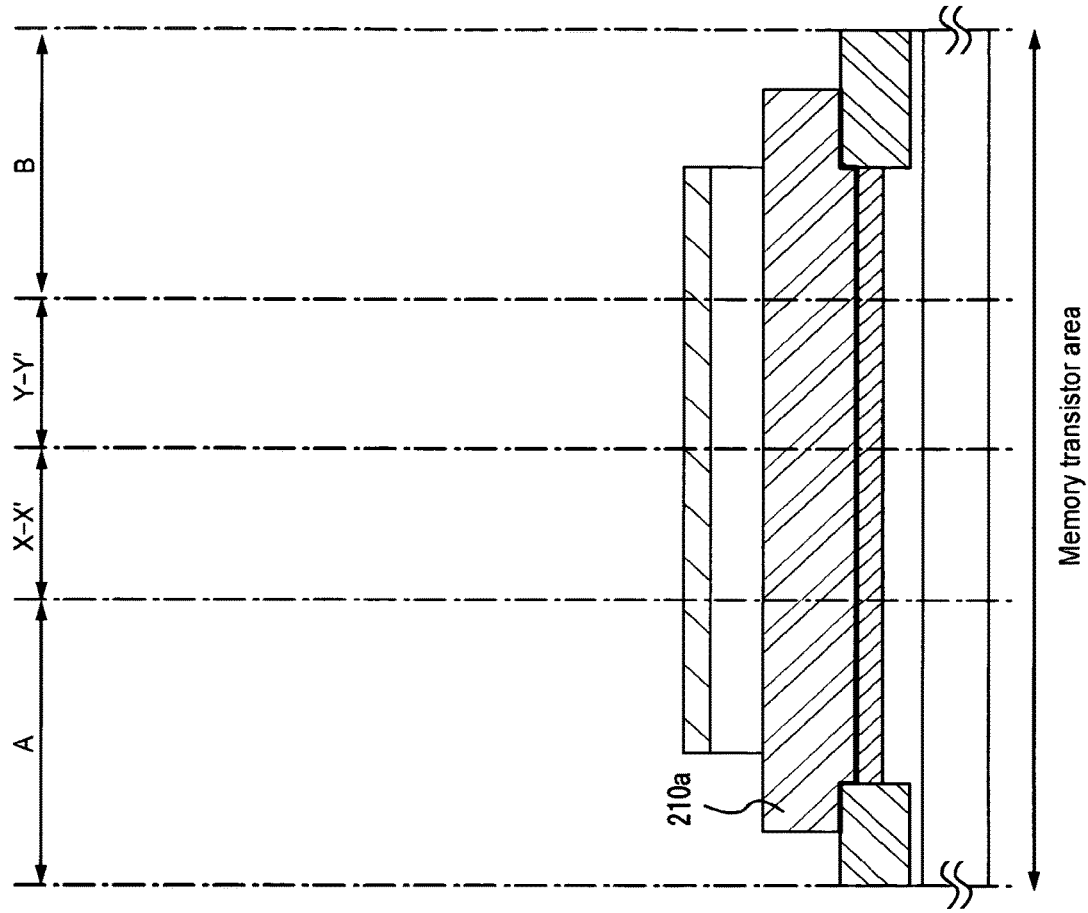
FIG. 48 is a diagram that shows a manufacturing process of the nonvolatile semiconductor memory device 1 according to one embodiment of the present invention.
Figure 48:
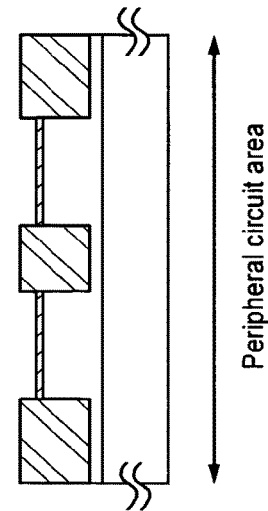

Next, photo resist mask (not shown in the figures) is formed at the place except for the peripheral circuit area; using the photo resist mask, a silicon oxide film 210 and a silicon nitride film (barrier silicon nitride film) 209 are etched, silicon nitride film 210a at the memory transistor area is made remained; and the silicon oxide film 210 and the silicon nitride film (barrier silicon nitride film) of the peripheral circuit area are removed (FIG. 48). Then subsequently, photo resist mask (not shown in the figures) is removed.

Subsequently, by removing a sacrificial oxidation film (not shown in the figures) and performing heat treatment, the first thermally-oxidized film (not shown in the figures) is formed.

Figure 49:
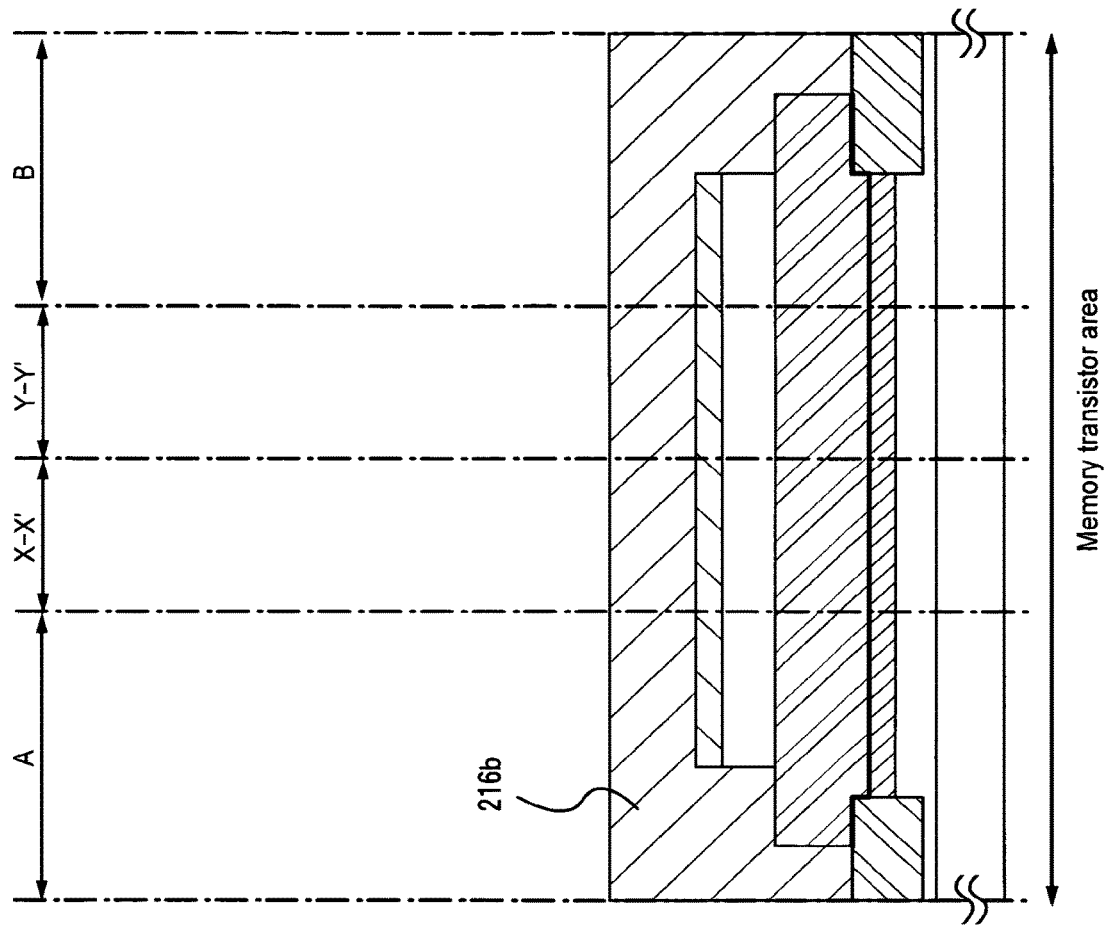
FIG. 49 is a diagram that shows a manufacturing process of the nonvolatile semiconductor memory device 1 according to one embodiment of the present invention.
Figure 49:
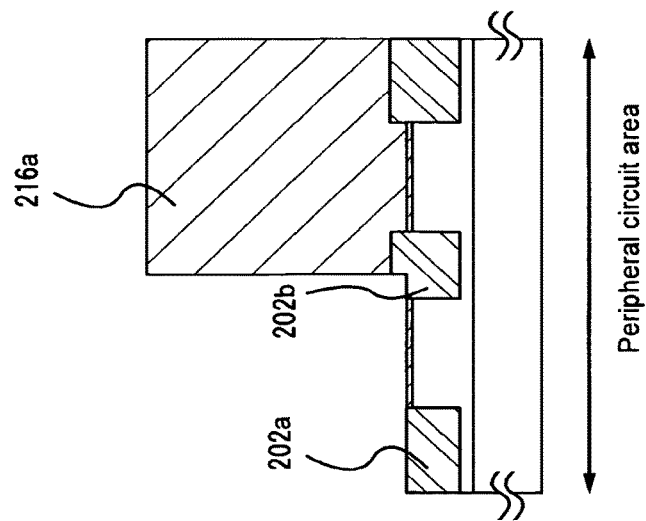

Next, by forming a photo resist mask 216a and 216b in the desired pattern and performing wet etching, a part of first thermally-oxidized films, STI202a and 202b are removed by etching (FIG. 49). A thin film transistor for high speed operation is formed in the area removed by etching; and a thick film gate transistor for high voltage resist will be formed at the part, where no removal by the etching are performed.

Afterwards by removing the photo resist mask 216a and 216b and performing heat treatment, a second thermally-oxidized film (not shown in the figures) is formed.

Figure 50:
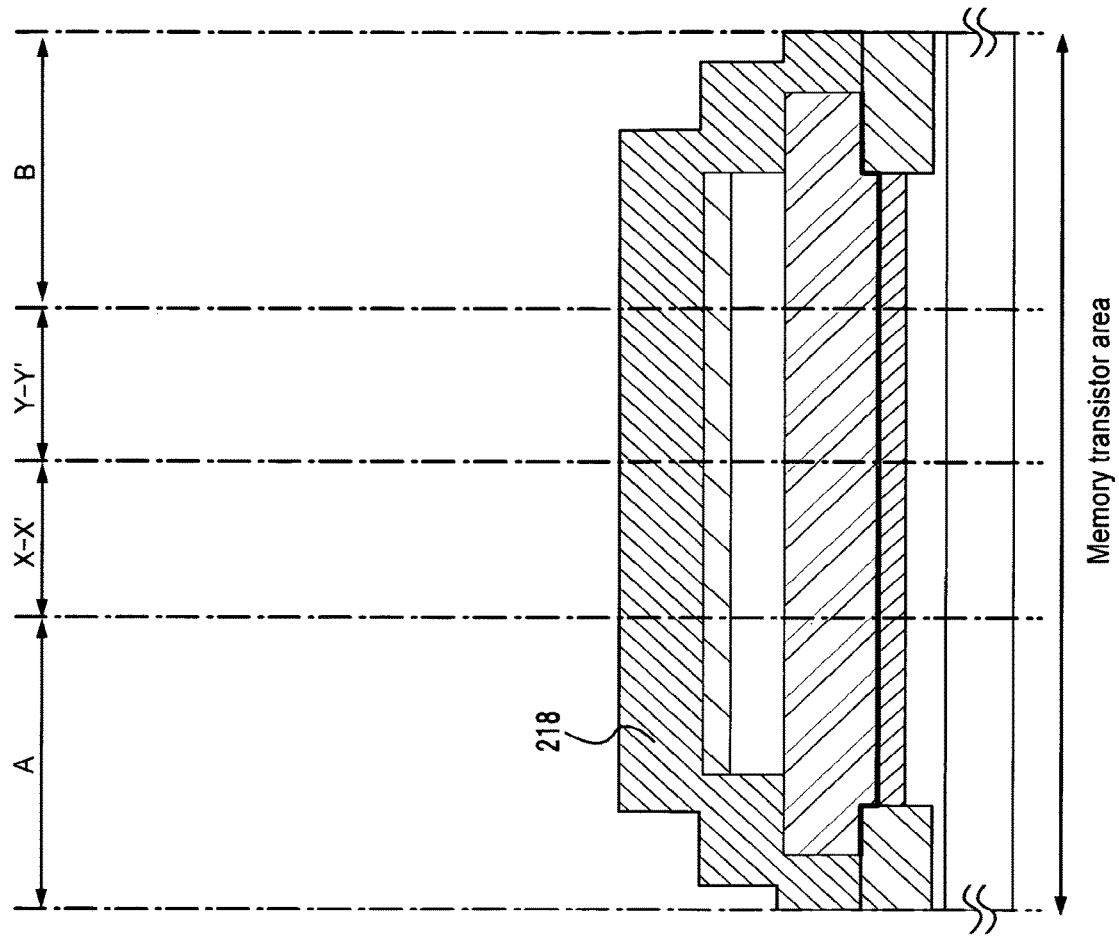
FIG. 50 is a diagram that shows a manufacturing process of the nonvolatile semiconductor memory device 1 according to one embodiment of the present invention.
Figure 51:
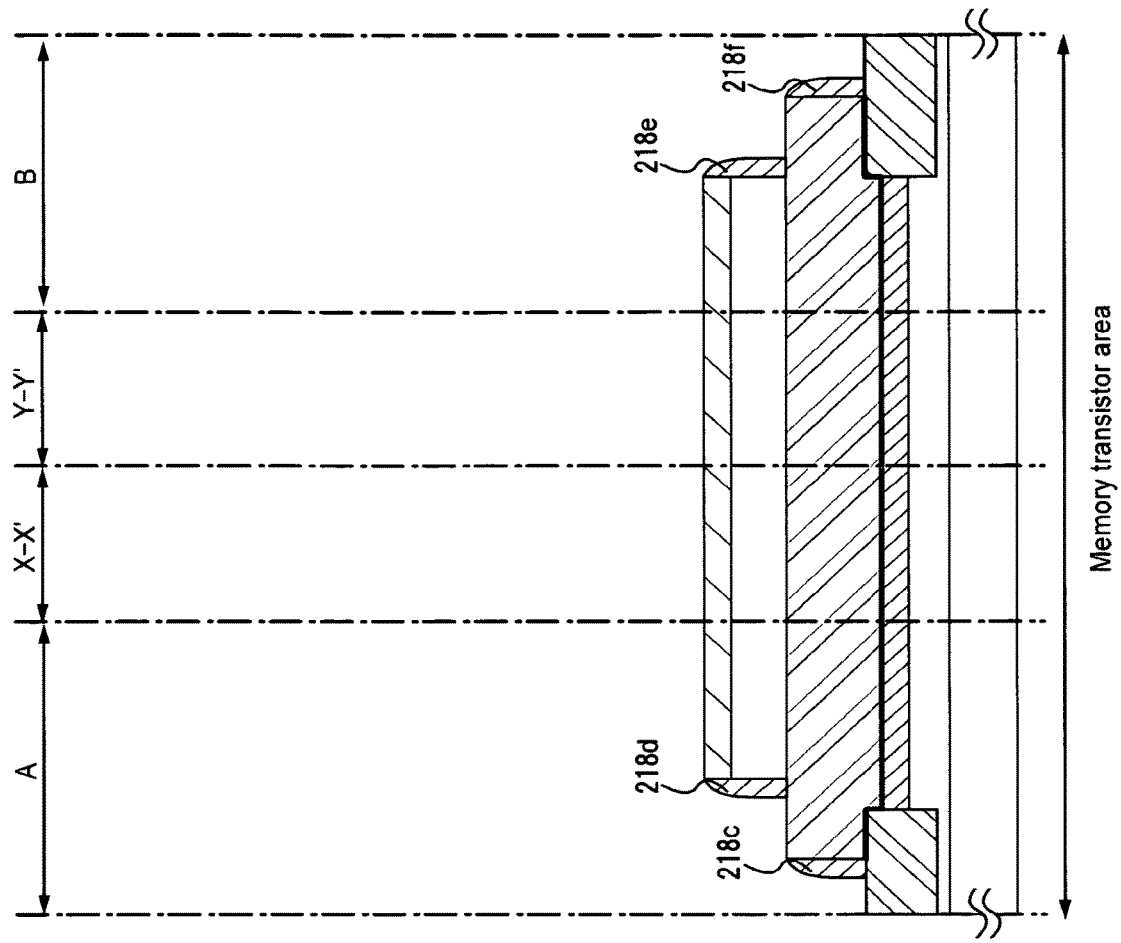
FIG. 51 is a diagram that shows a manufacturing process of the nonvolatile semiconductor memory device 1 according to one embodiment of the present invention.

Subsequently, a poly-silicon film 218, in which conductive impurities such as P (phosphorus) are added, are formed (FIG. 50). Then a poly-silicon film 218 is etched with a predetermined pattern and thus gate electrodes 218a and 218b of the peripheral circuit area are formed (FIG. 51). At this time, in the memory transistor area, poly-silicon films 218c, 218d, 218e and 218f may as well remain upon etching condition.

Then photo resist is formed in the P-channel type transistor of the peripheral circuit area and the memory transistor area (not shown in the figures); As ions or P ions are implanted into the N-channel type transistor area of the peripheral circuit area; the N-type areas 220a, 220b, 220c and 220d that are automatically shallow with the gate electrodes 218a and 218b are formed (FIG. 51); then photo resist is removed.

Next, a photo resist is formed in the N-channel type transistor area of the peripheral circuit area and the memory transistor area (not shown in the figures); in the P-channel type transistor area of the peripheral circuit area, for example B ions are implanted; P-type areas (not shown in the figures) that is automatically shallow with the gate electrodes (not shown in the figures) are formed; then, photo resist is removed.

Figure 52:
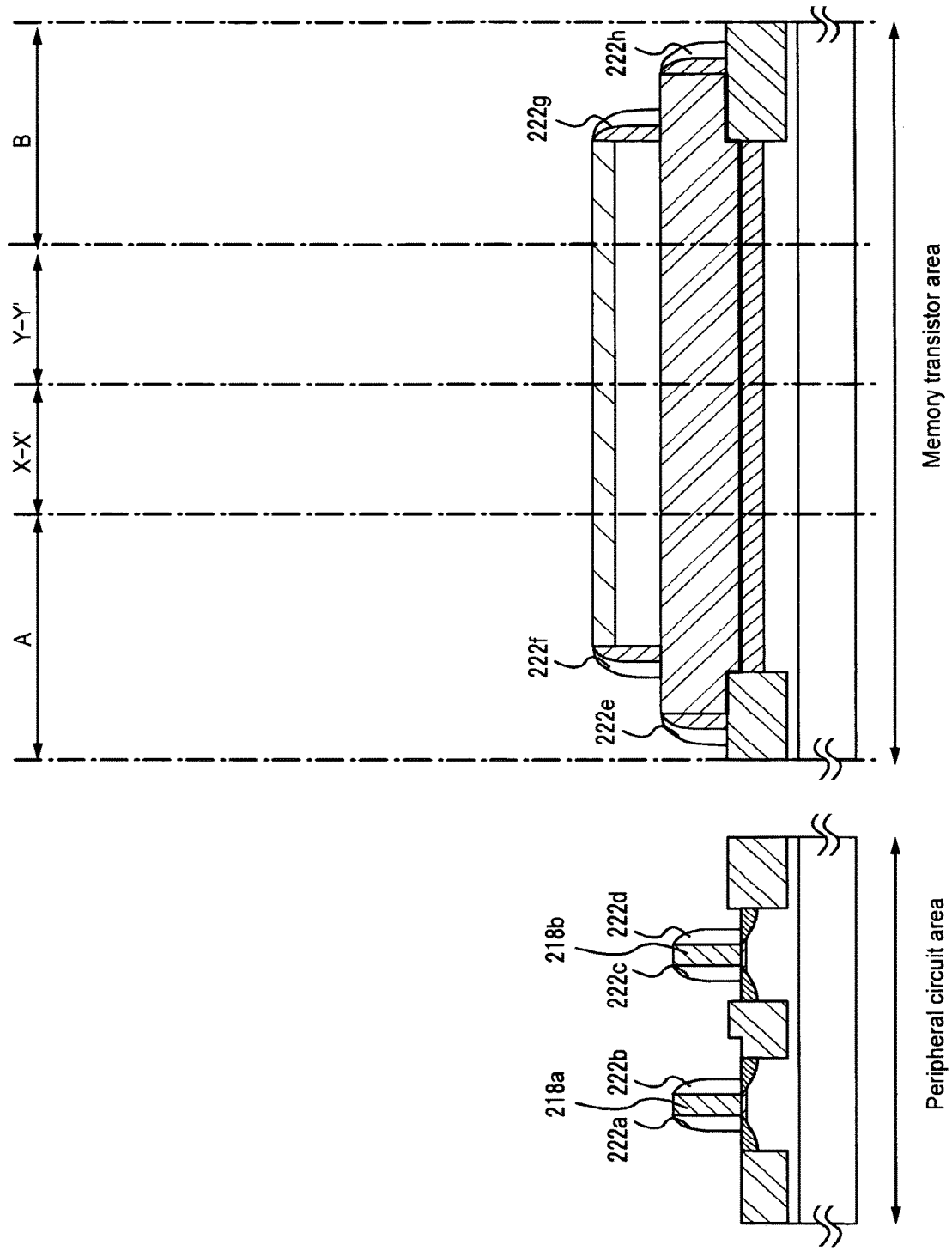
FIG. 52 is a diagram that shows a manufacturing process of the nonvolatile semiconductor memory device 1 according to one embodiment of the present invention.

Next, by forming a silicon nitride film on the whole surface of the substrate and performing anisotropic etching the silicon nitride films are made remained on at the both edges of the gate electrodes 218a and 218b; then side walls 222a, 222b, 222c and 222d are formed (FIG. 52). In addition, in the memory transistor area, upon the etching condition, side walls 222e, 222f, 222g and 222h may as well be formed at the side part of the poly-silicon films 218c, 218d, 218d and 218f, respectively.

Next, photo resist is formed in the P-channel type transistor area of the peripheral circuit area and the memory transistor area (not shown in the figures); arsenic (As) ions are implanted into the N-channel type transistor area of the peripheral circuit area; source/drain area 224a, 224b, 224c and 224d are formed automatically with the side walls 224a, 224b, 224c and 224d (FIG. 53); then afterwards the photo resist is removed.

Next, photo resist is formed in the N-channel type transistor of the peripheral circuit area and the memory transistor area (not shown in the figures); B ions are implanted into the P-channel type transistor area of the peripheral circuit area; the source/drain area (not shown in the figures) is shown automatically with the side walls (not shown in the figures), then photo resist is removed.

Figure 53:
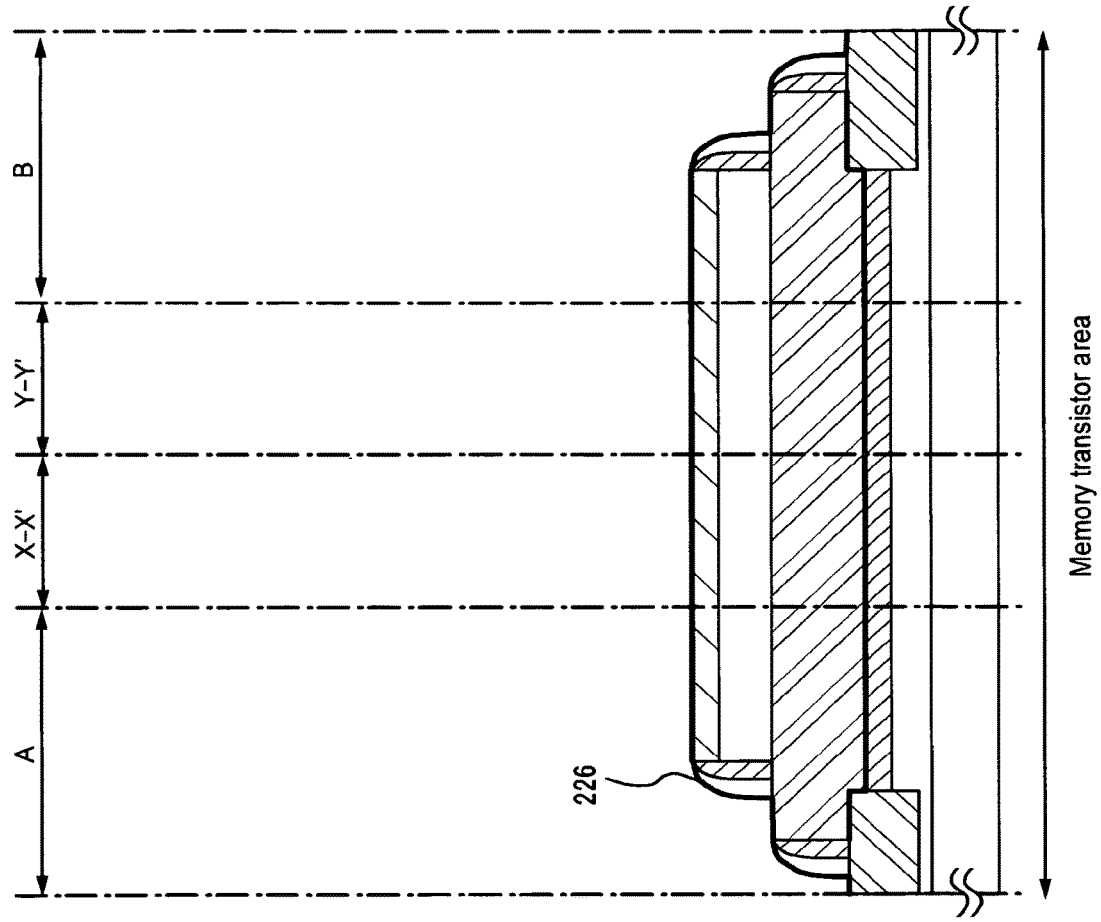
FIG. 53 is a diagram that shows a manufacturing process of the nonvolatile semiconductor memory device 1 according to one embodiment of the present invention.
Figure 53:
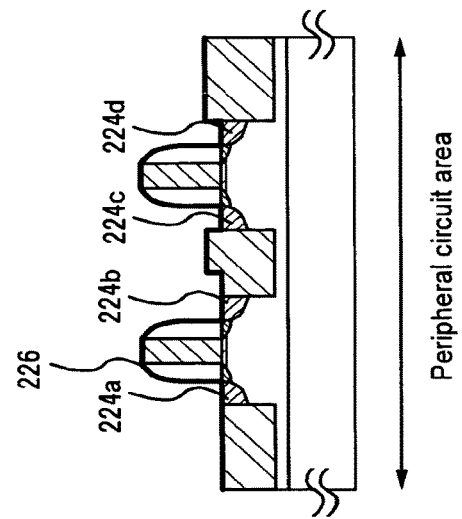

Next, a silicon nitride film (the barrier silicon nitride film) 226 are formed on the whole surface of the substrate (FIG. 53).

Figure 54:
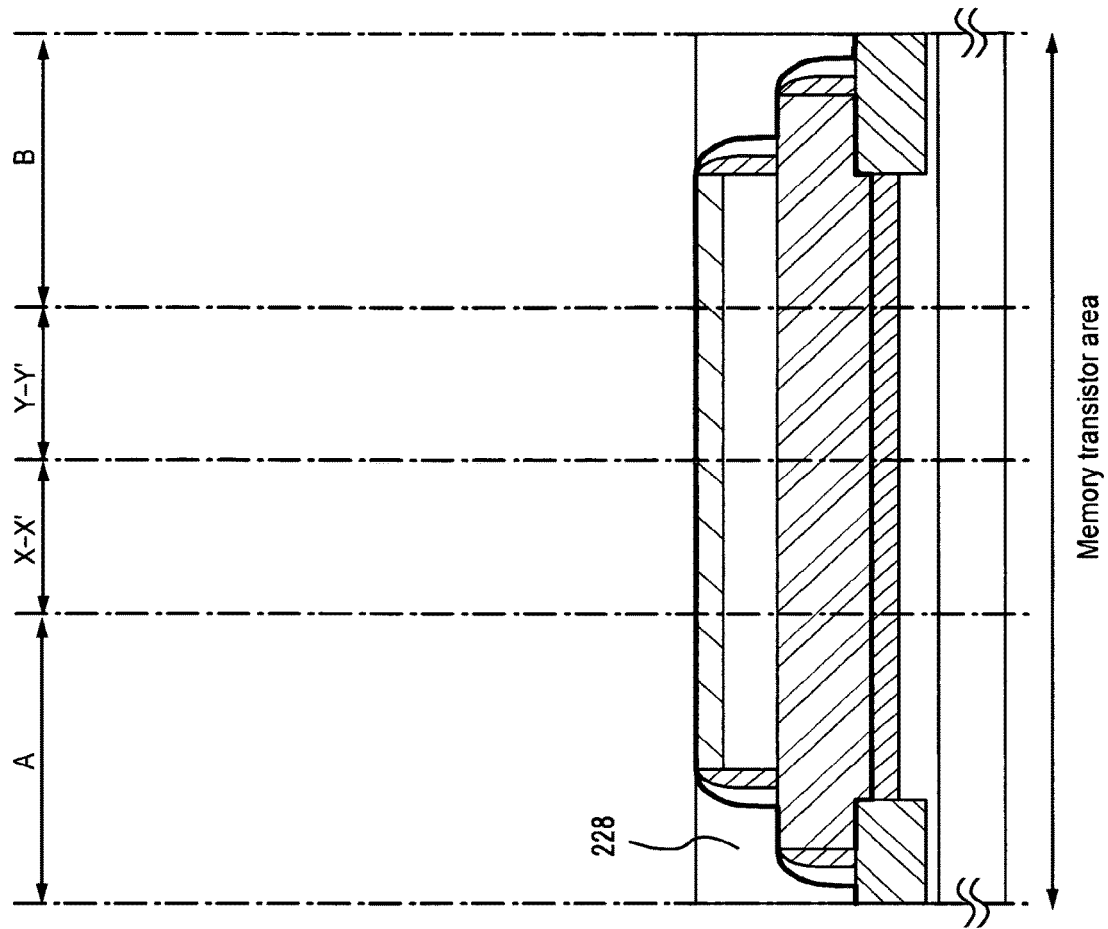
FIG. 54 is a diagram that shows a manufacturing process of the nonvolatile semiconductor memory device 1 according to one embodiment of the present invention.
Figure 54:
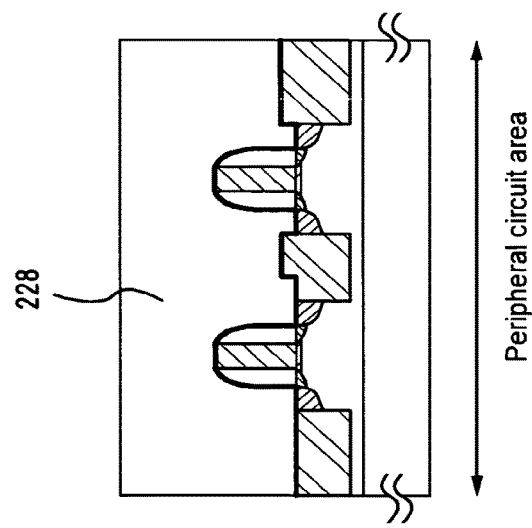

Subsequently by forming a BPSG film 228 on the whole surface of the substrate and performing a CMP treatment, the BPSG film 228 is planarized (FIG. 54).

Figure 55:
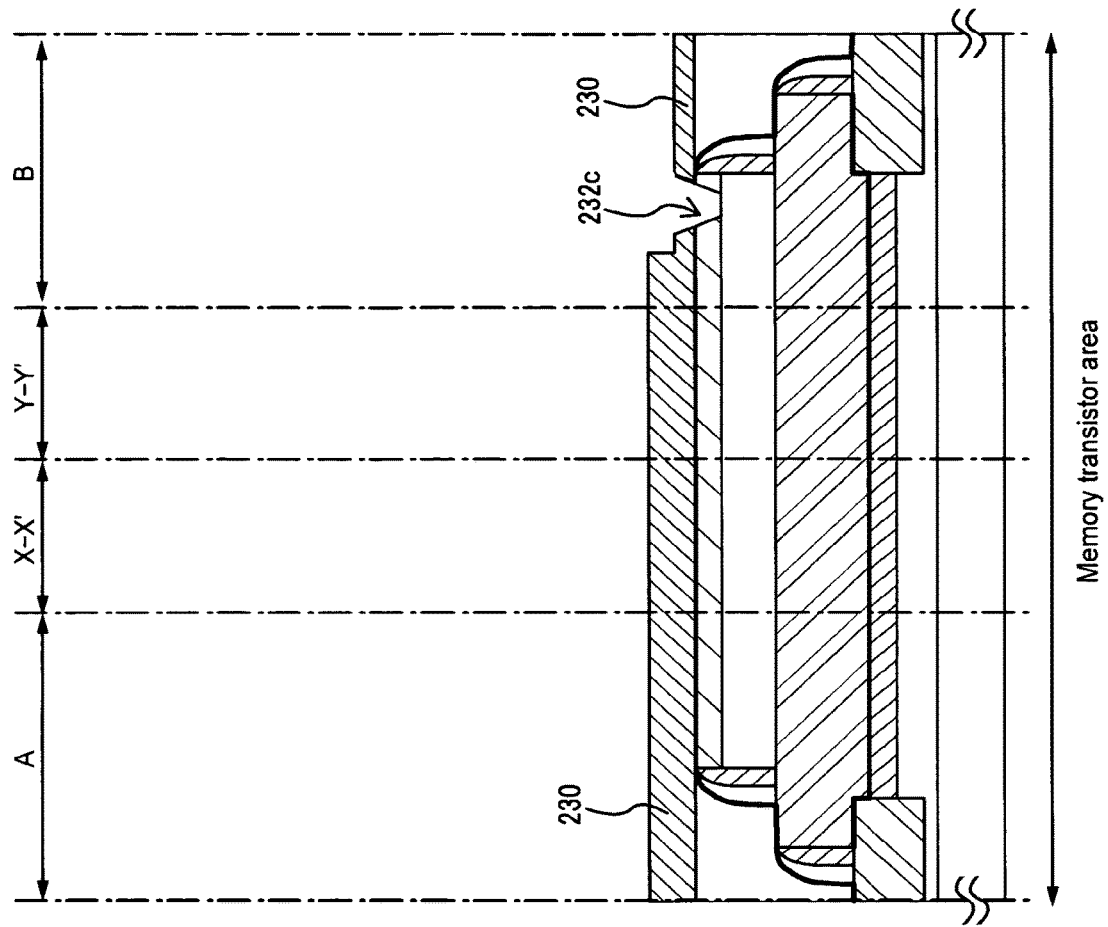
FIG. 55 is a diagram that shows a manufacturing process of the nonvolatile semiconductor memory device 1 according to one embodiment of the present invention.
Figure 55:
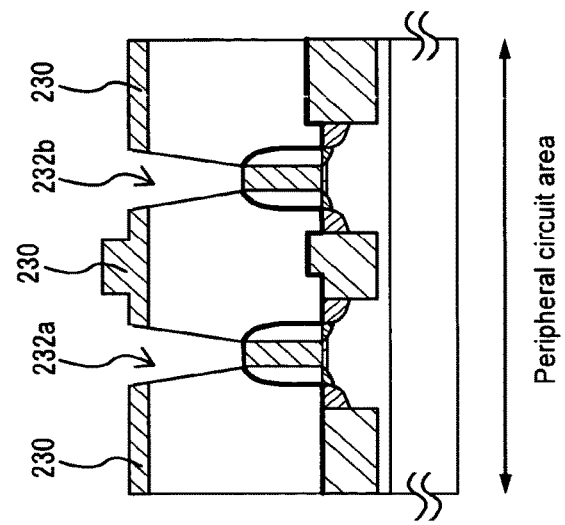
Figure 56:
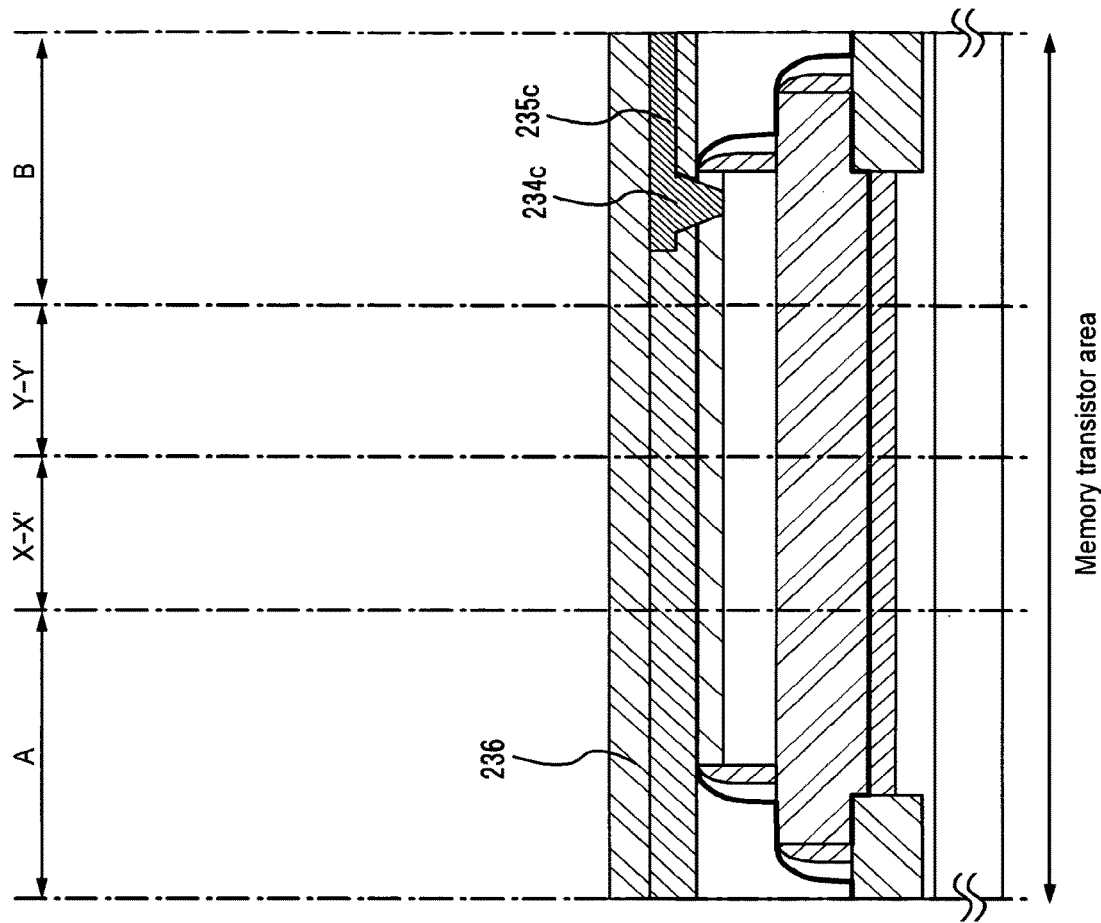
FIG. 56 is a diagram that shows a manufacturing process of the nonvolatile semiconductor memory device 1 according to one embodiment of the present invention.
Figure 56:
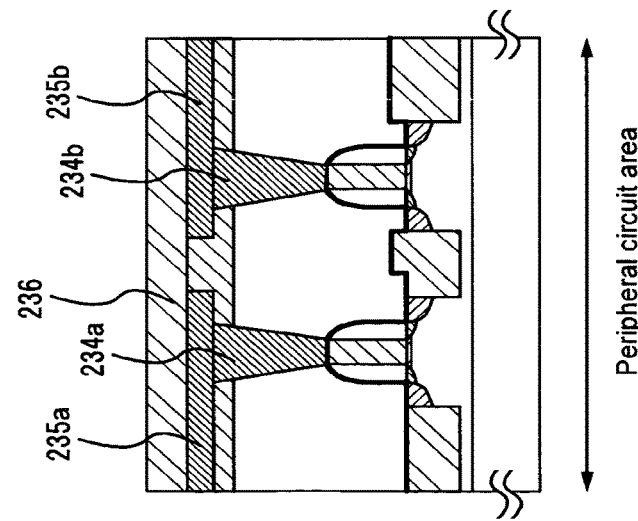

Next, a silicon oxide film 230 is formed as a primetal layer; then subsequently, contact holes 232a, 232b and 232c are formed in the silicon oxide film by the photo etching process (FIG. 55). Then, by forming a trench for wiring in the silicon oxide film 230 by the photo etching process and planarization the tungsten by such as the embedded CMP, tungsten plugs 234a, 234b and 234c, and wirings 235a, 235b and 235c are formed (FIG. 56). Then a TEOS film 236 is formed (FIG. 56).

Figure 57:
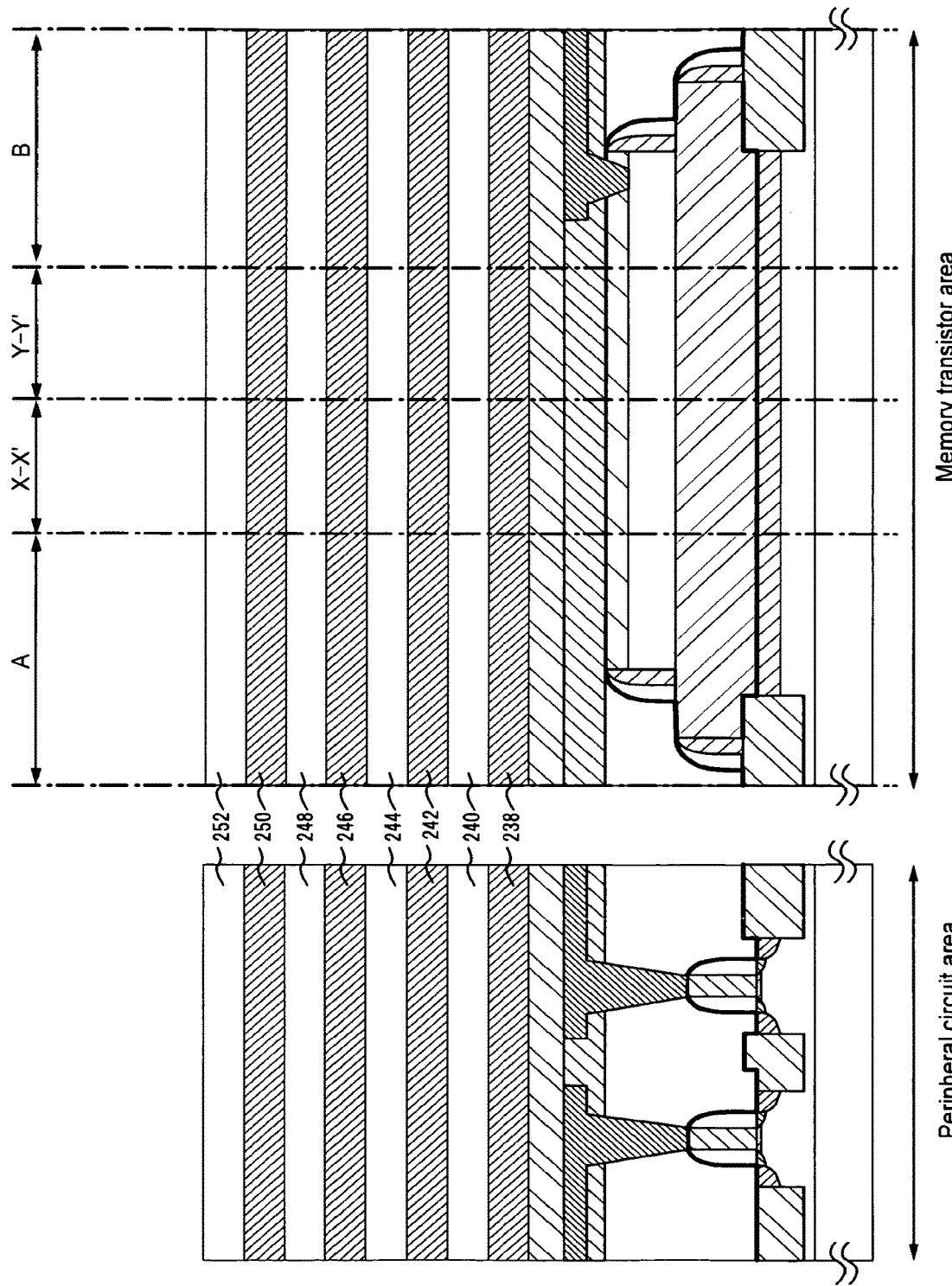
FIG. 57 is a diagram that shows a manufacturing process of the nonvolatile semiconductor memory device 1 according to one embodiment of the present invention.

Subsequently, by forming the poly-silicon films and the TEOS films, in which conductive impurities such as P are added, poly-silicon films 238, 242, 246 and 250, and silicon oxide films 240, 244, 248 and 252, are formed (FIG. 57).

Figure 58:
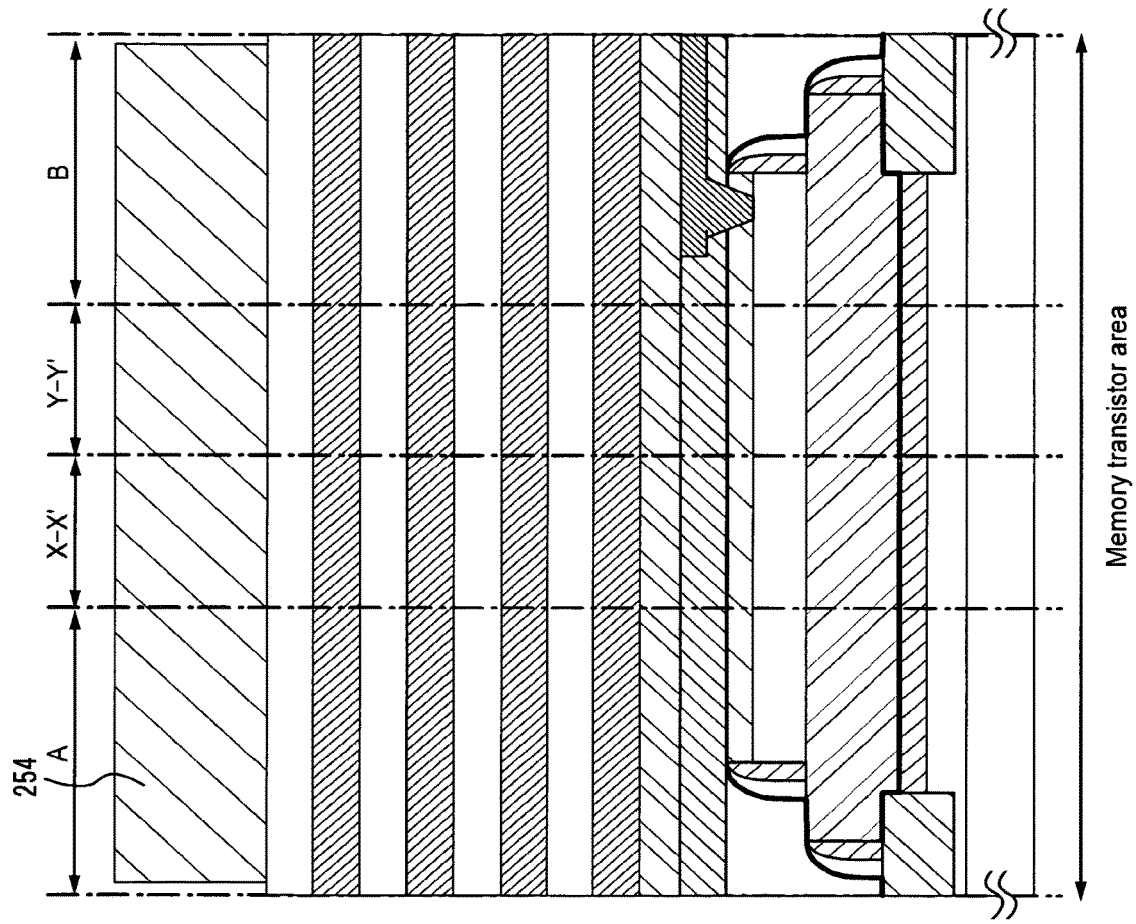
FIG. 58 is a diagram that shows a manufacturing process of the nonvolatile semiconductor memory device 1 according to one embodiment of the present invention.
Figure 58:
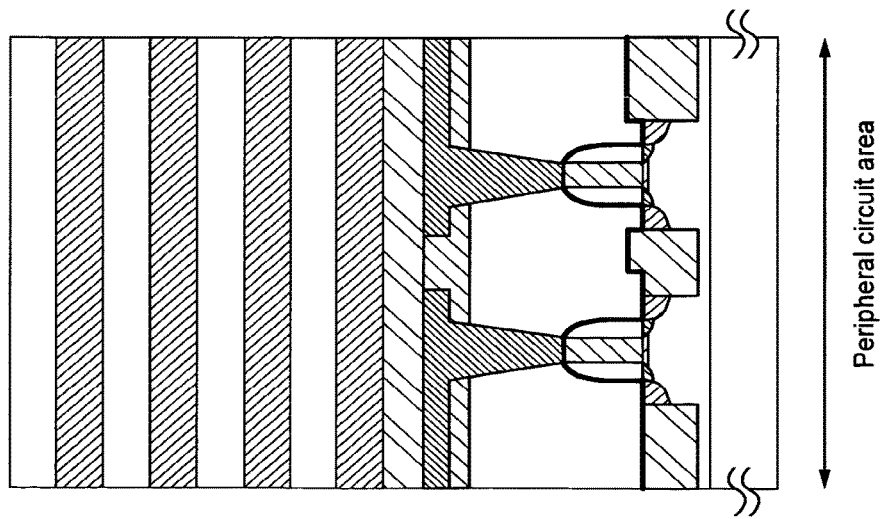

Next, taper etching process is performed so that edge parts of the each layer of the memory transistor area are set to be in the shape of stairs. At first, photo resist mask 254 is formed in the predetermined position of the memory transistor area (FIG. 58).

Figure 59:
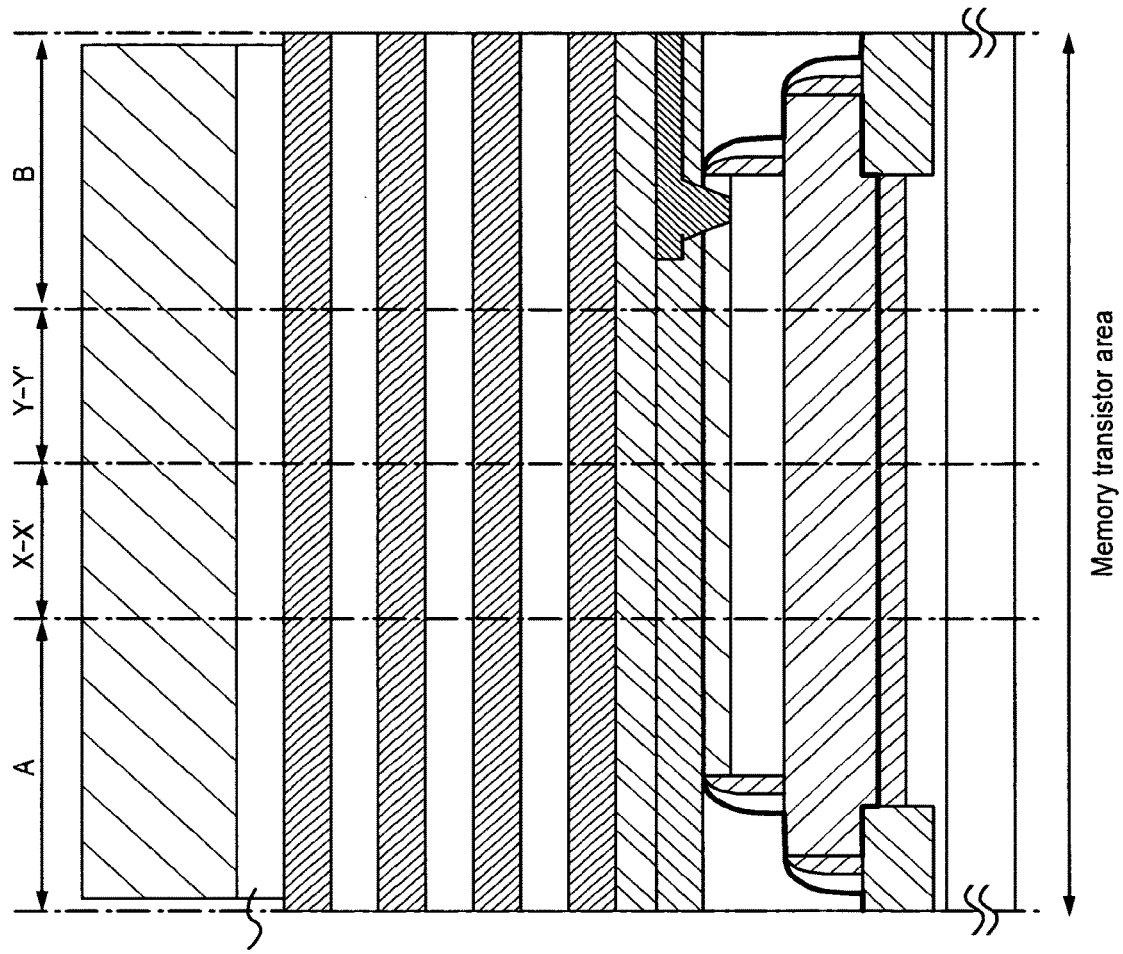
FIG. 59 is a diagram that shows a manufacturing process of the nonvolatile semiconductor memory device 1 according to one embodiment of the present invention.
Figure 59:
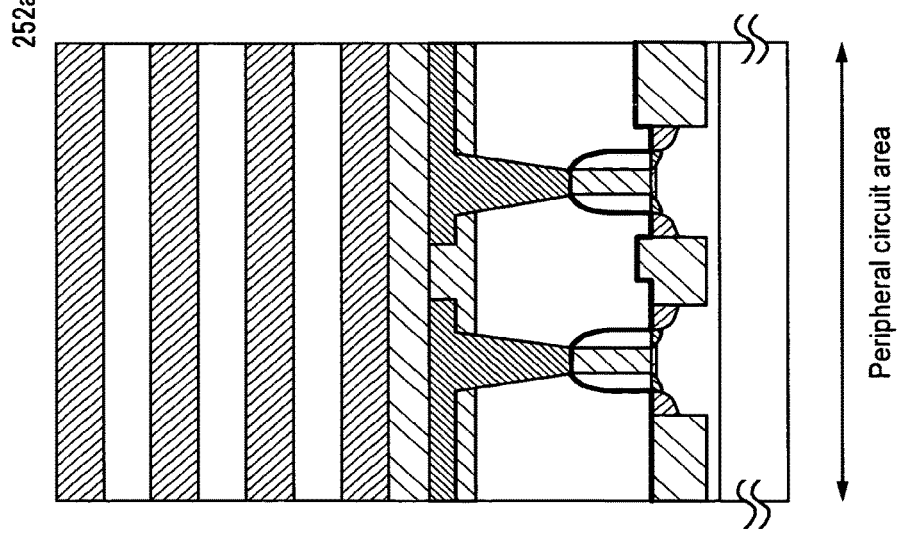

Next, using the photo resist mask 254, the silicon oxide is 252 is etched and thus a silicon oxide film 252a is formed (FIG. 59).

Figure 60:
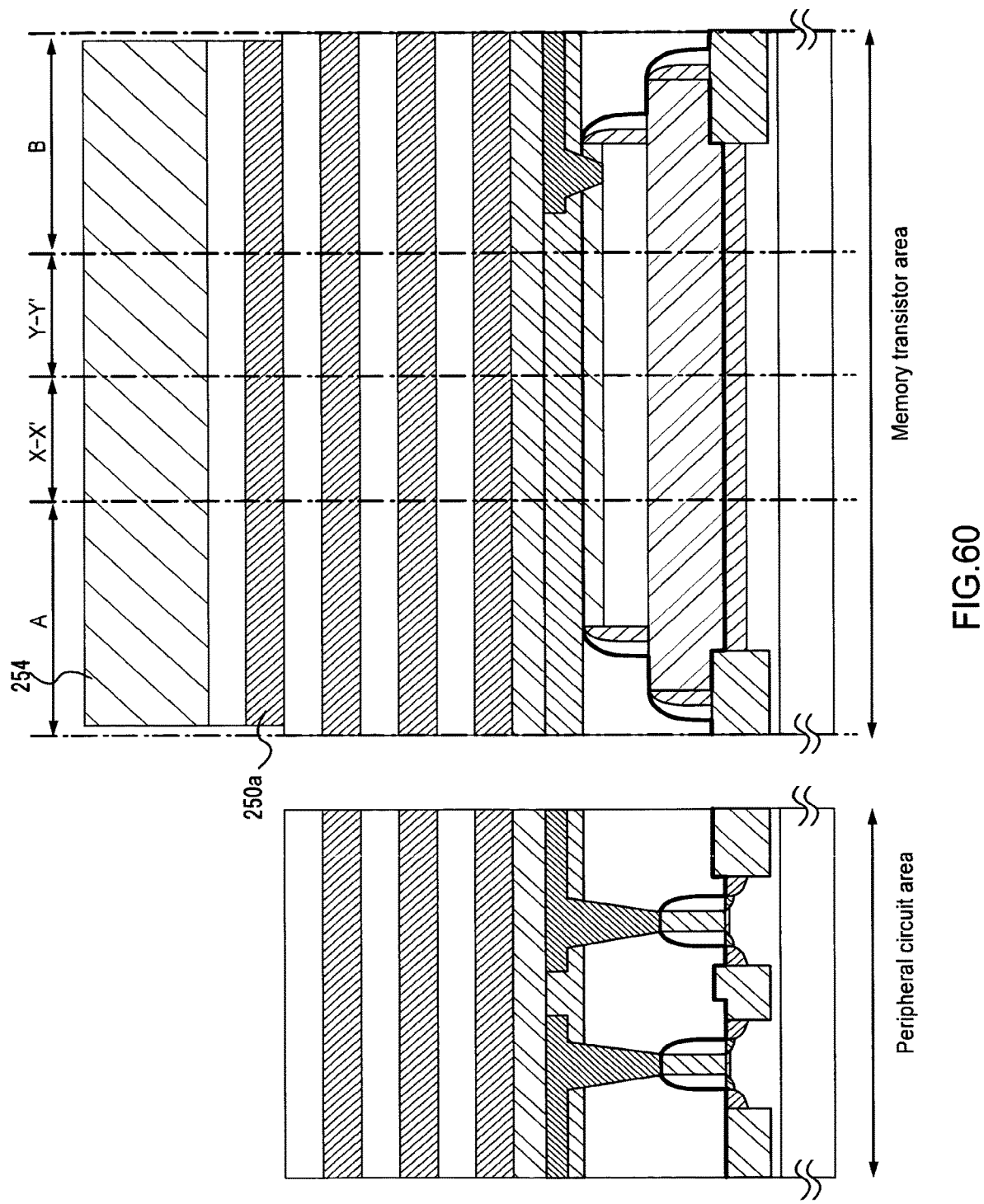
FIG. 60 is a diagram that shows a manufacturing process of the nonvolatile semiconductor memory device 1 according to one embodiment of the present invention.

Then using the photo resist mask 254, poly-silicon film 250a is etched and thus a poly-silicon film 250a is formed (FIG. 60).

Figure 61:
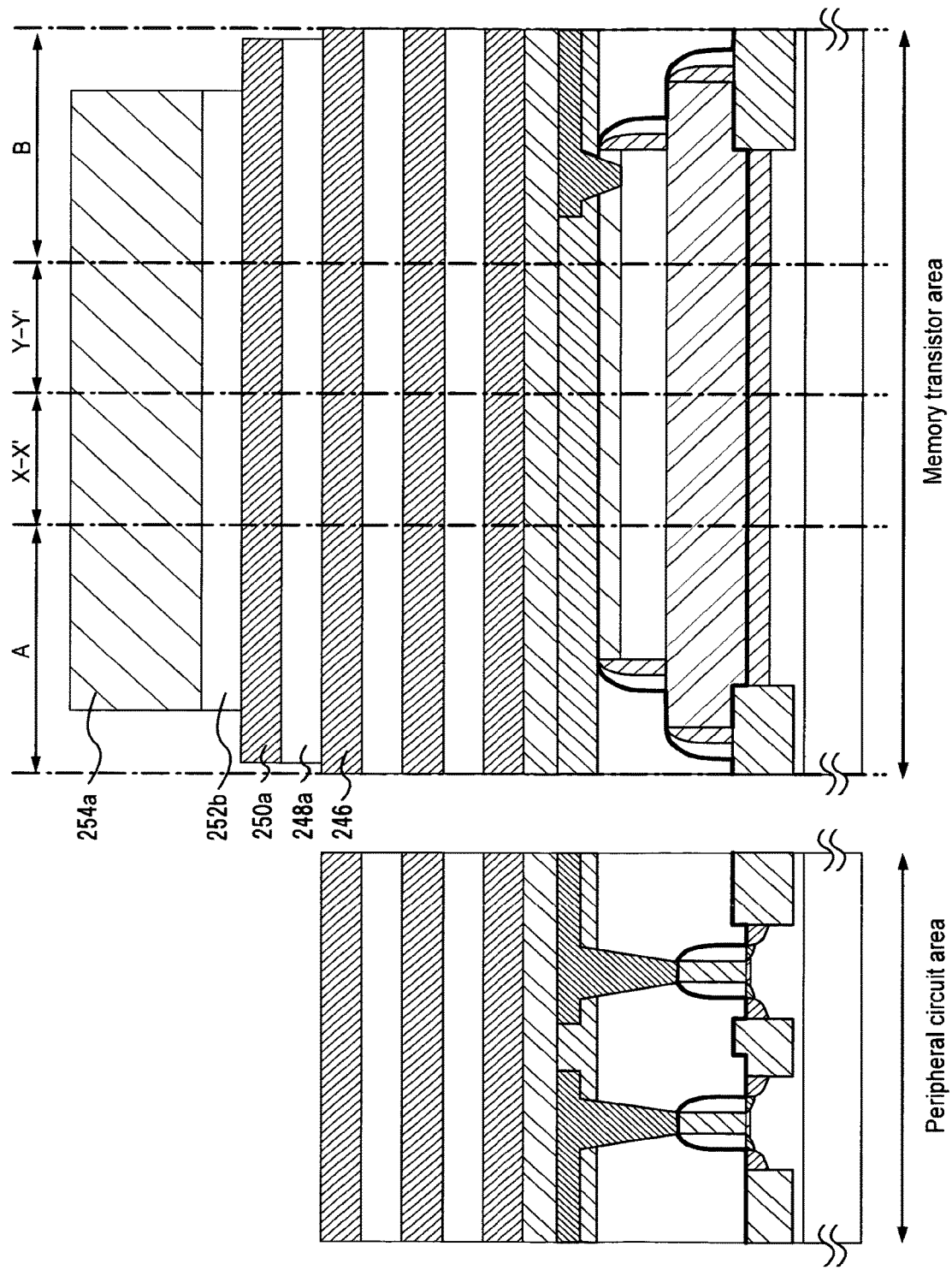
FIG. 61 is a diagram that shows a manufacturing process of the nonvolatile semiconductor memory device 1 according to one embodiment of the present invention.

Subsequently, the photo resist mask 254 is thinning, then the photo resist mask 254a is formed (FIG. 61). And using photo resist mask 254a, the silicon oxide films 252a and 248 are etched so that a silicon oxide films 252b and 248a are formed (FIG. 61).

Figure 62:
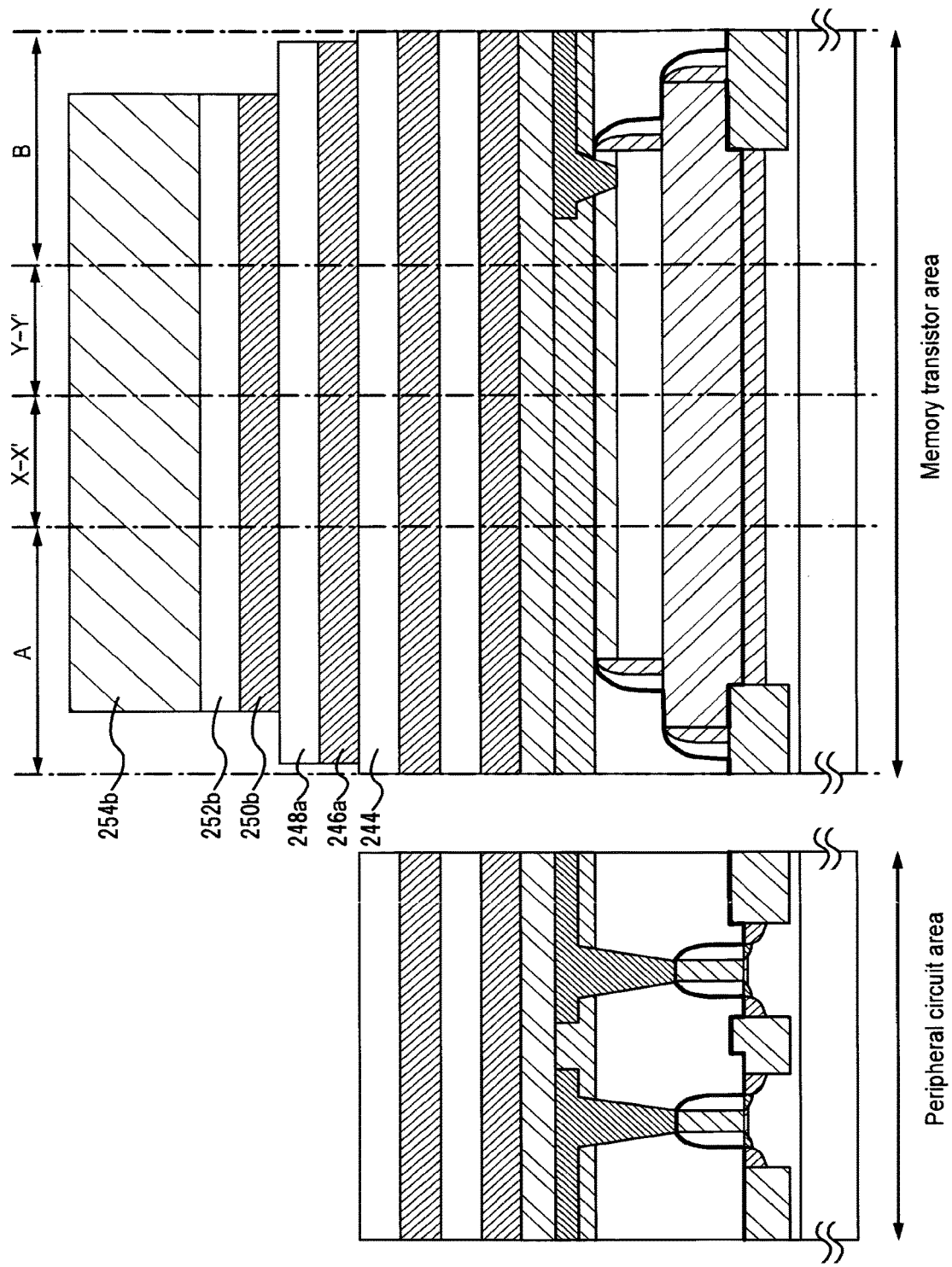
FIG. 62 is a diagram that shows a manufacturing process of the nonvolatile semiconductor memory device 1 according to one embodiment of the present invention.

Then, using the photo resist mask 254a, a poly-silicon film 250a and 246 are etched so that a poly-silicon film 250b and 246a are formed (FIG. 62).

Figure 63:
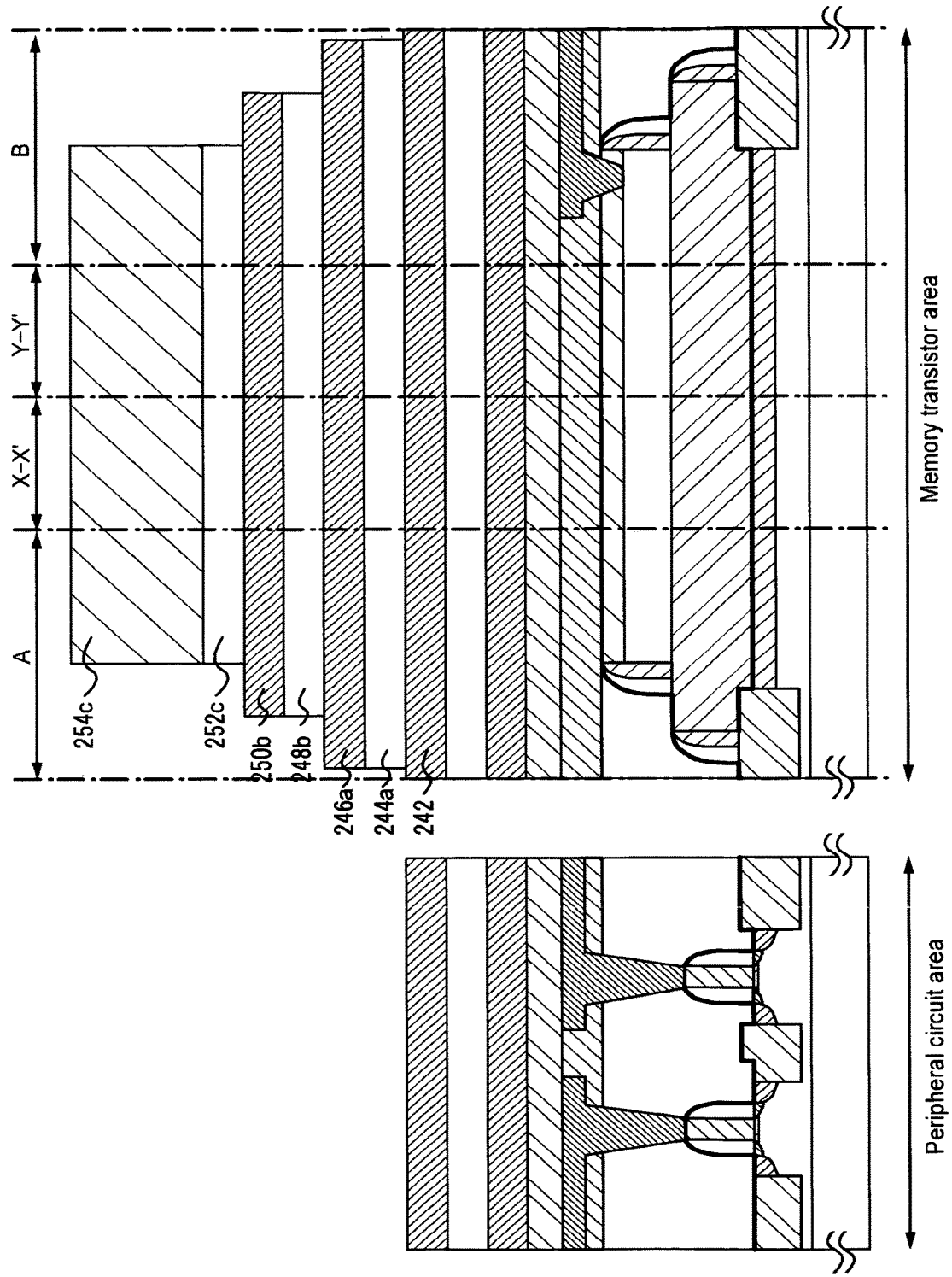
FIG. 63 is a diagram that shows a manufacturing process of the nonvolatile semiconductor memory device 1 according to one embodiment of the present invention.

Subsequently, the photo resist mask 254b is thinning so that a photo resist mask 254c is formed (FIG. 63). And using the photo resist mask 254c, the silicon oxide films of 252b 248a and 244 are etched and thus silicon oxide films 252c, 248b and 244a are formed (FIG. 63).

Figure 64:
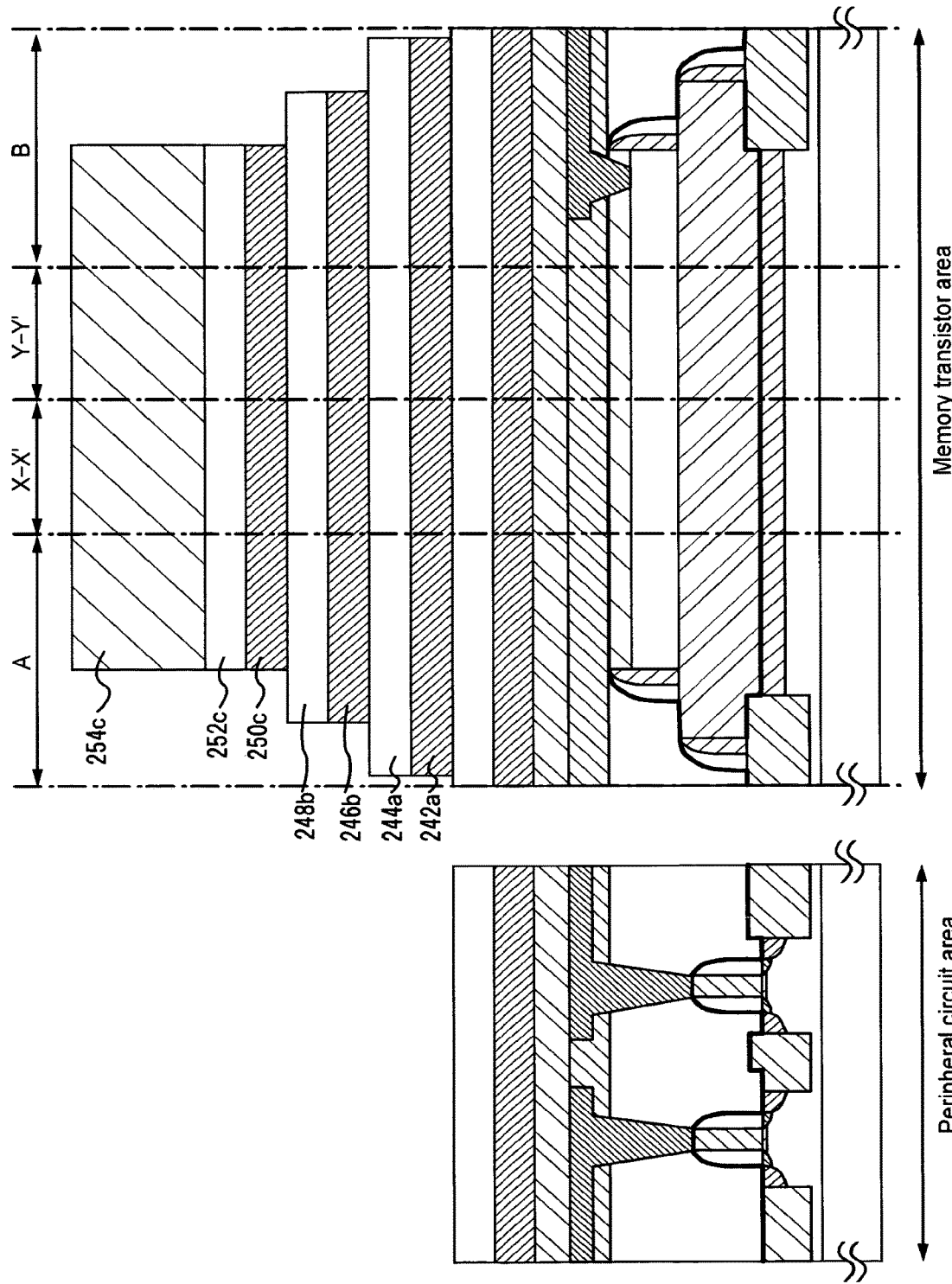
FIG. 64 is a diagram that shows a manufacturing process of the nonvolatile semiconductor memory device 1 according to one embodiment of the present invention.

Next, using photo resist mask 254c, poly-silicon films 250b, 246a and 242 are etched so that poly-silicon films 250c, 246b and 242a are formed (FIG. 64).

Figure 65:
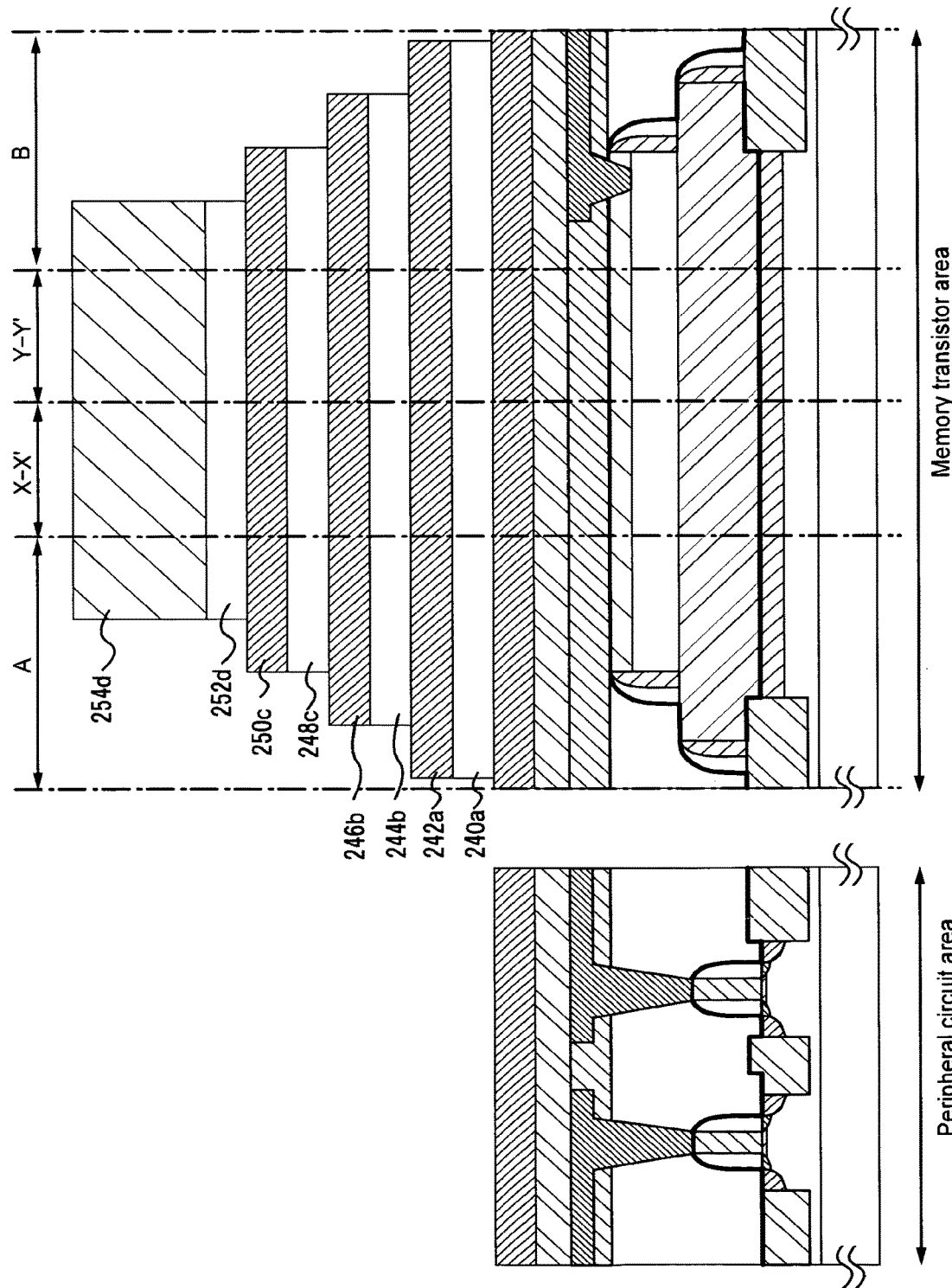
FIG. 65 is a diagram that shows a manufacturing process of the nonvolatile semiconductor memory device 1 according to one embodiment of the present invention.

Then the photo resist mask 254c is thinning so that a photo resist mask 254d is formed (FIG. 64). And, using the photo resist mask 254d, silicon nitride films 252c, 248b, 244a and 240 are etched so that silicon nitride films 252d, 248c, 244b and 240a are formed (FIG. 65).

Figure 66:
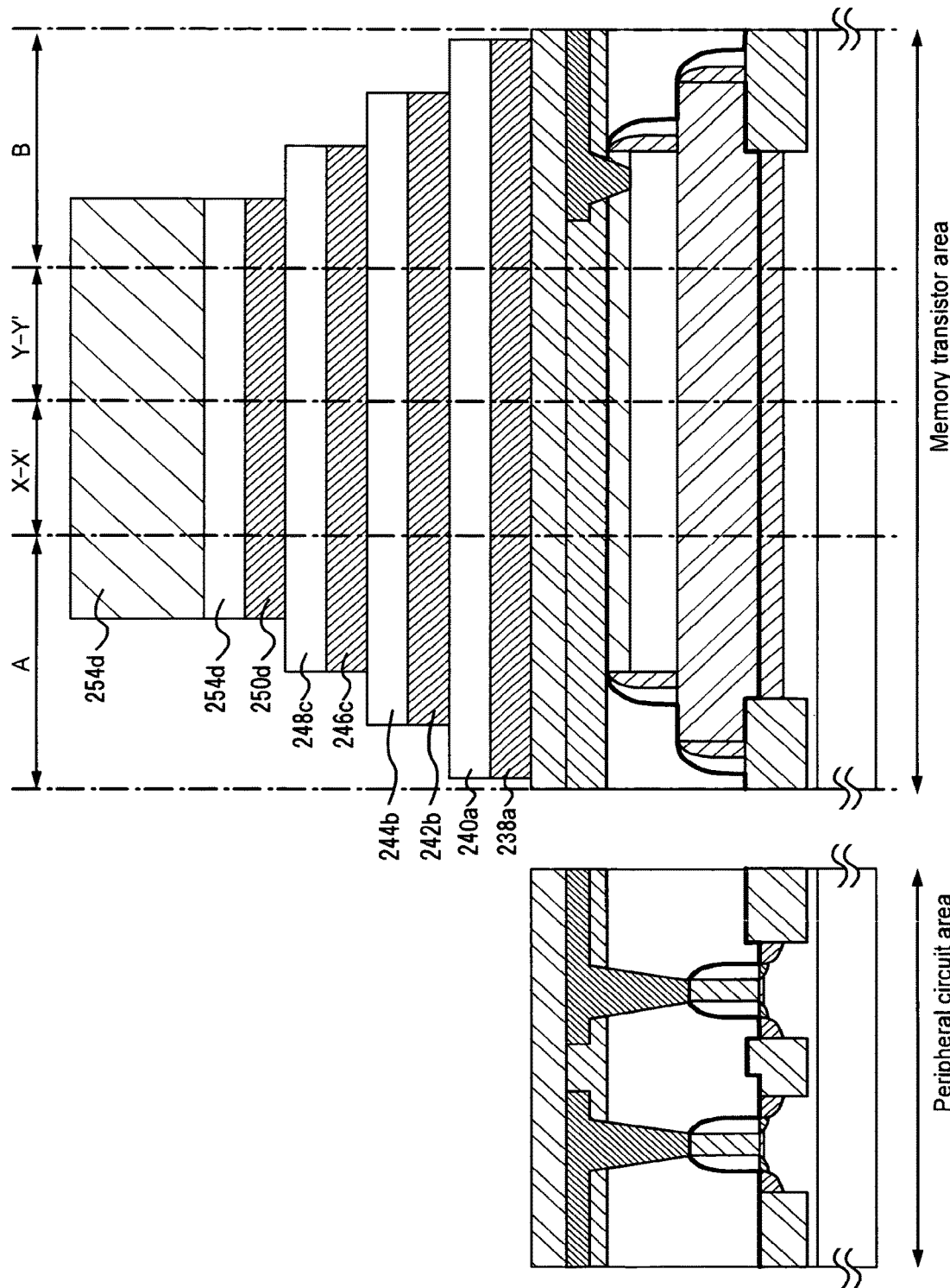
FIG. 66 is a diagram that shows a manufacturing process of the nonvolatile semiconductor memory device 1 according to one embodiment of the present invention.

Next, using the photo resist mask 254d, poly-silicon film 250c, 246b, 242a and 238 are etched so that poly-silicon films 250d, 246c, 242b and 238a are formed (FIG. 66). By doing so, edge parts of the each layer are formed in the shape of stairs.

Also in the above-described embodiment 1, using the taper etching explained in this second embodiment, a silicon nitride film 168a, poly-silicon films 150, 154a, 158a, 162a and 166a, and silicon oxide films 152a, 156a, 160a and 164a may be formed as shown in FIG. 41.

Figure 67:
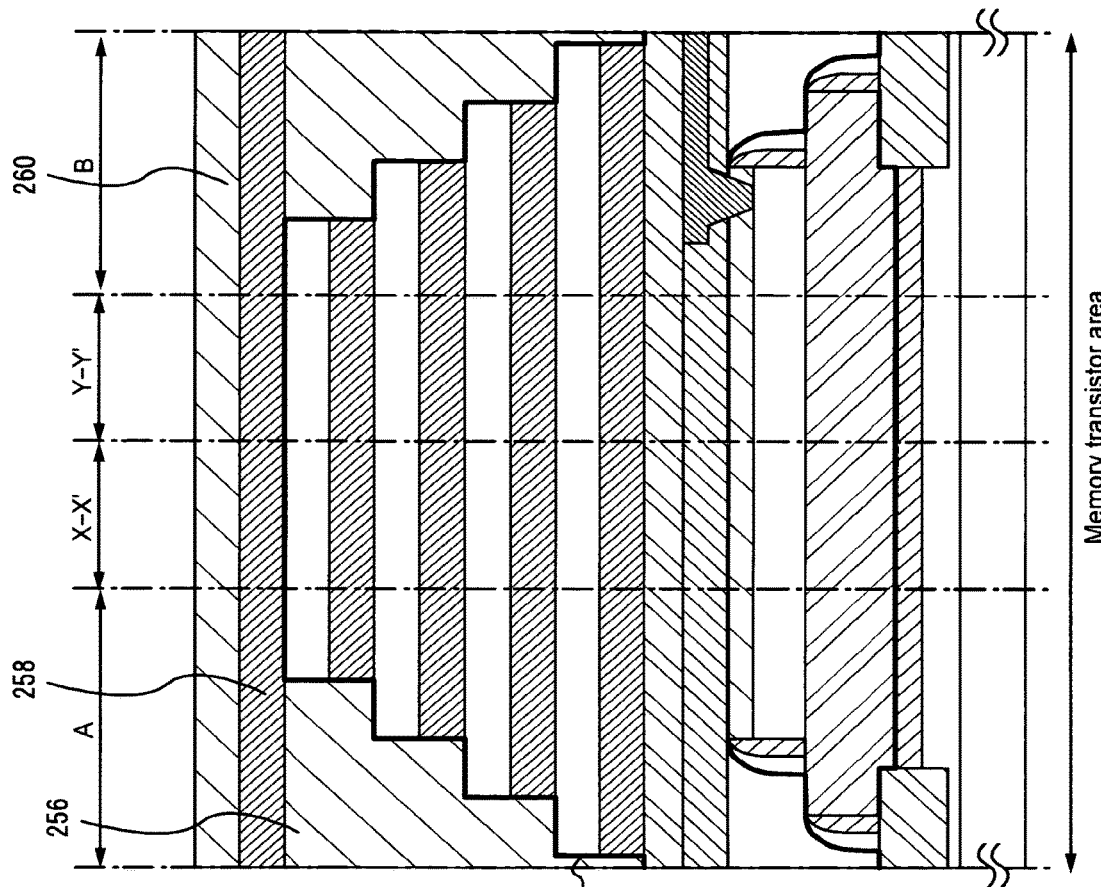
FIG. 67 is a diagram that shows a manufacturing process of the nonvolatile semiconductor memory device 1 according to one embodiment of the present invention.
Figure 67:
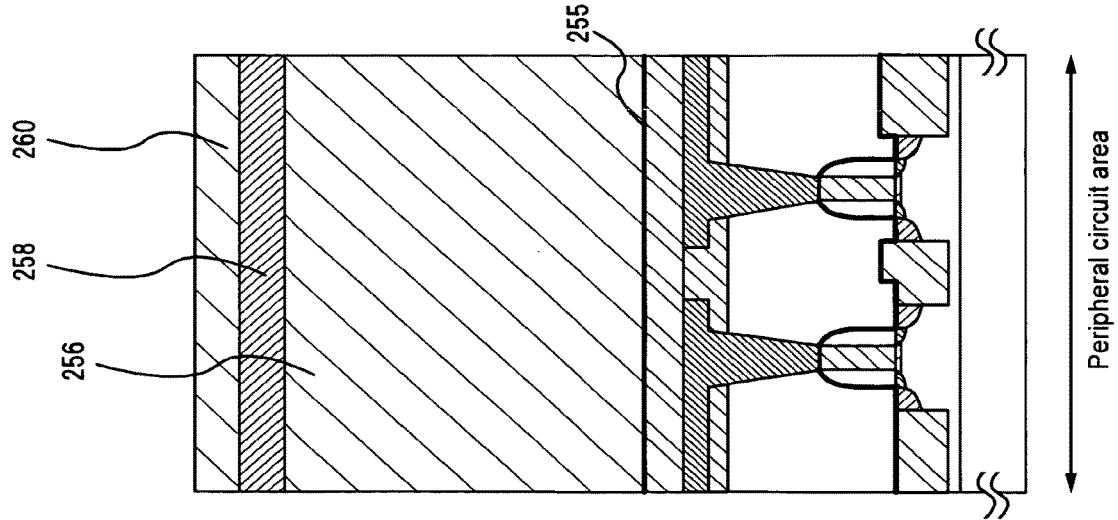

Next, the photo resist film 254d is removed, then a silicon nitride film (barrier silicon nitride film) 255 is formed on the whole surface of the substrate (FIG. 67)

Subsequently, by forming the BPSG film 256 on the whole surface of the substrate and performing heat treatment (reflow treatment), surface of the BPSG film 256 is planarized (FIG. 67). Further by performing the CMP treatment to the BPSG film 256, flatness of the surface of the BPSG film 256 is made enhanced. Here, the memory transistor area may be divided as shown in FIG. 80 (B), FIG. 90 or FIG. 11. At the time, after forming the interlayer insulation film (BPSG) 256 and planarizing the BPSG with CMP, division patterns of the memory transistor area are formed with the photolithography method, and thus conductive films 238*a*, 242*b*, 246*c* and 250*d*, and the interlayer insulation films 240*a*, 244*b*, 248*c* and 254*d* are etched. Then, by laminating the interlayer insulation films (BPSG) 256 again and planarizing it, array divisions like FIG. 80 (B), FIG. 90 or FIG. 11 are formed. Further, in case of performing the array division, the silicon substrate 100 of the memory transistor area may be divided in advance into the area at the same degree of the array divided by the STI102; or the silicon substrate 200 may as well be not divided. Afterward, a poly-silicon film 258, in which conductive impurities such as P (phosphorus) are added, and a silicon nitride 260 are formed (FIG. 67).

Figure 68:
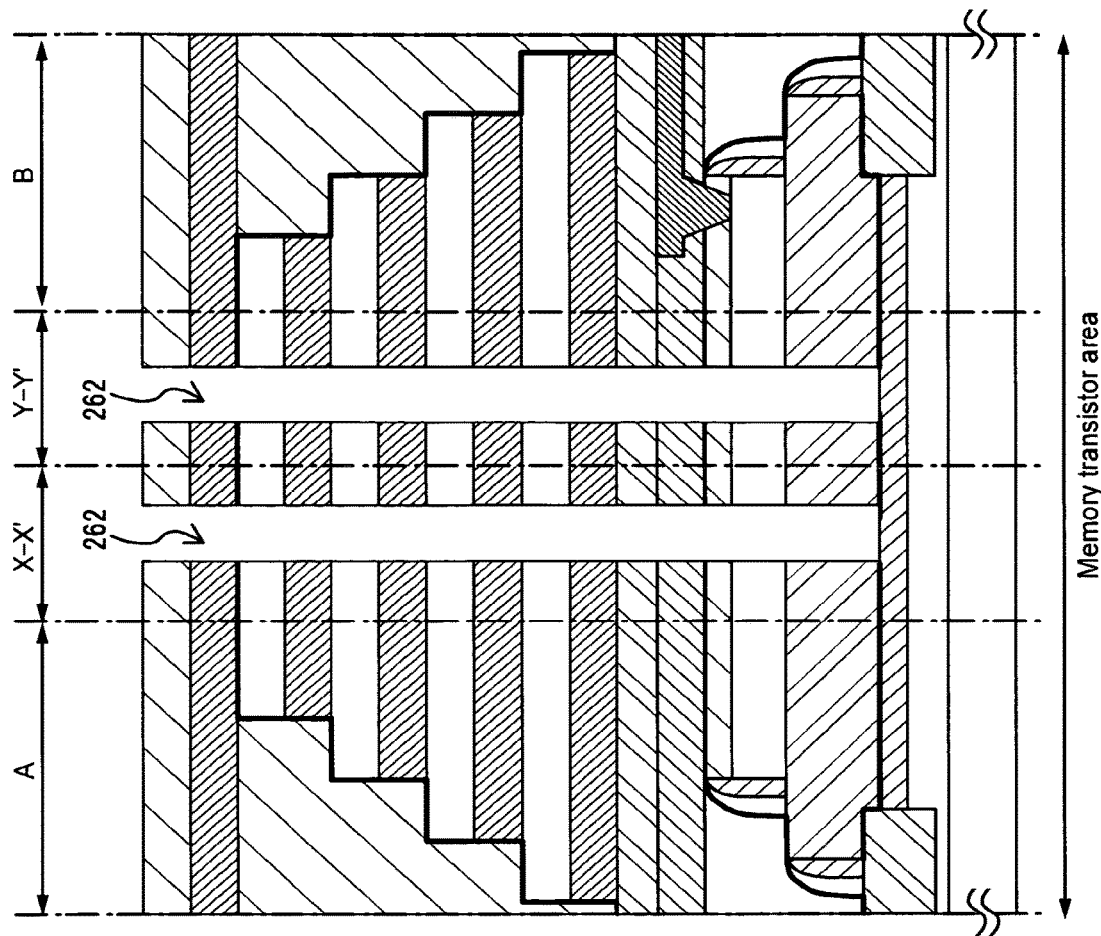
FIG. 68 is a diagram that shows a manufacturing process of the nonvolatile semiconductor memory device 1 according to one embodiment of the present invention.
Figure 68:
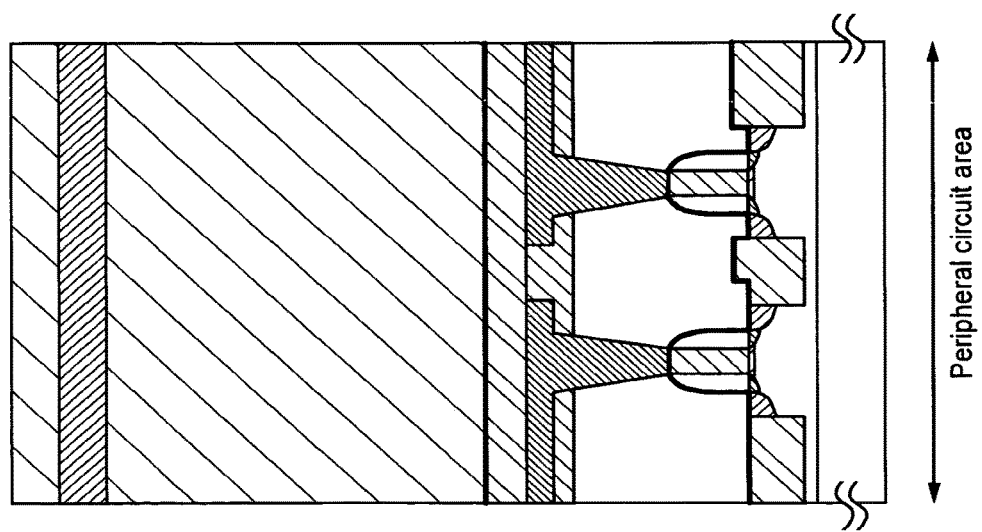

Next in the memory transistor area, holes 262 to form a pillar shaped semiconductor (a body part) of the memory transistor are formed (FIG. 68). Further in this embodiment, the holes 262 are called "memory plug holes 262".

In addition, unevenness may be occurred on the surface of the memory plug holes 262 as well as with those shown in FIG. 81 and FIG. 82 of the above-described first embodiment by various factors such as switching of the etching gas at the time of forming the memory plug holes 262, removal of the piles, materials of films 238 to 252 and so on. In addition, even though the case like this, which the unevenness is occurred on the surface of the memory plug holes 262, the cross-sectional shape of the memory transistor area of the nonvolatile semiconductor memory device 1 according to this embodiment is almost symmetric to a central axis of the memory plug holes 262.

Also as well as with those shown in FIG. 83 of the above-described first embodiment 1, silicon nitride films are formed on the surface of the memory plug holes 262; thus, dielectric constant of the films, which are among each of the poly-silicon films 238, 242, 246 and 250 that become the word lines of the nonvolatile semiconductor memory device 1 according to this embodiment, may be made enhanced. By doing so, effect of the potential change of the word lines WL may be transmitted effectively to the pillar-shaped semiconductor layers formed later in the memory plug holes 262.

And as well as with those shown in FIG. 84 of the above-described first embodiment, the lamination films with silicon oxide films/silicon nitride films/silicon oxide films may be formed respectively in this embodiment. By doing so, effect of the potential change of the word lines WL may be transmitted effectively to the pillar-shaped semiconductor layers formed later in the memory plug holes 262.

In addition, the shapes of the memory plug holes 262 may become a forward taper shape or a barrel shape as well as with those shown in FIG. 85 and FIG. 86 of the above-described first embodiment, by various factors such as switching of the etching gas at the time of forming the memory plug holes 262, removal of the piles, materials of films 238 to 252 and so on.

After forming the memory plug holes 262, phosphorus (P) ions may be implanted into the whole surface of the substrate, and may be implanted again into the n+ diffusion area 208, which becomes the source line SL (not shown in the figures).

Figure 69:
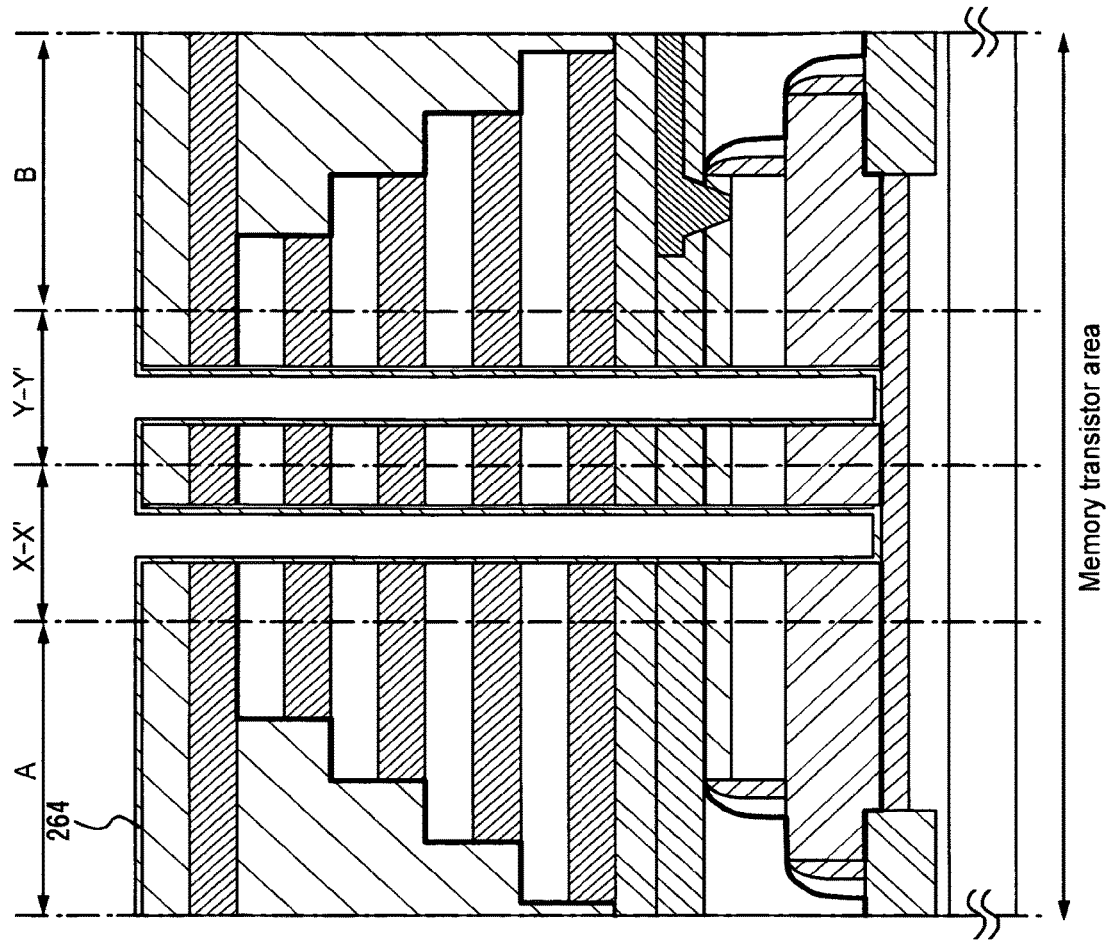
FIG. 69 is a diagram that shows a manufacturing process of the nonvolatile semiconductor memory device 1 according to one embodiment of the present invention.
Figure 69:
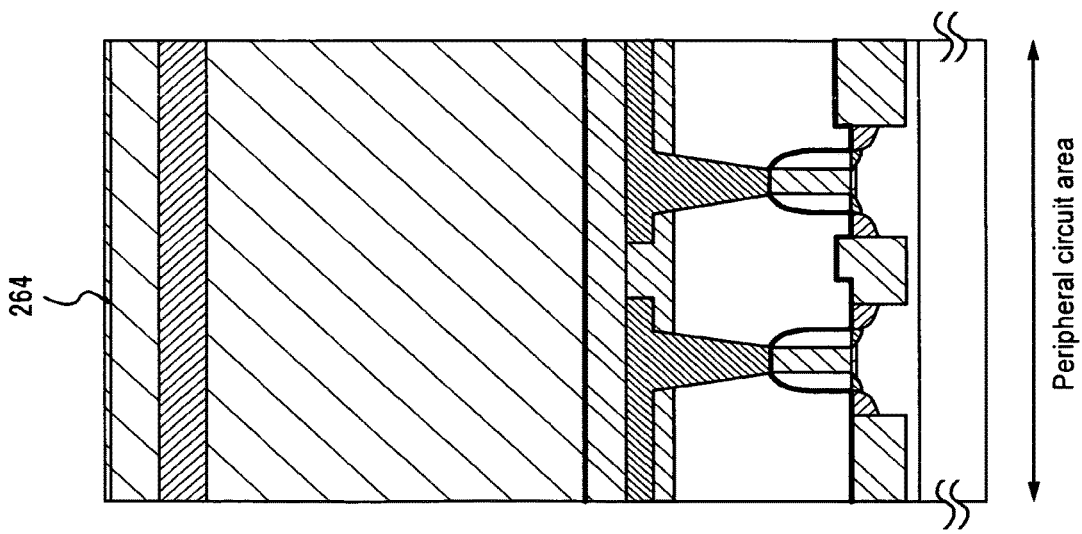

Next, a TEOS film 264 is formed on the whole surface of the substrate (FIG. 69). The TEOS film 264 is formed to the bottom parts of the memory plug holes 262, as shown in FIG. 69. Here, instead of forming the TEOS film 264, an oxidation film may be formed by thermal oxidation method; in this case, as well as with the first embodiment, oxidation films may be formed only on the poly-silicon part of the side wall of the memory plug holes 262 and the silicon substrate of the bottom part of the memory plug holes 262.

Figure 70:
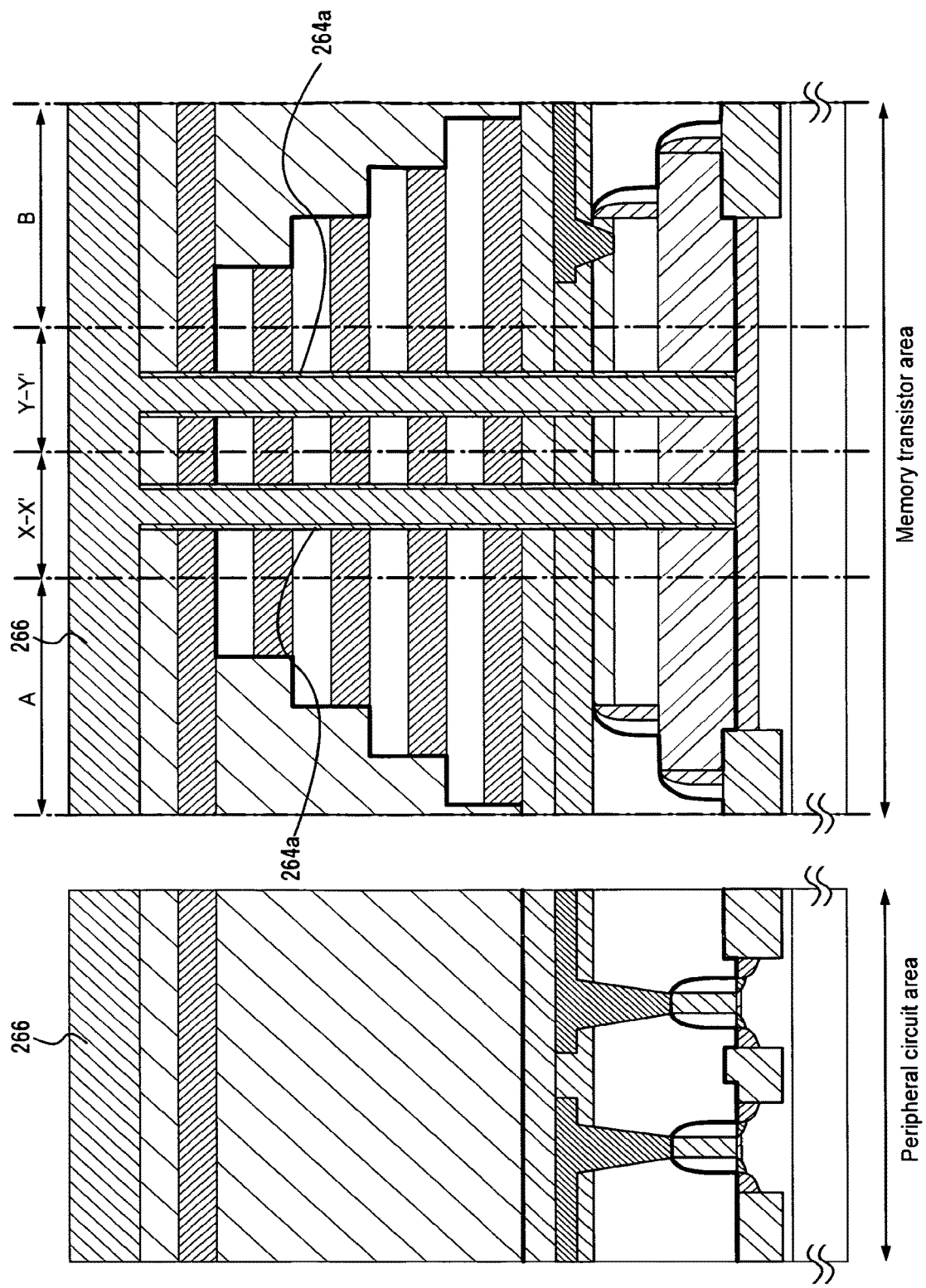
FIG. 70 is a diagram that shows a manufacturing process of the nonvolatile semiconductor memory device 1 according to one embodiment of the present invention.

Subsequently, anisotropic etching is performed to the TEOS film 264 so that the TEOS film 264*a* is formed (FIG. 70). Then in the TEOS film 264, the bottom parts of the memory plug holes 262 are set to be etched.

Then an amorphous silicon film 266 are formed (FIG. 70).

Figure 71:
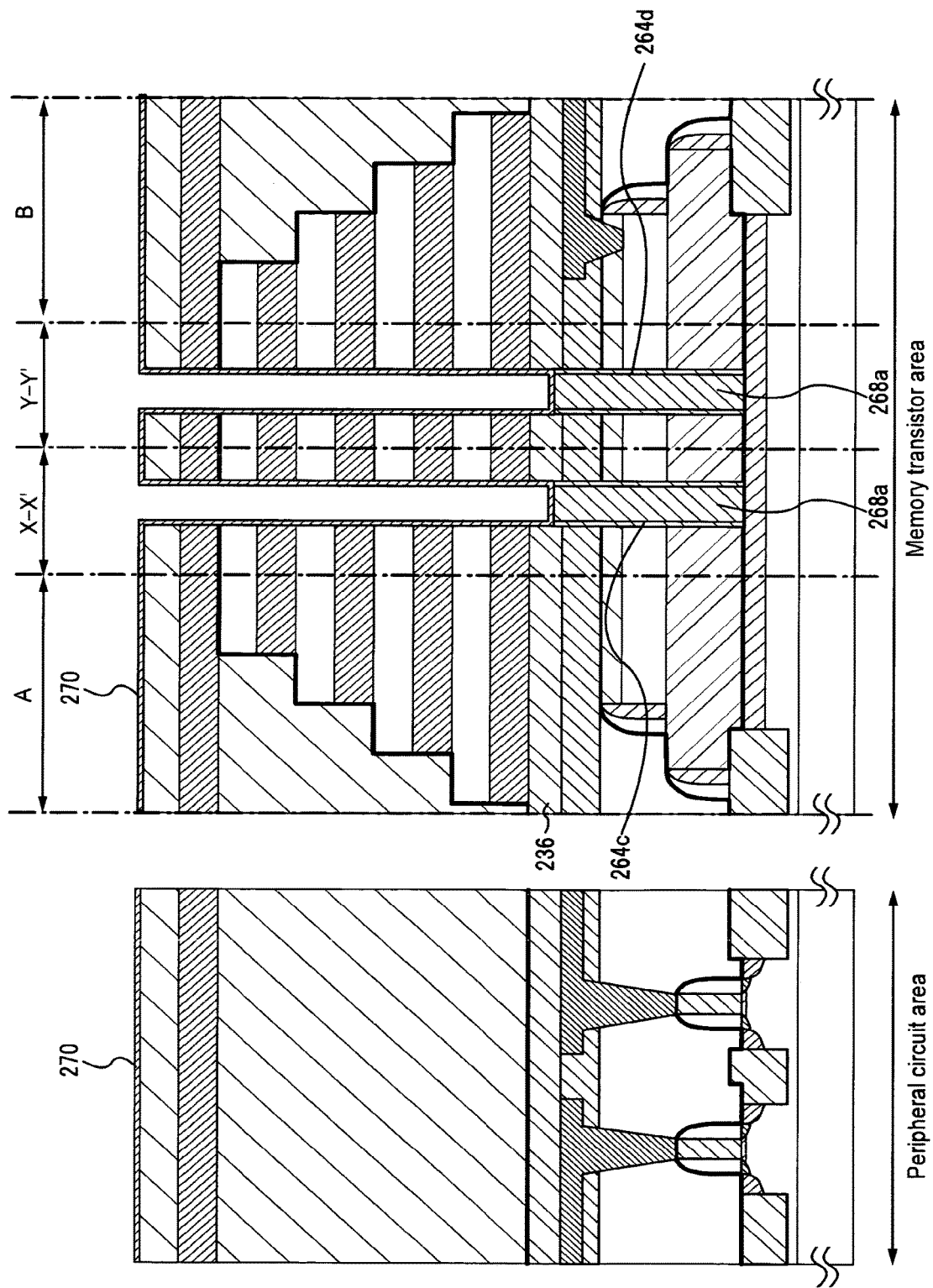
FIG. 71 is a diagram that shows a manufacturing process of the nonvolatile semiconductor memory device 1 according to one embodiment of the present invention.

Next, the amorphous silicon film 266 are etch backed and made it receded until it become an amorphous silicon films 268*a* (FIG. 71). Next, the TEOS film 264*a* inside the memory plug holes 262 is removed, and then a silicon oxide film, a silicon nitride film and a silicon oxide film are laminated in turn so that what is called an ONO film 270 are formed (FIG. 71). The ONO film becomes a charge storage layer of the memory transistor. Further, the silicon oxide film of the ONO film 270 may include the TEOS film.

Figure 72:
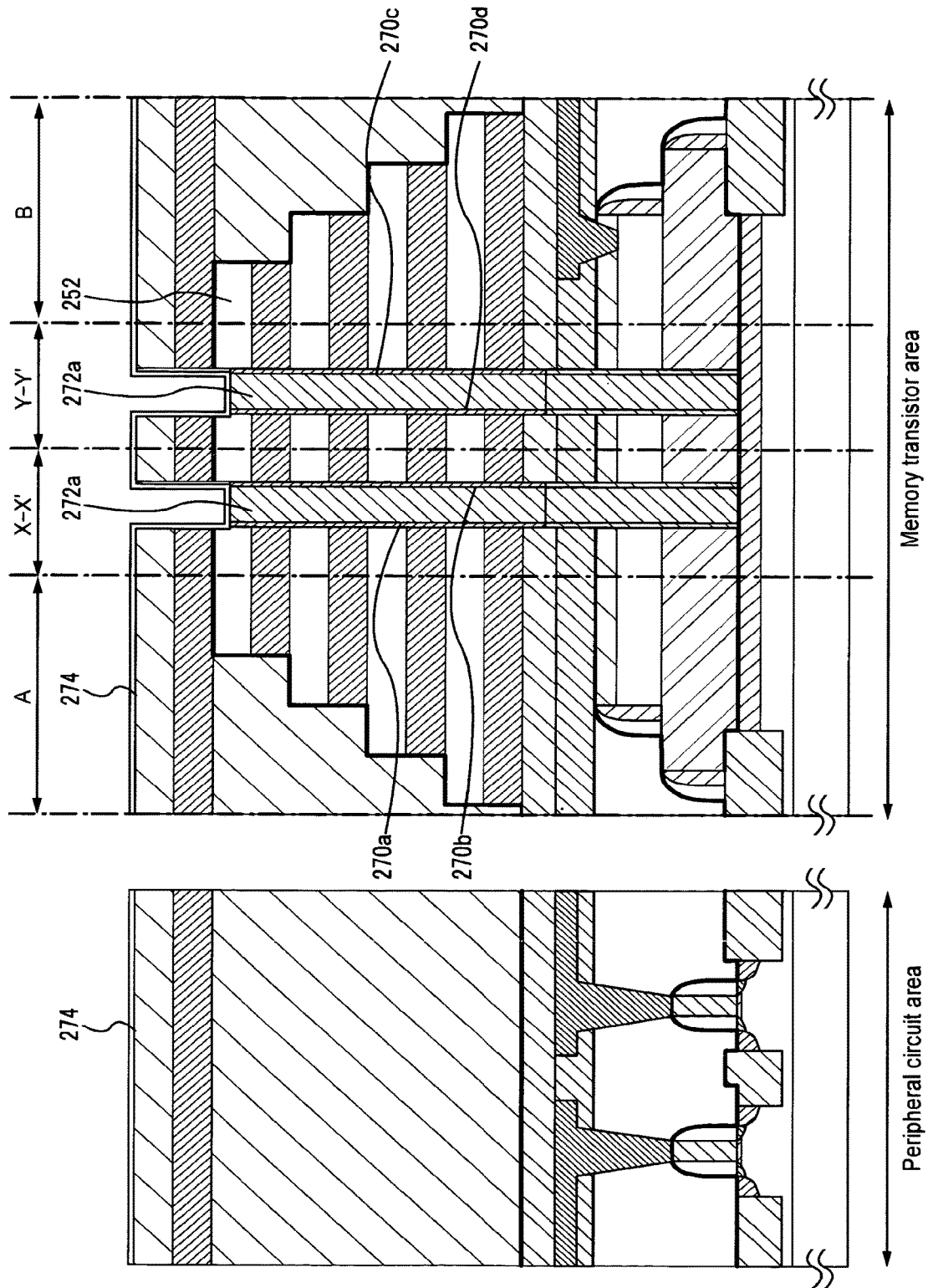
FIG. 72 is a diagram that shows a manufacturing process of the nonvolatile semiconductor memory device 1 according to one embodiment of the present invention.

Subsequently, by performing the anisotropic etching to the ONO film 270, a bottom part of the ONO film 270 is removed so that the ONO film 270*a* are formed (FIG. 72). Next, an amorphous silicon film 272 is formed, etch backed and made it receded until it become an amorphous silicon films 272*a* (FIG. 72). Next, an area, where the ONO films 270*a* of the side wall inside of the memory plug holes 262 are removed to a degree that a part of the silicon oxide 252 is exposed (FIG. 72). Then, a TEOS film 274 is formed on the whole surface of the substrate (FIG. 72). Also, thermal oxidation films may be formed instead of the TEOS. In this case, oxidation films are formed only on the poly-silicon of the side wall of the memory plug holes 262 and the poly-silicon parts of the bottom parts of the memory plug holes 262.

Figure 73:
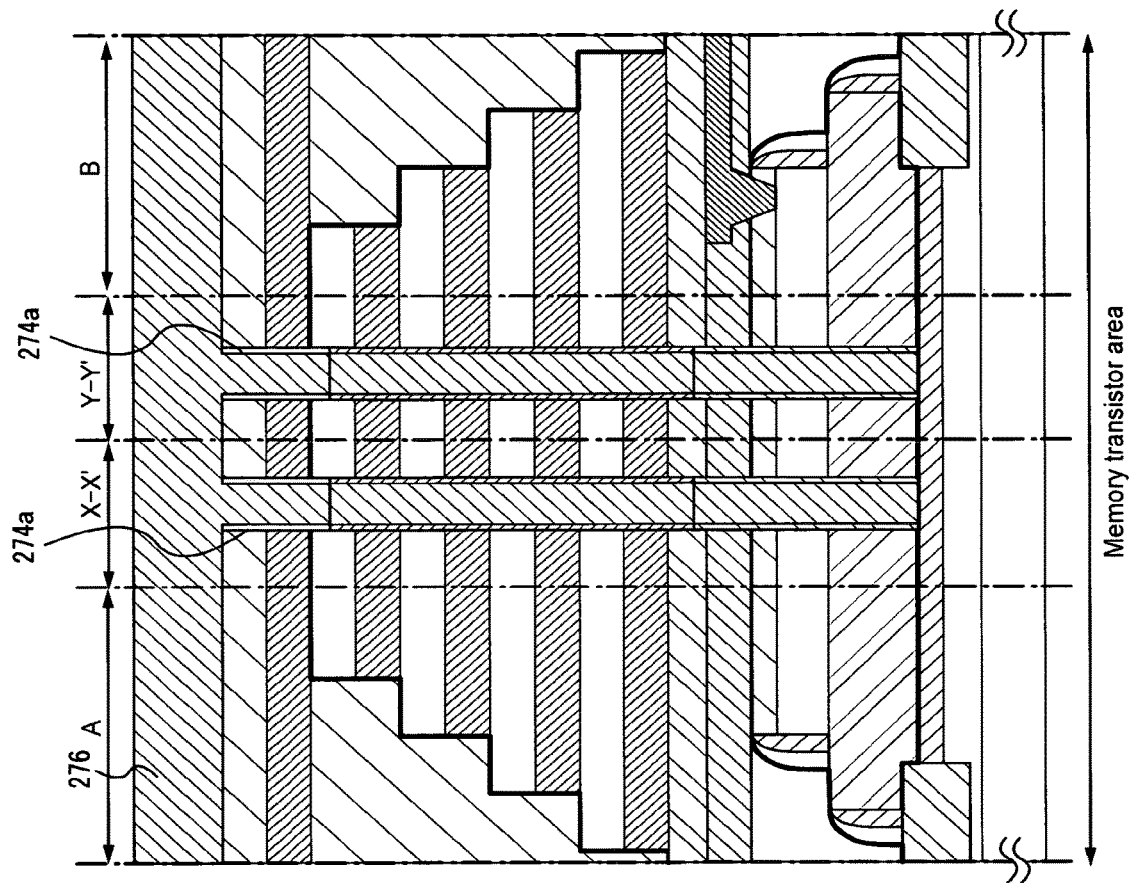
FIG. 73 is a diagram that shows a manufacturing process of the nonvolatile semiconductor memory device 1 according to one embodiment of the present invention.
Figure 73:
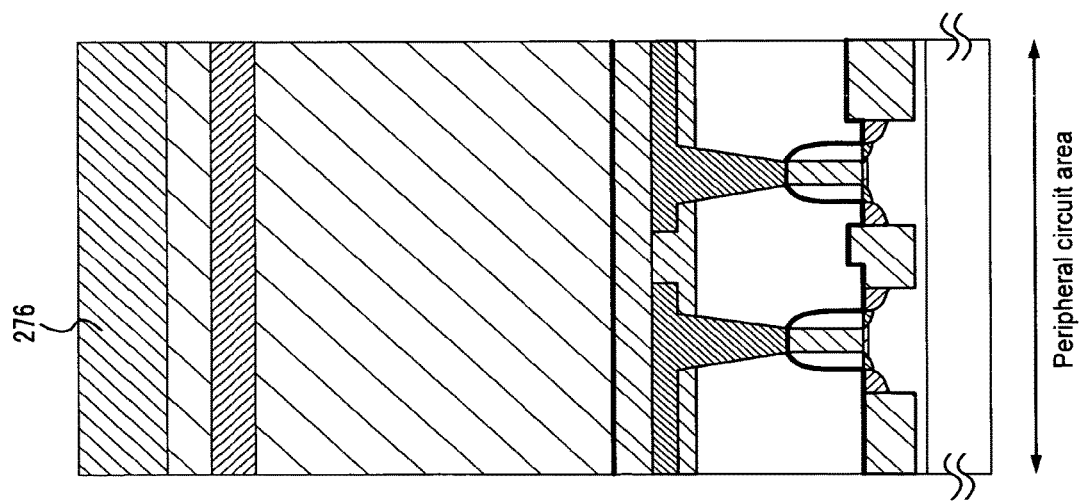

Next, by performing the anisotropic etching to the TEOS film 274, the bottom part of the TEOS film 274 is removed so that TEOS films 274*a* are formed (FIG. 73).

Figure 74:
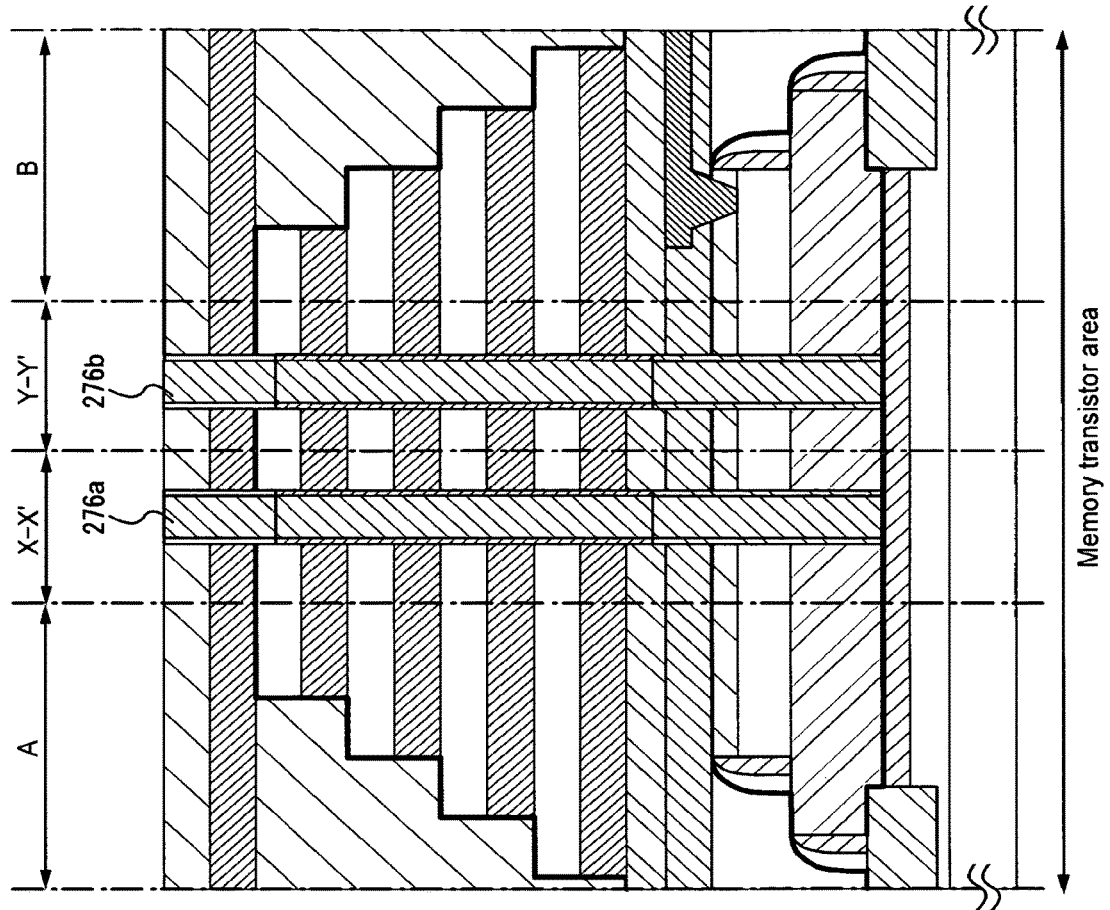
FIG. 74 is a diagram that shows a manufacturing process of the nonvolatile semiconductor memory device 1 according to one embodiment of the present invention.
Figure 74:
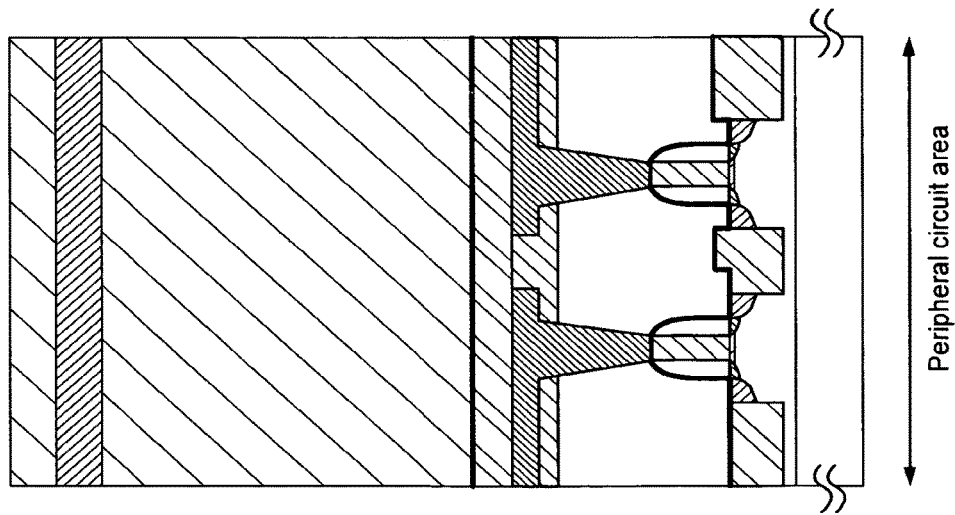
Figure 75:
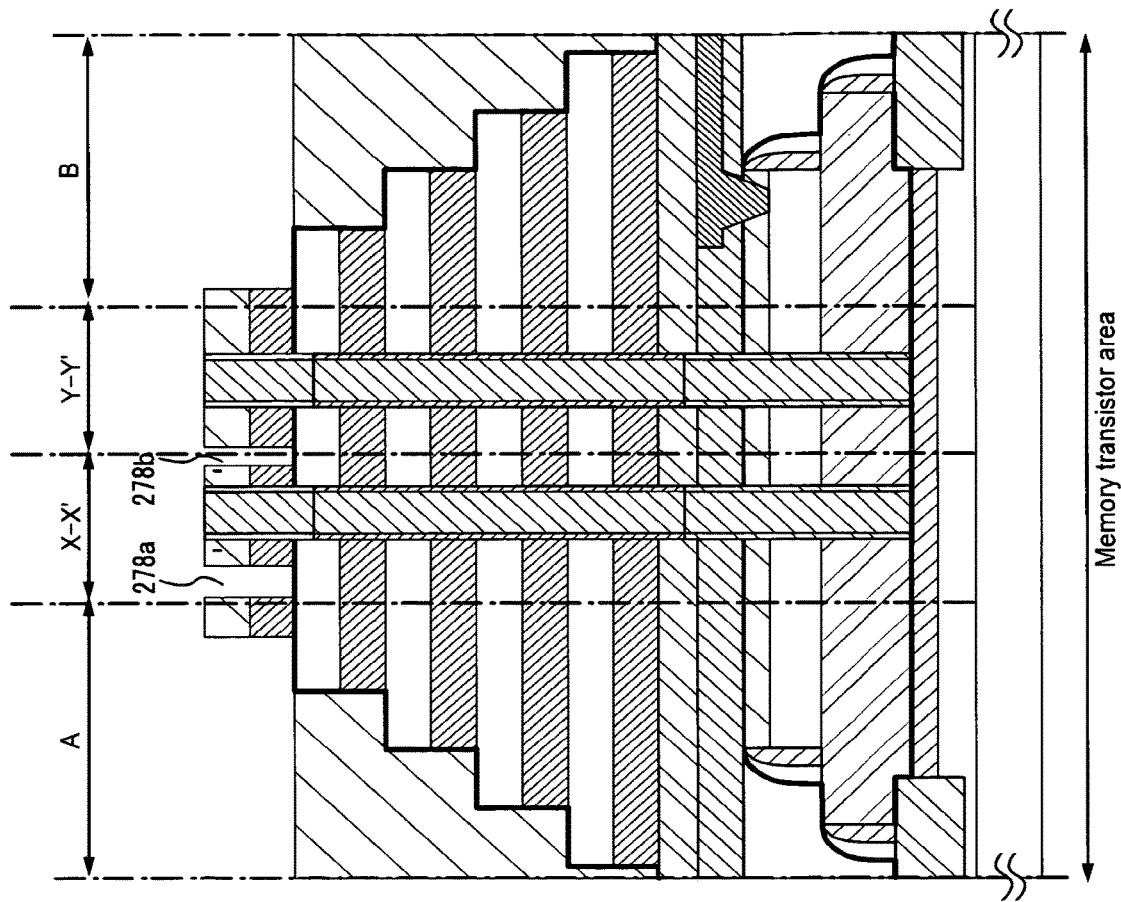
FIG. 75 is a diagram that shows a manufacturing process of the nonvolatile semiconductor memory device 1 according to one embodiment of the present invention.
Figure 75:
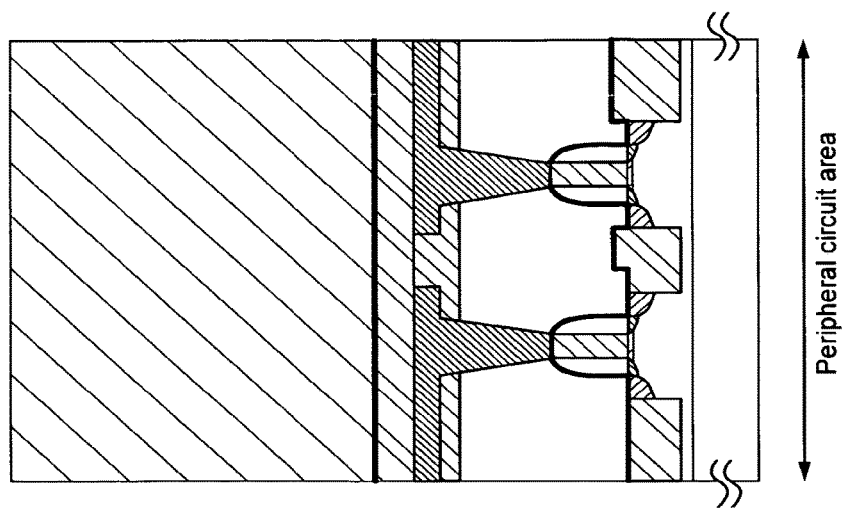

Next, by forming an amorphous silicon film 276 and performing the CMP treatment, an amorphous silicon film 276 is planarized (FIG. 74).

Figure 76:
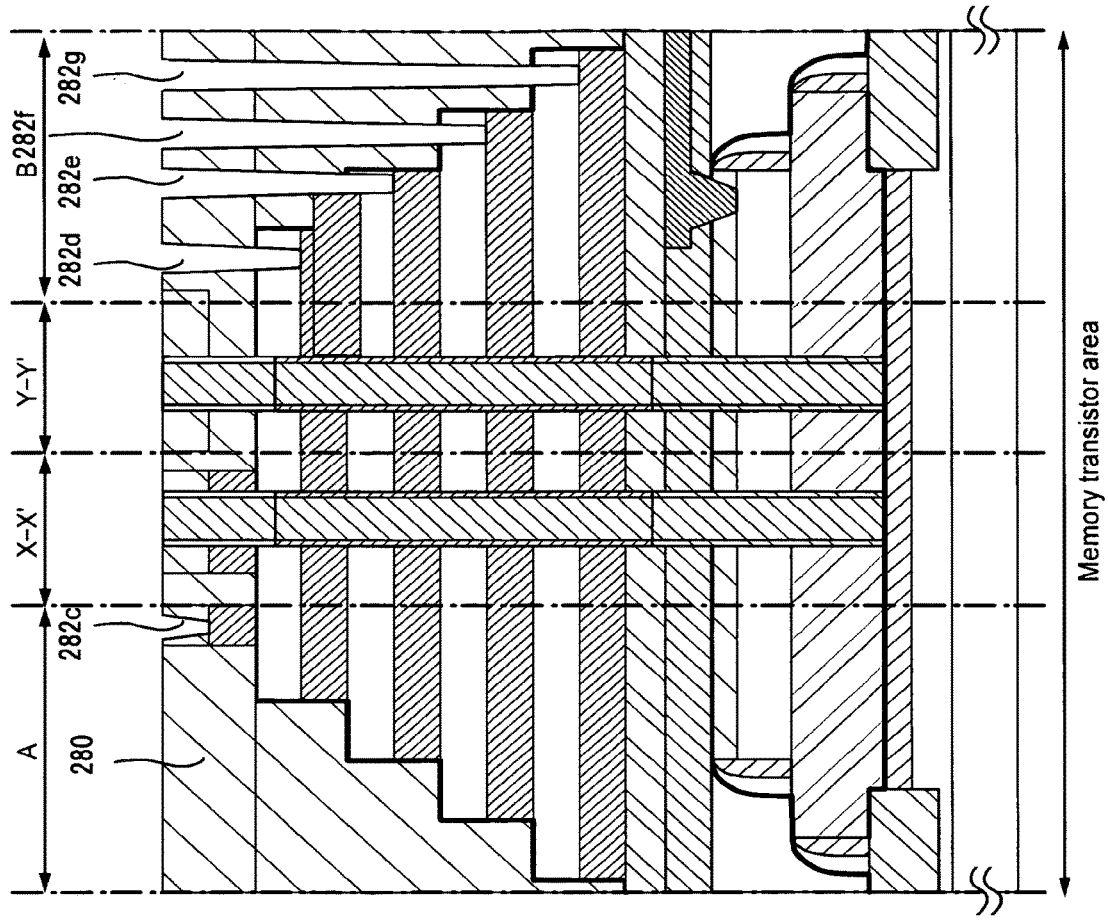
FIG. 76 is a diagram that shows a manufacturing process of the nonvolatile semiconductor memory device 1 according to one embodiment of the present invention.
Figure 76:
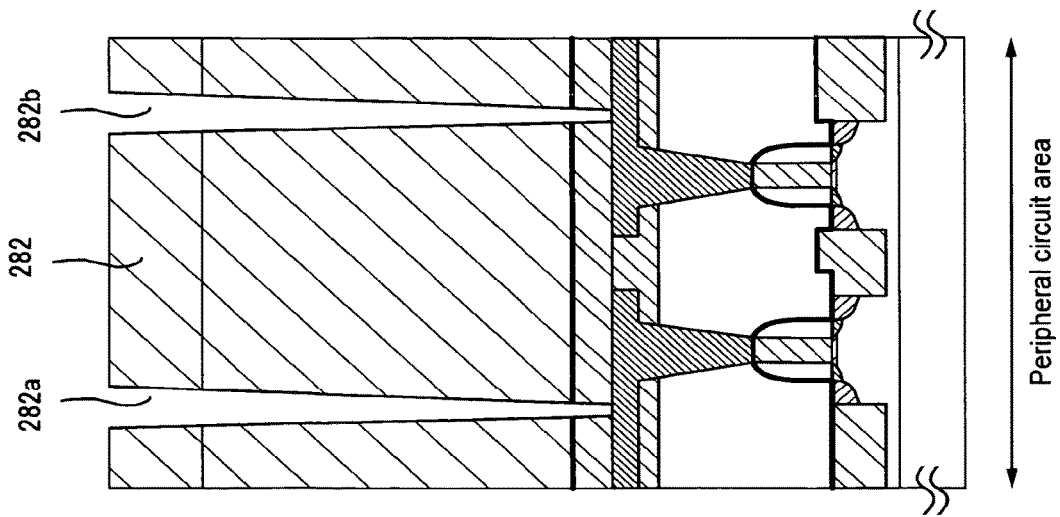

Subsequently by photo etching process, the layer of the selection gate transistor SDTr are divided (FIG. 75), BPSG film 280 is accumulated in the area 278*a* and 186*b*; and then the CMP treatment is performed (FIG. 76).

Next, by the photo etching process, contact holes 282*a*, 282*b*, 282*c*, 282*d*, 282*e*, 282*f* and 282*g* are formed (FIG. 76).

Figure 77:
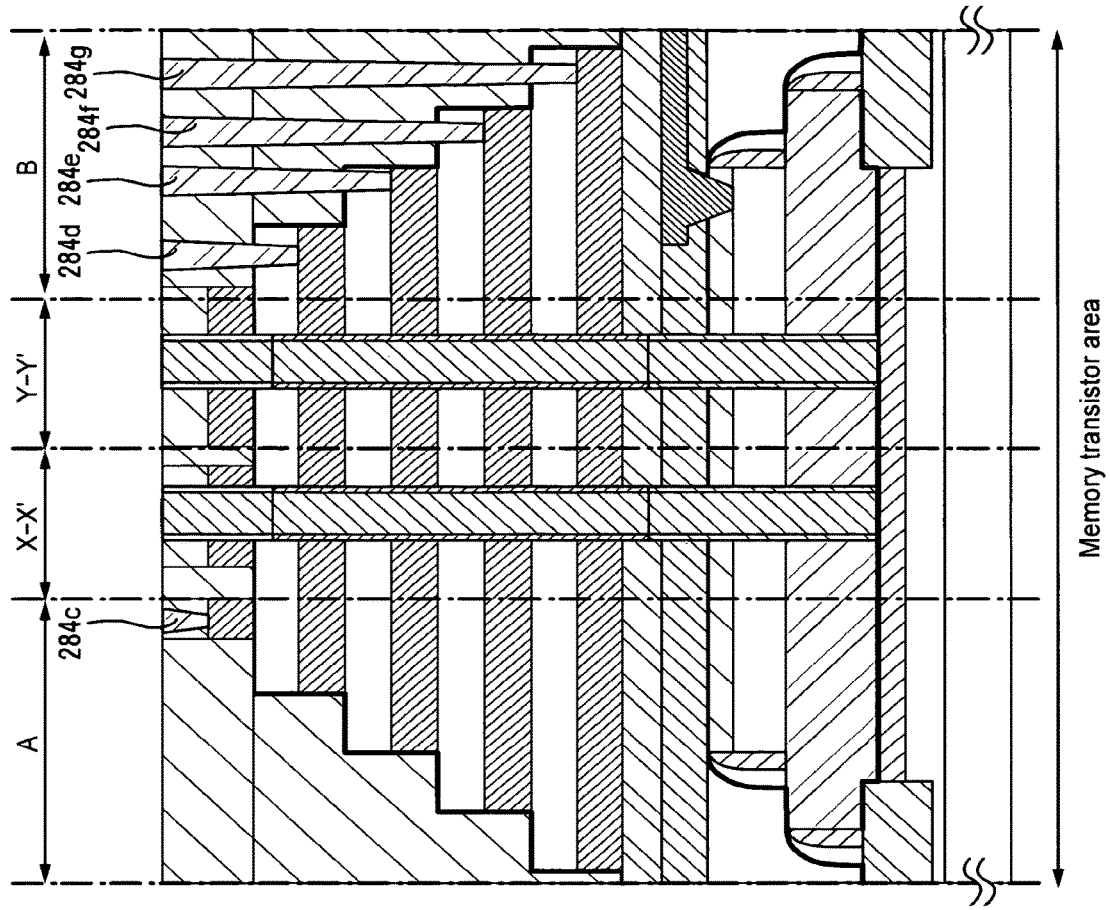
FIG. 77 is a diagram that shows a manufacturing process of the nonvolatile semiconductor memory device 1 according to one embodiment of the present invention.
Figure 77:
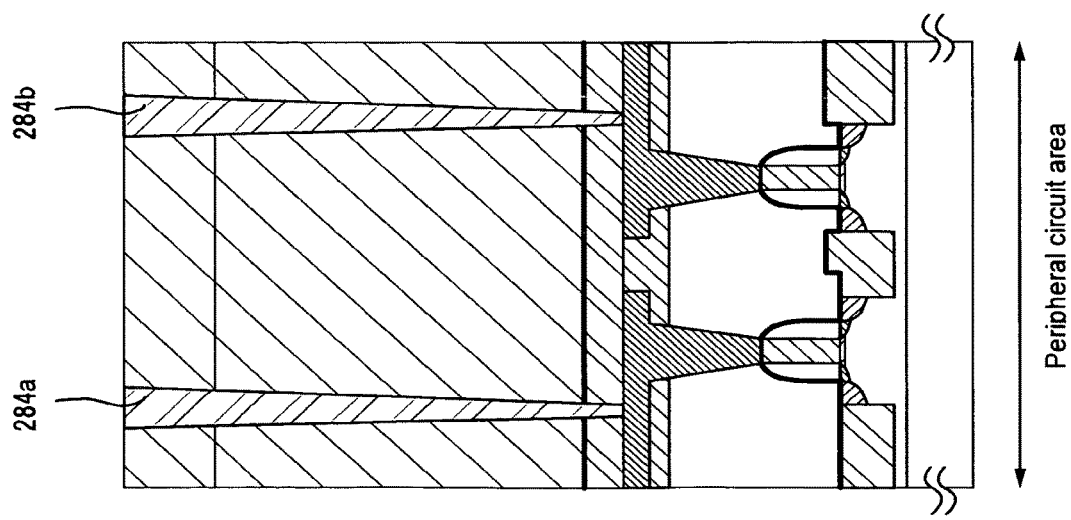

After forming the lamination films of titanium and titanium nitride (not showing in the figures), by forming a tungsten film and performing CMP treatment, tungsten plugs 284*a*, 284*b*, 284*c*, 284*d*, 284*e*, 284*f* and 284*g* are formed into contact holes 282*a*, 282*b*, 282*c*, 282*d*, 282*e*, 282*f* and 282*g* a (FIG. 77).

Figure 78:
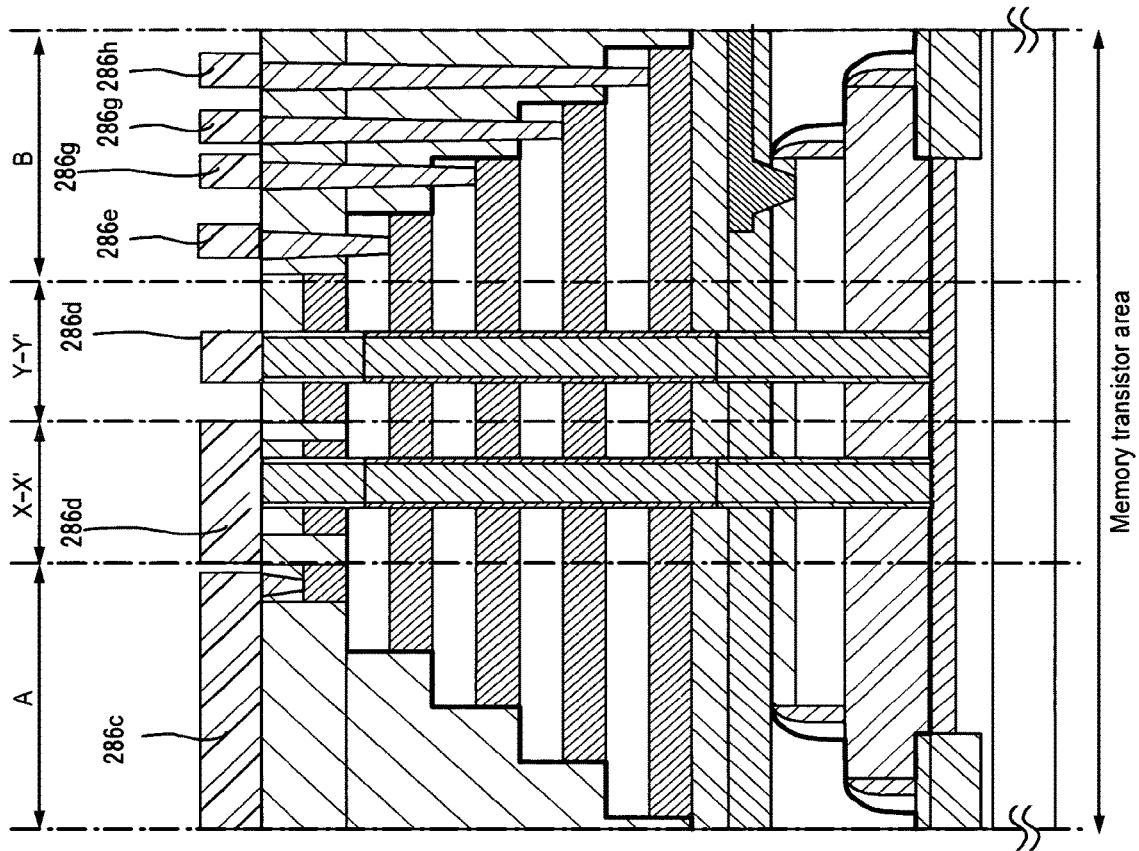
FIG. 78 is a diagram that shows a manufacturing process of the nonvolatile semiconductor memory device 1 according to one embodiment of the present invention.
Figure 78:
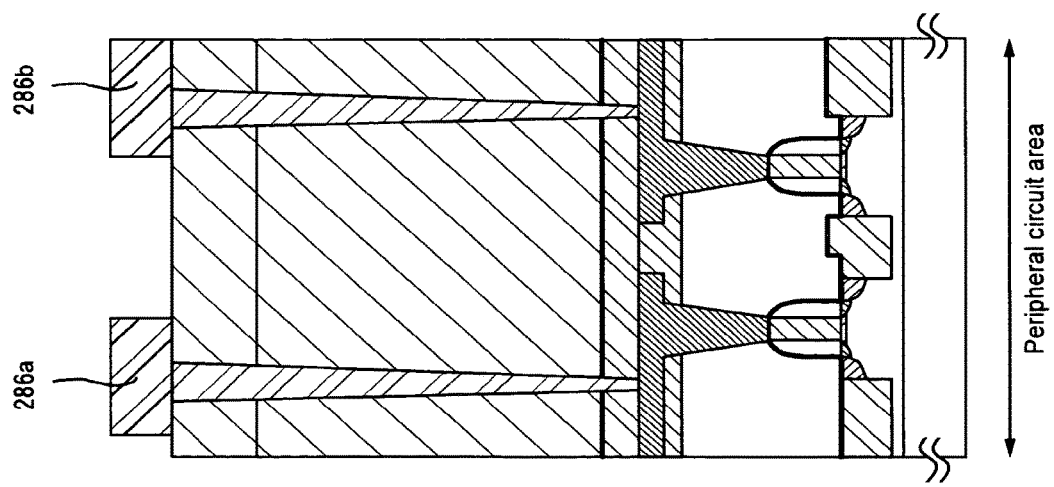

Next, aluminum/copper (Al, CU) films are formed; photo resist mask (not shown in the figures) is formed; and patterning is performed by photo etching process so that wirings 286*a*, 286*b*, 286*c*, 286*d*, 286*e*, 286*f*, 286*g* and 286*h* are formed (FIG. 78). Then photo resist mask is removed (FIG. 77).

By the above-described process, the nonvolatile semiconductor memory device 1 according to this embodiment may be manufactured.

According to the nonvolatile semiconductor memory device and the manufacturing method thereof according to one embodiment of the present invention, number of word line drivers may be reduced by forming the word line per each layer with a common conductor layer, and thus reduction of chip area may be realized.

And in the nonvolatile semiconductor memory device according to one embodiment of the present invention and the manufacturing method thereof, a plurality of vertical type transistors that are connected in series may be formed by 1 PEP, by laminating the lamination films corresponding to the number of the lamination layers of the memory transistors in advance and formation hole patterns in a lump.

Also in the nonvolatile semiconductor memory device according to one embodiment of the present invention and the manufacturing method thereof, it is necessary to connect the selection gates to the upper and lower parts of vertical type transistors that are connected in series to operate a plurality of the transistors. Also the formation of the series structure with the plurality of the vertical type transistors that are connected to the selection gates in series may be performed simultaneously with the PEPs of 1 or 2 (memory transistor formation PEP).

Further in the nonvolatile semiconductor memory device according to one embodiment of the present invention and the manufacturing method thereof, the source side selection gates SGS of the plurality of vertical type transistors that are connected in series and the word lines WL of each of the memory transistors, as a matter of operation, can be set to be a common potential per each layer all the time. Therefore, the layer structure may be applied to both of the selection gate lines SGS and the word lines WL. As thus described, the word lines can be formed by the rough PEP, by which the manufacturing process may be simplified and thus the cost reduction may be realized.

Third Embodiment

In this embodiment, a film including a nanocrystal film in the charge storage layer of the nonvolatile semiconductor memory device of the present invention. For example, the charge storage layer is set to be a lamination structure configured to a silicon oxide film, a nanocrystal film and a silicon oxide film. As the nanocrystal films, a silicon oxide film including the nanocrystal of the silicon may be used. In the nonvolatile semiconductor memory device according to this embodiment, charges are held in the nanocrystal of the silicon that are disintegrated and distributed in this nanocrystal film.

Further in this embodiment, the nanocrystal film including the nanocrystal of the silicon is used; however, nanocrystal of metals or the other nanocrystal of conductors, such as cobalt (Co), tungsten (W), silver (Ag), gold (Au), platinum (Pt), etc. In addition, the nanocrystal is also called "metal nano dot" and "nanocrystal".

Also in this embodiment, silicon oxide film, nanocrystal film and silicon oxide film are applied for the charge storage layers; a single layer structure of the insulation film such as silicon oxide film, in which the three layers are formed serially and in which nanocrystal of silicon, metals and the other conductors are contained, may be applied.

Fourth Embodiment

In this embodiment, another example of the configuration of the memory transistor area in the nonvolatile semiconductor memory device of the present invention will be explained. In addition, the other configuration will not be explained again, for they are same with the above-described first embodiment, the second embodiment and the third embodiment.

Figure 79:
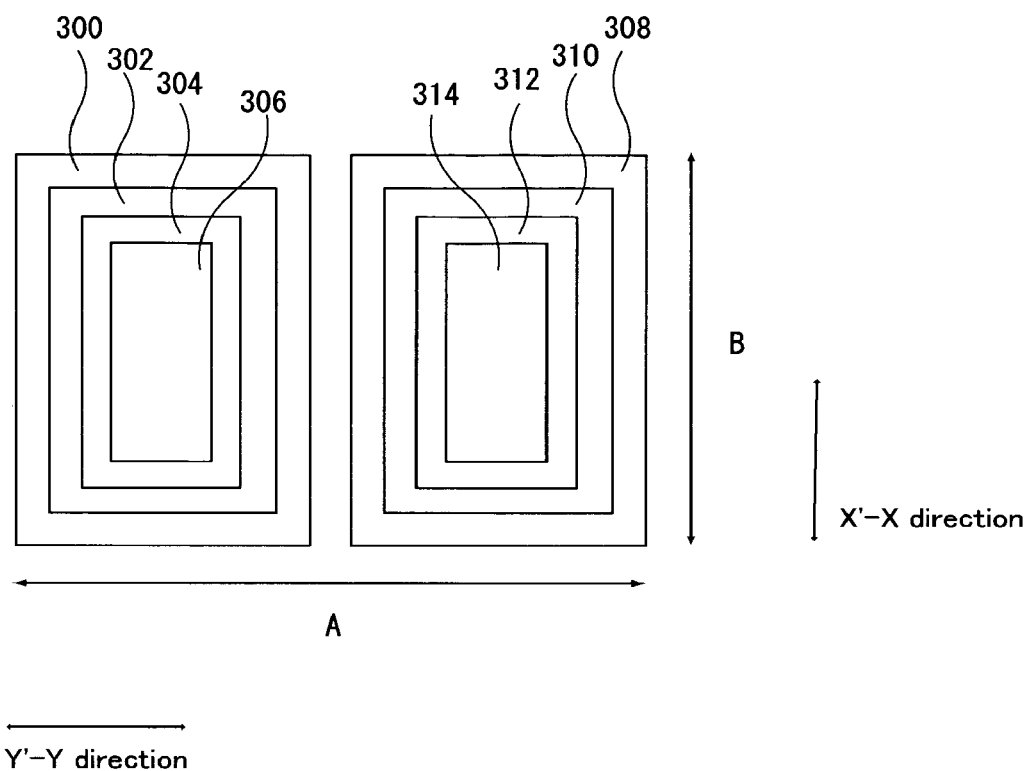
FIG. 79 is a diagram that shows two adjacent memory transistor areas in the nonvolatile semiconductor memory device 1 according to one embodiment of the present invention.

In the nonvolatile semiconductor memory device according to one embodiment of the present invention, conductor layers and the interlayer films are etched in a taper shape so that steps are formed. Hereby an example, in which two adjacent memory transistor areas are formed, is shown in FIG. 79. FIG. 79 is a diagram, in which the conductor layers of the memory transistor area of the nonvolatile semiconductor memory device of the present invention according to this embodiment are seen from the top part. The conductor layers 300 to 306 show one memory transistor area, in which 300 shows a first conductor layer; 302 shows a second conductor layer; 304 shows a third conductor layer; and 306 shows a fourth conductor layer. And the conductor layers 308 to 314 show the adjacent memory transistor areas, in which 308 shows a first conductor layer; 310 shows a second conductor layer; 312 shows a third conductor layer; and 314 shows a fourth conductor layer. In addition, "A" is a length of Y' to Y direction of the two adjacent memory transistors, and "B" is a length of the X to X' direction.

Thus, in the case that the adjacent memory transistor areas are formed, each of the memory transistor areas may be formed separately.

Also in FIG. 80, another example of two memory transistor areas of the nonvolatile semiconductor memory device according to this embodiment is shown. FIG. 80 (A) is a diagram, in which the conductor layers of the memory transistor area of the nonvolatile semiconductor memory device of the present invention according to this embodiment are seen from the top part. 320 show a first conductor layer; 322 show a second conductor layer; 324 show a third conductor layer; and 326 and 328 show fourth conductor layers.

In the memory transistor area shown in FIG. 80 (A) (B), by removing with etching the conductor layers 320, 324 and 326 along with X to X' to in the vicinity of the centre, two memory transistor areas of: a memory transistor area configured to conductor areas 320a, 322a, 324a and 326 and; the memory transistor area configured to conductor layers 320b, 322b, 324b and 328, may be formed. In the memory transistor area shown in FIG. 80, the length of the Y to Y' direction may be shortened as compared with the memory transistor area shown in FIG. 79, and thus the area of the memory transistor area may be reduced.

Figure 89:
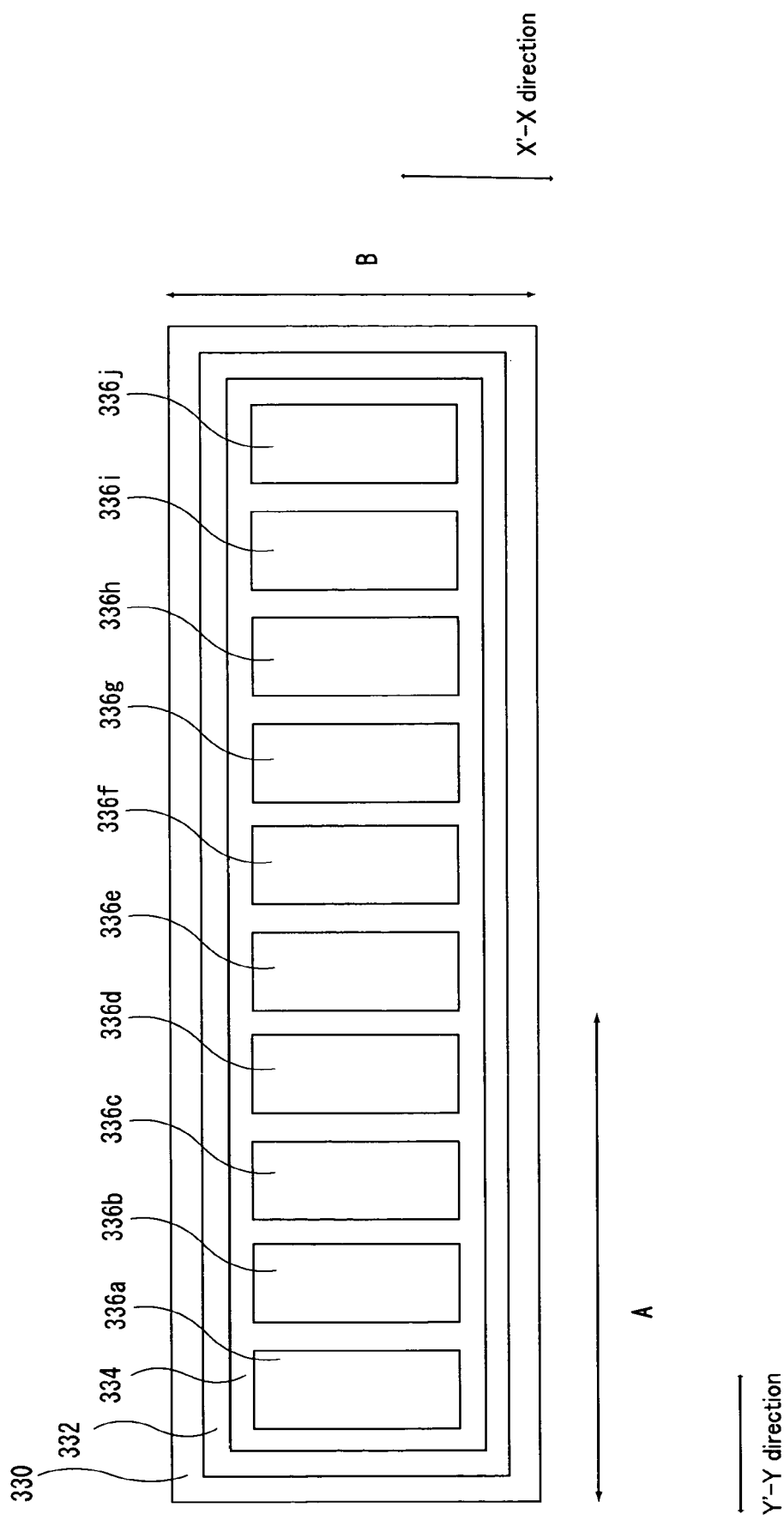
FIG. 89 is a diagram that shows a plurality of adjacent memory transistor areas in the nonvolatile semiconductor memory device 1 according to one embodiment of the present invention.

Subsequently an example, in which the 10 adjacent memory transistor areas are formed, is shown in FIG. 89. FIG. 89 is a diagram, in which the conductor layers of the memory transistor area of the nonvolatile semiconductor memory device of the present invention according to this embodiment are seen from the top part. In addition, "A" is equivalent to the length of the Y to Y' direction of the two adjacent memory transistors shown in FIG. 79; and "B" is equivalent to the length of the X to X' direction.

In the nonvolatile semiconductor memory device according to this embodiment shown in FIG. 89, 330 shows a first conductor layer; 332 shows a second conductor layer; 334 shows a third conductor layer; and 336a to 336j show fourth conductor layer.

In the memory transistor area shown in FIG. 89, as shown in FIG. 90, the conductor layers 330, 332 and 334 are removed by etching along with the X' to X direction between the fourth conductor layers 336a to 336j, by which conductor layers 330a to 330j, conductor layers 332a to 332j, conductor layers 334a to 334j, and conductor layers 336a to 336j are formed.

In the memory transistor area shown in FIG. 89, a overhead view diagram, in which the conductor layers 330, 32 and 334 are removed by the etching along with the X' to X direction between the fourth conductor layers 336a to 336j and thus ten memory transistor areas are formed, are shown in FIG. 90. The memory transistor area configured to conductor layers 330a, 332a, 334a and 336a the memory transistor areas configured to the conductor layers 330b, 332b, 334b and 336b, the memory transistor areas configured to the conductor layers 330c, 332c, 334c and 336c, the memory transistor areas configured to the conductor layers 330d, 332d, 334d and 336d; the memory transistor areas configured to the conductor layers 330e, 332e, 334e and 336e; the memory transistor areas configured to the conductor layers 330f, 332f, 334f and 336f; the memory transistor areas configured to the conductor layers 330g, 332g, 334g and 336g; the memory transistor areas configured to the conductor layers 330h, 332h, 334h and 336h; the memory transistor areas configured to the conductor layers 330i, 332i, 334i and 336i; and the memory transistor areas configured to the conductor layers 330j, 332j, 334j and 336j are formed, thus totally ten memory transistor areas are formed. The memory transistor areas shown in FIG. 90 may be shorten the length of the Y to Y' direction as compared with the memory transistor areas shown in FIG. 79, therefore the areas of the memory transistor areas may be reduced.

Further in this embodiment, an example the nonvolatile semiconductor memory device of the present invention, in the case that it is formed by laminating the four conductor layers so that ten memory transistor are formed, are explained. However, the nonvolatile semiconductor memory device of the present invention is not limited to this; an arbitrary number of the conductor layers may be laminated and an arbitrary number of the memory transistor areas may be formed simultaneously.

Figure 91:
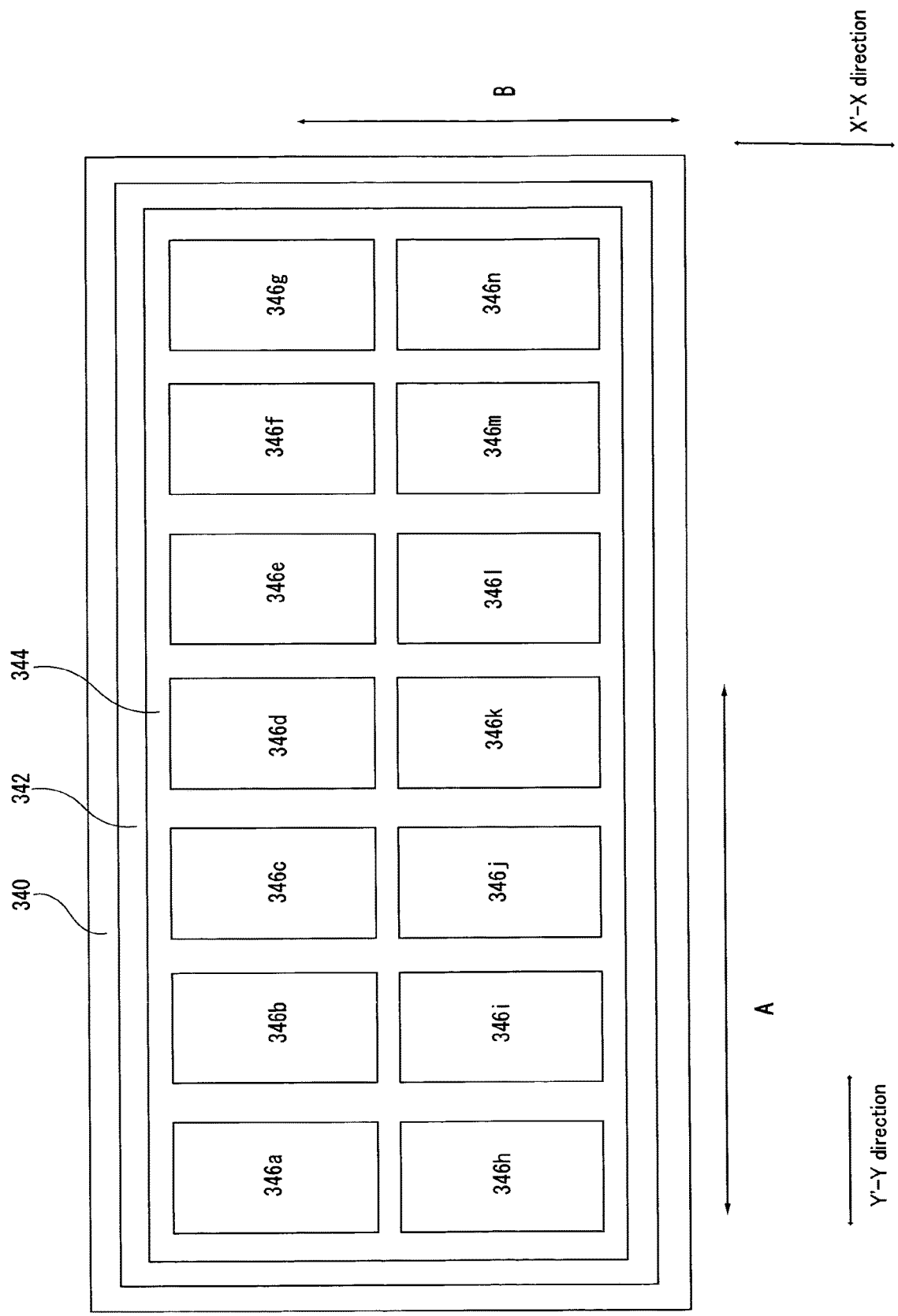
FIG. 91 is a diagram that shows a plurality of adjacent memory transistor areas in the nonvolatile semiconductor memory device 1 according to one embodiment of the present invention.
Figure 92:
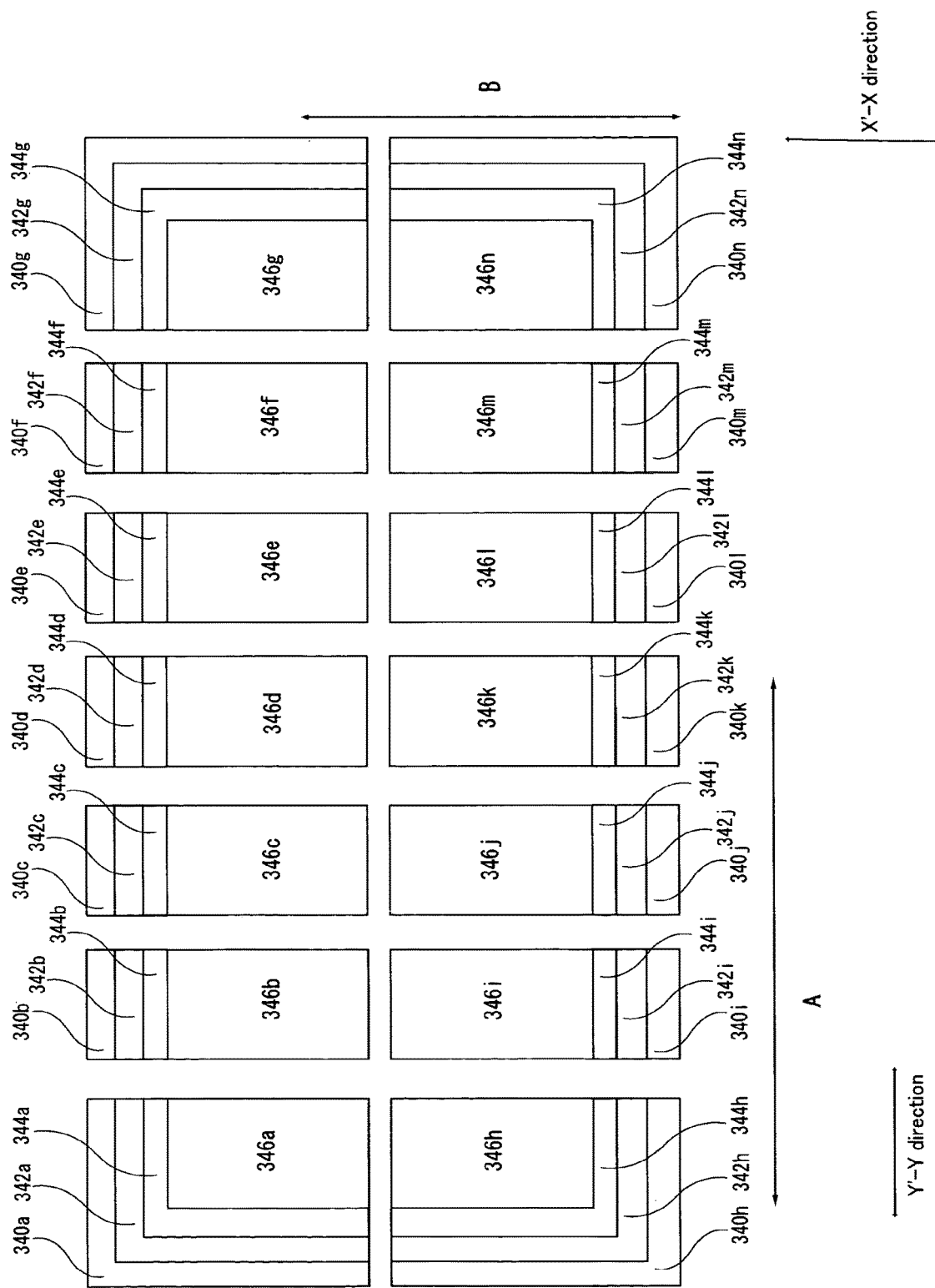
FIG. 92 is a diagram that shows a plurality of adjacent memory transistor areas in the nonvolatile semiconductor memory device 1 according to one embodiment of the present invention.

Also, an example, in which the adjacent seven memory transistor areas are formed into two columns, is shown in FIG. 91 and FIG. 92. FIG. 91 is a diagram, in which the conductor layers of the memory transistor areas of the nonvolatile semiconductor memory device of the present invention according to this embodiment are seen from the top part. In addition, "A" is equivalent to a length of Y' to Y direction of the two adjacent memory transistor areas shown in FIG. 79, and "B" is equivalent to a length of the X' to X direction.

In the nonvolatile semiconductor memory device according to this embodiment shown in FIG. 91, 340 shows a first conductor layer; 342 shows a second conductor layer; 344 shows a third conductor layer; and 346a to 346n show fourth conductor layers.

In the memory transistor area shown in FIG. 91, as shown in FIG. 92, the conductor layers 340, 342 and 344 are removed by etching along with the X' to X direction and the Y' to Y direction between the fourth conductor layers 346a to 346n, by which conductor layers 340a to 340n, conductor layers 342a to 342n, conductor layers 344a to 344n, and conductor layers 346a to 346n are formed.

In FIG. 92, the memory transistor area configured to conductor layers 340a, 342a, 344a and 346a; the memory transistor areas configured to the conductor layers 340b, 342b, 344b and 346b, the memory transistor areas configured to the conductor layers 340c, 342c, 344c and 346c, the memory transistor areas configured to the conductor layers 340d, 342d, 344d and 346d, the memory transistor areas configured to the conductor layers 340e, 342e, 344e and 346e, the memory transistor areas configured to the conductor layers 340f, 342f, 344f and 346f; the memory transistor areas configured to the conductor layers 340g, 342g, 344g and 346g, the memory transistor areas configured to the conductor layers 340h, 342h, 344h and 346h, the memory transistor areas configured to the conductor layers 340i, 342i, 344i and 346i, and the memory transistor areas configured to the conductor layers 340j, 342j, 344j and 346j are formed, thus totally fourteen memory transistor areas are formed. The memory transistor areas shown in FIG. 92 may be shorten the length of the Y to Y' direction as compared with the memory transistor areas shown in FIG. 79, therefore the areas of the memory transistor areas may be reduced.

In addition here, an example the nonvolatile semiconductor memory device of the present invention, in the case that it is formed by laminating the four conductor layers so that fourteen memory transistor areas are formed, are explained. However, the nonvolatile semiconductor memory device of the present invention is not limited to this; an arbitrary number of the conductor layers may be laminated and an arbitrary number of the memory transistor areas may be formed simultaneously.

Further in FIG. 11, an example, in which a plurality number of the memory transistor areas shown in FIG. 92 are formed, is shown. As shown in FIG. 11, in the nonvolatile semiconductor memory device according to this embodiment, the plurality of the memory transistor areas may be disposed efficiently.

In addition here, an example the nonvolatile semiconductor memory device of the present invention, in the case that it is formed by laminating the four conductor layers so that two fourteen-memory-transistor areas are formed, are explained. However, the nonvolatile semiconductor memory device of the present invention is not limited to this; an arbitrary number of the conductor layers may be laminated and an arbitrary number of the memory transistor areas may be formed simultaneously.

In addition, in the above-described embodiment 1, a case is shown, where a metal wiring 146a of the bottom layer is formed after forming the transistor and the source side selection gate (SGS) in the peripheral circuit area and the memory cell areas are stacked afterward. The case is not limited to this formation process; for example, a metal wiring may be formed on the top layer after stacking the memory cell areas.

Figure 93:
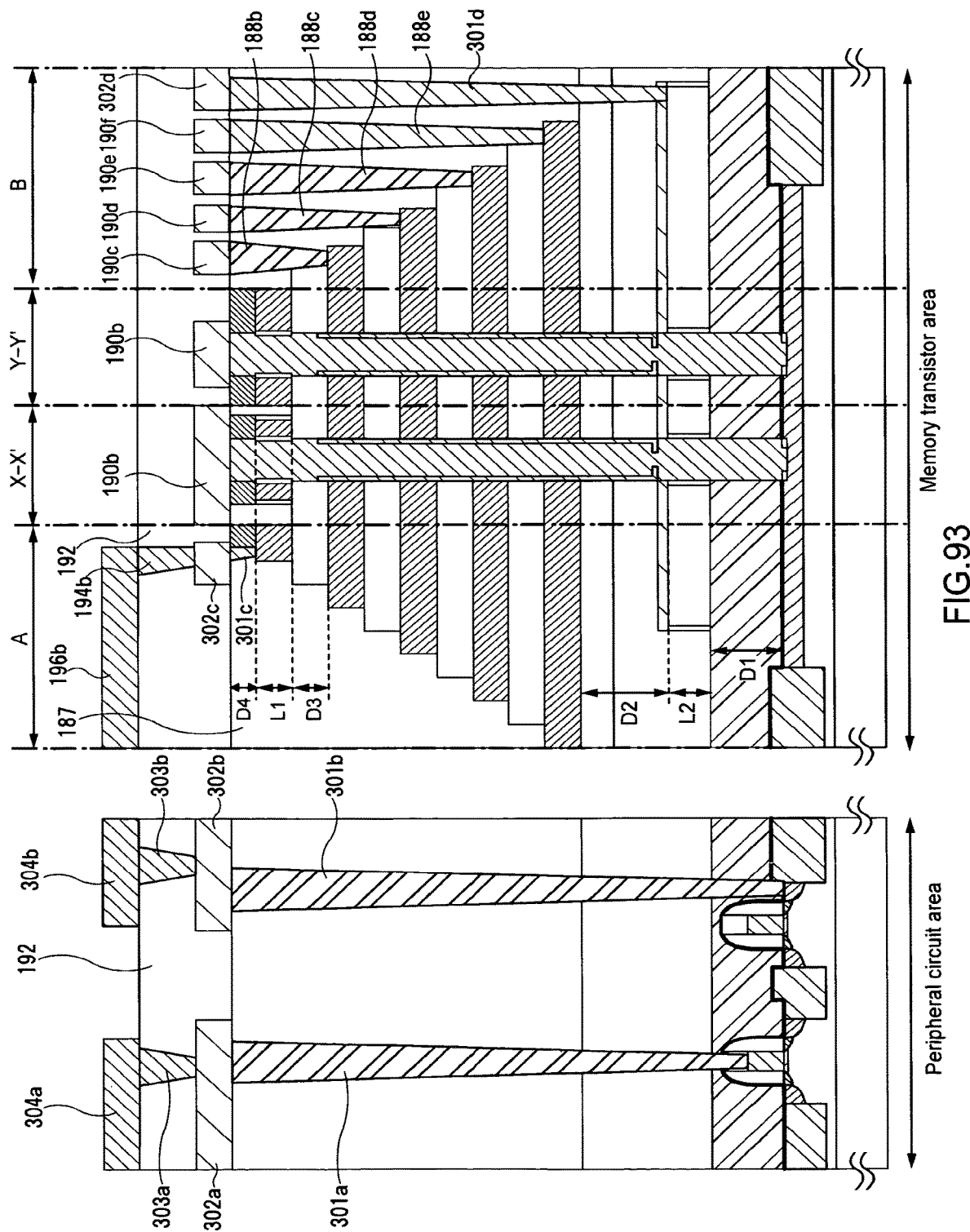
FIG. 93 is a diagram showing another configuration of the nonvolatile semiconductor memory device 1 of the present invention according to one embodiment.

An example, where the metal wiring is formed on the top layer, is shown in FIG. 93. In the example, tungsten (W) plug 144a, 144b and the wiring 146a, which are shown in the peripheral circuit area of the above-described FIG. 33, are not formed. After the interlayer insulation film 182 is formed in the peripheral circuit area shown in the above-described FIG. 42, and shifted to a process of forming the metal wiring shown in FIG. 93. In FIG. 93, a contact hole is formed by photo etching process, a tungsten film is formed and CMP process is performed. Thereby, the tungsten plugs 301a, 301b, 301c, 301d, 188b, 188c, 188d and 188e are formed.

Next in FIG. 93, an aluminum (AL) film is formed, and the electrodes 302a, 302b, 302c, 302d, 190b, 190c, 190d, 190e and 190f are formed via the photo etching process. In the next place, in FIG. 93, the interlayer insulation film (BPSG) 192 is formed, the CMP process is performed to perform planarization. Afterwards, a contact hole is formed by the photo etching process, a tungsten film is formed and the CMP process is performed. Thereby, the tungsten plugs 303a, 303b and 194b are formed. Further, in FIG. 93, an aluminum (Al) film is formed, and the electrodes 304a, 304b and 196b are formed.

As above, in the peripheral circuit area, influence of the heat process performed at the time of stacking the memory cell area may be reduced by forming the metal wiring from the top layer rather than by forming the metal wiring at the bottom layer.

In addition, in a case where the nonvolatile semiconductor memory device shown in the above-described FIG. 44, FIG. 77 and FIG. 93 is formed, the thermal history is different in the upper layer selection gate transistor SDTr and the lower layer selection gate transistor SSTr, because the nonvolatile semiconductor memory device is formed from the bottom layer section. In particular, the bottom layer selection gate transistor SSTr affect the thermal history larger than the upper layer selection gate transistor SDTr; therefore, measures to maintain the electric connection of the off electric current characteristics with the memory array area well is required. As measures for this, an example, in which a gate length L1 of the upper layer selection gate transistor SDTr and the gate length L2 of the lower layer selection gate transistor SSTr becomes the different lengths, are explained as follows.

In FIG. 93, the gate length L1 of the upper layer selection gate transistor SDTr and the gate length L2 of the lower layer selection gate transistor SSTr are shown. In this case, the gate length L2 of the lower layer selection gate transistor SSTr is set longer than the gate length L1 of the upper layer selection gate transistor SDTr. Hereinafter, setting examples of the gate length L1 and L2 will be respectively explained referring to FIG. 93 to FIG. 95.

In FIG. 93, D1 shows a distance between the lower layer source line SL and the lower layer selection gate transistor SSTr; L2 shows a gate length of the lower selection gate transistor SSTr; D2 shows a distance of joint between the lower layer selection gate transistor SSTr and the memory array at the bottom layer; D3 shows a distance of joint between the memory array at the top layer and the upper layer selection gate transistor SDTr; also in FIG. 93, D4 shows a distance between the upper layer selection gate transistor SDTr and the body silicon top layer.

Figure 94:
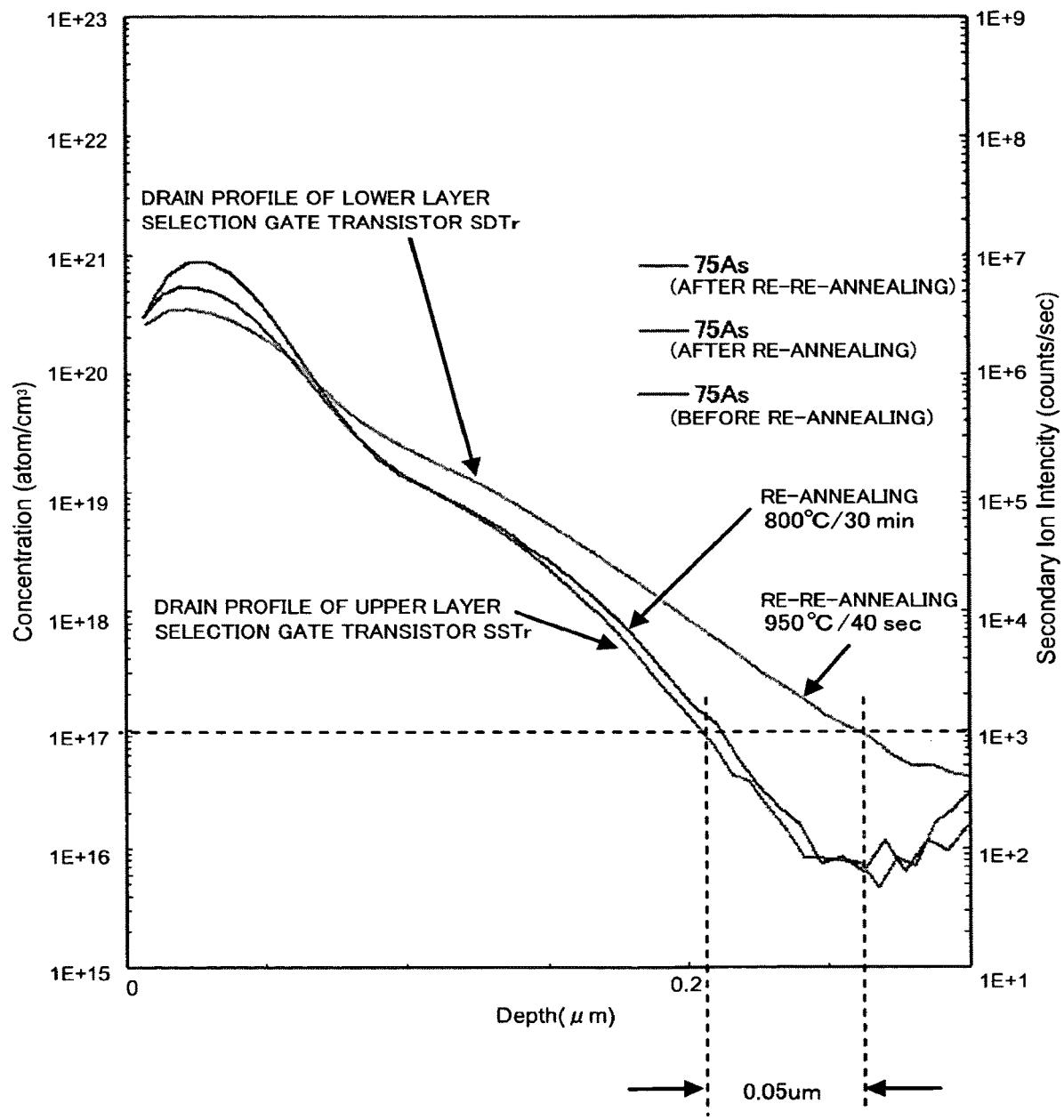
FIG. 94 is a diagram showing one example of simulation result of the impurity distribution in the nonvolatile semiconductor memory 1 of the present invention according to one embodiment.

FIG. 94 is a diagram showing one example of each drain profile of the lower selection gate transistor SSTr before or after re-re-annealing, and a drain profile of the upper selection gate transistor SSTr after the re-annealing. In the diagram, depth of the diffusion layer became 0.25 μm, when applying 950° C./40 sec which is equivalent to the heat process forming the upper layer selection gate transistor SDTr and the memory array. By the above, it becomes apparent that depth of the diffusion layer in the lower selection gate transistor SSTr differs in the depth 0.05 μm, as compared to depth of the diffusion layer of the upper layer selection gate transistor SDTr. By this, it became further apparent that the gate length L2 of the lower selection gate transistor SSTr is required to be lengthened in at least equal to or more than 0.05 μm as compared to the gate length L1 of the upper layer selection gate transistor SDTr.

Figure 95:
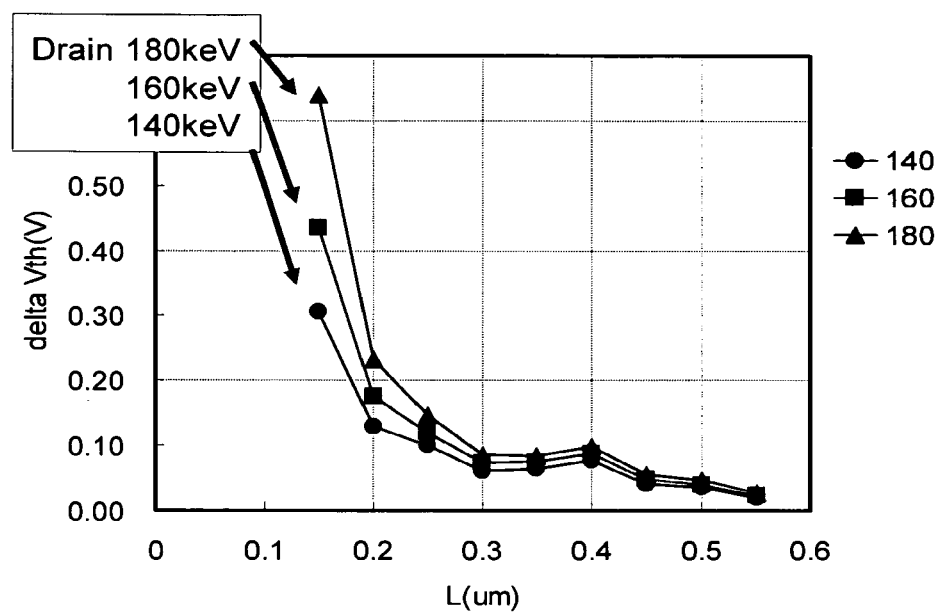
FIG. 95 is diagram showing one example of threshold change amount considering process difference in case of changing a gate length of the selection gate transistor in the nonvolatile semiconductor memory device 1 of the present invention according to one embodiment.

FIG. 95 is a diagram showing an example of difference of threshold (a threshold change amount delta Vth) considering the process difference in the case of changing the gate length L of the selection gate transistor. In the diagram, an example is shown, in which three drain diffusion conditions 140 keV, 160 keV, 180 keV are set and the length of the gate length L are changed. Together with the three conditions, it became apparent that the unevenness of threshold change amount delta Vth is large in the case that the gate length L is set to be less than 0.2 μm; it became further apparent that the difference of threshold change amount delta Vth becomes small in the case that the gate length L is set to be equal to or more than 0.2 μm.

By the result shown in the above-described FIG. 94 and FIG. 95, it became apparent that the gate length L1 of the upper layer selection gate transistor SDTr and the gate length L2 of the lower layer selection gate transistor SSTr both require lengths of equal to or more than 0.2 μm. It became further apparent that the gate length L2 of the lower selection gate transistor SSTr is required to be lengthened at least equal to or more than 0.05 μm as compared to the gate length L1 of the upper layer selection gate transistor SDTr.

It is preferred that the length of the above-described gate lengths be set to be different, and that the following measures (1) to (3) be performed.

(1) To lengthen the distance D1 between the lower layer selection gate transistor SSTr and the source line SL than the distance D3 of joint between the memory array of the top layer and the upper layer selection gate transistor SDTr.

(2) To lengthen the distance D2 of joint between the lower selection gate transistor SSTr and the memory array at the bottom layer, longer than the distance D4 (Refer to FIG. 93) between the upper layer selection gate transistor STDr and the body silicon top layer.

(3) To set the distance D1 between the lower gate transistor SSTr and the source line SL to be equal to or more than 300 nm.

By performing the above-described measures (1) to (3), increase of the off electric current caused by the extent of the diffusion layer by different thermal histories may be improved, and the concentration of the diffusion layer of the gate connection section may be maintained in high concentration. Further, by setting the gate length L2 of the lower layer selection gate transistor SSTr and the gate length L1 of the upper layer selection gate transistor SDTr to be different lengths, an overlap amount of gate electrodes of the upper layer selection gate transistor SDTr and the lower layer selection gate transistor SSTr and the drain diffusion layer is set to save sufficiently together with maintaining satisfactory contact resistance, and thus the driving force may be improved.

In addition, in the above-described embodiments, a case is shown, in which an ONO film is applied as a gate insulation film including the charge storage layer; however, the present invention is not limited to this. For example, an ONA film, a SANOS film and such may be applied. That is to say, anything is possible as far as the gate insulation film may be the film that includes the charge storage layer, which does not mean limitation of the materials.

What is claimed is:

1. A nonvolatile semiconductor memory device comprising:

an n type semiconductor area;
a plurality of electrode layers stacked in a first direction and provided above the n type semiconductor area, the plurality of electrode layers including a first electrode layer;
a first semiconductor layer penetrating through the plurality of electrode layers and contacting the n type semiconductor area;
a first charge storage portion provided between the first semiconductor layer and the first electrode layer;
a second semiconductor layer penetrating through the plurality of electrode layers and contacting the n type semiconductor area, the first semiconductor layer and the second semiconductor layer being arranged in a second direction perpendicular to the first direction;

a second charge storage portion provided between the second semiconductor layer and the first electrode layer;

a third semiconductor layer penetrating through the plurality of electrode layers and contacting the n type semiconductor area, the first semiconductor layer and the third semiconductor layer being arranged in a third direction, the third direction being perpendicular to the first direction and different from the second direction; and a third charge storage portion provided between the third semiconductor layer and the first electrode layer.

2. The nonvolatile semiconductor memory device according to claim 1, wherein
the n type semiconductor area includes materials giving the N type in a semiconductor area.

3. The nonvolatile semiconductor memory device according to claim 2, wherein
the n type semiconductor area includes phosphorous.

4. The nonvolatile semiconductor memory device according to claim 3, wherein
the n type semiconductor area is provided on a first material thicker than the n type semiconductor area.

5. The nonvolatile semiconductor memory device according to claim 4, wherein
the first material is a p type semiconductor layer.

6. The nonvolatile semiconductor memory device according to claim 1, the device further comprising:
a second electrode layer provided above the plurality of electrode layers in the first direction; and
a third electrode layer provided above the plurality of electrode layers in the first direction, the second electrode layer and the third electrode layer being arranged in the second direction and isolated from each other.

7. The nonvolatile semiconductor memory device according to claim 1, further comprising:
a first bit line extending in the second direction and electrically connected to the first semiconductor layer and the second semiconductor layer; and
a second bit line extending in the second direction and electrically connected to the third semiconductor layer.

8. The nonvolatile semiconductor memory device according to claim 6, further comprising:
a first gate insulating portion provided between the first semiconductor layer and the second electrode layer;
a second gate insulating portion provided between the second semiconductor layer and the third electrode layer; and
a third gate insulating portion provided between the third semiconductor layer and the second electrode layer.

9. The nonvolatile semiconductor memory device according to claim 8, wherein
the first electrode layer is a gate of a first memory cell transistor having the first semiconductor layer and the first charge storage portion, a gate of a second memory cell transistor having the second semiconductor layer and the second charge storage portion, and a gate of a third memory cell transistor having the third semiconductor layer and the third charge storage portion,
the second electrode layer is a gate of a first select transistor having the first semiconductor layer and the first gate insulating portion, and a gate of a third select transistor having the third semiconductor layer and the third gate insulating portion, and the third electrode layer is a gate of a second select transistor having the second semiconductor layer and the second gate insulating portion.

10. The nonvolatile semiconductor memory device according to claim 6, wherein
the plurality of electrode layers include a fourth electrode layer above the first electrode layer in the first direction.

11. The nonvolatile semiconductor memory device according to claim 10, further comprising:
a fourth charge storage portion provided between the first semiconductor layer and the fourth electrode layer;
a fifth charge storage portion provided between the second semiconductor layer and the fourth electrode layer; and
a sixth charge storage portion provided between the third semiconductor layer and the fourth electrode layer.

12. The nonvolatile semiconductor memory device according to claim 1, further comprising:
a fifth electrode layer below the plurality of electrode layers in the first direction; and
a sixth electrode layer below the plurality of electrode layers in the first direction, the fifth electrode layer and the sixth electrode layer being arranged in the second direction and isolated from each other.

13. The nonvolatile semiconductor memory device according to claim 12, further comprising:
a fourth gate insulating portion provided between the first semiconductor layer and the fifth electrode layer;
a fifth gate insulating portion provided between the second semiconductor layer and the sixth electrode layer; and
a sixth gate insulating portion provided between the third semiconductor layer and the fifth electrode layer.

14. The nonvolatile semiconductor memory device according to claim 13, wherein
the fifth electrode layer is a gate of a fourth select transistor having the first semiconductor layer and the fourth gate insulating portion, and a gate of a sixth select transistor having the third semiconductor layer and the sixth gate insulating portion, and
the sixth electrode layer is a gate of a fifth select transistor having the second semiconductor layer and the fifth gate insulating portion.

15. The nonvolatile semiconductor memory device according to claim 9, further comprising:
a fifth electrode layer below the plurality of electrode layers in the first direction;
a sixth electrode layer below the plurality of electrode layers in the first direction, the fifth electrode layer and the sixth electrode layer being arranged in the second direction and isolated from each other;
a fourth gate insulating portion provided between the first semiconductor layer and the fifth electrode layer;
a fifth gate insulating portion provided between the second semiconductor layer and the sixth electrode layer; and
a sixth gate insulating portion provided between the third semiconductor layer and the fifth electrode layer,
wherein
the fifth electrode layer is a gate of a fourth select transistor having the first semiconductor layer and the fourth gate insulating portion, and a gate of a sixth select transistor having the third semiconductor layer and the sixth gate insulating portion, and the sixth electrode layer is a gate of a fifth select transistor having the second semiconductor layer and the fifth gate insulating portion.

\* \* \* \* \*